(12) United States Patent
Telefus et al.

(10) Patent No.: US 11,682,891 B2
(45) Date of Patent: Jun. 20, 2023

(54) INTELLIGENT CIRCUIT BREAKERS WITH INTERNAL SHORT CIRCUIT CONTROL SYSTEM

(71) Applicant: Amber Semiconductor, Inc., Dublin, CA (US)

(72) Inventors: Mark Telefus, Orinda, CA (US); Stephen C. Gerber, Austin, TX (US); Damon M. Baker, Livermore, CA (US); Kenneth D. Alton, Austin, TX (US)

(73) Assignee: Amber Semiconductor, Inc., Dublin, CA (US)

( * ) Notice: Subject to any disclaimer, the term of this patent is extended or adjusted under 35 U.S.C. 154(b) by 394 days.

(21) Appl. No.: 17/047,613

(22) PCT Filed: May 18, 2020

(86) PCT No.: PCT/US2020/033421
§ 371 (c)(1),
(2) Date: Oct. 14, 2020

(87) PCT Pub. No.: WO2020/236726
PCT Pub. Date: Nov. 26, 2020

(65) Prior Publication Data
US 2022/0189721 A1   Jun. 16, 2022

Related U.S. Application Data

(63) Continuation of application No. 16/720,446, filed on Dec. 19, 2019, now Pat. No. 11,373,831, and a
(Continued)

(51) Int. Cl.
*H02H 3/08* (2006.01)
*H01H 71/04* (2006.01)
(Continued)

(52) U.S. Cl.
CPC .............. *H02H 3/08* (2013.01); *G01R 15/202* (2013.01); *G01R 19/175* (2013.01);
(Continued)

(58) Field of Classification Search
CPC . H01H 71/04; H02H 3/08; H02H 3/33; G01R 19/175
See application file for complete search history.

(56) References Cited

U.S. PATENT DOCUMENTS 3,638,102 A   1/1972  Pelka
3,777,253 A   12/1973 Callan
(Continued)

FOREIGN PATENT DOCUMENTS

CN   109075551 B   1/2021
EP   0016646 A1    10/1980
(Continued)

OTHER PUBLICATIONS

F. Stajano et al., "The Resurrecting Duckling: Security Issues for Ad-hoc Wireless Networks," International Workshop on Security Protocols, 1999, 11 pages.
(Continued)

*Primary Examiner* — Adolf D Berhane
*Assistant Examiner* — Afework S Demisse
(74) *Attorney, Agent, or Firm* — Ryan, Mason & Lewis, LLP

(57) ABSTRACT

A circuit breaker includes an electromechanical switch, a current sensor, a voltage sensor, and a processor. The electromechanical switch is serially connected between a line input terminal and a load output terminal of the circuit breaker, and configured to be placed in a switched-closed state or a switched-open state. The current sensor is configured to sense a magnitude of current flowing in a path between the line input and load output terminals and gen-
(Continued)

erate a current sense signal. The voltage sensor is configured to sense a magnitude of voltage at a point on the path between the line input and load output terminals and generate a voltage sense signal. The processor is configured to receive and process the current sense signal and the voltage sense signal to determine operational status information of the circuit breaker and determine power usage information of a load connected to the load output terminal.

20 Claims, 47 Drawing Sheets

Related U.S. Application Data continuation of application No. 16/720,506, filed on Dec. 19, 2019, now Pat. No. 11,551,899, and a continuation of application No. 16/720,485, filed on Dec. 19, 2019, now Pat. No. 11,348,752, and a continuation of application No. 16/720,533, filed on Dec. 19, 2019, now Pat. No. 11,170,964, and a continuation of application No. 16/720,583, filed on Dec. 19, 2019, now Pat. No. 11,342,151.

(60) Provisional application No. 62/849,847, filed on May 18, 2019.

(51) Int. Cl.
| | | |
|---|---|---|
| *H01H 71/12* | (2006.01) | |
| *H02H 1/00* | (2006.01) | |
| *H01H 71/24* | (2006.01) | |
| *G01R 15/20* | (2006.01) | |
| *H02H 3/33* | (2006.01) | |
| *G01R 19/175* | (2006.01) | |
| *H01H 9/54* | (2006.01) | |
| *H01H 9/56* | (2006.01) | |
| *H01H 33/59* | (2006.01) | |
| *H02J 13/00* | (2006.01) | |
| *H02M 7/06* | (2006.01) | |

(52) U.S. Cl.
CPC ............ *H01H 9/542* (2013.01); *H01H 9/548* (2013.01); *H01H 9/56* (2013.01); *H01H 9/563* (2013.01); *H01H 33/593* (2013.01); *H01H 71/04* (2013.01); *H01H 71/128* (2013.01); *H01H 71/24* (2013.01); *H02H 1/0007* (2013.01); *H02H 1/0092* (2013.01); *H02H 3/33* (2013.01); *H02J 13/00022* (2020.01); *H01H 2009/543* (2013.01); *H01H 2009/546* (2013.01); *H01H 2300/03* (2013.01); *H02H 3/085* (2013.01); *H02M 7/06* (2013.01)

(56) References Cited

U.S. PATENT DOCUMENTS

| | | |
|---|---|---|
| 4,074,345 A | 2/1978 | Ackermann |
| 4,127,895 A | 11/1978 | Krueger |
| 4,245,148 A | 1/1981 | Gisske et al. |
| 4,245,184 A | 1/1981 | Billings et al. |
| 4,245,185 A | 1/1981 | Mitchell et al. |
| 4,257,081 A | 3/1981 | Sauer et al. |
| 4,466,071 A | 8/1984 | Russell, Jr. |
| 4,487,458 A | 12/1984 | Janutka |
| 4,581,540 A | 4/1986 | Guajardo |
| 4,631,625 A | 12/1986 | Alexander et al. |
| 4,636,907 A | 1/1987 | Howell |
| 4,649,302 A | 3/1987 | Damiano et al. |
| 4,653,084 A | 3/1987 | Ahuja |
| 4,682,061 A | 7/1987 | Donovan |
| 4,685,046 A | 8/1987 | Sanders |
| 4,709,296 A | 11/1987 | Hung et al. |
| 4,760,293 A | 7/1988 | Hebenstreit |
| 4,766,281 A | 8/1988 | Buhler |
| 4,812,995 A | 3/1989 | Girgis et al. |
| 4,888,504 A | 12/1989 | Kinzer |
| 5,121,282 A | 6/1992 | White |
| 5,276,737 A | 1/1994 | Micali |
| 5,307,257 A | 4/1994 | Fukushima |
| 5,371,646 A | 12/1994 | Biegelmeier |
| 5,410,745 A | 4/1995 | Friesen et al. |
| 5,559,656 A | 9/1996 | Chokhawala |
| 5,646,514 A | 7/1997 | Tsunetsugu |
| 5,654,880 A | 8/1997 | Brkovic et al. |
| 5,731,732 A | 3/1998 | Williams |
| 5,793,596 A | 8/1998 | Jordan et al. |
| 5,796,274 A | 8/1998 | Willis et al. |
| 5,870,009 A | 2/1999 | Serpinet et al. |
| 5,933,305 A | 8/1999 | Schmalz et al. |
| 6,081,123 A | 6/2000 | Kasbarian et al. |
| 6,111,494 A | 8/2000 | Fischer et al. |
| 6,115,267 A | 9/2000 | Herbert |
| 6,141,197 A | 10/2000 | Kim et al. |
| 6,160,689 A | 12/2000 | Stolzenberg |
| 6,167,329 A | 12/2000 | Engel et al. |
| 6,169,391 B1 | 1/2001 | Lei |
| 6,188,203 B1 | 2/2001 | Rice et al. |
| 6,300,748 B1 | 10/2001 | Miller |
| 6,369,554 B1 | 4/2002 | Aram |
| 6,483,290 B1 | 11/2002 | Hemminger et al. |
| 6,515,434 B1 | 2/2003 | Biebl |
| 6,538,906 B1 | 3/2003 | Ke et al. |
| 6,756,998 B1 | 6/2004 | Bilger |
| 6,788,512 B2 | 9/2004 | Vicente et al. |
| 6,813,720 B2 | 11/2004 | Leblanc |
| 6,839,208 B2 | 1/2005 | Macbeth et al. |
| 6,843,680 B2 | 1/2005 | Gorman |
| 6,906,476 B1 | 6/2005 | Beatenbough et al. |
| 6,984,988 B2 | 1/2006 | Yamamoto |
| 7,045,723 B1 | 5/2006 | Projkovski |
| 7,053,626 B2 | 5/2006 | Monter et al. |
| 7,110,225 B1 | 9/2006 | Hick |
| 7,164,238 B2 | 1/2007 | Kazanov et al. |
| 7,297,603 B2 | 11/2007 | Robb et al. |
| 7,304,828 B1 | 12/2007 | Shvartsman |
| D558,683 S | 1/2008 | Pape et al. |
| 7,319,574 B2 | 1/2008 | Engel |
| D568,253 S | 5/2008 | Gorman |
| 7,367,121 B1 | 5/2008 | Gorman |
| 7,586,285 B2 | 9/2009 | Gunji |
| 7,595,680 B2 | 9/2009 | Morita et al. |
| 7,610,616 B2 | 10/2009 | Masuouka et al. |
| 7,633,727 B2 | 12/2009 | Zhou et al. |
| 7,643,256 B2 | 1/2010 | Wright et al. |
| 7,693,670 B2 | 4/2010 | Durling et al. |
| 7,715,216 B2 | 5/2010 | Liu et al. |
| 7,729,147 B1 | 6/2010 | Wong et al. |
| 7,731,403 B2 | 6/2010 | Lynam et al. |
| 7,746,677 B2 | 6/2010 | Unkrich |
| 7,821,023 B2 | 10/2010 | Yuan et al. |
| D638,355 S | 5/2011 | Chen |
| 7,936,279 B2 | 5/2011 | Tang et al. |
| 7,948,719 B2 | 5/2011 | Xu |
| 8,124,888 B2 | 2/2012 | Etemad-Moghadam et al. |
| 8,256,675 B2 | 9/2012 | Baglin et al. |
| 8,374,729 B2 | 2/2013 | Chapel et al. |
| 8,463,453 B2 | 6/2013 | Parsons, Jr. |
| 8,482,885 B2 | 7/2013 | Billingsley et al. |
| 8,560,134 B1 | 10/2013 | Lee |
| 8,649,883 B2 | 2/2014 | Lu et al. |
| 8,664,886 B2 | 3/2014 | Ostrovsky |
| 8,717,720 B2 | 5/2014 | DeBoer |
| 8,718,830 B2 | 5/2014 | Smith |
| 8,781,637 B2 | 7/2014 | Eaves |
| 8,817,441 B2 | 8/2014 | Callanan |
| 8,890,371 B2 | 11/2014 | Gotou |
| D720,295 S | 12/2014 | Dodal et al. |
| 8,947,838 B2 | 2/2015 | Yamai et al. |
| 9,054,587 B2 | 6/2015 | Neyman |

(56) References Cited

U.S. PATENT DOCUMENTS

| | | |
|---|---|---|
| 9,055,641 B2 | 6/2015 | Shteynberg et al. |
| 9,287,792 B2 | 3/2016 | Telefus et al. |
| 9,325,516 B2 | 4/2016 | Pera et al. |
| 9,366,702 B2 | 6/2016 | Steele et al. |
| 9,439,318 B2 | 9/2016 | Chen |
| 9,443,845 B1 | 9/2016 | Stafanov et al. |
| 9,502,832 B1 | 11/2016 | Ullahkhan et al. |
| 9,509,083 B2 | 11/2016 | Yang |
| 9,515,560 B1 | 12/2016 | Telefus et al. |
| 9,577,420 B2 | 2/2017 | Ostrovsky et al. |
| 9,621,053 B1 | 4/2017 | Telefus |
| 9,774,182 B2 | 9/2017 | Phillips |
| 9,836,243 B1 | 12/2017 | Chanler et al. |
| D814,424 S | 4/2018 | DeCosta |
| 9,965,007 B2 | 5/2018 | Amelio et al. |
| 9,990,786 B1 | 6/2018 | Ziraknejad |
| 9,991,633 B2 | 6/2018 | Robinet |
| 10,072,942 B2 | 9/2018 | Wootton et al. |
| 10,101,716 B2 | 10/2018 | Kim |
| 10,187,944 B2 | 1/2019 | MacAdam et al. |
| 10,469,077 B2 | 11/2019 | Telefus et al. |
| D879,056 S | 3/2020 | Telefus |
| D881,144 S | 4/2020 | Telefus |
| 10,615,713 B2 | 4/2020 | Telefus et al. |
| 10,645,536 B1 | 5/2020 | Barnes et al. |
| 10,756,662 B2 | 8/2020 | Steiner et al. |
| 10,812,072 B2 | 10/2020 | Telefus et al. |
| 10,812,282 B2 | 10/2020 | Telefus et al. |
| 10,819,336 B2 | 10/2020 | Telefus et al. |
| 10,834,792 B2 | 11/2020 | Telefus et al. |
| 10,887,447 B2 | 1/2021 | Jakobsson et al. |
| 10,936,749 B2 | 3/2021 | Jakobsson |
| 10,951,435 B2 | 3/2021 | Jakobsson |
| 10,985,548 B2 | 4/2021 | Telefus |
| 10,992,236 B2 | 4/2021 | Telefus et al. |
| 10,993,082 B2 | 4/2021 | Jakobsson |
| 2002/0109487 A1 | 8/2002 | Telefus et al. |
| 2003/0052544 A1 | 3/2003 | Yamamoto et al. |
| 2003/0063420 A1 | 4/2003 | Pahl et al. |
| 2003/0151865 A1 | 8/2003 | Maio |
| 2004/0032756 A1 | 2/2004 | Van Den Bossche |
| 2004/0251884 A1 | 12/2004 | Steffie et al. |
| 2005/0162139 A1 | 7/2005 | Hirst |
| 2005/0185353 A1 | 8/2005 | Rasmussen et al. |
| 2005/0286184 A1 | 12/2005 | Campolo |
| 2006/0285366 A1 | 12/2006 | Radecker et al. |
| 2007/0008747 A1 | 1/2007 | Soldano et al. |
| 2007/0143826 A1 | 6/2007 | Sastry et al. |
| 2007/0159745 A1 | 7/2007 | Berberich et al. |
| 2007/0188025 A1 | 8/2007 | Keagy et al. |
| 2007/0236152 A1 | 10/2007 | Davis et al. |
| 2008/0006607 A1 | 1/2008 | Boeder et al. |
| 2008/0136581 A1 | 6/2008 | Heilman et al. |
| 2008/0151444 A1 | 6/2008 | Upton |
| 2008/0174922 A1 | 7/2008 | Kimbrough |
| 2008/0180866 A1 | 7/2008 | Wong |
| 2008/0204950 A1 | 8/2008 | Zhou et al. |
| 2008/0253153 A1 | 10/2008 | Wu et al. |
| 2008/0281472 A1 | 11/2008 | Podgorny et al. |
| 2009/0034139 A1 | 2/2009 | Martin |
| 2009/0067201 A1 | 3/2009 | Cai |
| 2009/0168273 A1 | 7/2009 | Yu et al. |
| 2009/0195349 A1 | 8/2009 | Frader-Thompson et al. |
| 2009/0203355 A1 | 8/2009 | Clark |
| 2009/0213629 A1 | 8/2009 | Liu et al. |
| 2009/0284385 A1 | 11/2009 | Tang et al. |
| 2010/0091418 A1 | 4/2010 | Xu |
| 2010/0145479 A1 | 6/2010 | Griffiths |
| 2010/0145542 A1 | 6/2010 | Chapel et al. |
| 2010/0156369 A1 | 6/2010 | Kularatna et al. |
| 2010/0188054 A1 | 7/2010 | Asakura et al. |
| 2010/0231135 A1 | 9/2010 | Hum et al. |
| 2010/0231373 A1 | 9/2010 | Romp |
| 2010/0244730 A1 | 9/2010 | Nerone |
| 2010/0261373 A1 | 10/2010 | Roneker |
| 2010/0284207 A1 | 11/2010 | Watanabe et al. |
| 2010/0296207 A1 | 11/2010 | Schumacher et al. |
| 2010/0320840 A1 | 12/2010 | Fridberg |
| 2011/0062936 A1 | 3/2011 | Bartelous |
| 2011/0121752 A1 | 5/2011 | Newman, Jr. et al. |
| 2011/0127922 A1 | 6/2011 | Sauerlaender |
| 2011/0156610 A1 | 6/2011 | Ostrovsky et al. |
| 2011/0273103 A1 | 11/2011 | Hong |
| 2011/0292703 A1 | 12/2011 | Cuk |
| 2011/0299547 A1 | 12/2011 | Diab et al. |
| 2011/0301894 A1 | 12/2011 | Sanderford, Jr. |
| 2011/0305054 A1 | 12/2011 | Yamagiwa et al. |
| 2011/0307447 A1 | 12/2011 | Sabaa et al. |
| 2012/0026632 A1 | 2/2012 | Acharya et al. |
| 2012/0075897 A1 | 3/2012 | Fujita |
| 2012/0089266 A1 | 4/2012 | Tomimbang et al. |
| 2012/0095605 A1 | 4/2012 | Tran |
| 2012/0133289 A1 | 5/2012 | Hum et al. |
| 2012/0275076 A1 | 11/2012 | Shono |
| 2012/0311035 A1 | 12/2012 | Guha et al. |
| 2013/0051102 A1 | 2/2013 | Huang et al. |
| 2013/0057247 A1 | 3/2013 | Russell et al. |
| 2013/0063851 A1 | 3/2013 | Stevens et al. |
| 2013/0066478 A1 | 3/2013 | Smith |
| 2013/0088160 A1 | 4/2013 | Chai et al. |
| 2013/0119958 A1 | 5/2013 | Gasperi |
| 2013/0128396 A1 | 5/2013 | Danesh et al. |
| 2013/0170261 A1 | 7/2013 | Lee et al. |
| 2013/0174211 A1 | 7/2013 | Aad et al. |
| 2013/0245841 A1 | 9/2013 | Ahn et al. |
| 2013/0253898 A1 | 9/2013 | Meagher et al. |
| 2013/0261821 A1 | 10/2013 | Lu et al. |
| 2013/0300534 A1 | 11/2013 | Myllymaki |
| 2013/0329331 A1 | 12/2013 | Erger et al. |
| 2014/0043732 A1 | 2/2014 | McKay et al. |
| 2014/0067137 A1 | 3/2014 | Amelio et al. |
| 2014/0074730 A1 | 3/2014 | Arensmeier et al. |
| 2014/0085940 A1 | 3/2014 | Lee et al. |
| 2014/0096272 A1 | 4/2014 | Makofsky et al. |
| 2014/0097809 A1 | 4/2014 | Follic et al. |
| 2014/0159593 A1 | 6/2014 | Chu et al. |
| 2014/0203718 A1 | 7/2014 | Yoon et al. |
| 2014/0246926 A1 | 9/2014 | Cruz et al. |
| 2014/0266698 A1 | 9/2014 | Hall et al. |
| 2014/0268935 A1 | 9/2014 | Chiang |
| 2014/0276753 A1 | 9/2014 | Wham et al. |
| 2015/0042274 A1 | 2/2015 | Kim et al. |
| 2015/0055261 A1 | 2/2015 | Lubicki et al. |
| 2015/0097430 A1 | 4/2015 | Scruggs |
| 2015/0116886 A1 | 4/2015 | Zehnder et al. |
| 2015/0154404 A1 | 6/2015 | Patel et al. |
| 2015/0155789 A1 | 6/2015 | Freeman et al. |
| 2015/0180469 A1 | 6/2015 | Kim |
| 2015/0185261 A1 | 7/2015 | Frader-Thompson et al. |
| 2015/0216006 A1 | 7/2015 | Lee et al. |
| 2015/0236587 A1 | 8/2015 | Kim et al. |
| 2015/0253364 A1 | 9/2015 | Hieda et al. |
| 2015/0256355 A1 | 9/2015 | Pera et al. |
| 2015/0256665 A1 | 9/2015 | Pera et al. |
| 2015/0282223 A1 | 10/2015 | Wang et al. |
| 2015/0309521 A1 | 10/2015 | Pan |
| 2015/0317326 A1 | 11/2015 | Bandarupalli et al. |
| 2015/0355649 A1 | 12/2015 | Ovadia |
| 2015/0362927 A1 | 12/2015 | Giorgi |
| 2016/0012699 A1 | 1/2016 | Lundy |
| 2016/0018800 A1 | 1/2016 | Gettings et al. |
| 2016/0035159 A1 | 2/2016 | Ganapathy Achari et al. |
| 2016/0057841 A1 | 2/2016 | Lenig |
| 2016/0069933 A1 | 3/2016 | Cook et al. |
| 2016/0077746 A1 | 3/2016 | Muth et al. |
| 2016/0081143 A1 | 3/2016 | Wang |
| 2016/0110154 A1 | 4/2016 | Qureshi et al. |
| 2016/0117917 A1 | 4/2016 | Prakash et al. |
| 2016/0126031 A1* | 5/2016 | Wootton .............. H05B 47/175 361/211 |
| 2016/0178691 A1 | 6/2016 | Simonin |
| 2016/0181941 A1 | 6/2016 | Gratton et al. |
| 2016/0195864 A1 | 7/2016 | Kim |
| 2016/0247799 A1 | 8/2016 | Stafanov et al. |

(56) References Cited

U.S. PATENT DOCUMENTS

| | | |
|---|---|---|
| 2016/0259308 A1 | 9/2016 | Fadell et al. |
| 2016/0260135 A1 | 9/2016 | Zomet et al. |
| 2016/0277528 A1 | 9/2016 | Guilaume et al. |
| 2016/0294179 A1 | 10/2016 | Kennedy et al. |
| 2016/0343083 A1 | 11/2016 | Hering et al. |
| 2016/0360586 A1 | 12/2016 | Yang et al. |
| 2016/0374134 A1 | 12/2016 | Kweon et al. |
| 2017/0004948 A1 | 1/2017 | Leyh |
| 2017/0019969 A1 | 1/2017 | O'Neil et al. |
| 2017/0026194 A1 | 1/2017 | Vijayrao et al. |
| 2017/0033942 A1 | 2/2017 | Koeninger |
| 2017/0063225 A1 | 3/2017 | Guo et al. |
| 2017/0086281 A1 | 3/2017 | Avrahamy |
| 2017/0099647 A1 | 4/2017 | Shah et al. |
| 2017/0170730 A1 | 6/2017 | Sugiura |
| 2017/0171802 A1 | 6/2017 | Hou et al. |
| 2017/0179946 A1 | 6/2017 | Turvey |
| 2017/0195130 A1 | 7/2017 | Landow et al. |
| 2017/0212653 A1 | 7/2017 | Kanojia et al. |
| 2017/0230193 A1 | 8/2017 | Apte et al. |
| 2017/0244241 A1 | 8/2017 | Wilson et al. |
| 2017/0256934 A1 | 9/2017 | Kennedy et al. |
| 2017/0256941 A1 | 9/2017 | Bowers et al. |
| 2017/0256956 A1 | 9/2017 | Irish et al. |
| 2017/0277709 A1 | 9/2017 | Strauss et al. |
| 2017/0314743 A1 | 11/2017 | Del Castillo et al. |
| 2017/0322049 A1 | 11/2017 | Wootton et al. |
| 2017/0322258 A1 | 11/2017 | Miller et al. |
| 2017/0338809 A1 | 11/2017 | Stefanov et al. |
| 2017/0347415 A1 | 11/2017 | Cho et al. |
| 2017/0366950 A1 | 12/2017 | Arbon |
| 2018/0026534 A1 | 1/2018 | Turcan |
| 2018/0054862 A1 | 2/2018 | Takagimoto et al. |
| 2018/0061158 A1 | 3/2018 | Greene |
| 2018/0146369 A1 | 5/2018 | Kennedy, Jr. |
| 2018/0174076 A1 | 6/2018 | Fukami |
| 2018/0188706 A1* | 7/2018 | Wootton ............ G05B 19/0423 |
| 2018/0196094 A1 | 7/2018 | Fishburn et al. |
| 2018/0201302 A1 | 7/2018 | Sonoda et al. |
| 2018/0254959 A1 | 9/2018 | Mantyjarvi et al. |
| 2018/0285198 A1 | 10/2018 | Dantkale et al. |
| 2018/0287802 A1 | 10/2018 | Brickell |
| 2018/0301006 A1 | 10/2018 | Flint et al. |
| 2018/0307609 A1 | 10/2018 | Qiang et al. |
| 2018/0342329 A1 | 11/2018 | Rufo et al. |
| 2018/0359039 A1 | 12/2018 | Daoura et al. |
| 2018/0359223 A1 | 12/2018 | Maier et al. |
| 2019/0003855 A1 | 1/2019 | Wootton et al. |
| 2019/0020477 A1 | 1/2019 | Antonatos et al. |
| 2019/0028869 A1 | 1/2019 | Kaliner |
| 2019/0036928 A1 | 1/2019 | Meriac et al. |
| 2019/0050903 A1 | 2/2019 | DeWitt et al. |
| 2019/0052174 A1 | 2/2019 | Gong |
| 2019/0068716 A1 | 2/2019 | Lauer |
| 2019/0086979 A1 | 3/2019 | Kao et al. |
| 2019/0087835 A1 | 3/2019 | Schwed et al. |
| 2019/0104138 A1 | 4/2019 | Storms et al. |
| 2019/0122834 A1 | 4/2019 | Wootton et al. |
| 2019/0140640 A1 | 5/2019 | Telefus et al. |
| 2019/0165691 A1 | 5/2019 | Telefus et al. |
| 2019/0207375 A1 | 7/2019 | Telefus et al. |
| 2019/0238060 A1 | 8/2019 | Telefus et al. |
| 2019/0245457 A1 | 8/2019 | Telefus et al. |
| 2019/0253243 A1 | 8/2019 | Zimmerman et al. |
| 2019/0268176 A1 | 8/2019 | Pognant |
| 2019/0280887 A1 | 9/2019 | Telefus et al. |
| 2019/0306953 A1 | 10/2019 | Joyce et al. |
| 2019/0334999 A1 | 10/2019 | Ryhorchuk et al. |
| 2019/0355014 A1 | 11/2019 | Gerber |
| 2019/0372331 A1 | 12/2019 | Liu et al. |
| 2020/0007126 A1 | 1/2020 | Telefus et al. |
| 2020/0014301 A1 | 1/2020 | Telefus |
| 2020/0014379 A1 | 1/2020 | Telefus |
| 2020/0044883 A1 | 2/2020 | Telefus et al. |
| 2020/0052607 A1 | 2/2020 | Telefus et al. |
| 2020/0053100 A1 | 2/2020 | Jakobsson |
| 2020/0106259 A1 | 4/2020 | Telefus |
| 2020/0106260 A1 | 4/2020 | Telefus |
| 2020/0106637 A1 | 4/2020 | Jakobsson |
| 2020/0120202 A1 | 4/2020 | Jakobsson et al. |
| 2020/0145247 A1 | 5/2020 | Jakobsson |
| 2020/0153245 A1 | 5/2020 | Jakobsson et al. |
| 2020/0159960 A1 | 5/2020 | Jakobsson |
| 2020/0193785 A1 | 6/2020 | Berglund et al. |
| 2020/0196110 A1 | 6/2020 | Jakobsson |
| 2020/0196412 A1 | 6/2020 | Telefus et al. |
| 2020/0260287 A1 | 8/2020 | Hendel |
| 2020/0275266 A1 | 8/2020 | Jakobsson |
| 2020/0287537 A1 | 9/2020 | Telefus et al. |
| 2020/0314233 A1 | 10/2020 | Mohalik et al. |
| 2020/0328694 A1 | 10/2020 | Telefus et al. |
| 2020/0344596 A1 | 10/2020 | Dong et al. |
| 2020/0365345 A1 | 11/2020 | Telefus et al. |
| 2020/0365346 A1 | 11/2020 | Telefus et al. |
| 2020/0365356 A1 | 11/2020 | Telefus et al. |
| 2020/0366078 A1 | 11/2020 | Telefus et al. |
| 2020/0394332 A1 | 12/2020 | Jakobsson et al. |
| 2021/0014947 A1 | 1/2021 | Telefus et al. |
| 2021/0119528 A1 | 4/2021 | Telefus |

FOREIGN PATENT DOCUMENTS

| | | |
|---|---|---|
| EP | 0398026 A2 | 11/1990 |
| EP | 2560063 A1 | 2/2013 |
| GB | 2458699 A | 9/2009 |
| JP | 06-053779 A | 2/1994 |
| JP | 2013230034 A | 11/2013 |
| JP | 2014030355 A | 2/2014 |
| WO | 2010110951 A1 | 9/2010 |
| WO | 2016010529 A1 | 1/2016 |
| WO | 2016110833 A2 | 7/2016 |
| WO | 2017196571 A1 | 11/2017 |
| WO | 2017196572 A1 | 11/2017 |
| WO | 2017196649 A1 | 11/2017 |
| WO | 2018075726 A1 | 4/2018 |
| WO | 2018080604 A1 | 5/2018 |
| WO | 2018080614 A1 | 5/2018 |
| WO | 2018081619 A2 | 5/2018 |
| WO | 2018081619 A3 | 5/2018 |
| WO | 2019133110 A1 | 7/2019 |
| WO | 2020014158 A1 | 1/2020 |
| WO | 2020014161 A1 | 1/2020 |
| WO | PCT/US19/54102 | 2/2020 |
| WO | 2020072516 A1 | 4/2020 |
| WO | PCT/US19/67004 | 4/2020 |
| WO | 2020131977 A1 | 6/2020 |
| WO | PCT/US20/33421 | 9/2020 |
| WO | 2020236726 A1 | 11/2020 |
| WO | PCT/US21/14320 | 4/2021 |

OTHER PUBLICATIONS

L. Sweeney, "Simple Demographics Often Identify People Uniquely," Carnegie Mellon University, Data Privacy Working Paper 3, 2000, 34 pages.

A. Narayanan et al., "Robust De-anonymization of Large Sparse Datasets," IEEE Symposium on Security and Privacy, May 2008, 15 pages.

M. Alahmad et al., "Non-Intrusive Electrical Load Monitoring and Profiling Methods for Applications in Energy Management Systems," IEEE Long Island Systems, Applications and Technology Conference, 2011, 7 pages.

K. Yang et al. "Series Arc Fault Detection Algorithm Based on Autoregressive Bispecturm Analysis," Algorithms, vol. 8, Oct. 16, 2015, pp. 929-950.

J.-E. Park et al., "Design on Topologies for High Efficiency Two-Stage AC-DC Converter," 2012 IEEE 7th International Power Electronics and Motion Control Conference—ECCE Asia, Jun. 2-5, 2012, China, 6 pages.

S. Cuk, "98% Efficient Single-Stage AC/DC Converter Topologies," Power Electronics Europe, Issue 4, 2011, 6 pages.

(56) References Cited

OTHER PUBLICATIONS

E. Carvou et al., "Electrical Arc Characterization for Ac-Arc Fault Applications," 2009 Proceedings of the 55th IEEE Holm Conference on Electrical Contacts, IEEE Explore Oct. 9, 2009, 6 pages.

C. Restrepo, "Arc Fault Detection and Discrimination Methods," 2007 Proceedings of the 53rd IEEE Holm Conference on Electrical Contacts, IEEE Explore Sep. 24, 2007, 8 pages.

K. Eguchi et al., "Design of a Charge-Pump Type AC-DC Converter for RF-ID Tags," 2006 International Symposium on Communications and Information Technologies, F4D-3, IEEE, 2006, 4 pages.

A. Ayari et al., "Active Power Measurement Comparison Between Analog and Digital Methods," International Conference on Electrical Engineering and Software Applications, 2013, 6 pages.

G. D. Gregory et al., "The Arc-Fault Circuit Interrupter, an Emerging Product," IEEE, 1998, 8 pages.

D. Irwin et al., "Exploiting Home Automation Protocols for Load Monitoring in Smart Buildings," BuildSys '11: Proceedings of the Third ACM Workshop on Embedded Sensing Systems for Energy-Efficiency in Buildings, Nov. 2011, 6 pages.

B. Mrazovac et al., "Towards Ubiquitous Smart Outlets for Safety and Energetic Efficiency of Home Electric Appliances," 2011 IEEE International Conference on Consumer Electronics, Berlin, German, Sep. 6-8, 2011, 5 pages.

J. K. Becker et al., "Tracking Anonymized Bluetooth Devices," Proceedings on Privacy Enhancing Technologies, vol. 3, 2019, pp. 50-65.

H. Siadati et al., "Mind your SMSes: Mitigating Social Engineering in Second Factor Authentication," Computers & Security, vol. 65, Mar. 2017, 12 pages.

S. Jerde, "The New York Times Can Now Predict Your Emotions and Motivations After Reading a Story," https://www.adweek.com/tv-video/the-new-york-times-can-now-predict-your-emotions-and-motivations-after-reading-a-story/, Apr. 29, 2019, 3 pages.

K. Mowery et al., "Pixel Perfect: Fingerprinting Canvas in HTML5," Proceedings of W2SP, 2012, 12 pages.

S. Kamkar, "Evercookie," https://samy.pl/evercookie/, Oct. 11, 2010, 5 pages.

M. K. Franklin et al., "Fair Exchange with a Semi-Trusted Third Party," Association for Computing Machinery, 1997, 6 pages.

J. Camenisch et al., "Digital Payment Systems with Passive Anonymity-Revoking Trustees," Journal of Computer Security, vol. 5, No. 1, 1997, 11 pages.

L. Coney et al., "Towards a Privacy Measurement Criterion for Voting Systems," Proceedings of the 2005 National Conference On Digital Government Research, 2005, 2 pages.

L. Sweeney, "k-anonymity: A Model for Protecting Privacy," International Journal of Uncertainty, Fuzziness and Knowledge-Based Systems, vol. 1, No. 5, 2002, 14 pages.

C. Dwork, "Differential Privacy," Encyclopedia of Cryptography and Security, 2011, 12 pages.

A. P. Felt et al., "Android Permissions: User Attention, Comprehension, and Behavior," Symposium on Usable Privacy and Security, Jul. 11-13, 2012, 14 pages.

S. Von Solms et al., "On Blind Signatures and Perfect Crimes," Computers & Security, vol. 11, No. 6, 1992, 3 pages.

R. Wyden, "Wyden Releases Discussion Draft Of Legislation To Provide Real Protections For Americans' Privacy," https://www.wyden.senate.gov/news/press-releases/wyden-releases-discussion-draft-of-legislation-to-provide-real-protections-for-americans-privacy, Nov. 1, 2018, 3 pages.

M. Rubio, "Rubio Introduces Privacy Bill To Protect Consumers While Promoting Innovation," https://www.rubio.senate.gov/public/index.cfm/2019/1/rubio-introduces-privacy-bill-to-protect-consumers-while-promoting-innovation#:%7E:text=Washingt%E2%80%A6, Jan. 16, 2019, 2 pages.

C. Dwork et al., "Differential Privacy and Robust Statistics," 41st ACM Symposium on Theory of Computing, 2009, 10 pages.

J. Camenisch et al., "Compact E-Cash," Eurocrypt, vol. 3494, 2005, pp. 302-321.

D. L. Chaum, "Untraceable Electronic Mail, Return Addresses, and Digital Pseudonyms," Communications of the ACM, vol. 24, No. 2, Feb. 1981, pp. 84-88.

J. Camenisch et al., "An Efficient System For Nontransferable Anonymous Credentials With Optional Anonymity Revocation," International Conference on the Theory and Application of Cryptographic Techniques, May 6-10, 2001, 30 pages.

M. K. Reiter et al., "Crowds: Anonymity For Web Transactions," ACM Transactions on Information and System Security, vol. 1, 1997, 23 pages.

I. Clarke et al., "Freenet: A Distributed Anonymous Information Storage And Retrieval System," International Workshop on Designing Privacy Enhancing Technologies: Design Issues in Anonymity and Unobservability, 2001, 21 pages.

P. Golle et al., "Universal Re-encryption for Mixnets," Lecture Notes in Computer Science, Feb. 2004, 15 pages.

Y. Lindell et al., "Multiparty Computation For Privacy Preserving Data Mining," Journal of Privacy and Confidentiality, May 6, 2008, 39 pages.

J. Hollan et al., "Distributed Cognition: Toward a New Foundation for Human-Computer Interaction Research," ACM Transactions on Computer-Human Interaction, vol. 7, No. 2, Jun. 2000, pp. 174-196.

A. Adams et al., "Users are Not the Enemy," Communications of the ACM, Dec. 1999, 6 pages.

A. Morton et al., "Privacy is a Process, Not a Pet: a Theory for Effective Privacy Practice," Proceedings of the 2012 New Security Paradigms Workshop, Sep. 2012, 18 pages.

G. D. Abowd et al., "Charting Past, Present And Future Research In Ubiquitous Computing," ACM Transactions on Computer-Human Interaction, vol. 7, No. 1, Mar. 2000, pp. 29-58.

W. Mason et al., "Conducting Behavioral Research on Amazon's Mechanical Turk," Behavior Research Methods, Jun. 2011, 23 pages.

G. M. Gray et al., "Dealing with the Dangers of Fear: The Role of Risk Communication," Health Affairs, Nov. 2002, 11 pages.

U.S. Appl. No. 16/720,446 filed in the name of Mark Telefus et al. filed Dec. 19, 2019, and entitled "Intelligent Circuit Breakers."

U.S. Appl. No. 16/720,485 filed in the name of Mark Telefus et al. filed Dec. 19, 2019, and entitled "Intelligent Circuit Breakers with Air-Gap and Solid-State Switches."

U.S. Appl. No. 16/720,506 filed in the name of Mark Telefus et al. filed Dec. 19, 2019, and entitled "Intelligent Circuit Breakers with Solid-State Bidirectional Switches."

U.S. Appl. No. 16/720,533 filed in the name of Mark Telefus et al. filed Dec. 19, 2019, and entitled "Intelligent Circuit Breakers with Detection Circuitry Configured to Detect Fault Conditions."

U.S. Appl. No. 16/720,583 filed in the name of Mark Telefus et al. filed Dec. 19, 2019, and entitled "Intelligent Circuit Breakers with Visual Indicators to Provide Operational Status."

U.S. Appl. No. 17/005,949 filed in the name of Bjorn Markus Jakobsson et al. filed Aug. 28, 2020, and entitled "Privacy and the Management of Permissions."

U.S. Appl. No. 17/032,759 filed in the name of Mark D. Telefus et al. filed Sep. 25, 2020, and entitled "AC-Driven Light-Emitting Diode Systems."

U.S. Appl. No. 62/963,230 filed in the name of Bjorn Markus Jakobsson filed Jan. 20, 2020, and entitled "Infrastructure Support to Enhance Resource-Constrained Device Capabilities."

U.S. Appl. No. 62/964,078 filed in the name of Mark Telefus et al. filed Jan. 21, 2020, and entitled "Intelligent Power Receptacle with Arc Fault Circuit Interruption."

U.S. Appl. No. 63/064,399 filed in the name of Mark Telefus et al. filed Aug. 11, 2020, and entitled "Energy Traffic Monitoring and Control System."

L. Shengyuan et al., "Instantaneous Value Sampling AC-DC Converter and its Application in Power Quantity Detection," 2011 Third International Conference on Measuring Technology and Mechatronics Automation, Jan. 6-7, 2011, 4 pages.

H.-H. Chang et al., "Load Recognition for Different Loads with the Same Real Power and Reactive Power in a Non-intrusive Load-monitoring System," 2008 12th International Conference on Computer Supported Cooperative Work in Design, Apr. 16-18, 2008, 6 pages.

(56) References Cited

OTHER PUBLICATIONS

U.S. Appl. No. 17/115,753 filed in the name of Mark Telefus filed Dec. 8, 2020, and entitled "Solid-State Power Interrupters."
U.S. Appl. No. 17/145,291 filed in the name of Mark Telefus et al. filed Jan. 9, 2021, and entitled "Building Automation System."
U.S. Appl. No. 17/145,291 filed in the name of Bjorn Markus Jakobsson filed Jan. 20, 2021, and entitled "Infrastructure Support to Enhance Resource-Constrained Device Capabilities."
U.S. Appl. No. 17/154,625 filed in the name of Mark Telefus et al. filed Jan. 21, 2021, and entitled "Intelligent Circuit Interruption."

* cited by examiner

400

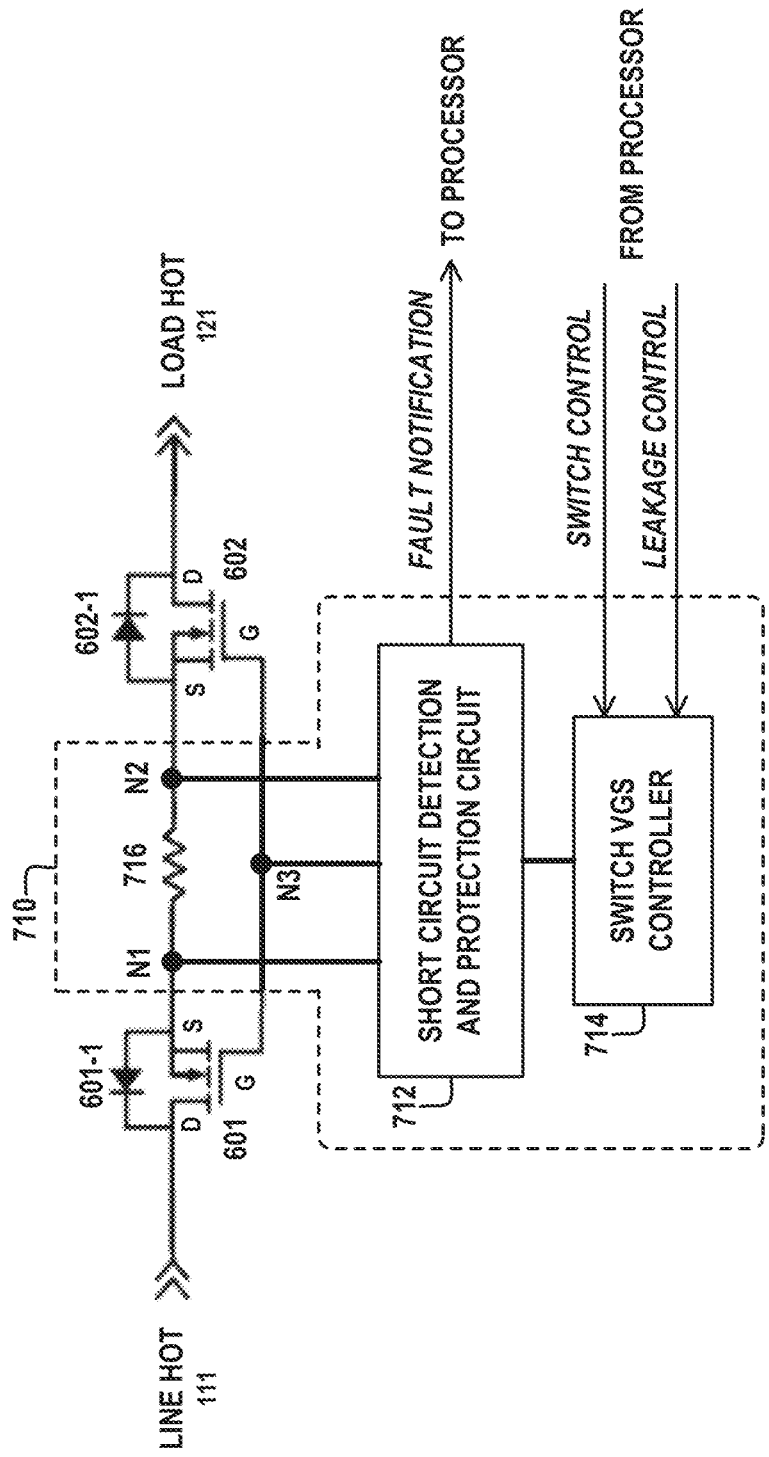

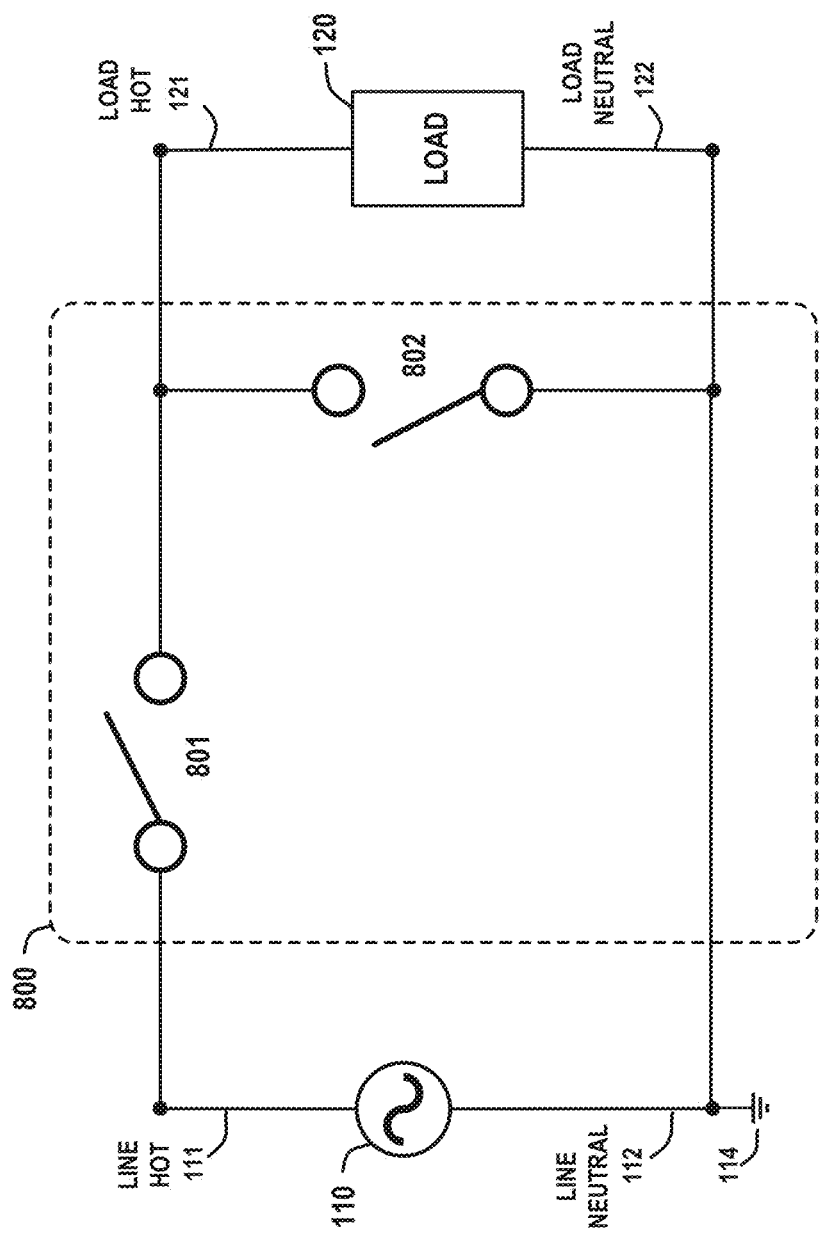

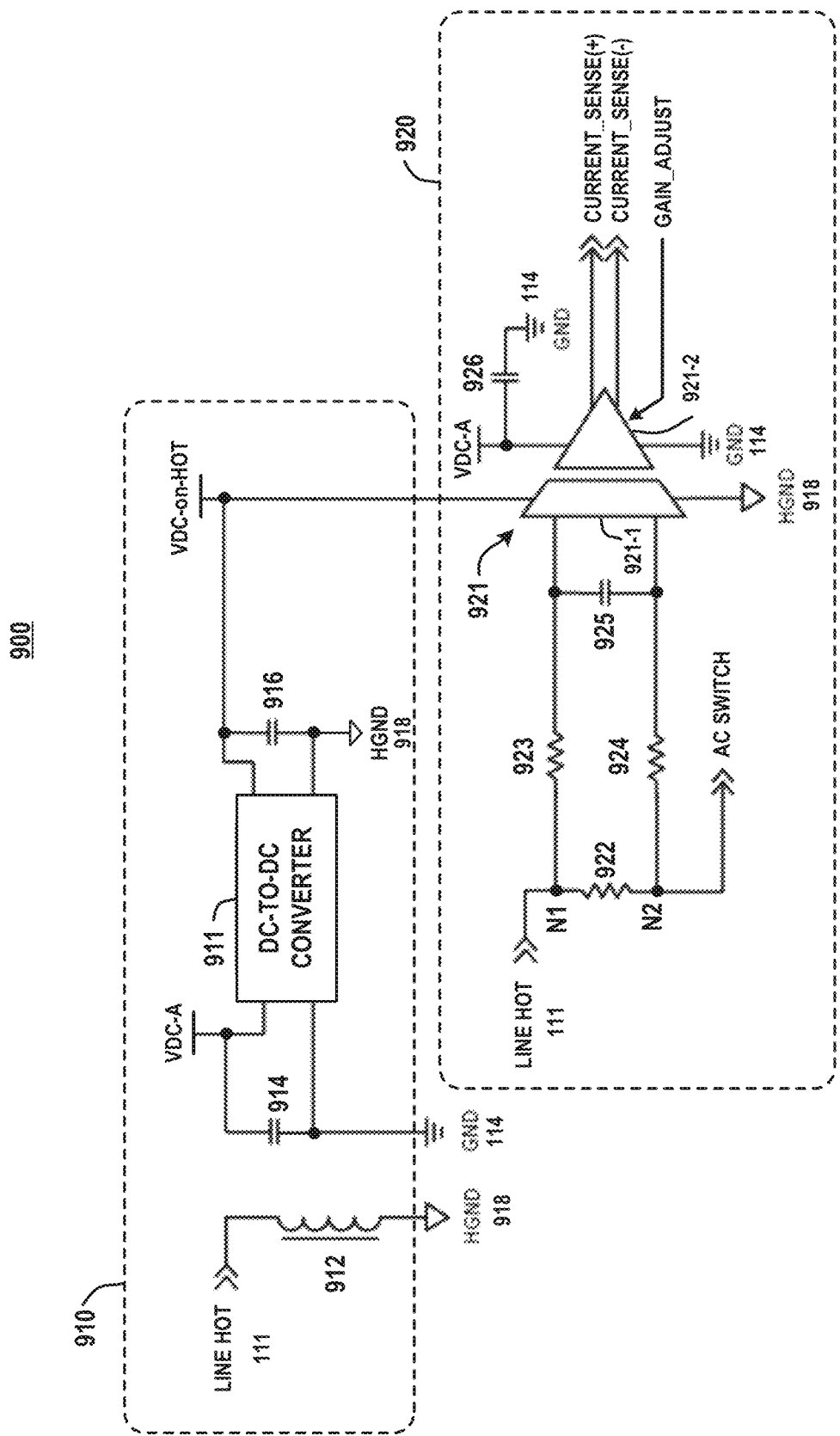

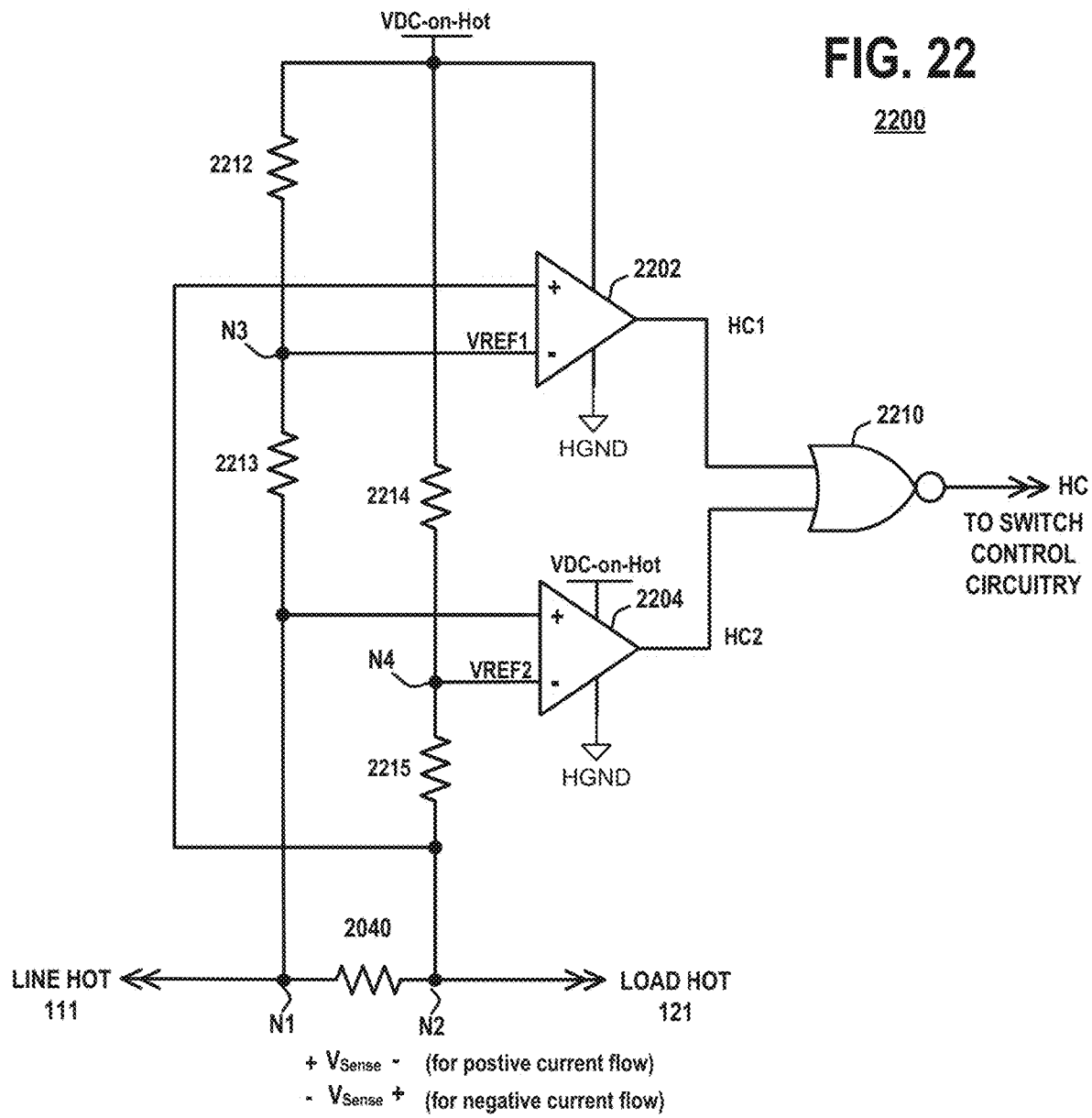

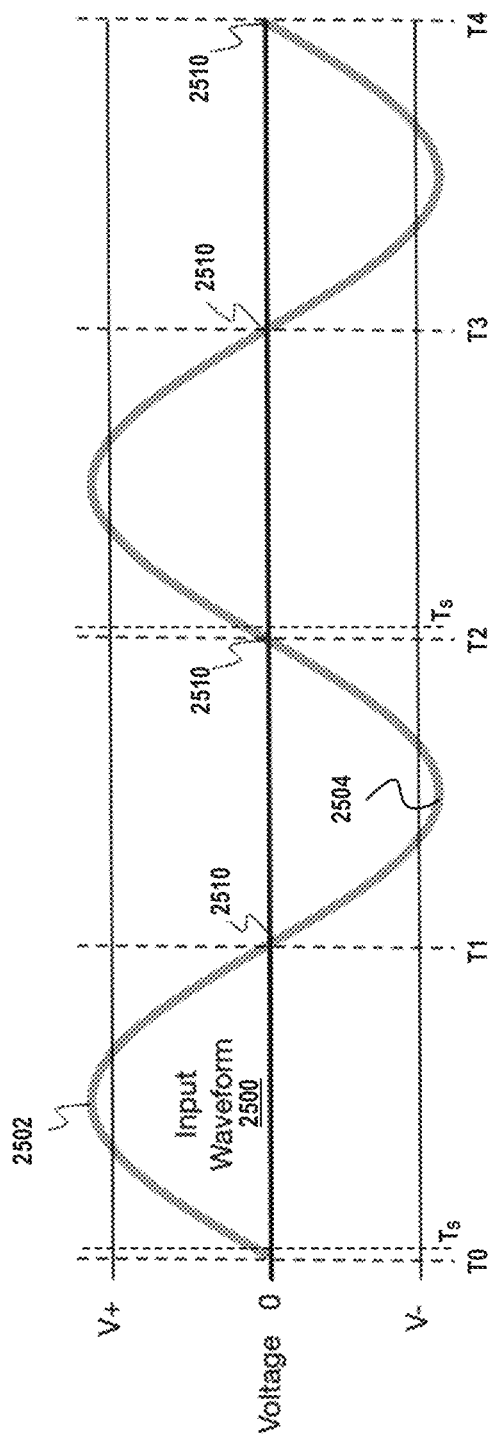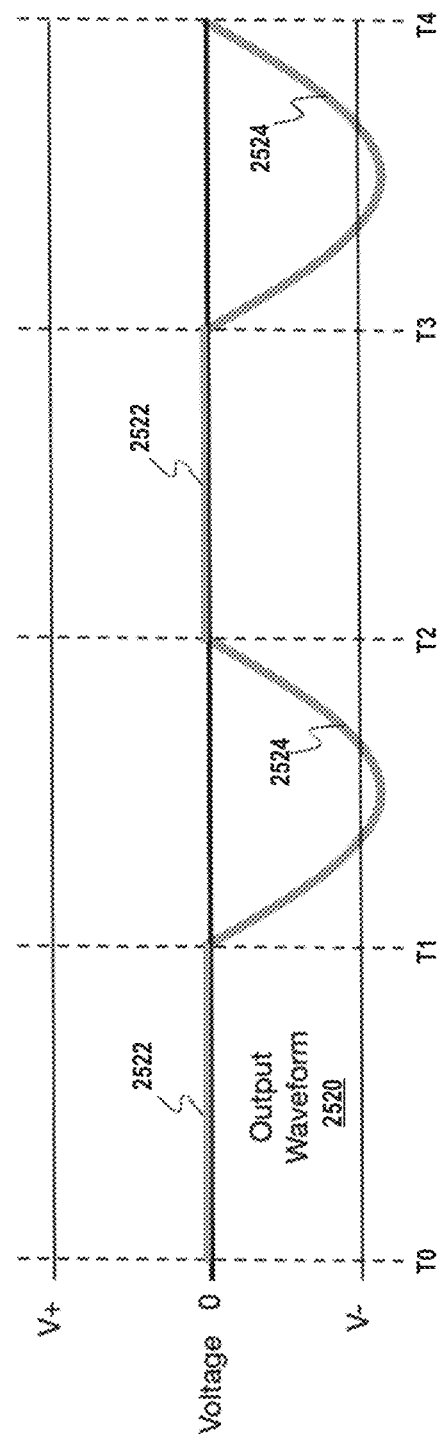

2800

2800

2800

AIR-GAP STATE: OPEN (OFF)

2800

AIR-GAP STATE: CLOSED (ON)

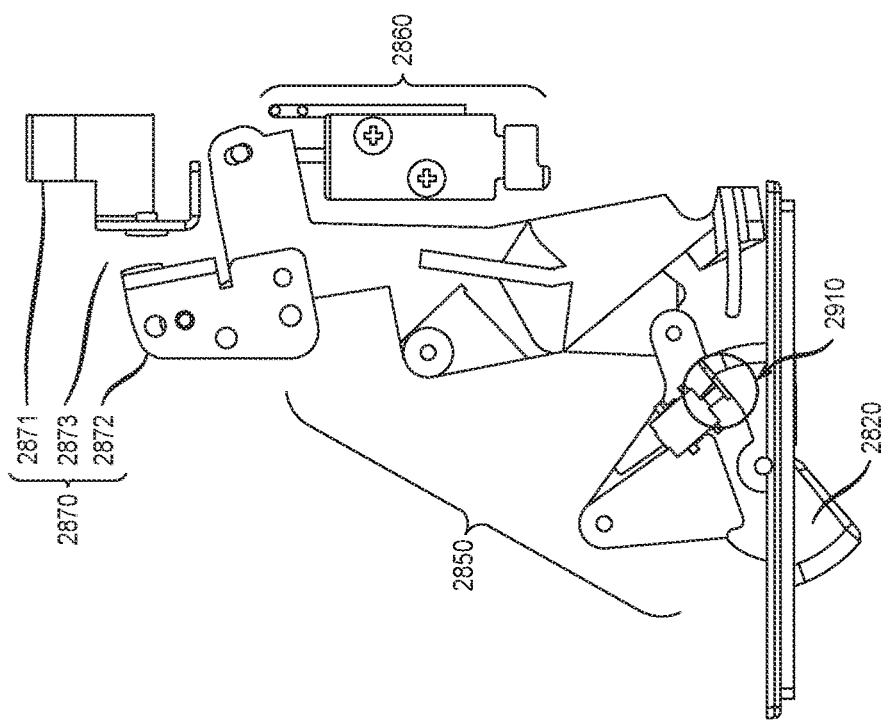
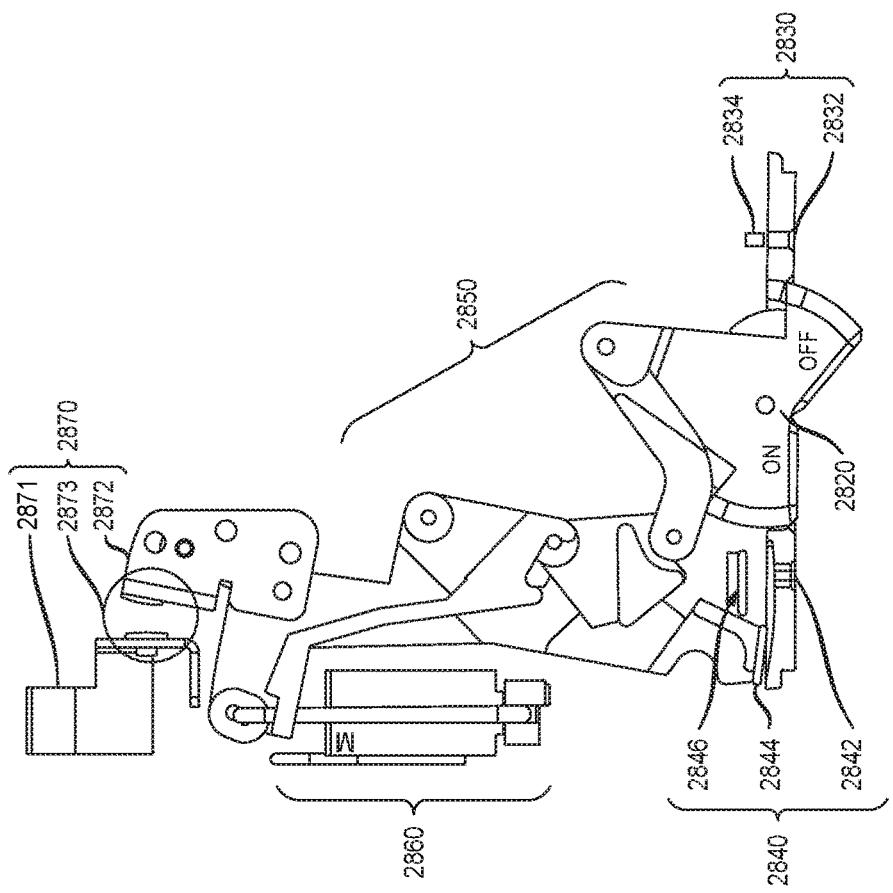

INTELLIGENT CIRCUIT BREAKERS WITH INTERNAL SHORT CIRCUIT CONTROL SYSTEM

CROSS-REFERENCE TO RELATED APPLICATIONS

This application is a U.S. National Stage Application of International Application No. PCT/US2020/033421, filed on May 18, 2020, which claims the benefit of and priority to each of the following applications: (i) U.S. Provisional Application Ser. No. 62/849,847 filed on May 18, 2019; (ii) U.S. patent application Ser. No. 16/720,446 filed on Dec. 19, 2019, and entitled Intelligent Circuit Breakers; (iii) U.S. patent application Ser. No. 16/720,506 filed on Dec. 19, 2019, and entitled Intelligent Circuit Breakers with Solid-State Bidirectional Switches; (iv) U.S. patent application Ser. No. 16/720,485 filed on Dec. 19, 2019, and entitled Intelligent Circuit Breakers with Air-Gap and Solid-State Switches; (v) U.S. patent application Ser. No. 16/720,533 filed on Dec. 19, 2019, and entitled Intelligent Circuit Breakers with Detection Circuitry Configured to Detect Fault Conditions; and (vi) U.S. patent application Ser. No. 16/720,583 filed on Dec. 19, 2019, and entitled Intelligent Circuit Breakers with Visual Indicators to Provide Operational Status, the disclosures of which are all fully incorporated herein by reference.

TECHNICAL FIELD

This disclosure relates generally to power control systems and devices and, in particular, to circuit breaker devices and systems for protecting branch circuits from damage due to fault conditions.

BACKGROUND

Electrical circuit breakers are essential components in electrical distribution systems. In general, circuit breakers are disposed in a power distribution panel (e.g., circuit breaker panel) which divides a high-current power supply feed of a utility power supply system into a plurality of downstream branch circuits within a given building or home structure. Each circuit breaker is connected between the incoming high-current power supply feed and a corresponding one of the branch circuits to protect the branch circuit conductors and electrical loads on the branch circuit from being exposed to over-current conditions. There are several types of over-current conditions including overload conditions and fault conditions. An overload condition is defined as operation of equipment in excess of its normal, full-load rating, or a branch circuit in excess of its ampacity which, when the overload persists for a sufficient period of time, would cause damage or dangerous over-heating. Fault conditions comprise unintended or accidental load conditions that typically produce much higher over-current conditions than do overloads, depending on the impedance of the fault. A fault producing the maximum over-current condition is referred to as a short-circuit or a "bolted fault."

Conventional circuit breakers are electromechanical in nature and have electrical contacts that are physically separated by either manual intervention of an operator lever or automatically upon the occurrence of a fault condition or prolonged over-current condition, in which cases the circuit breaker is deemed to be "tripped." The separation of the electrical contacts of a circuit breaker can be performed electromagnetically or electromechanically, or by combination of both.

A significant problem with conventional circuit breakers is that they are slow to react to fault conditions due to their electromechanical construction. Conventional circuit breakers typically require at least several milliseconds to isolate a fault condition. The slow reaction time is undesirable since it raises the risk of hazardous fire, damage to electrical equipment, and arc-flashes, which can occur at the short-circuit location when a bolted fault is not isolated quickly enough. An arc-flash is an electrical explosion of the electrical conductors that create the short-circuit condition. The energy release in an arc-flash can produce temperatures exceeding 35,000° F. at the terminals, resulting in rapidly vaporizing metal conductors, blasting molten metal, as well as expanding plasma that is ejected outwards with extreme force. Therefore, arc-flashes are extremely hazardous to life, property and electrical equipment, particularly in industrial and residential environments where the risk of a gas leak is significant.

In addition to being slow at isolating faults, conventional circuit breakers exhibit large variations in both the time to trip and the current trip limit in response to a fault or prolonged over-current conditions. This variation is predominately due to the limitations of the electromechanical design of the circuit breaker device and the influence of physical factors such as mounting stresses and temperature variation. The variations in the time to trip and the current trip limit can themselves vary from device to device even when the devices are of the same type, have the same rating, and are from the same manufacturer.

Conventional circuit breakers provide high isolation capability once they have been tripped. However, their slow reaction times, lack of precision and high degree of variability are all very undesirable characteristics. Not only do the slow reaction times result in inadequate protection against the possibilities of arc-flashes, but the high degree of variability and lack of precision make coordination between multiple circuit breakers in a complex system almost impossible.

As a protection device, circuit breakers must be able to isolate a fault from the utility supply circuit even when the fault current greatly exceeds the circuit breaker trip current rating and, thereby, protect against being an internal single point of failure. The Ampere Interrupting Capacity (AIC) rating of a circuit breaker indicates the maximum fault current (in amperes) that the circuit breaker device will safely clear when a fault is applied at the load side of the circuit breaker device. The AIC rating of a circuit breaker device denotes the maximum fault current that can be interrupted by the circuit breaker device without failure of the circuit breaker device. The AIC rating demands an extremely high level of short-circuit protection and domestic circuit breakers are often rated at an AIC of 10,000 amperes or more.

Conventional circuit breakers do not implement functionality based on smart decision making for breaking or isolating utility power from a load, or otherwise monitoring or measuring power components such as voltage and/or current, and making intelligent decisions based on measurements and computations of the voltage and/or current. In contrast, conventional circuit breakers operate to protect against excessive load power demand (e.g., current overload, short-circuits) based on electromechanical components in which circuit breakers are tripped by magnetic forces or mechanical forces that are generated by expansion of a bi-metal element having metals with disparate thermal expansion parameters. The lack of intelligent tripping operations and the dependency on the brutal forces created in power distribution environment can result in excessive power conditions such as excessive arcing, slow trip response times, and dangerously high internal operational temperature. The dependency of conventional circuit breakers on mechanical components to effect tripping, such as hooks, springs etc., increases the potential for disasters with regard to fire hazards, device unreliability, and potential loss of human life and property. It is known that a common cause of electrical fires within a home or building is the result of unreliable and faulty electromechanical protection devices and circuit breakers. Accordingly, there is a desire and need in the circuit breaker and protection device industry to eliminate the use of conventional electromechanical/thermomagnetic circuit breaker/protection devices and implement a more reliable and efficient solution for protection devices.

SUMMARY

Embodiments of the disclosure include intelligent circuit breakers and systems and methods for implementing intelligent circuit breakers. For example, one embodiment includes a circuit breaker. The circuit breaker comprises an electromechanical switch, a current sensor, a voltage sensor, and a processor. The electromechanical switch is serially connected between a line input terminal and a load output terminal of the circuit breaker, and configured to be placed in one of (i) a switched-closed state and (ii) a switched-open state. The current sensor is configured to sense a magnitude of current flowing in the electrical path between the line input terminal and the load output terminal and generate a current sense signal. The voltage sensor is configured to sense a magnitude of voltage at a point on the electrical path between the line input terminal and the load output terminal and generate a voltage sense signal. The processor is configured to receive and process the current sense signal and the voltage sense signal to determine operational status information of the circuit breaker and determine power usage information of a load connected to the load output terminal.

Another embodiment includes a method which comprises: connecting a circuit breaker between a utility power source and a branch circuit comprising a load, wherein the circuit breaker comprises an electromechanical switch which is configured to be placed in one of (i) a switched-closed state to connect the utility power source to the branch circuit and (ii) a switched-open state to disconnect the utility power source from the branch circuit; sensing current flow through the circuit breaker and generating a current sense signal that is indicative of a magnitude of the sensed current flow through the circuit breaker; sensing a voltage at a point on an electrical path through the circuit breaker and generating a voltage sense signal that is indicative of a magnitude of the sensed voltage; and processing the current sense signal and the voltage sense signal to determine operational status information of the circuit breaker and determine power usage information of the load.

Another embodiment includes a system which comprises a circuit breaker distribution panel and a circuit breaker disposed within the circuit breaker distribution panel. The circuit breaker distribution panel comprises a bus bar coupled to a utility power source. The circuit breaker comprises a line input terminal coupled to the bus bar, a load output terminal connected to a branch circuit, an electromechanical switch, a current sensor, a voltage sensor, and a processor. The electromechanical switch is configured to be placed in one of (i) a switched-closed state to connect the utility power source to the branch circuit and (ii) a switched-open state to disconnect the utility power source from the branch circuit. The current sensor is configured to sense a magnitude of current flowing in an electrical path between the line input terminal and the load output terminal and generate a current sense signal. The voltage sensor is configured to sense a magnitude of voltage at a point on the electrical path between the line input terminal and the load output terminal and generate a voltage sense signal. The processor is configured to receive and process the current sense signal and the voltage sense signal to determine operational status information of the circuit breaker and determine power usage information of a load connected to the load output terminal.

Another embodiment includes a circuit breaker, which comprises a solid-state bidirectional switch, a first switch control circuit, a current sensor, a voltage sensor, and a processor. The solid-state bidirectional switch is serially connected between a line input terminal and a load output terminal of the circuit breaker, and configured to be placed in one of (i) a switched-on state and (ii) a switched-off state. The first switch control circuit is configured to generate control signals to control operation of the solid-state bidirectional switch. The current sensor is configured to sense a magnitude of current flowing in an electrical path between the line input terminal and the load output terminal and generate a current sense signal. The voltage sensor is configured to sense a magnitude of voltage at a point on the electrical path between the line input terminal and the load output terminal and generate a voltage sense signal. The processor is configured to receive and process the current sense signals and voltage sense signals to determine operational status information of the circuit breaker, to determine a fault event, and to determine power usage information of a load connected to the load output terminal.

Another embodiment includes a method which comprises: connecting a circuit breaker between a utility power source and a branch circuit comprising a load, wherein the circuit breaker comprises a solid-state bidirectional switch which is configured to be placed in one of (i) a switched-on state to connect the utility power source to the branch circuit and (ii) a switched-off state to disconnect the utility power source from the branch circuit; sensing current flow through the circuit breaker and generating a current sense signal that is indicative of a magnitude of the sensed current flow through the circuit breaker; sensing a voltage at a point on an electrical path through the circuit breaker and generating a voltage sense signal that is indicative of a magnitude of the sensed voltage; generating a control signal to place the solid-state bidirectional switch into a switched-off state in response to detection of a fault event based on at least one of the current sense signal and the voltage sense signal; and processing the current sense signal and the voltage sense signal to determine operational status information of the circuit breaker and determine power usage information of the load.

Another embodiment includes a system which comprises a circuit breaker distribution panel and a circuit breaker disposed within the circuit breaker distribution panel. The circuit breaker distribution panel comprises a bus bar coupled to a utility power source. The circuit breaker comprises a line input terminal coupled to the bus bar, a load output terminal connected to a branch circuit, a solid-state bidirectional switch, a first switch control circuit, a current sensor, a voltage sensor, and a processor. The solid-state bidirectional switch is serially connected between the line input terminal and the load output terminal of the circuit breaker, and configured to be placed in one of (i) a switched-on state and (ii) a switched-off state. The first switch control circuit is configured to generate control signals to control operation of the solid-state bidirectional switch. The current sensor is configured to sense a magnitude of current flowing in an electrical path between the line input terminal and the load output terminal and generate a current sense signal. The voltage sensor is configured to sense a magnitude of voltage at a point on the electrical path between the line input terminal and the load output terminal and generate a voltage sense signal. The processor is configured to receive and process the current sense signals and voltage sense signals to determine operational status information of the circuit breaker, to determine a fault event, and to determine power usage information of a load connected to the load output terminal.

Another embodiment includes a circuit breaker which comprises a solid-state switch, an air-gap electromagnetic switch, switch control circuitry, a zero-crossing detection circuit, and a current sensor. The solid-state switch and air-gap electromagnetic switch are connected in series in an electrical path between a line input terminal and a load output terminal of the circuit breaker. The switch control circuitry is configured to control operation of the solid-state switch and the air-gap electromagnetic switch. The zero-crossing detection circuit is configured to detect zero crossings of an AC power waveform on the electrical path between the line input terminal and the load output terminal of the circuit breaker. The current sensor is configured to sense a current flowing in the electrical path between the line input terminal and the load output terminal, and detect a fault condition based on the sensed current flow. In response to detecting a fault condition by the current sensor, the switch control circuitry is configured to generate switch control signals to (i) place the solid-state switch into a switched-off state and (ii) place the air-gap electromagnetic switch into a switched-open state after the solid-state switch is placed into the switched-off state. The switch control circuitry utilizes zero-crossing detection signals output from the zero-crossing detection circuit to determine when to place the air-gap electromagnetic switch into the switched-open state.

Another embodiment includes a method which comprises: sensing a current flowing in an electrical path between a line input terminal and a load output terminal of a circuit breaker, the circuit breaker comprising a solid-state switch and an air-gap electromagnetic switch connected in series in the electrical path between the line input terminal and the load output terminal of the circuit breaker; detecting a fault condition based on the sensed current flow; and in response to detecting the fault condition, generating a first switch control signal to place the solid-state switch into a switched-off state; detecting a zero-crossing event of an AC waveform at a point on the electrical path and a polarity of the AC waveform following the zero-crossing event; and generating a second control signal to place the air-gap electromagnetic switch into a switched-open state in response to detecting that the polarity of the AC waveform following the zero-crossing event causes a body diode of the solid-state switch to be reversed-biased.

Another embodiment includes a system which comprises a circuit breaker distribution panel and a circuit breaker disposed within the circuit breaker distribution panel. The circuit breaker distribution panel comprises a bus bar coupled to a utility power source. The circuit breaker comprises a line input terminal coupled to the bus bar, a load output terminal connected to a branch circuit, a solid-state switch, an air-gap electromagnetic switch, switch control circuitry, a zero-crossing detection circuit, and a current sensor. The solid-state switch and air-gap electromagnetic switch are connected in series in an electrical path between the line input terminal and the load output terminal of the circuit breaker. The switch control circuitry is configured to control operation of the solid-state switch and the air-gap electromagnetic switch. The zero-crossing detection circuit is configured to detect zero crossings of an AC power waveform on the electrical path between the line input terminal and the load output terminal of the circuit breaker. The current sensor configured to sense a current flowing in the electrical path between the line input terminal and the load output terminal, and detect a fault condition based on the sensed current flow. In response to detecting a fault condition by the current sensor, the switch control circuitry is configured to generate switch control signals to (i) place the solid-state switch into a switched-off state and (ii) place the air-gap electromagnetic switch into a switched-open state after the solid-state switch is placed into the switched-off state. The switch control circuitry utilizes zero-crossing detection signals output from the zero-crossing detection circuit to determine when to place the air-gap electromagnetic switch into the switched-open state.

Another embodiment includes a circuit breaker which comprises a solid-state switch, a sense resistor, a current detection circuit, and a switch control circuit. The solid-state switch and sense resistor are connected in series in an electrical path between a line input terminal and a load output terminal of the circuit breaker. The current detection circuit is configured to (i) sample a sense voltage that is generated across the sense resistor in response to load current flowing through the sense resistor, (ii) detect an over-current fault condition based on the sampled sense voltage, and (iii) output a fault detection signal in response to detecting the over-current fault condition. The switch control circuit is configured to control the solid-state switch, wherein the switch control circuit is configured to switch-off the solid-state switch in response to the fault detection signal output from the current detection circuit.

Another embodiment includes a circuit breaker which comprises a switch, a sense resistor, a zero-crossing detection circuit, and a switch control circuit. The switch and sense resistor are connected in series in an electrical path between a line input terminal and a load output terminal of the circuit breaker. The zero-crossing detection circuit is configured to (i) sample a sense voltage that is generated across the sense resistor in response to load current flowing through the sense resistor, (ii) detect a zero-crossing of the load current based on the sampled sense voltage, and (iii) output a zero-crossing detection signal in response to detecting the zero-crossing of the load current. The switch control circuit is configured to control operation of the switch based on the output of the zero-crossing detection circuit.

Another embodiment includes a circuit breaker which comprises a circuit breaker housing, an air-gap switch disposed within the circuit breaker housing, and a first visual indicator configured to provide an indication of an open state and a closed state of the air-gap switch. The first visual indicator comprises (i) a first window that is formed as part of the circuit breaker housing, (ii) a first indicator element disposed within the circuit breaker housing, and (iii) a second indicator element disposed within the circuit breaker housing. The first indicator element is configured to move into position behind the first window as the air-gap switch is placed into the open state, such that the first indicator element is viewable through the first window to provide an indication of the open state of the air-gap switch. The second indicator element is configured to move into position behind the first window as the air-gap switch is placed into the closed state, such that the second indicator element is viewable through the first window to provide an indication of the closed state of the air-gap switch.

Another embodiment includes a circuit breaker which comprises a circuit breaker housing, an air-gap switch disposed within the circuit breaker housing, an actuator mechanism disposed within the circuit breaker housing, and a first visual indicator configured to provide an indication of a state of the air-gap switch. The air-gap switch comprises a first contact and a second contact disposed in an electrical path between a line input terminal and a load output terminal of the circuit breaker. The air-gap switch is coupled to the actuator mechanism, and the actuator mechanism is operatively configured to (i) mechanically force the first and second contacts apart to place the air-gap switch into an open state and create an air-gap in the electrical path, and (ii) mechanically force the first and second contacts together to place the air-gap switch into a closed state. The first visual indicator comprises (i) a first window that is formed as part of the circuit breaker housing, (ii) a first indicator element coupled to the actuator mechanism and (iii) a second indicator element coupled to the actuator mechanism. The actuator mechanism is configured to move the first indicator element into position behind the first window as the actuator mechanism places the air-gap switch into the open state, such that the first indicator element is viewable through the first window to provide an indication of the open state of the air-gap switch. The actuator mechanism is configured to move the second indicator element into position behind the first window as the actuator mechanism places the air-gap switch into the closed state, such that the second indicator element is viewable through the first window to provide an indication of the closed state of the air-gap switch.

Another embodiment includes a circuit breaker which comprises a solid-state switch, an air-gap switch, an actuator mechanism, a manual control switch, an electromechanical actuator, control circuitry, and a sensor switch. The solid-state switch and air-gap switch are connected in series in an electrical path between a line input terminal and a load output terminal of the circuit breaker. The air-gap switch comprises a first contact and a second contact. The actuator mechanism is operatively configured to (i) mechanically force the first and second contacts apart to place the air-gap switch into an open state and create an air-gap in the electrical path, and (ii) mechanically force the first and second contacts together to place the air-gap switch into a closed state. The manual control switch is operatively coupled to the actuator mechanism, and is configured to toggle between a first position and a second position, wherein toggling the manual control switch into the first position causes the actuator mechanism to place the air-gap switch into the open state. The electromechanical actuator is operatively coupled to the actuator mechanism, wherein actuation of the electromechanical actuator causes the actuator mechanism to place the air-gap switch into the open state. The control circuitry is configured to control operation of the solid-state switch and the electromechanical actuator, wherein the control circuitry is configured to generate (i) a first control signal that is configured to place the solid-state switch into one of a switched-on state and a switched-off state and (ii) a second control signal that is configured to control actuation of the electromechanical actuator. The sensor switch is operatively coupled to the manual control switch and electrically connected to the control circuitry, wherein the sensor switch is configured to (i) detect a toggling of the manual control switch from the second position to the first position which causes the actuator mechanism to place the air-gap switch into the open state and (ii) in response to detecting the toggling of the manual control switch from the second position to the first position, output a third control signal to the control circuitry. In response to the third control signal, the control circuitry is configured to generate the first control signal to place the solid-state switch into the switched-off state before the air-gap switch is placed into the open state to create the air-gap in the electrical path.

Another embodiment includes a circuit breaker device which comprises a line hot terminal, a line neutral terminal, a load hot terminal, and a load neutral terminal, a solid-state switch, an air gap electromagnetic switch, an internal switch and shunt resistor, switch control circuitry, and fault detection circuitry. The solid-state switch and the air-gap electromagnetic switch are connected in series between the line hot terminal and the load hot terminal. The internal switch and the shunt resistor are serially connected between a first node and a second node, wherein the first node comprises a point along an electrical path between the line hot terminal and the load hot terminal, and wherein the second node comprises a point along an electrical path between the line neutral terminal and the load neutral terminal. The switch control circuitry is configured to control operation of the solid-state switch and the internal switch. The fault detection circuitry is configured to detect a fault condition and generate a fault detection control signal in response to detection of the fault condition. The switch control circuitry is configured to place the solid-state switch in a switched-off state in response to the fault detection control signal. The switch control circuitry is further configured to activate the internal switch in response to the fault detection control signal and thereby generate an internal short-circuit path with the shunt resistor connected between the first and second nodes and cause an internal short-circuit current to flow through the air-gap electromagnetic switch. The internal short-circuit current is sufficient to trip the air-gap electromagnetic switch and thereby create an air-gap in the electrical path between line hot terminal and the load hot terminal.

Another embodiment includes a method which comprises: sensing a current flowing in an electrical path between a line hot terminal and a load hot terminal of a circuit breaker device, wherein the circuit breaker device comprises a solid-state switch and an air-gap electromagnetic switch connected in series in the electrical path between the line hot terminal and the load hot terminal of the circuit breaker device; detecting a fault condition based on the sensed current flow; and in response to detecting the fault condition, (i) applying a first switch control signal to the solid-state switch to place the solid-state switch into a switched-off state; and (ii) applying a second switch control signal to an internal switch to activate the internal switch and thereby generate an internal short-circuit path within the circuit breaker device and generate an internal short-circuit current which flows through the air-gap electromagnetic switch. The flow of the internal short-circuit current causes the air-gap electromagnetic switch to trip and thereby create an air-gap in the electrical path between line hot terminal and the load hot terminal of the circuit breaker device.

Another embodiment includes a system which comprises a circuit breaker distribution panel comprising a line hot bus bar and a line neutral bus bar coupled to a utility power source, and a circuit breaker device disposed within the circuit breaker distribution panel. The circuit breaker device comprises a line hot terminal coupled to the line hot bus bar, a line neutral terminal coupled to the line neutral bus bar, and a load hot terminal and a load neutral terminal connected to a branch circuit. The circuit breaker device further comprises: a solid-state switch and an air-gap electromagnetic switch connected in series between the line hot terminal and the load hot terminal; an internal switch and a shunt resistor serially connected between a first node and a second node, wherein the first node comprises a point along an electrical path between the line hot terminal and the load hot terminal, and wherein the second node comprises a point along an electrical path between the line neutral terminal and the load neutral terminal; switch control circuitry that is configured to control operation of (i) the solid-state switch and (ii) the internal switch; and fault detection circuitry that is configured to detect a fault condition and generate a fault detection control signal in response to detection of the fault condition. The switch control circuitry is configured to place the solid-state switch in a switched-off state in response to the fault detection control signal. The switch control circuitry is configured to activate the internal switch in response to the fault detection control signal and thereby generate an internal short-circuit path with the shunt resistor connected between the first and second nodes and cause an internal short-circuit current to flow through the air-gap electromagnetic switch. The internal short-circuit current is sufficient to trip the air-gap electromagnetic switch and thereby create an air-gap in the electrical path between line hot terminal and the load hot terminal.

Other embodiments will be described in the following detailed description of embodiments, which is to be read in conjunction with the accompanying figures.

BRIEF DESCRIPTION OF THE DRAWINGS

FIGS. 7A and 7B schematically illustrate switch control circuitry for controlling a solid-state bidirectional switch, according to an embodiment of the disclosure, wherein:

FIG. 7A is a schematic block diagram of control circuitry that can be implemented in an intelligent circuit breaker for controlling a solid-state bidirectional switch, according to embodiment of the disclosure; and FIG. 7B is a schematic circuit diagram of the control circuitry of FIG. 7A, according to embodiment of the disclosure.

FIG. 8A is a high-level schematic illustration of an intelligent circuit breaker according to another embodiment of the disclosure.

FIGS. 9A, 9B and 9C schematically illustrate an integrated current sensor and energy metering circuit that can be implemented in an intelligent circuit breaker, according to an embodiment of the disclosure, wherein:

FIG. 9A is a schematic diagram of a power supply block and a current sensor block of the current sensor and energy metering circuit;

FIG. 9B is a schematic diagram of an over-current detection block of the current sensor and energy metering circuit; and FIG. 9C is a schematic diagram of an energy metering block of the current sensor and energy metering circuit.

FIGS. 21A and 21B depict various waveforms that illustrate operating modes of the current zero-crossing detection circuit of FIG. 20, according to an embodiment of the disclosure, wherein:

FIG. 21A depicts waveforms that illustrate a mode of operation of the edge detection stage of FIG. 20; and FIG. 21B illustrates simulated signal waveforms that illustrate an operating mode of the current zero-crossing detection circuit of FIG. 20, according to an embodiment of the disclosure.

FIG. 22 schematically illustrates a short-circuit detection circuit according to an embodiment of the disclosure.

FIG. 25A illustrates a power supply voltage waveform that is input to a line side of the intelligent circuit breaker of FIG. 24.

FIG. 25B illustrates an output voltage waveform on a load side of the intelligent circuit breaker of FIG. 24, when a solid-state switch of the intelligent circuit breaker is in a switched-off state and an air-gap electromagnetic switch of the intelligent circuit breaker is in a switched-closed state.

FIGS. 28A, 28B, 28C, 28D and 28E are perspective and schematic views of an intelligent circuit breaker which comprises multiple visual indictors that are configured to indicate operational states of the intelligent circuit breaker, according to another embodiment of the disclosure.

FIG. 29 schematically illustrates an intelligent circuit breaker according to another embodiment of the disclosure.

DETAILED DESCRIPTION OF EXEMPLARY EMBODIMENTS

Embodiments of the disclosure will now be described in further detail with regard to intelligent circuit breakers and systems and methods for implementing intelligent circuit breakers. It is to be understood that same or similar reference numbers are used throughout the drawings to denote the same or similar features, elements, or structures, and thus, a detailed explanation of the same or similar features, elements, or structures will not be repeated for each of the drawings. In addition, the terms "about" or "substantially" as used herein with regard to percentages, ranges, etc., are meant to denote being close or approximate to, but not exactly. For example, the term "about" or "substantially" as used herein implies that a small margin of error is present, such as 1% or less than the stated amount. The term "exemplary" as used herein means "serving as an example, instance, or illustration". Any embodiment or design described herein as "exemplary" is not to be construed as preferred or advantageous over other embodiments or designs.

Figure 1A:
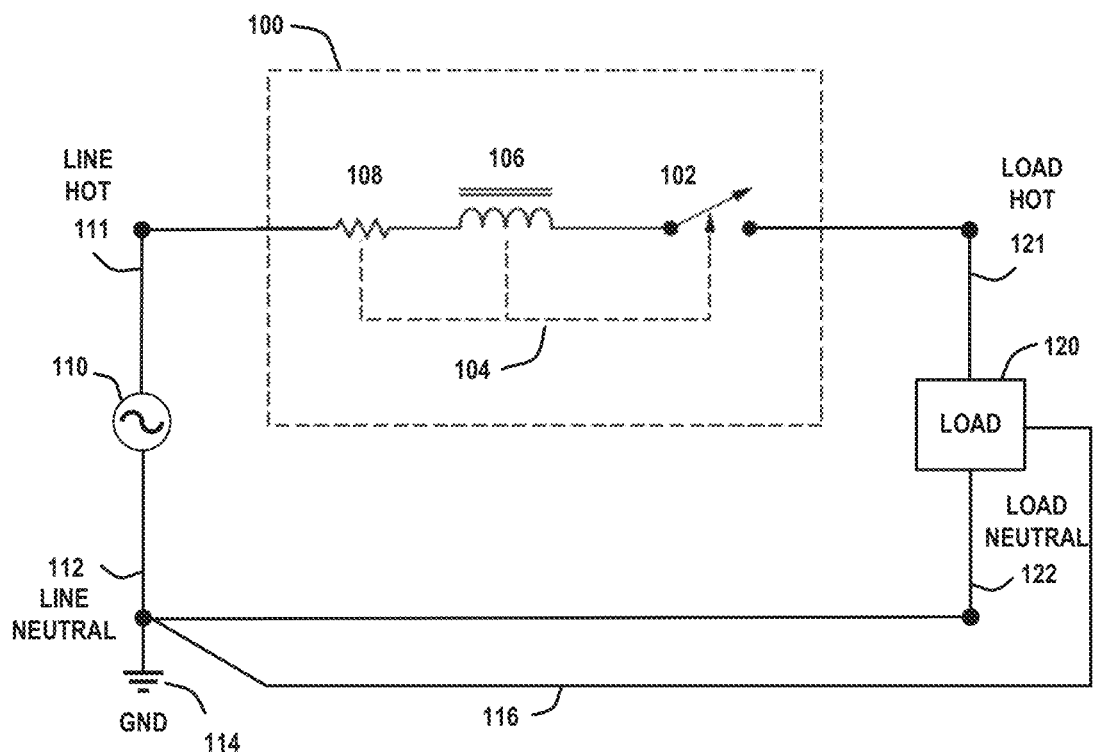
FIG. 1A is a schematic circuit diagram of a conventional thermal-magnetic circuit breaker.
Figure 1B:
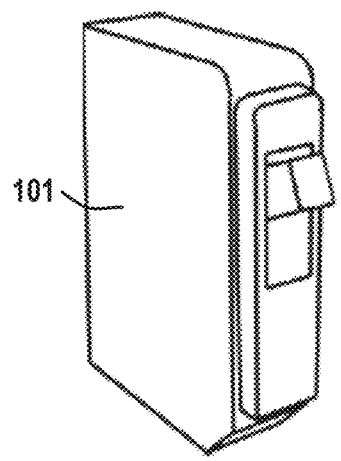
FIG. 1B is a perspective view of a housing of the conventional circuit breaker of FIG. 1A.

FIGS. 1A and 1B schematically illustrate a conventional thermal-magnetic circuit breaker 100, wherein FIG. 1A is a schematic circuit diagram of the thermal-magnetic circuit breaker 100, and FIG. 1B is a perspective view of a housing 101 of the thermal-magnetic circuit breaker 100. In particular, FIG. 1A illustrates the thermal-magnetic circuit breaker 100 connected between a utility power supply 110 (referred to herein as AC mains 110) and a load 120 which is connected to a branch circuit that is protected by the circuit breaker 100. As further illustrated in FIG. 1A, the circuit breaker 100 is typically connected between a hot phase 111 (referred to as "line hot") of the AC mains 110 and a load hot line 121 of the load 120, while a neutral phase 112 (referred to as "line neutral") of the AC mains 110 is directly connected to a load neutral line 122 of the load 120.

The circuit breaker 100 comprises an electromechanical switch 102 that is manually opened and closed by means of a manual switch mechanism (not shown). The electromechanical switch 102 is mechanically coupled 104 to a thermal-magnetic actuator comprising a solenoid 106 connected in series with the switch 102 and a bimetallic element 108 (which is heated by a resistive element) also connected in series with the switch 102. The mechanical coupling 104 is configured such that an instantaneous current flowing from the hot phase 111 which exceeds a first threshold value (e.g., beyond the current rating of the circuit breaker 100)

causes the solenoid 106 to separate the contacts of the switch 102, thereby opening the circuit and "tripping" the circuit breaker 100. The solenoid 106 (e.g., electromagnet) asserts a pulling force which increases with the current. The circuit breaker contacts are held closed by a latch. As the current in the solenoid 106 increases beyond the rating of the circuit breaker, the solenoid's pull releases the latch, which causes the contacts to open by spring action.

In addition, the mechanical coupling 104 is configured such that a prolonged excess current at a second, lower threshold value causes the bimetallic element 108 to separate the contacts of the switch 102 and thereby trip the circuit breaker 100. The bimetallic element 108 is responsive to less extreme but longer-term over-current conditions. The thermal mechanism of the circuit breaker 100 provides a time response feature, that trips the circuit breaker 100 sooner for larger over-currents but allows smaller overloads to persist for a longer time. This allows short current spikes such as are produced when a motor or other non-resistive load is switched on. In this regard, the solenoid 106 (electromagnet mechanism) responds instantaneously to large surges in current (short-circuits) and the bimetallic element 108 responds to less extreme but longer-term over-current conditions. Once tripped, the circuit breaker 100 must be manually reset using the manual switch mechanism.

As further illustrated in FIG. 1A, the line neutral 112 is typically bonded to earth ground 114 (GND) in a circuit breaker distribution panel, and an earth ground connection 116 is made from ground bar in the circuit breaker distribution panel to a ground connection of the load 120. The earth ground connection 116 provides an alternative low-resistance path for ground-fault return current to flow in the event of a ground-fault event at the load 120. The earth ground connection 116 is useful for other circuit breaker or receptacle designs which provide protections such as arc-fault sensing and arc-fault circuit interruption (AFCI), and ground-fault sensing and ground-fault circuit interruption (GFCI). Furthermore, a line neutral wire (not shown in FIG. 1A or FIG. 1B) would be included in the circuit breaker 100 that is designed to provide AFCI and GFCI protection.

FIG. 1B illustrates a conventional housing 101 for a residential circuit breaker which is usually manufactured using molded plastic components. In some embodiments, intelligent circuit breakers are implemented using standard housings for residential and/or commercial applications to allow the intelligent circuit breakers to be backward compatible with existing housings and retrofitted into existing distribution panels. One skilled in the art will recognize that the circuits, algorithms, heat exchangers, and other aspects of the disclosed technologies can be adjusted to various form factors required in other locations or countries. It is contemplated herein that present approach does not require using traditional style breaker elements, for example, particularly without using traditional breaker housing.

In accordance with embodiments of the disclosure, intelligent circuit breakers are designed to provide high isolation capability, while having relatively fast reaction times to isolate short-circuit conditions, over-current conditions, and other types of faults, more rapidly than conventional circuit breakers. Intelligent circuit breakers are designed with time-current characteristics that can be programmable in real time, and which are more precise with less variability as compared to conventional circuit breakers. For example, in some embodiments, intelligent circuit breakers implement low-power solid-state bidirectional switches that enable fast reaction time to isolate faults on high-energy branch circuits. Intelligent breakers are designed to communicate with smart devices connected to provide support for multiple points of failure, independent from the location of the circuit breaker installation, thereby allowing for a reduction in the impedance of short-circuited conductors.

Intelligent circuit breakers according to embodiments of the disclosure provide added safety, expanded convenience, added energy awareness, control, energy savings, and improved situational awareness, as compared to conventional circuit breakers. As explained in further detail below, intelligent circuit breakers implement various functionalities and control circuits to implement intelligent processing, including AC mains switching techniques, AC-to-DC conversion techniques, internal short-circuit trip techniques, techniques to communicate status and sensor data wirelessly to enable a variety of innovative use-cases, algorithms for detecting faults, techniques for detecting and protection from internal device failures, techniques for handling new types of loads through over-the-air updates, techniques for exchanging thermal energy, techniques for cloud services support for remote notifications, control, monitoring and big data collection even during collapsing utility events, circuit techniques for shunt-resistor current sensing, energy metering, and over-current detection, techniques for avoiding fault conditions. These are novel techniques in and by themselves, but their true impact in terms of addressing the challenges of improving safety, expanded convenience, added control, energy awareness, energy savings, and improved situational awareness lies in their combination.

Figure 2A:
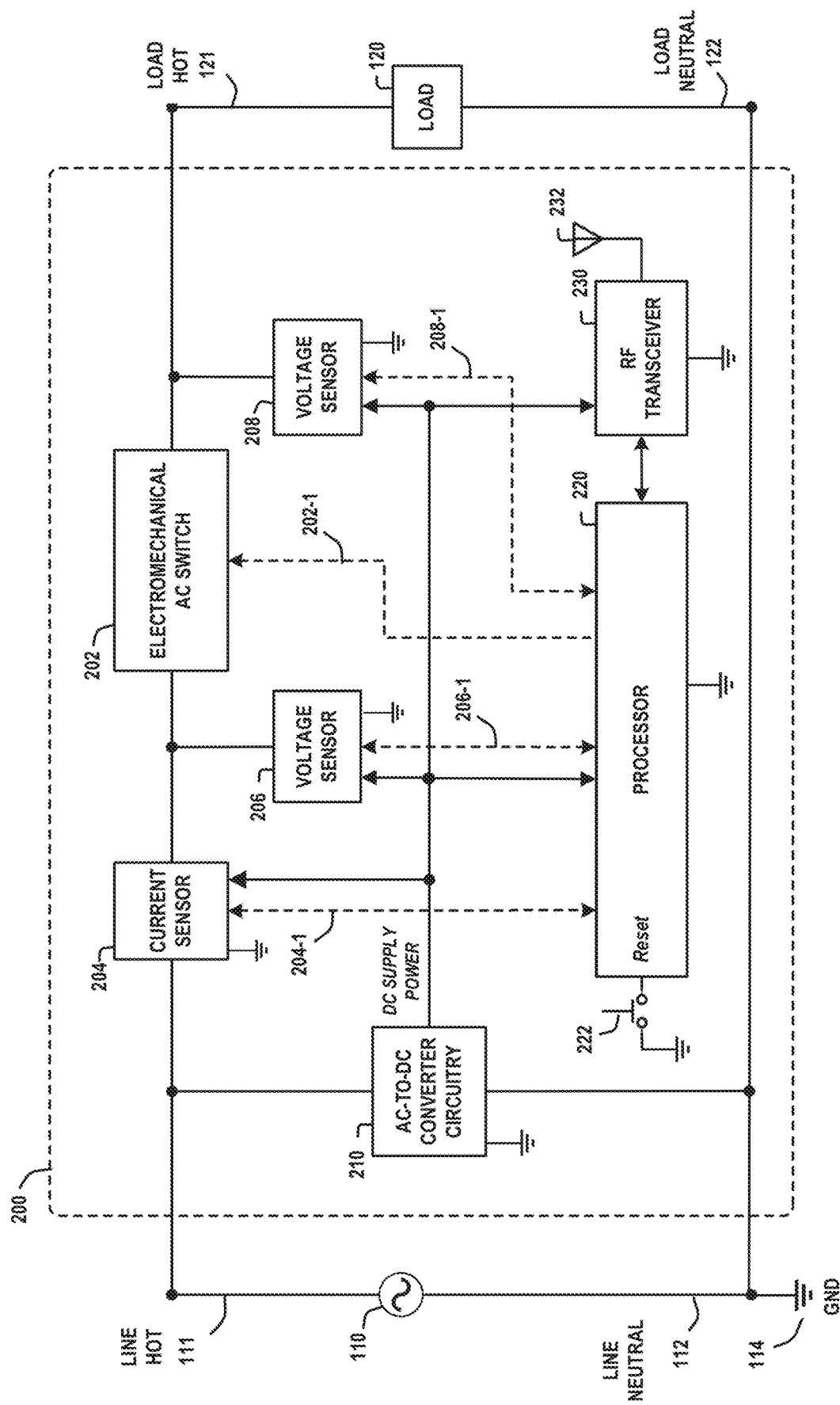
FIG. 2A is a schematic block diagram of an intelligent circuit breaker comprising an electromechanical switch, according to an embodiment of the disclosure.

FIG. 2A is a schematic block diagram of an intelligent circuit breaker according to an embodiment of the disclosure. In particular, FIG. 2A schematically illustrates an intelligent circuit breaker 200 connected between an AC mains 110 and a load 120. The intelligent circuit breaker 200 comprises an electromechanical AC switch 202, a current sensor 204, a first voltage sensor 206, a second voltage sensor 208, AC-to-DC converter circuitry 210, a processor 220, a processor reset switch 222, and a radio frequency (RF) transceiver 230 with an associated antenna 232. The electromechanical AC switch 202 is serially connected between a line input terminal and a load output terminal of the circuit breaker 200, wherein the line hot 111 of the AC mains 110 is connected to the line input terminal and the load hot 121 of the load 120 is connected to the load output terminal. The line hot 111 of the AC mains 110 is connected to the load hot 121 when the electromechanical AC switch 202 is in a switched-closed state. In this embodiment, the line neutral 112 (which, for example, is bonded to the earth ground 114 in the breaker distribution panel) serves as a low-side voltage reference (e.g., ground) for the electronic circuitry of the intelligent circuit breaker 200.

In some embodiments, the electromechanical AC switch 202 comprises a thermal-magnetic trip and switch mechanism which is the same or similar to the thermal-magnetic circuit breaker 100 discussed above in conjunction with FIG. 1A, wherein the electromechanical AC switch 202 comprises a thermal switching mechanism (e.g., bimetal switch) and an electromagnetic switching mechanism (e.g., solenoid). The electromechanical AC switch 202 is configured to provide an "open" circuit when either an operator manually disables the hot path using the manual switch (or actuator lever) or automatically when a fault condition (e.g., short-circuit conditions, over-current conditions, etc.) is detected by the electromechanical AC switch 202.

The processor 220 operates in conjunction with the current sensor 204 and the first and second voltage sensors 206 and 208 to perform functions such as monitoring energy utilization and detecting fault conditions. For example, in some embodiments, the processor 220 is configured (via software and/or hardware) to detect the presence of a fault condition in the load 120 (e.g., short-circuit condition, over-current condition, over-voltage condition, etc.), or an internal fault condition within the intelligent circuit breaker 200, and generate a control signal on a control line 202-1 to cause electrical contacts of an electromagnetic component (e.g., solenoid) to open and thereby disconnect the line hot 111 from the load hot 121. In other embodiments, the intelligent circuit breaker 200 comprises additional sensor circuitry and/or processing functionality to support arc-fault circuit interruption and/or ground-fault circuit interruption functions using, for example, techniques as discussed herein.

The processor 220 can be implemented using one or more processing architectures. For example, the processor 220 may comprise a central processing unit, a microprocessor, a microcontroller, an application-specific integrated circuit (ASIC), a field programmable gate array (FPGA), a system-on-chip (SOC) and other types of processors, as well as portions or combinations of such processors, which can perform processing functions based on software, hardware, firmware, etc. In some embodiments, the solid-state circuitry of the various components (e.g., 204, 206, 208, 210, 220, and/or 230) of the intelligent circuit breaker 200 can be implemented on a single die as a system-on-chip. In some embodiments, the solid-state circuitry of the various components (e.g., 204, 206, 208, 210, 220, and/or 230) of the intelligent circuit breaker 200 can be implemented on one or more separate dies that are integrally packaged as a multi-chip module (e.g., system-in-package) providing a high-density heterogeneous integrated solution.

The processor 220 utilizes the RF transceiver 230 to wirelessly communicate with a remote node, device, system, etc., to support remote monitoring of energy utilization and detection of fault conditions. The processor reset switch 222 is utilized to reset the status of the processor 220 under certain conditions, e.g., when there is a loss of DC power to the processor 220, etc. In some embodiments, the processor reset switch 222 comprises a manual result switch that is mechanically coupled to the manual switch lever mechanism (e.g., actuator lever) of the electromechanical AC switch 202 so that a manual reset of the switch lever following a trip event also causes mechanical activation of the processor reset switch 222.

The current sensor 204 and the voltage sensors 206 and 208 are configured to sense and detect conditions that are indicative of open circuits or damaged or failed internal components of the intelligent circuit breaker 200 and to provide timing for the safe opening and closing of circuits. In particular, the current sensor 204 is configured to detect a magnitude of current being drawn by the load 120 in the hot line path through the intelligent circuit breaker 200. The current sensor 204 can be implemented using any suitable type of current sensing circuit including, but not limited to, a current-sensing resistor, a current amplifier, a Hall Effect current sensor, etc. The current sensor 204 is coupled to the processor 220 by one or more data acquisition and control lines 204-1.

The first and second voltage sensors 206 and 208 are configured to monitor the voltage at different points along the hot line path through the circuit breaker 200. For example, as shown in FIG. 2A, the first voltage sensor 206 is coupled to the hot line path upstream of the electromechanical AC switch 202 to monitor the AC supply voltage of the AC mains 110, and the second voltage sensor 208 is coupled to the hot line path downstream of the electromechanical AC switch 202 to monitor the load voltage on the branch circuit which is connected to, and protected by, the intelligent circuit breaker 200. The voltage sensors 206 and 208 are coupled to the processor 220 by one or more data acquisition and control lines 206-1 and 208-1, respectively.

The voltage sensors 206 and 208 can be implemented using any suitable type of voltage sensing circuitry including, but not limited to, zero-crossing detector circuits. A zero-crossing detector is configured to receive as input an AC waveform, compare the input AC waveform to a zero reference voltage (e.g., line neutral voltage), and detect the AC waveform transition from positive and negative, which coincides when the AC waveform crosses the zero reference voltage. In some embodiments, the zero-crossing detector circuitry is configured to generate a square wave output which transitions between a logic "1" and logic "0" output upon each zero crossing detection of the AC voltage waveform. In other embodiments, the zero-crossing detector circuitry is configured to generate a short-lived pulse (~3 us) having an RC-adjustable duration.

The AC-to-DC converter circuitry 210 is configured to provide DC supply power to various circuitry and elements of the intelligent circuit breaker 200 including the current sensor 204, the voltage sensors 206 and 208, the processor 220 and the RF transceiver 230. The AC-to-DC converter circuitry 210 remains powered during faults when the electromechanical AC switch 202 is in an open state. In some embodiments, the AC-to-DC converter circuitry 210 comprises sufficient storage capacitance to power the DC subsystems immediately following a utility outage such that relevant power outage or short-circuit information may be obtained and stored by the processor 220 as the utility power collapses, and then wirelessly transmitted to a remote node, device, or system using the RF transceiver 230. The AC-to-DC converter circuitry 210 may also include sufficient capacitance to power the DC subsystem during a load short-circuit event without being pulled-down by the collapsing voltage of the hot line and load, such that the load can be intentionally disconnected to prevent damage during out-of-range voltage events.

Figure 2B:
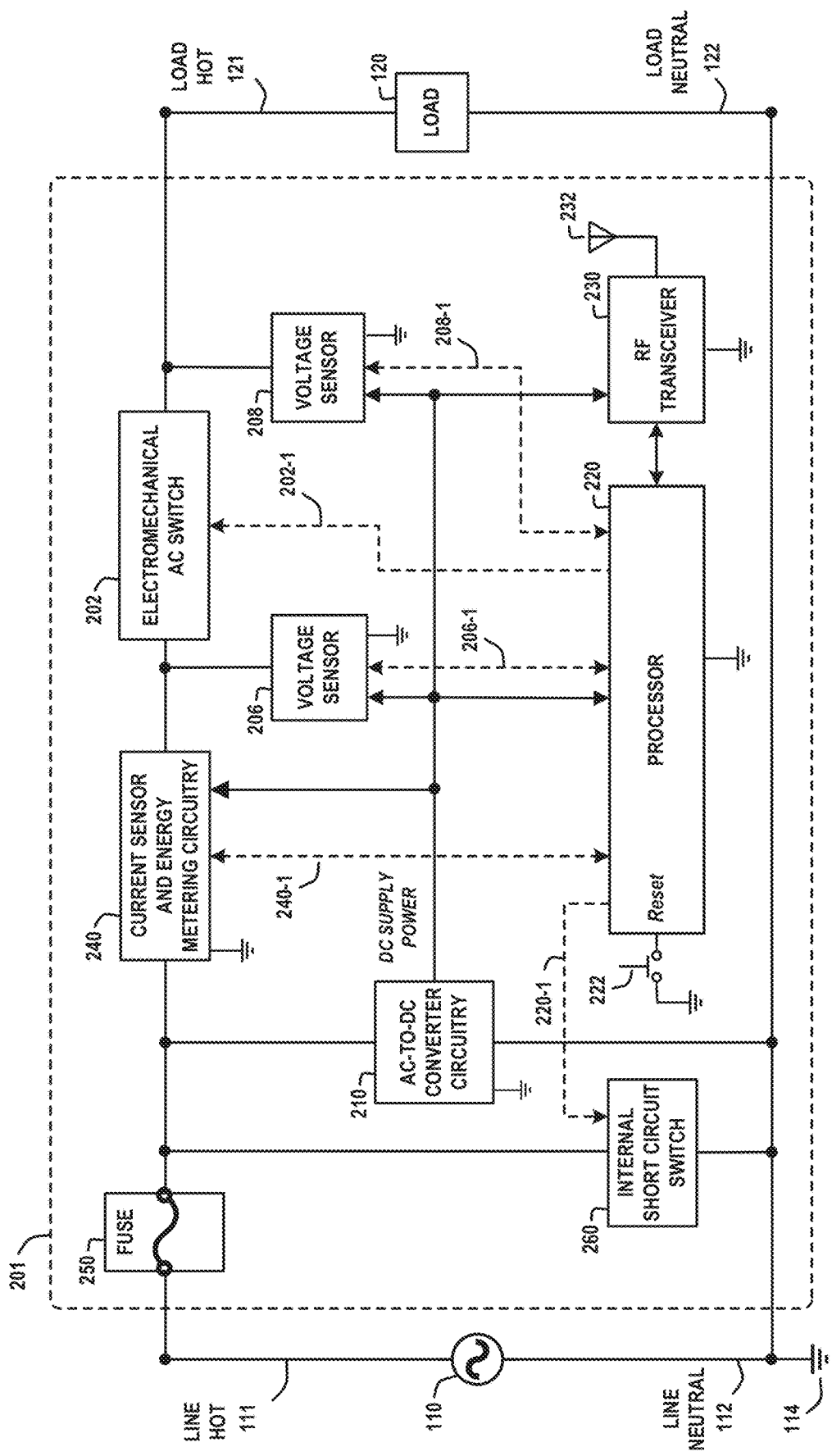
FIG. 2B is a schematic block diagram of an intelligent circuit breaker comprising an electromechanical switch, according to another embodiment of the disclosure.

FIG. 2B is a schematic block diagram of an intelligent circuit breaker according to another embodiment of the disclosure. In particular, FIG. 2B schematically illustrates an intelligent circuit breaker 201 connected between an AC mains 110 and a load 120. The intelligent circuit breaker 201 is similar to the intelligent circuit breaker 200 of FIG. 2A, except that the intelligent circuit breaker 201 comprises current sensor and energy metering circuitry 240, a fuse 250, and an internal short-circuit switch 260. The current sensor and energy metering circuitry 240 is configured to detect a magnitude of current being drawn by the load 120 in the hot line path through the circuit breaker 201 as well as implement a programmable over-current detection system and intelligent energy metering circuitry. An exemplary embodiment of the current sensor and energy metering circuitry 240 will be discussed below in conjunction with FIGS. 9A, 9B and 9C.

The fuse 250 is implemented to protect the circuit breaker 201 from internal failure or to provide a simple end-of-life disablement mechanism, such as in the event of a device failure. In some embodiments, as shown in FIG. 2B, the internal short-circuit switch 260 is connected between the AC hot line path of the circuit breaker 201 and the line neutral 112, wherein the internal short-circuit switch 260 is connected to the AC hot line path at some point between the fuse 250 and the electromechanical AC switch 202. The internal short-circuit switch 260 is responsive to control signals generated by the processor 220 and applied to the short-circuit switch 260 over a switch control line 220-1. In this configuration, the processor 220 can implement an end-of-life disablement mechanism, such as in the event of a device failure, wherein the processor 220 outputs a control signal on the control line 220-1 to activate the internal short-circuit switch 260 and blow the fuse 250 to disable the intelligent circuit breaker 201. In other embodiments, an end-of-life disablement mechanism can be implemented by configuring the processor 220 to generate a control signal which, e.g., keeps the electromechanical AC switch 202 from being placed in a switched-closed state at any time after a device failure has been detected, or which immediately causes the electromechanical AC switch 202 to trip (and be placed in a switched-open state) any time an individual attempts to turn on the breaker (via activation of the manual switch) after a device failure has been detected.

In other embodiments, an internal short-circuit switch can be implemented in an intelligent circuit breaker as a mechanism to internally trigger a fault to trip the electromechanical AC switch 202. For example, in the exemplary embodiments of FIGS. 2A and 2B, an internal short-circuit switch can be connected between the AC hot line path and the line neutral 112 on the load side of the electromechanical AC switch 202. The processor 220 can be configured to generate a switch control signal to activate the internal short-circuit switch and generate a short-circuit fault condition at the load side of the electromechanical AC switch 202 and thereby trip the electromechanical AC switch 202. In this configuration, the processor 220 can detect the existence of an unsafe condition or internal circuit breaker failure based on sensor data generated by the current and/or voltage sensors 240, 206, and 208, and then generate a control signal to activate the internal short-circuit switch 260 and thereby trip the electromechanical AC switch 202. In addition, an internal short-circuit trigger event can be triggered in response to the processor 220 receiving a remote command to disconnect or in response to the detection of an unsafe local condition such as over-heating, excessive moisture, or a device failure, etc.

Figure 3A:
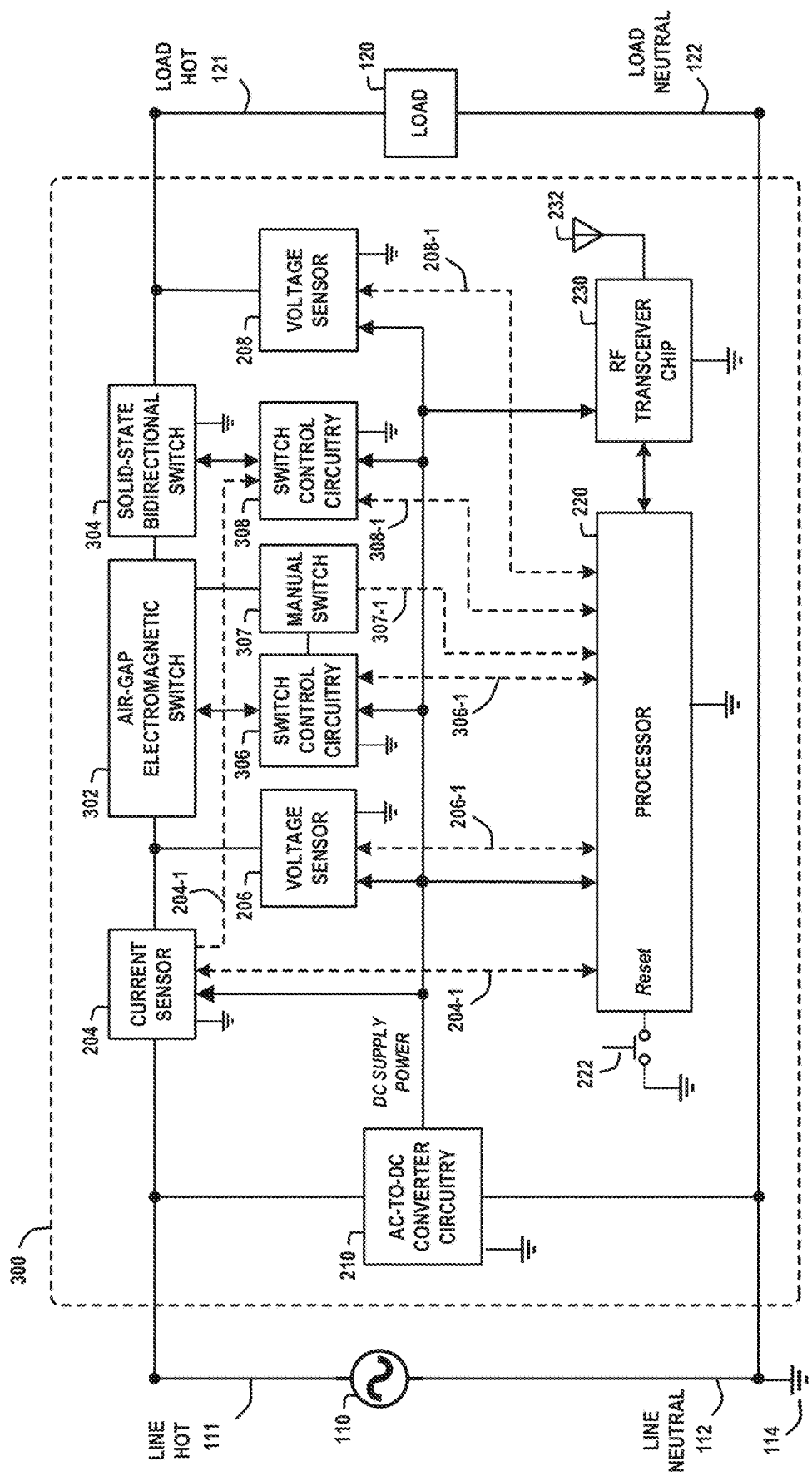
FIG. 3A is a schematic block diagram of an intelligent circuit breaker comprising a solid-state bidirectional switch, according to an embodiment of the disclosure.

FIG. 3A is a schematic block diagram of an intelligent circuit breaker according to another embodiment of the disclosure. In particular, FIG. 3A schematically illustrates an intelligent circuit breaker 300 connected between an AC mains 110 and a load 120. The intelligent circuit breaker 300 comprises an air-gap electromagnetic switch 302, a solid-state bidirectional switch 304, switch control circuitry 306 that is configured to control operation of the air-gap electromagnetic switch 302, a manual switch 307 that allows a user to manually open and close the air-gap electromagnetic switch 302, and switch control circuitry 308 that is configured to control operation of the solid-state bidirectional switch 304. In addition, similar to the exemplary embodiment of FIG. 2A, the intelligent circuit breaker 300 of FIG. 3A comprises a current sensor 204, a first voltage sensor 206, a second voltage sensor 208, AC-to-DC converter circuitry 210, a processor 220, a processor reset switch 222, and a RF transceiver 230 and associated antenna 232, which are configured to perform functions which are the same or similar to the functions as discussed above. In other embodiments, as noted above, an external DC power supply can be implemented to provide DC power to the solid-state circuitry and components of the intelligent circuit breaker 300.

In some embodiments, the air-gap electromagnetic switch 302 comprises any suitable type of electromagnetic trip and mechanical switch mechanism, which is configured to physically open and close a set of electrical contacts, wherein an air gap is created between the electrical contacts when the air-gap electromagnetic switch 302 is in a switched-open state. For example, the air-gap electromagnetic switch 302 may comprise a latching solenoid or relay element that is responsive to control signals from the switch control circuitry 306 to automatically open or close the electrical contacts of the air-gap electromagnetic switch 302. In some embodiments, the switch control circuitry 306 and the air-gap electromagnetic switch 302 are configured such that the electrical contacts of the air-gap electromagnetic switch 302 can be automatically opened by the switch control circuitry 306, but not automatically closed by operation of the switch control circuitry 306. In this instance, the electrical contacts of the air-gap electromagnetic switch 302 are manually closed by operation of the manual switch 307.

In some embodiments, the switch control circuitry 308 is responsive to control signals from one or more of the sensors (e.g., current sensor 204, voltage sensors 206 and 208 etc.) to determine when to open the air-gap electromagnetic switch 302 in response to fault conditions detected by the sensors. In some embodiments, the switch control circuitry 306 is responsive to control signals received from the processor 220 (over a control line 306-1) to control the opening of the air-gap electromagnetic switch 302 in response to fault conditions such as short-circuit faults, over-current faults, and other faults that are detected by the processor 220 as a result of the processor 220 analyzing sensor data obtained from the current sensor 204 and the voltage sensor 206 and 208.

In addition, the air-gap electromagnetic switch 302 comprises a manual switch 307 that enables a person to manually open or close the electrical contacts of the air-gap electromagnetic switch 302 and thereby manually place the air-gap electromagnetic switch 302 into a switched-open or switched-closed state. The state of the manual switch 307 (activated or deactivated) can be detected by the processor 220 based on an electrical signal that is present on a sense line 307-1 connected between the manual switch 307 and the processor 220. The creation of the air gap in the line path between the line hot 111 and load hot 121 provides complete isolation of the AC mains 110 from the load 120, and prevents the flow of current from the line hot 111 to the load 120 (and also prevents flow of leakage current that can be generated by the solid-state bidirectional switch 304 when the solid-state bidirectional switch 304 is in a switched-off state).

As shown in FIG. 3A, the air-gap electromagnetic switch 302 is connected in series with the solid-state bidirectional switch 304 between the line input terminal and the load output terminal of the intelligent circuit breaker 300. The air-gap electromagnetic switch 302 may be disposed on either the line side (as shown in FIG. 3A) of the solid-state bidirectional switch 304 or on the load side of the solid-state bidirectional switch 304. The solid-state bidirectional switch 304 comprises electrically controlled solid-state switching devices such as power MOSFET (metal-oxide semiconductor field effect transistor) devices and associated biasing circuitry. Exemplary embodiments of the solid-state bidirectional switch 304 will be discussed in further detail below in conjunction with FIGS. 6A through 6H. The semiconductor MOSFET devices can be silicon-based solid-state devices or silicon carbide (SiC) or gallium arsenide (GaN) based solid state devices.

The solid-state bidirectional switch 304 is controlled by the switch control circuitry 308 to place the solid-state bidirectional switch 304 into a switched-on state or a switched-off state in response to gate control signals generated by the switch control circuitry 308. In some embodiments, the switch control circuitry 308 is responsive to control signals received from the processor 220 (over a control line 308-1) to switch off the solid-state bidirectional switch 304 in response to fault conditions such as short-circuit faults, over-current faults, and other faults that are detected by the processor 220 as a result of the processor 220 analyzing sensor data obtained from the current sensor 204 and the voltage sensor 206 and 208.

In other embodiments, the switch control circuitry 308 comprises control circuitry that is responsive to control signals generated by the current sensor 204 (and other sensors, e.g., voltage sensors 206 and 208) in response to detection of fault conditions, and transmitted on a control line 204-1 to the switch control circuitry 308. The switch control circuitry 308 is responsive to such control signals to generate gating control signals to control activation and deactivation of the solid-state bidirectional switch 304. In other embodiments, the switch control circuitry 308 comprises short-circuit detection circuitry which is configured to detect a load-side short-circuit fault, and automatically deactivate the solid-state bidirectional switch 304 in response to the detected short-circuit fault. An exemplary embodiment of the switch control circuitry 308 comprising short-circuit detection circuitry will be discussed in further detail below in conjunction with FIGS. 7A and 7B. In addition, the switch control circuitry 308 is configured to control the drive voltage of the solid-state bidirectional switch 304 for the purpose of controlling and minimizing leakage of the solid-state bidirectional switch 304 when the switch 304 is in a switched-off state.

It is to be appreciated that the implementation of the solid-state bidirectional switch 304 allows the intelligent circuit breaker 300 to rapidly respond to imminent fault conditions such as over-current fault conditions, load-side short-circuit fault conditions, internal fault conditions, over-voltage conditions, etc., by rapid deactivation of the solid-state bidirectional switch 304. Indeed, the response time for deactivating the solid-state bidirectional switch 304 to isolate a fault condition can be on the order of 1000 times faster than the response time associated with the automatic tripping of an electromechanical AC switch to isolate the fault condition (e.g., on the order of several milliseconds), as the solid-state state bidirectional switch 304 can transition from a switched-on state to a switched-off state on the order of microseconds or nanoseconds. As a further advantage, the solid-state bidirectional switch 304 has a time-current characteristic profile that is more precise and repeatable as compared to a conventional electromechanical circuit breaker. This allows the current which is conducted by the solid-state bidirectional switch 304 to be more precisely controlled, as compared to conventional electromechanical circuit breakers which have time-current characteristics that vary over their life-time.

In some embodiments, the control logic implemented by the processor 220 of the intelligent circuit breaker 300 is configured to issue switch control signals to the switch control circuitry 306 so that the air-gap electromagnetic switch 302 is placed in a switched-open state in response to the solid-state bidirectional switch 304 being placed into a switched-off state. In some embodiments, the control logic implemented by the processor 220 is configured to issue switch control signals to the switch control circuitry 306 so that the air-gap electromagnetic switch 302 is placed in a switched-closed state prior to placing the solid-state bidirectional switch 304 into a switched-on state. In addition, the processor 220 is configured to monitor and detect for a manual switch opening event wherein the manual switch 307 of the air-gap electromagnetic switch 302 is actuated to manually open the electrical contacts of the air-gap electromagnetic switch 302. In response to the manual switch opening event, the processor 220 will generate and output a control signal to the switch control circuitry 308 to place the solid-state bidirectional switch 304 into a switched-off state.

The switch timing control scheme as outlined above prevents or minimizes the generation of electrical arcs between the electrical contacts of the air-gap electromagnetic switch 302 by ensuring that (i) the air-gap electromagnetic switch 302 is placed in a switched-closed state prior to placing the solid-state bidirectional switch 304 into a switched-on state, and that (ii) the solid-state bidirectional switch 304 is automatically placed in a switched-off state in response to detection of a manual operator disconnect of the air-gap electromagnetic switch 302 and thereby deactivate the solid-state bidirectional switch 304 prior to the opening of the electrical contacts of the air-gap electromagnetic switch 302. In another embodiment, the switch control scheme is configured to operate the intelligent circuit breaker 300 in a "standby" state, wherein the solid-state bidirectional switch 304 is in a switched-off state, and the air-gap electromagnetic switch 304 in a switched-closed state.

With such switch control configuration, the electrical contacts of the air-gap electromagnetic switch 302 are configured to support high energy flow in a switched-closed state, but may be designed for movement only during low-current flow conditions to prevent or minimize arcing between the electrical contacts. For example, a switch control scheme can be implemented in which the air-gap electromagnetic switch 302 is actuated when the magnitude of the current on the hot line path is less than a pre-selected value. The prevention of arcing within the air-gap electromagnetic switch 302 enables miniaturization of the air-gap electromagnetic switch 302.

The implementation of the air-gap electromagnetic switch 302 provides additional safety features for the intelligent circuit breaker 301. For example, the air-gap electromagnetic switch 302 provides a fail-safe mechanism for fault isolation in the event that the solid-state bidirectional switch 304 fails. By analyzing the real-time sensor data obtained from the various sensors 204, 206 and 208, the processor 220 can be configured to detect a failure state of the solid-state bidirectional switch 304 or otherwise detect potential over-current or short-circuit fault conditions. In such instance, the processor 220 can generate and output a control signal to the switch control circuitry 306 to place the air-gap electromagnetic switch 302 into a switched-open state.

In some embodiments, the current sensor 204 comprises a sense resistor that is connected in series in the hot line path. As explained in further detail below, the sense resistor is configured to generate a burden voltage or sense voltage as a result of load current flowing through the sense resistor, wherein the burden voltage or sense voltage is measured and processed by one or more detection circuits (e.g., current sensor circuit, short-circuit detection circuit, energy metering circuit, etc.) to detect fault conditions and to control the solid-state switch directly without the assistance of the processor. This allows for faster reaction time by avoiding the indeterminate time of the processor or CPU response.

In addition, the air-gap switch 302 provides galvanic isolation between the AC mains 110 and the load 120 when the air-gap switch 302 is placed in a switched-open state. With the air gap formed, no current can flow from the AC mains 110 to the load 120. Such galvanic isolation guards against the unwanted flow of current due to leakage current of the solid-state bidirectional switch 304 when the solid-state bidirectional switch 304 is in a switched-off state.

As with other embodiments discussed herein, the processor 220 can be implemented using one or more processing architectures (e.g., CPU, microprocessor, a microcontroller, ASIC, etc.). In some embodiments, the solid-state circuitry of the various components (e.g., 204, 206, 208, 210, 220, 230, 306, and/or 308) of the intelligent circuit breaker 300 can be implemented on a single die as a system-on-chip. In some embodiments, the solid-state circuitry of the various components (e.g., 204, 206, 208, 210, 220, 230, 306, and/or 308) of the intelligent circuit breaker 230 can be implemented on one or more separate dies that are integrally packaged as a multi-chip module (e.g., system-in-package) providing a high-density heterogeneous integrated solution.

Figure 3B:
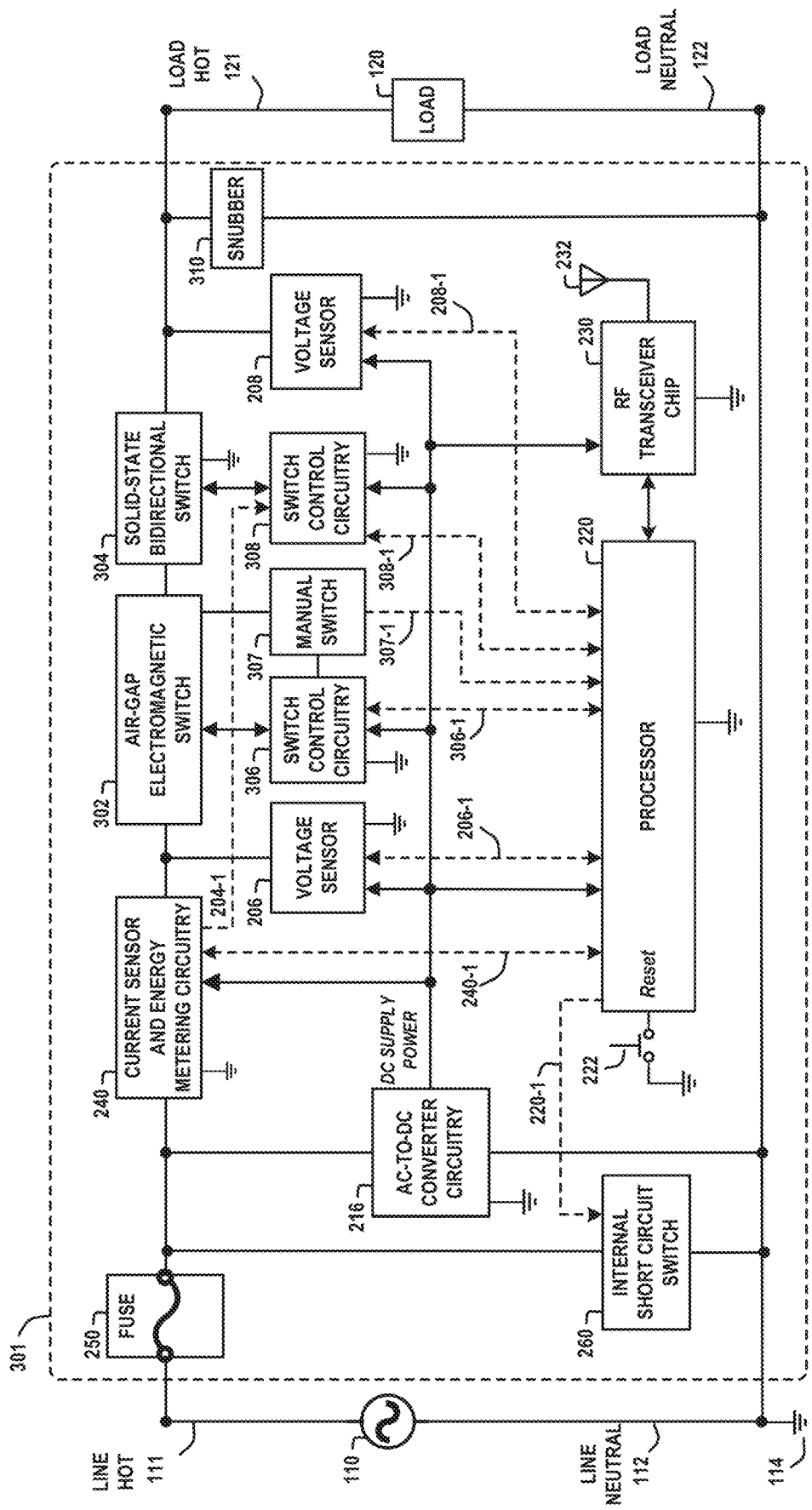
FIG. 3B is a schematic block diagram of an intelligent circuit breaker comprising a solid-state bidirectional switch, according to another embodiment of the disclosure.

FIG. 3B is a schematic block diagram of an intelligent circuit breaker according to another embodiment of the disclosure. In particular, FIG. 3B schematically illustrates an intelligent circuit breaker 301 connected between an AC mains 110 and a load 120. The intelligent circuit breaker 301 comprises a combination of components of the intelligent circuit breakers 201 and 300 (FIGS. 2B and 3A) and thus, a detailed description of the various components and associated functionalities will not be repeated. The intelligent circuit breaker 301 comprises a snubber 310 that is connected between the hot line path and neutral line path to protect the internal components from damage due to energy kick-back from inductive loads. The snubber 310 may be disposed on the line and/or load side of the switches 302 and 304. A snubber located on the line side of the switches 302 and 304 allows the snubber to only protect the internal circuits when the switches 302 and 304 are in switched-open and switched-on states, respectively. However, the snubber 310 located on the load side of the switches 302 and 304 as shown in FIG. 3B helps to eliminate the possibility of an arc occurring within the air-gap electromagnetic switch 302 during an inductive load kick-back event. It is to be understood that a snubber can be implemented in the intelligent circuit breaker embodiments of FIGS. 2A, 2B, and 3A.

In other embodiments, an external DC power supply can be implemented to provide DC power to the solid-state circuitry and components of the intelligent circuit breakers 200, 201, 300, and 301 of FIGS. 2A, 2B, 3A and 3B (as well as other embodiments of circuit breakers discussed below). For example, a distribution panel in which an intelligent circuit breaker is mounted can have a DC battery and a DC power bus that is configured to distribute DC power to the intelligent circuit breakers within the distribution panel. In this instance, the DC battery can be coupled to an AC-to-DC converter that is configured to convert the AC power of the AC mains 110 to DC power that charges the DC battery.

While the exemplary embodiments of FIGS. 2A, 2B, 3A and 3B illustrate a processor reset switch 222 for resetting the processor 220, it is to be understood that the processor reset switch 222 is an optional feature, and that other mechanisms can be implemented for effecting a processor reset. In some embodiments, the processor 220 comprises an internal reset circuit that is configured to reset the processor 220 under certain circumstances such as when there is a loss of DC power to the processor 220 or when there is an internal fault condition of the processor 200. In some embodiments, the processor is configured to generate a "CPU_OK" signal which is output on the control lines 306-1 and 308-1 to the switch control circuitry 306 and 308. The CPU_OK signal provides an indication of whether or not the processor 220 and associated software is operating normally. When the CPU_OK signal indicates that the processor 200 and/or associated software is not operating normally, the switch control circuitry 306 and 308 will automatically place the solid-state bidirectional switch 304 into a switched-off state and then place the air-gap electromagnetic switch 302 into a switched-open state (to create the air-gap for galvanic isolation). This provides a hardware fail-safe mechanism to ensure that the intelligent circuit breaker is not servicing a load under conditions where the processor 220 or a subsystem thereof is not operating correctly.

For example, in some embodiments, the internal reset circuit of the processor 220 comprises a Watchdog timer and suitable architected software that is configured to service the Watchdog timer (e.g., reset the Watchdog timer) when all subsystems within the firmware of the processor 220 are determined to be operating correctly. In some embodiments, the Watchdog timer comprises a resistor/capacitor network which implements a unique clock. When the Watchdog timer is enabled, the timer counts from an initial value to final count value. If the Watchdog timer is not initialized to the initial count value before reaching the final count value, the processor 220 will be reset. The processor 220 will be reset because of a loss of AC (thus DC) power, or an internal fault condition that causes the Watchdog timer to reach the final count value in which case a control signal is generated which causes the processor 220 to be reset.

More specifically, in some embodiments, the internal reset circuit of the processor 220 operates as follows. When DC power is first applied to the processor 220, the processor will perform a self-check and initialization routine. If the self-check and initialization routine are successfully completed, the processor 220 will output a logic "1" CPU_OK control signal to indicate that the processor 220 and embedded software are operating correctly. The logic "1" CPU_OK control signal is input to the switch control circuitry 306 and 308 to indicate that the switches 302 and 304 can be safely activated to service the load 120. On the other hand, a logic "0" CPU_OK control signal indicates to the switch control circuitry 306 and 306 that the switches 320 and 304 should be deactivated or should not be activated (if deactivated at the time that CPU_OK is asserted to a logic "0" level). Upon reset of the processor 220 (e.g., a power-up reset or a forced reset due to a determined internal processor fault), the control signal CPU_OK is held at a logic "0" level until the processor 220 is reset and determined to be fully functional and operating as expected.

The software of the processor 220, as part of its normal operation, continuously monitors several points in the firmware to ensure that all subsystems of the processor 220 are properly operating as excepted. If all monitored points are determined to be operating correctly, then the Watchdog timer is serviced (e.g., counter is reset to the initial value). If any one of the monitored points is determined to be nonfunctional or operating incorrectly, the Watchdog timer will not be serviced, and the Watchdog timer will eventually reach its maximum count value. In some embodiments, the Watchdog timer has a count sequence with defines approximately 1 second of time. If the Watchdog timer is not serviced by the reset control software of the processor 220, the Watchdog timer will "fire" after ~1 second and reset the processor 220, which causes the CPU_OK control signal to transition to a logic "0" level. The transition of the CPU_OK signal from logic "1" to logic "0" triggers the switch control circuitry 306 and 308 to place the solid-state bidirectional switch 304 into a switched-off state, and place the air-gap electromagnetic switch 302 into a switched-open state.

Furthermore, in some embodiments, as part of the reset sequence of the processor 220, there is a hardware indication (designed into the processor 220) which indicates whether the processor reset was caused by a Watchdog timer reset or a power-on-reset. If the processor reset is caused by a power-on-reset, the firmware of the processor 220 will proceed with a normal startup initialization process. On the other hand, if the processor reset is triggered by the Watchdog timer, the firmware of the processor 220 will proceed with a "Recover from a Watchdog timer reset" initialization path instead of the normal startup initialization. To the user, a Watchdog timer reset appears like a normal over-current "Trip" condition (with communication to the cloud or a remote computing device that the processor reset was caused by an internal Watchdog timer reset).

With this reset sequence, the firmware will determine whether the number of consecutive Watchdog timer resets has exceeded a predefined threshold number (e.g., 5). If the number of consecutive Watchdog timer resets is determined to exceed the predefined threshold number, an internal failure or internal fault condition will be declared and the intelligent circuit breaker will be disabled until it is serviced and the counter is reset. In this instance, the processor firmware will declare an internal failure and report the error via cloud notification, status LEDs, and other available user interfaces, and not allow the intelligent circuit breaker to be manually turned ON until it is serviced. On the other hand, the intelligent circuit breaker can be manually reset following a Watchdog timer reset if the number of consecutive Watchdog timer resets has not exceeded the predetermined threshold number.

In other words, a Watchdog timer reset event appears like a "normal over-current trip" by design and is the result of the processor firmware which executes immediately following a reset. The processor firmware will determine if the processor reset was caused by the Watchdog timer, and if so, recovery is performed by emulating a "trip" event, with communication to the cloud indicating the Watchdog timer reset event, and allowing normal operation to continue once the air-gap switch 302 is placed into a switched-closed state either manually or automatically via a controls signal, if so provisioned. If the processor 220 is no longer functional once the Watchdog timer fires (or when power is (re)applied), the unit will be totally non-functional, with the AC to the load guaranteed to be OFF by design. In a rare case where the processor 220 becomes non-functional immediately following a Watchdog timer reset, there will be no communication of the event to the cloud, because the communication to the cloud is part of the "recovery" path during the initialization.

The exemplary embodiments of the intelligent circuit breakers of FIGS. 2A, 2B, 3A and 3B provide various advantages over conventional circuit breaker designs. For example, the implementation of voltage and current sensors, processors, and a wireless communications subsystem provide the ability of the intelligent circuit breaker to sense operating conditions of circuit breaker and load and wirelessly communicate which breaker has tripped making it far easier to identify within the circuit breaker panel. This may be extended with the addition of an LED signal at the front-panel controlled by a processor. The feature is enabled with the addition of the AC-to-DC converter circuit which remains powered during fault events.

Furthermore, intelligent circuit breakers are capable of saving time in life-safety applications such as when circuits are, or are nearly, over-loaded in hospitals and similar applications such as military command and control facilities. Maintenance technicians or electricians in such an environment can be wirelessly notified of an impending or existing fault with information to direct them to offending load without the local affected personnel having to reach out to maintenance for support. The speed at which the load is analyzed and cleared and the breaker re-energized, or prevented from opening, may be critical to the successful treatment of patients or the continuation of critical job functions. In some embodiments, wireless communication with an intelligent circuit breaker allows a technician or electrician to remotely re-energize the load using predetermined commands to remotely control the intelligent circuit breaker.

As a third example, the solid-state switch technology that is implemented in the intelligent circuit breakers of FIGS. 3A and 3B, for example, is capable of disconnecting a fault roughly 1000 times faster than the electro-mechanical equivalent in FIG. 1A, and with added reliability due to the arc-free non-moving nature of solid-state electronics. The added speed further reduces the likelihood of damage to a circuit, an electrical device, a load, fire, and personal harm. In some embodiments, the solid-state switch is opened in less than one cycle during the collapse of AC power that occurs during a short-circuit current at the load.

Figure 4A:
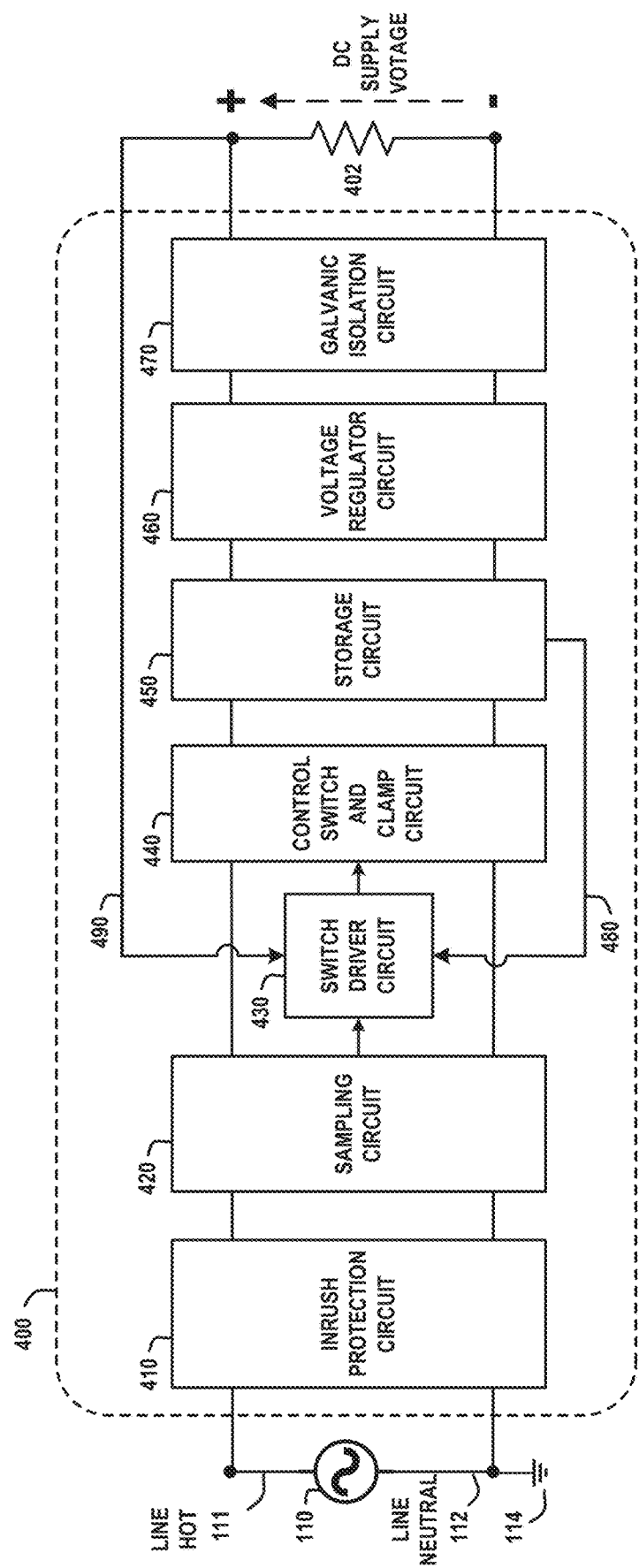
FIG. 4A is a schematic block diagram of an alternating current-to-direct current (AC-to-DC) converter circuit which can be implemented in an intelligent circuit breaker, according to an embodiment of the disclosure.

FIG. 4A is a schematic block diagram of an AC-to-DC converter circuit 400 which can be implemented in an intelligent circuit breaker, according to an embodiment of the disclosure. The AC-to-DC converter circuit 400 comprises an architecture which does not require a rectifier to generate DC voltage. The AC-to-DC converter circuit 400 comprises an inrush protection circuit 410, a sampling circuit 420, a switch driver circuit 430, a control switch and clamp circuit 440, a storage circuit 450, a voltage regulator circuit 460, and a galvanic isolation circuit 470. The AC-to-DC converter circuit 400 generates a DC supply voltage that is applied to load circuitry 402.

The inrush protection circuit 410 is configured to limit the magnitude of input current to the AC-to-DC converter circuit 400. The sampling circuit 420 is configured to sample the AC supply voltage waveform of AC mains 110. The sampling circuit 420 outputs sampled voltages to the switch driver circuit 430. The switch driver circuit 430 is configured to apply a control voltage to a control switch of the control switch and clamp circuit 440. The control switch and clamp circuit 440 is configured to supply power to the storage circuit 450 in response to the control voltage applied by the switch driver circuit 430. The storage circuit 450 comprises a voltage storage element (e.g., capacitor) that is configured to store a DC voltage that is applied to the voltage regulator circuit 460. The voltage regulator circuit 460 is configured to generate a regulated DC supply voltage to the load circuitry 402.

In some embodiments, the switch driver circuit 430 receives a feedback voltage 480 from the storage circuit 450 and generates the control voltage that is applied to the control switch and clamp circuit 440 based, at least in part, on the feedback voltage 480. In some embodiments, the feedback voltage 480 can be eliminated, and the AC-to-DC converter circuit 400 operates as a feed forward converter in which the storage element of the storage circuit 450 is controlled from the forward side elements 420, 430 and 440.

In some embodiments, the AC-to-DC converter circuitry 400 implements a feedback control circuit 490 from the load circuitry 402 to the switch driver circuit 430 to support both feed forward and feedback control. In some embodiments, the balance of feed forward and feedback control is determined by the feedback voltage 480 and the selection of components in the sampling circuitry 420. In some embodiments, a balance between feedforward and feedback control is configured according to resistor elements in the sampling circuitry 420 and the feedback voltage 480. In other embodiments, variable elements are utilized to enable adjustment of the feedforward and feedback control. In such embodiments, the feedback circuit 490 would comprise galvanic isolation between the switch driver circuit 430 and the load circuitry 402.

Figure 4B:
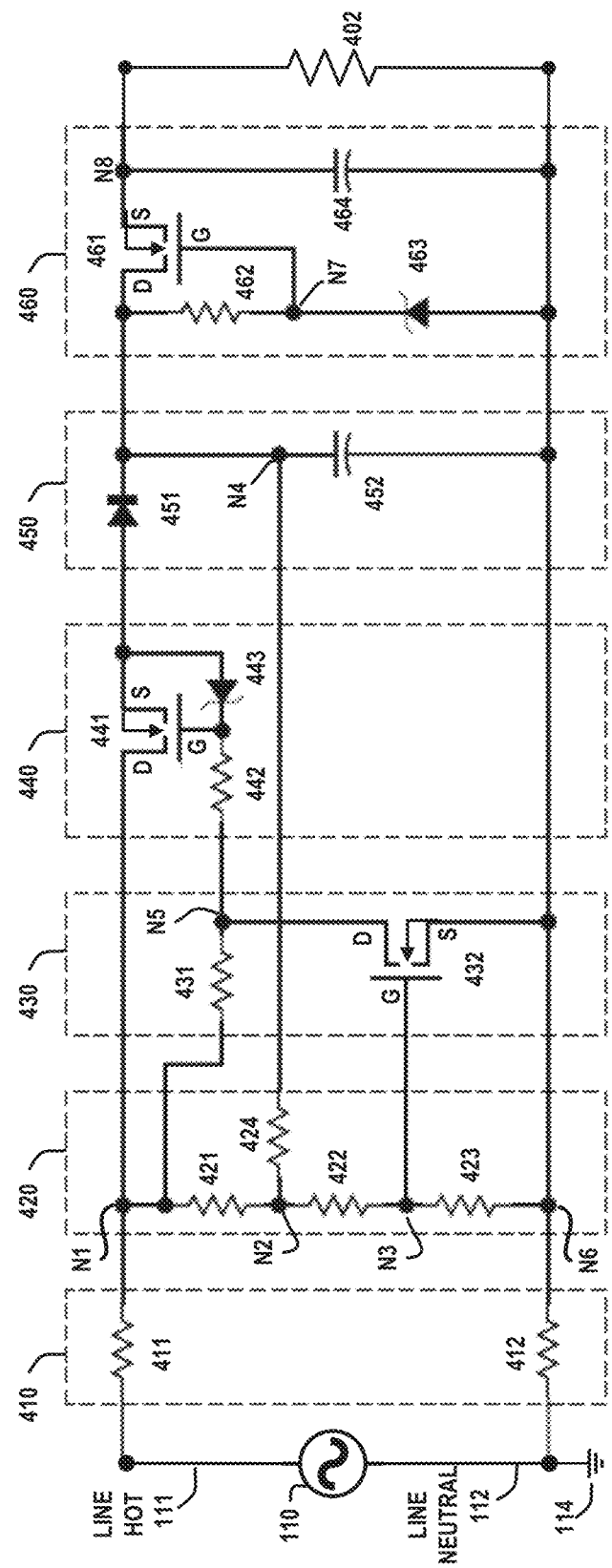
FIG. 4B is a schematic circuit diagram of the AC-to-DC converter circuit of FIG. 4A, according to an embodiment of the disclosure.

FIG. 4B is a schematic circuit diagram of the AC-to-DC converter circuit of FIG. 4A, according to an embodiment of the disclosure. In the exemplary embodiment of FIG. 4B, the inrush protection circuitry 410 comprises a first input resistor 411 connected to the line hot 111 of the AC mains 110 and a second input resistor 412 connected to the line neutral 112 of the AC mains 110. In other embodiments, for high-power and high-efficiency applications, the inrush protection circuitry 410 comprises switch elements that are configured to allow current to flow through the resistors 411 and 412 at startup, and then bypass the resistors 411 and 412 once steady state operation is reached. In other embodiments, the inrush protection circuitry 410 comprises first and second inductor elements in place of the first and second resistors 411 and 412.

The sampling circuitry 420 comprises a plurality of resistors 421, 422, 423, and 424 which are connected to various nodes N1, N2, N3, and N4 as shown. The resistors 421, 422, and 423 form a voltage divider network for sampling the input AC waveform, wherein the voltage divider network comprises a feedback node N2 and an output node N3. The resistor 424 is connected between the feedback node N2 and an output node N4 of the storage circuitry 450 to provide a feedback voltage from the storage capacitor 452. The switch driver circuitry 430 comprises a resistor 431 connected between nodes N1 and N5, and a switch element 432. The control switch and clamp circuitry 440 comprises a control switch element 441, a resistor 442, and a Zener diode 443. The storage circuitry 450 comprises a diode 451 and a storage capacitor 452. The voltage regulator circuitry 460 comprises a switch element 461, a resistor 462, a Zener diode 463, and a capacitor 464.

In some embodiments, the switch elements 432, 441 and 461 comprise n-type enhancement MOSFET devices with gate G, drain D and source S terminals as shown in FIG. 4B. In other embodiments, the switch elements 432, 441 and 461 may be implemented using bipolar transistors or microelectromechanical switches. As shown in FIG. 4B, the switch element 443 comprises a gate terminal G connected to the output node N3 of the voltage divider network of the sampling circuitry 420, a drain terminal D connected to an output node N5 of the switch driver circuitry 430, and a source terminal S connected to an output node N3 of the inrush protection circuitry 410. The drain terminal D of the switch element 432 is coupled to the output node N1 of the inrush protection circuitry 410 through the resistor 431.

The control switch 441 comprises a drain terminal D connected to the output node N1 of the inrush circuitry 410, a gate terminal G connected to the output node N5 of the switch driver circuitry, and a source terminal S connected to an input (i.e., anode of diode 451) of the storage circuitry 450. The Zener diode 443 is connected between the gate terminal G and source terminal S of the control switch 441, with a cathode of the Zener diode 443 connected to the gate terminal G of the control switch 441 and an anode of the Zener diode 443 connected to the source terminal S of the control switch 441.

The switch element 461 of the voltage regulator circuitry 460 comprises a drain terminal D connected to the output node N4 of the storage circuitry 450, a gate terminal G connected to a node N7 between the resistor 462 and the Zener diode 463, and a source terminal S connected to an output node N8 of the voltage regulator circuitry 460. The capacitor 464 is connected between the output node N8 of the voltage regulator circuitry 460 and the output node N6 of the inrush protection circuitry 410.

The resistor 424 (or sense resistor) is connected between the output node N4 of the storage circuitry 450 to provide a feedback voltage that is applied to the feedback node N2 of the sampling circuitry 420 through the resistor 424. The feedback path provided by the connection of the resistor 424 between nodes N4 and N2 provides an exemplary embodiment of the feedback voltage 480 as shown in FIG. 4A, wherein the charge of the storage capacitor 452 is utilized, in part, to generate a control voltage at the output node N3 of the sampling circuitry 420 connected to the gate terminal G of the switch element 432 of the switch driver circuitry 430.

The switch element 432 is driven by a gate control voltage generated at the output node N3 of the voltage divider network of the sampling circuitry 420. The gating of the switch element 432 controls operation of the control switch 441 of the switch driver circuitry 430. The resistance values of the resistors 421, 422, 423, and 424 are selected such that the voltage on node N3 of the voltage divider network, which is applied to the gate terminal G of the switch element 432 in the switch driver circuitry 430, will turn the switch element 432 ON and OFF and thereby synchronously turn the control switch element 441 OFF and ON. The control switch element 441 is thereby driven to output a preselected timed output pulse to charge the storage capacitor 452.

The peak output current of the control switch 441 is clamped to a preselected value based on a preselected value of the Zener voltage (i.e., reverse breakdown voltage) of the Zener diode 443, wherein the maximum gate-to-source voltage ($V_{GS}$) is limited by the Zener voltage of the Zener diode 443. The pulsed output from the control switch 441 operates to turn on the diode 451 and supply charge to the node N4 to charge the storage capacitor 452. The feedback provided by the resistor 424 connected between the output node N4 of the storage circuitry 450 and the feedback node N2 of the sampling circuitry 420 serves to drive the switch driver circuit 430 to maintain the storage capacitor 452 to a constant charge.

The switch element 432 and control switch 441 are activated, either opened or closed, in synch with the AC voltage input. The AC-to-DC converter circuit 400 provides a low voltage output with pulse modulation at the frequency of the incoming AC source. The switches 432 and 441 are activated, either opened or closed, at voltages that are near, within the threshold voltages for the switches 432 and 441, of the zero crossing of the AC source. The output node N4 of the storage circuitry 450 is applied to an input of the voltage regulator circuitry 460 and then the load circuit 402. The capacitor 464 provides storage capacity to buffer and thereby smooth the output from the AC-to-DC converter 400 to the load circuitry 402.

In summary, the exemplary AC-to-DC converter circuits 400 as shown in FIGS. 4A and 4B comprise the inrush protection circuit 410, the voltage sampling circuit 420, the switch driver circuit 430, the control switch and clamp circuit 440, the storage circuit 450, and the voltage regulator circuit 460. The selection of components in the voltage sampling circuit 420 determine the timing of the switch driver 430. The selection of components of the control switch and clamping circuit 440 determine a peak voltage and current for out pulses. Power output is controlled by selection of both the peak current and the pulse timing. Feedback from the storage element 452 through the voltage sampling circuit 420 is utilized to select the pulse timing. The AC-to-DC converter circuit 400 operates in sync with the AC voltage waveform of the AC mains 110.

In other embodiments, the AC-to-DC converter circuitry shown in FIGS. 2A, 2B, 3A, and 3B (and other embodiments of intelligent circuit breakers as discussed below) can be implemented using the same or similar DC power conversion techniques as disclosed in the following co-pending applications: (1) U.S. patent application Ser. No. 16/092, 263, filed on Oct. 9, 2018 (Pub. No.: US 2019/0165691), entitled High-Efficiency AC to DC Converter and Methods; and (2) U.S. patent application Ser. No. 16/340,672, filed on Apr. 9, 2019 (Pub. No.: US 2019/0238060), entitled High-Efficiency AC Direct to DC Extraction Converter and Methods, the disclosures of which are all fully incorporated herein by reference.

Figure 5:
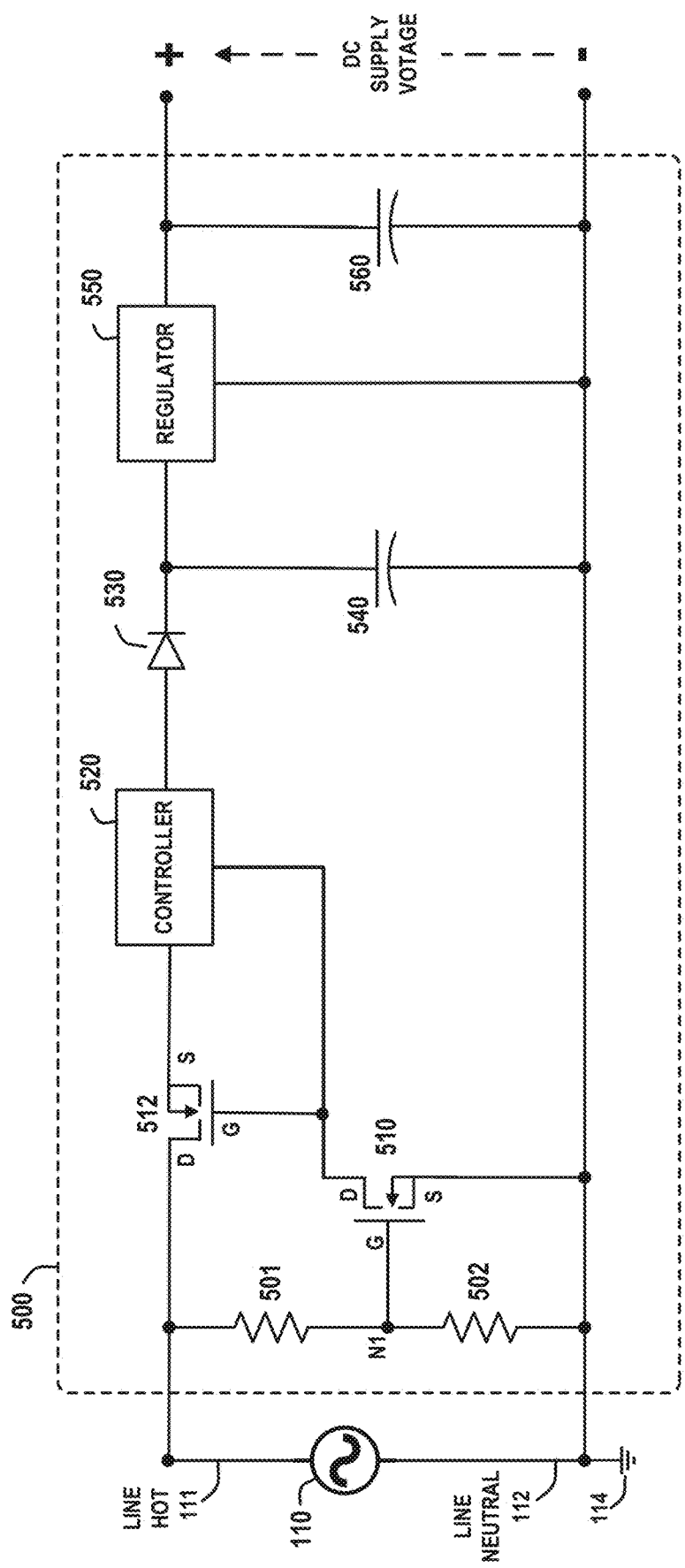
FIG. 5 is a schematic circuit diagram of an AC-to-DC circuit which can be implemented in an intelligent circuit breaker, according to an embodiment of the disclosure.

FIG. 5 is a schematic circuit diagram of an AC-to-DC converter circuit 500 which can be implemented in an intelligent circuit breaker, according to another embodiment of the disclosure. In particular, FIG. 5 schematically illustrates an exemplary embodiment of a sample and hold AC-to-DC converter circuit 500 which can be implemented using techniques as disclosed in U.S. patent application Ser. No. 16/029,546, filed on Jul. 7, 2018, entitled Method and Apparatus for Signal Extraction with Sample and Hold and Release, the disclosure of which is fully incorporated herein by reference. The AC-to-DC converter circuit 500 is configured to generate a DC supply voltage from an AC voltage waveform of the AC mains 110. The AC-to-DC converter circuit 500 comprises first and second resistors 501 and 502, a first switch 510, a second switch 512, a controller 520, a diode 530, a storage capacitor 540, a voltage regulator 550, and an output capacitor 560. In the exemplary embodiment of FIG. 5, the first and second switches 510 and 512 comprise N-type enhancement MOSFETS having gate terminals G, drain terminals D, and source terminals S as shown.

The resistors 501 and 502 form a voltage divider circuit having an output node N1 that drives the gate terminal G of the first switch 510. The source terminal S of the first switch 510 is connected to neutral/ground 114, and the drain terminal D of the first switch 510 is connected to the gate terminal G of the second switch 512 and to the controller 520. The drain terminal D of the second switch 512 is connected to the line hot 111, and the source terminal S of the second switch 512 is connected to an input of the controller 520. The controller 520 has an output that is connected to an anode of the diode 530. The diode 530 and the storage capacitor 540 form a storage circuit similar to that shown in FIG. 4B. In addition, the voltage regulator 550 and the output capacitor 560 form a voltage regulator circuit similar to that shown in FIG. 4B.

Figure 6A:
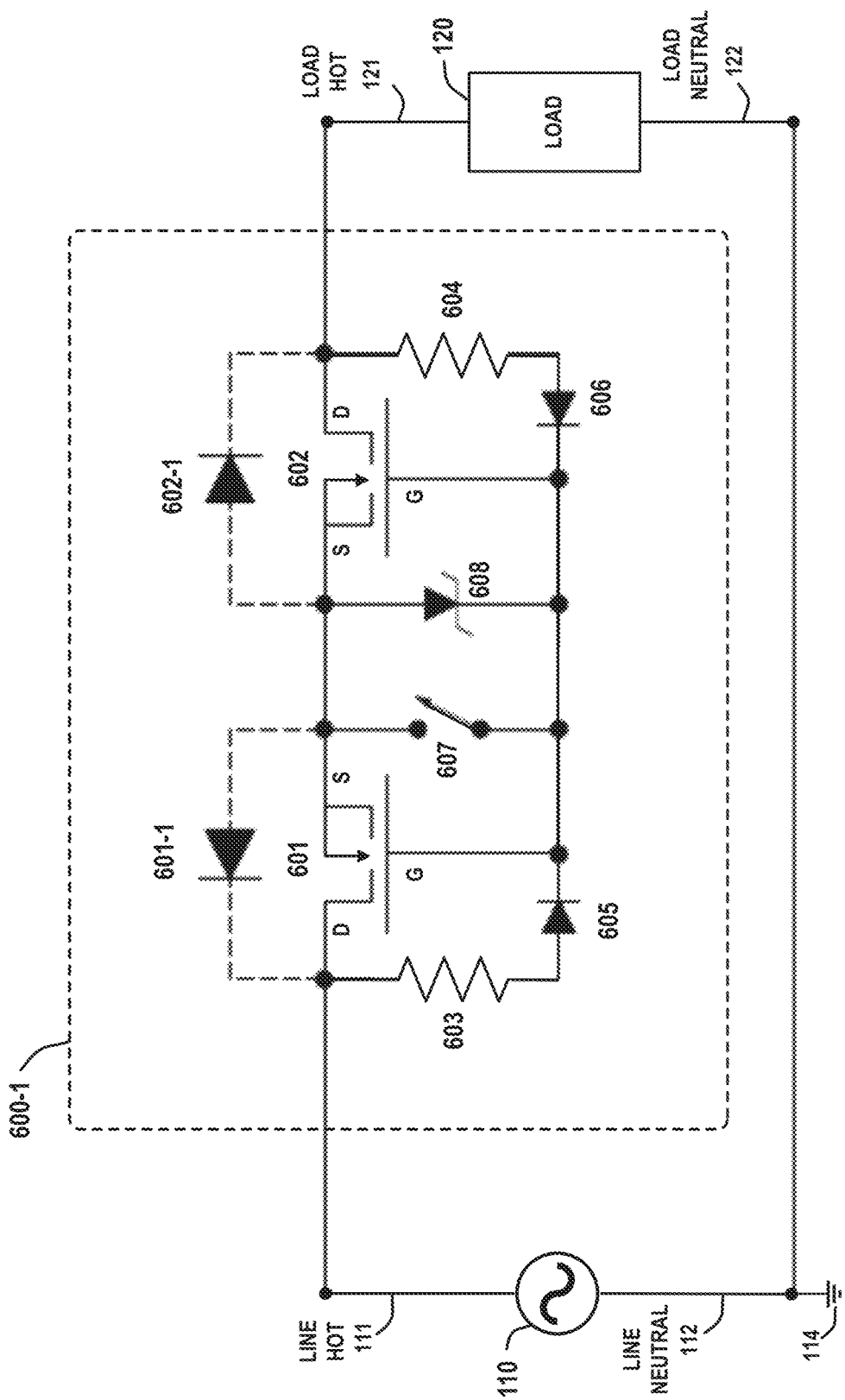
FIG. 6A is a schematic circuit diagram of a solid-state bidirectional switch that can be implemented in an intelligent circuit breaker, according to an embodiment of the disclosure.

Exemplary embodiments of the solid-state bidirectional switch 304 as shown in FIGS. 3A and 3B (and as implemented in other exemplary embodiments discussed below) will now be discussed in further detail in conjunction with FIGS. 6A through 6H. For example, FIG. 6A is a schematic circuit diagram of a solid-state bidirectional switch 600-1 that can be implemented in an intelligent circuit breaker, according to an embodiment of the disclosure. In particular, FIG. 6A illustrates an exemplary embodiment of the solid-state bidirectional switch 304 shown in FIGS. 3A and 3B for controlling AC power delivered from the AC mains 110 to the load 120. The solid-state bidirectional switch 600-1 is configured to allow a bidirectional flow of current between the AC mains 110 and load 120 (i.e., conduct positive current or negative current) when the solid-state bidirectional switch 600-1 is in switched-on state, and block positive or negative current flow between the AC mains 110 and the load 120 when the solid-state bidirectional switch 600-1 is in a switched-off state.

The solid-state bidirectional switch 600-1 comprises a first MOSFET switch 601 and a second MOSFET switch 602 which are connected back-to-back in series along the hot line path between the line hot 111 and the load hot 121. In some embodiments, the first and second MOSFET switches 601 and 602 comprise power MOSFET devices and, in particular, N-type enhancement MOSFET devices, having gate terminal (G), drain terminals (D), and source terminals (S) as shown. In the exemplary embodiment of FIG. 6A (and other embodiments discussed herein), the solid-state bidirectional switch 600-1 is implemented using two N-channel MOSFET switches 601 and 602 with commonly connected source terminals.

The first and second MOSFET switches 601 and 602 comprises intrinsic body diodes 601-1 and 602-1, respectively, which represent the P-N junctions between the P-type substrate body to N-doped drain regions of the MOSFET devices. The body diodes 601-1 and 602-1 are intrinsic elements of the MOSFET switches 601 and 602 (i.e., not discrete elements) and, thus, are shown with dashed-line connections. It is to be noted that the intrinsic body-to-source diodes of the MOSFET switches 601 and 602 are not shown as they are shorted out by the connections between the source regions and the substrate bodies (e.g., N+ source and P body junction are shorted through source metallization).

The solid-state bidirectional switch 600-1 further comprises first and second resistors 603 and 604, first and second rectifier diodes 605 and 606, a Zener diode 608, and a single pole, single throw (SPST) switch element 607. The first resistor 603 and the first rectifier diode 605 are serially connected between the drain terminal (D) and the gate terminal (G) of the first MOSFET switch 601. The second resistor 604 and the second rectifier diode 606 are serially connected between the drain terminal (D) and gate terminal (G) of the second MOSFET switch 602. The switch 607 and the Zener diode 608 are connected in parallel between the commonly connected source terminals (S) and the commonly connected gate terminals (G) of the first and second MOSFET switches 601 and 602, wherein an anode of the Zener diode 608 is connected to the source terminals, and a cathode of the Zener diode 608 is connected to the gate terminals.

The Zener diode 608 comprises a reverse breakdown voltage (referred to as "Zener voltage" $V_Z$) which is greater than a threshold voltage, $V_T$, of the power MOSFET switches 601 and 602. During a switched-on state of the solid-state bidirectional switch 600-1, the Zener diode 608 is "reversed" biased through a first bias branch circuit comprising the serially-connected first resistor 603 and first rectifier diode 605 or through a second bias branch circuit comprising the serially-connected second resistor 604 and second rectifier diode 606. The first and second rectifier diodes 605 and 606 are coupled to the drain terminals D of the power MOSFET switches 601 and 602, respectively, and protected by the first and second resistors 603 and 604 which serve to limit an amount of current that flows through the first and second rectifier diodes 605 and 606, respectively.

The solid-state bidirectional switch 600-1 generally operates as follows. When the switch 607 is in an "open" state as shown in FIG. 6A, the first bias branch (603-605) and the second bias branch (604-606) provide "reverse bias" for the Zener diode 608 when either drain terminal D exceeds the Zener voltage, thereby placing the power MOSFET switches 601 and 602 in an "on" state. When the switch 607 is in a "closed" state, the switch 607 shunts the bias current from the first and second bias branches (603-605) and 604-608 to the source S terminals of the power MOSFET switches 601 and 602, which causes the MOSFET switches 601 and 602 to be placed in an "off" state. In this circuit configuration, a "turn-on" time constant is dictated by the value of the current limiting resistors 603 and 604 and the gate-to-source capacitance of the power MOSFET switches 601 and 602, while a "turn-off" time constant is dictated by the intrinsic capacitances of the MOSFET switches 601 and 602 and the on-resistance of switch 607. The "turn-on" and "turn-off" time constants can be designed to be much shorter than the period of the AC mains 110, which allows the solid-state bidirectional switch 600-1 to operate in both an on-off and a phase-control mode. In practice, however, the Zener diode 608 may never reach its Zener voltage, and the gate-source voltage of the MOSFET switches 601 and 602 will rarely exceed the threshold voltage, $V_T$. Thus, neither MOSFET switch 601 and 602 may be fully "on" resulting in excess power dissipation in the units and reduced current supplied to the load 120.

Figure 6B:
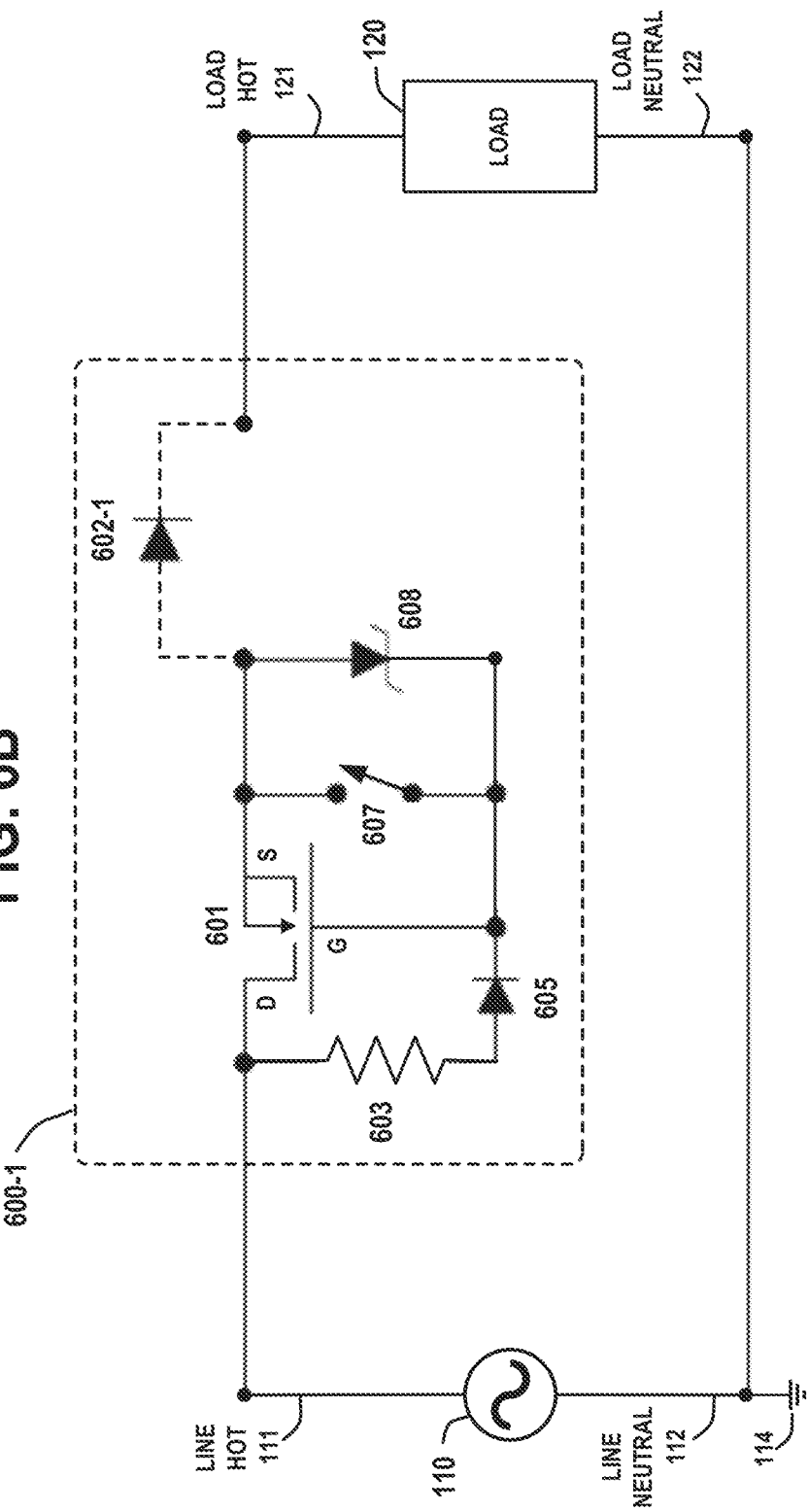
FIG. 6B illustrates active elements of the solid-state bidirectional switch of FIG. 6A during a positive half cycle of an AC mains supply voltage applied to the solid-state bidirectional switch.

FIG. 6B illustrates active elements of the solid-state bidirectional switch 600-1 of FIG. 6A during a positive half cycle of the supply voltage waveform of the AC mains 110 applied to the solid-state bidirectional switch 600-1. When the switch 607 is in an open state to allow the first MOSFET switch 601 to turn on, the gate voltage of the first MOSFET switch 601 begins to follow the positive excursion of the supply voltage waveform of the AC mains 110 when the supply voltage increases from zero volts. When the gate voltage reaches the threshold voltage of first MOSFET switch 601, current begins to flow to the load 120 and the body diode 602-1 of the second MOSFET switch 602 is forward biased. The source voltage of first MOSFET switch 601 "follows" the increasing gate voltage, but lagging behind by the value of the threshold voltage plus an additional bias to account for the current supplied to the load 120. This condition is maintained until the voltage waveform of AC mains 110 becomes negative. Consequently, the drain-to-source voltage of first MOSFET switch 601 never falls below the threshold voltage, regardless of the drain-to-source resistance of the first MOSFET switch 601, such that the power dissipated in the first MOSFET switch 601 is $(I_D \times V_T)$, where $I_D$ is the drain current. If the gate voltage is boosted well beyond the threshold voltage, the dissipated power is given by $(I_D^2 \times r_{ds})$, where $r_{ds}$ is the "on" resistance of the first MOSFET switch 601, wherein the value of $(I_D^2 \times r_{ds})$ can be significantly smaller than the value of $(I_D \times V_T)$.

On the other hand, during a negative half-cycle of the supply voltage waveform of the AC mains 110 applied to the solid-state bidirectional switch 600-1, the active components of the solid-state bidirectional switch 600-1 include the body diode 601-1 of the first MOSFET switch 601, the Zener diode 608, the second MOSFET switch 602, and the second branch elements 604 and 606. The gate voltage of the second MOSFET switch 602 starts at 0V and begins to follow the source voltage negative once the source voltage drops to the negative threshold voltage ($-V_T$) wherein current begins to flow through the load 120 and the body diode 601-1 of the first MOSFET switch 601 is forward biased. The drain voltage of the second MOSFET switch 602 is effectively clamped to the gate voltage, so that the drain-to-source voltage Vis remains at $-V_T$ until the supply voltage waveform of the AC mains 110 becomes positive. Consequently, VDS of the second MOSFET switch 602 never falls below the threshold voltage except around the zero-crossing of the power supply voltage waveform of the AC mains 110, regardless of the drain-to-source resistance of the second MOSFET switch 602, and the power dissipated is $(I_D \times V_T)$ in the negative half-cycle.

Figure 6C:
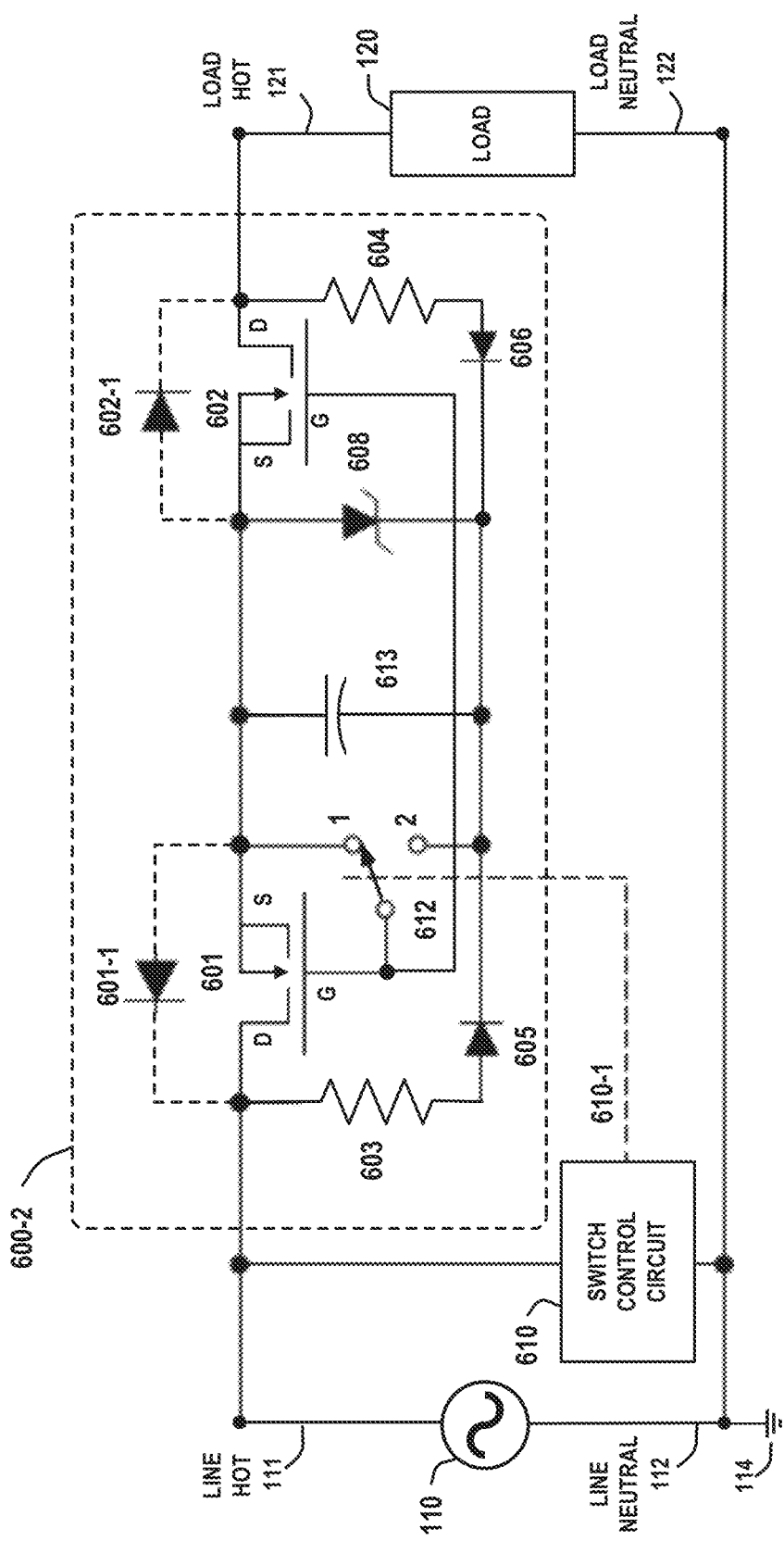
FIG. 6C is a schematic circuit diagram of a solid-state bidirectional switch that can be implemented in an intelligent circuit breaker, according to another embodiment of the disclosure.

FIG. 6C is a schematic circuit diagram of a solid-state bidirectional switch 600-2 that can be implemented in an intelligent circuit breaker, according to another embodiment of the disclosure. The solid-state bidirectional switch 600-2 is similar in circuit configuration to the solid-state bidirectional switch 600-1 of FIG. 6A, except that the solid-state bidirectional switch 600-2 implements a single pole, double-throw (SPDT) switch element 612 in place of the SPST switch 607, and further comprises a capacitor 613 that is connected in parallel with the Zener diode 608. The double pole switch 612 is controlled by a switch control circuit 610 which is coupled to the double pole switch 612 by a control line 610-1. In some embodiments, the switch control circuit 610 comprises an embodiment of the switch control circuitry 308 shown in FIGS. 3A and 3B. The switch control circuit 610 operates the double pole switch 612 to selectively connect the gate G terminals of the first and second MOSFET switches 601 and 602 to (i) the source S terminals of the first and second MOSFET switches 601 and 602 ("position 1") or to (ii) bias circuitry comprising the first and second resistors 603 and 604, the first and second rectifier diodes 605 and 606, and the capacitor 613 ("position 2").

When the switch 612 is set to position 1, the first and second MOSFET switches 601 and 602 are maintained in an "off" state. The switch control circuit 610 is configured to maintain the switch 612 in position 1 until the supply voltage waveform of the AC mains 110 exceeds a pre-established trigger level, $V_{TRIG}$, whereupon the switch 612 is set to position 2. In this instance, during a positive half cycle of the AC mains 110, the switch control circuit 610 operates the switch 612 to maintain the first and second MOSFET switches 601 and 602 in an "off" state until the AC supply voltage waveform reaches $V_{TRIG}$, which allows the bias circuitry 603, 605, 613 to charge to $V_{TRIG}$ while the source S terminal of the first MOSFET switch 601 remains at 0 volts.

When switch 612 is placed into position 2, the bias voltage, $V_{TRIG}$, is applied to the gate terminal of the first MOSFET switch 601, whereby the bias voltage value can be much larger than the threshold voltage, $V_T$. The source terminal of first MOSFET switch 601 begins charging towards $V_{TRIG}-V_T$, and part of this voltage step is coupled to the gate terminal of the first MOSFET switch 601 through the capacitor 613. This increases the gate bias well beyond $V_{TRIG}$ so that it exceeds the AC source 601 voltage value. Thus, the first MOSFET switch 601 reaches a state where the drain-to-source voltage is nearly zero, while the gate-to-source voltage is larger than $V_{TRIG}$. In this state, the first MOSFET switch 601 exhibits its minimum channel resistance, $R_{DS}$, and maximum voltage appears across load 120.

Figure 6D:
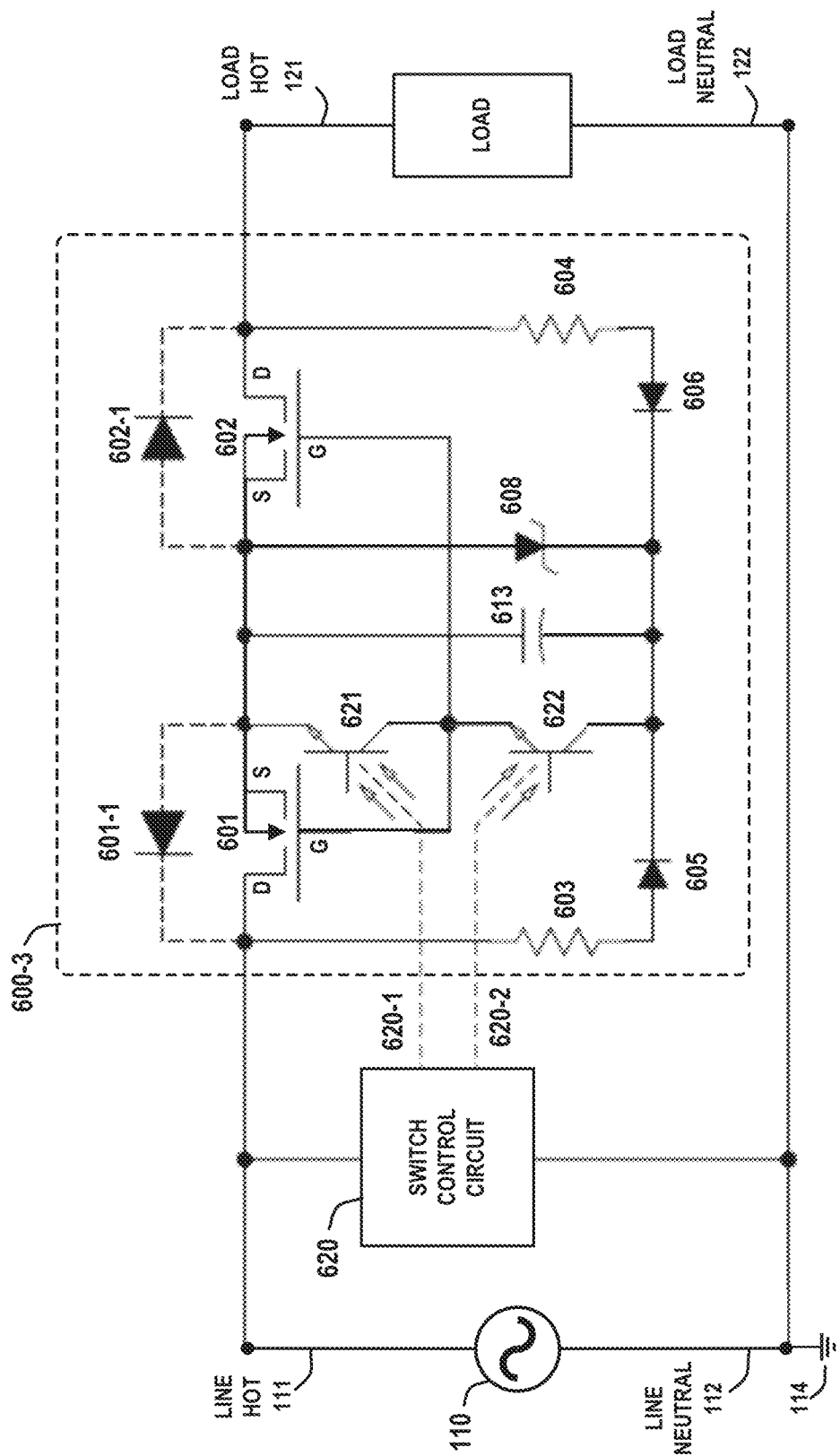
FIG. 6D is a schematic circuit diagram of a solid-state bidirectional switch that can be implemented in an intelligent circuit breaker, according to another embodiment of the disclosure.

FIG. 6D is a schematic circuit diagram of a solid-state bidirectional switch 600-3 that can be implemented in an intelligent circuit breaker, according to another embodiment of the disclosure. The solid-state bidirectional switch 600-3 is similar in circuit configuration to the solid-state bidirectional switch 600-2 of FIG. 6C, wherein the double pole switch 612 is implemented using first and second control switches 621 and 622 that are controlled by a switch control circuit 620. The switch control circuit 620 comprises a first control line 620-1 that is coupled to the first control switch 621, and a second control line 620-2 that is coupled to the second control switch 622. In some embodiments, the first and second control switches 621 and 622 comprise phototransistors (e.g., optical bipolar junction transistors).

The switch control circuit 620 monitors the voltage level of the supply voltage waveform on the line hot path 111. While the voltage level remains below the predetermined trigger level trigger level, $V_{TRIG}$, the switch control circuit 620 outputs an optical control signal on the control line 620-1 to drive the first control switch 621 (i.e., maintain switch 621 in an "on" state), while the second control switch 622 is maintained in an off state. On the other hand, when the voltage level exceeds the predetermined trigger level trigger level, $V_{TRIG}$, the switch control circuit 620 outputs an optical control signal on the control line 620-2 to drive the second control switch 622 (i.e., maintain the second control switch 622 in an "on" state), while the first control switch 621 is maintained in an off state. In some embodiments, the switch control circuit 620 is configured such that the optical drive control signal outputs 620-1 and 620-2 do not overlap, thereby providing a "break before make" switch characteristic, which avoids discharging the capacitor 613 prematurely.

Figure 6E:
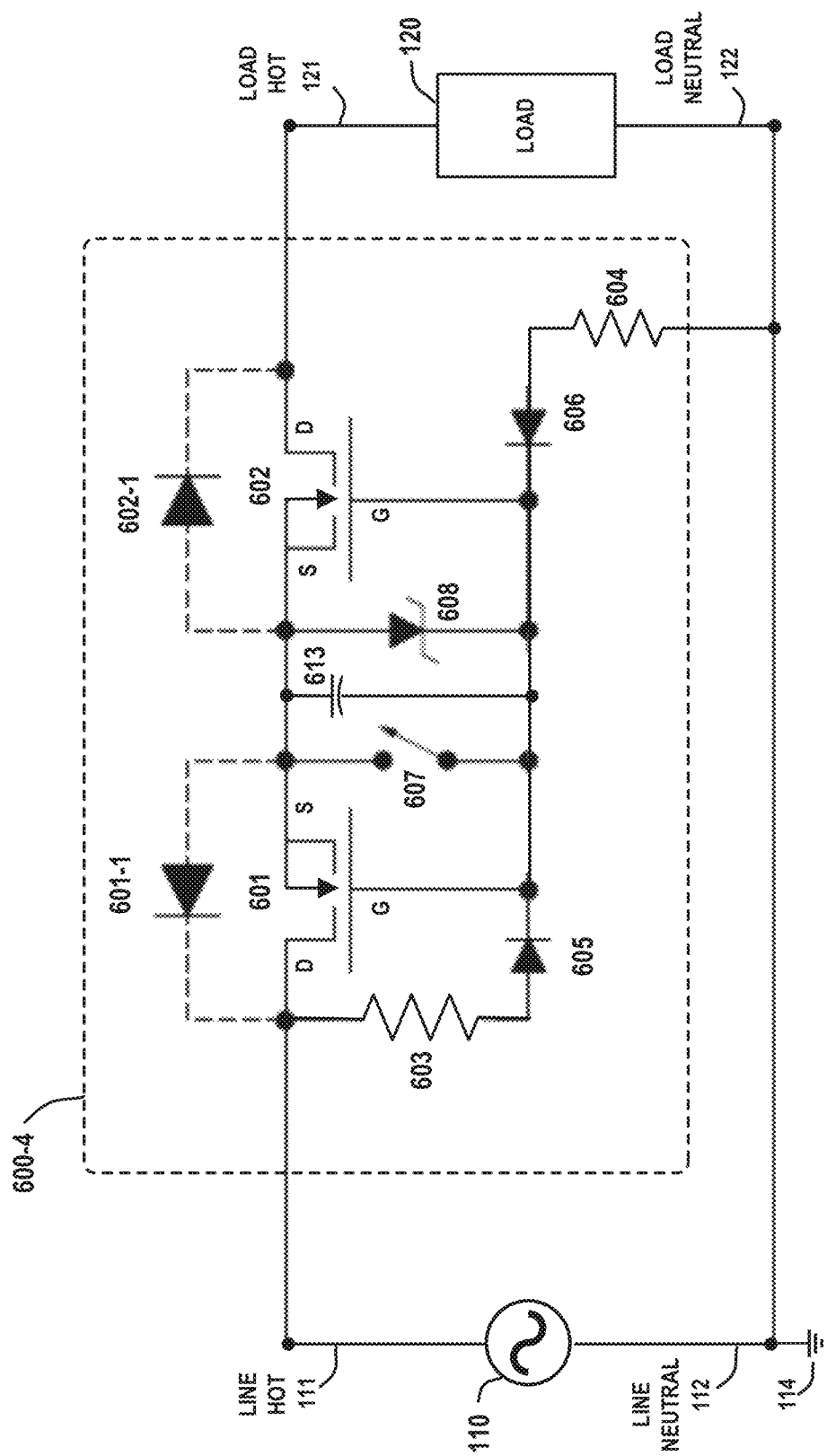
FIG. 6E is a schematic circuit diagram of a solid-state bidirectional switch that can be implemented in an intelligent circuit breaker, according to another embodiment of the disclosure.

FIG. 6E is a schematic circuit diagram of a solid-state bidirectional switch 600-4 that can be implemented in an intelligent circuit breaker, according to another embodiment of the disclosure. The solid-state bidirectional switch 600-4 is similar in circuit configuration to the solid-state bidirectional switch 600-1 of FIG. 6A, except that the solid-state bidirectional switch 600-4 comprises a capacitor 613 that is connected in parallel with the Zener diode 608, and wherein the second biasing branch comprising the second resistor 604 and the second rectifier diode 606 is connected to the line neural 112 of the AC mains 110, as opposed to being connected to the drain terminal D of the second MOSFET switch 602.

The configuration of the solid-state bidirectional switch 600-4 avoids the clamping action that occurs for the configuration of FIG. 6A and allows the Zener diode 608 to reach its Zener voltage, $V_Z$, when the source terminal S of the second MOSFET switch 602 falls to $-V_Z$. This causes the gate-to-source voltage of second MOSFET switch 602 to be $V_Z$ which can be significantly larger than $V_T$, which results in a relatively small thereby exhibiting a small drain-source resistance value ($R_{DS}$) and decreasing power dissipation. Furthermore, the boosted gate-to-source bias is stored on the intrinsic gate-to-source capacitances of the MOSFET switches 601 and 602 and the capacitor 613, and is maintained during the subsequent positive half-cycle of the supply voltage waveform of the AC mains 110. Thus, both MOSFET switches 601 and 602 remain in minimum $R_{DS}$ configurations until the switch 607 is closed.

The first resistor 603 and the first rectifier diode 605 (bias branch elements) are maintained to improve the initial turn-on characteristics during a positive half-cycle, and the additional capacitor 613 in parallel with the intrinsic gate-to-source capacitances of MOSFET switches 601 and 602 allows the storage of the boosted gate-to-source bias voltage to be more robust. When the solid-state bidirectional switch 600-4 is utilized in a phase-control mode, the switch 607 is closed for a predetermined period during each cycle of the supply voltage waveform of the AC mains 110. Since the capacitor 613 is discharged through the switch 607 while the switch 607 is closed, the gate-to-source bias required to turn on the MOSFET switches 601 and 602 must be re-established during each cycle. This results in the first MOSFET switch 601 operating in a suboptimal mode if the switch 607 opens during the positive half cycle of the voltage waveform of the AC mains 110 since the boost provided during the negative half cycle is reset when the switch 607 is closed.

Figure 6F:
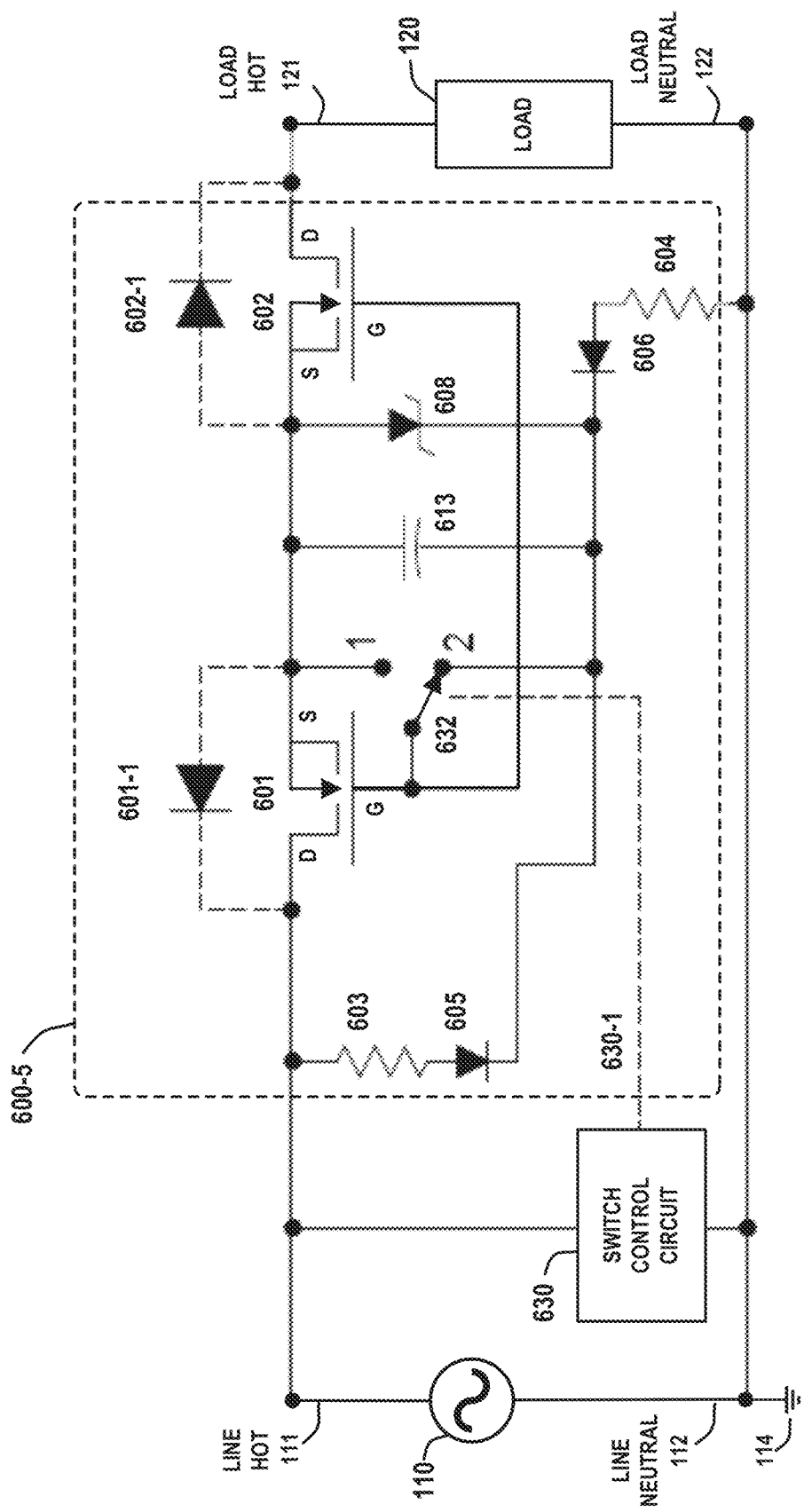
FIG. 6F is a schematic circuit diagram of a solid-state bidirectional switch that can be implemented in an intelligent circuit breaker, according to another embodiment of the disclosure.

FIG. 6F is a schematic circuit diagram of a solid-state bidirectional switch 600-5 that can be implemented in an intelligent circuit breaker, according to another embodiment of the disclosure. The solid-state bidirectional switch 600-5 is similar in circuit configuration to the solid-state bidirectional switch 600-4 of FIG. 6E, except that the solid-state bidirectional switch 600-5 implements a SPDT switch 632 in place of the SPST switch 607, and wherein the gate terminals of the first and second MOSFET switches 601 and 602 are directly connected to the input of the SPDT switch 632. The SPDT switch 632 is controlled by a switch control circuit 630 which is coupled to the SPDT switch 632 by a control line 630-1. In some embodiments, the switch control circuit 630 comprises an embodiment of the switch control circuitry 308 shown in FIGS. 3A and 3B. The switch control circuit 630 operates the SPDT switch 632 to selectively connect the gate terminals of the MOSFET switches 601 and 602 to either (i) the commonly connected source terminals S of the MOSFET switches 601 and 602 ("position 1") or (ii) to the Zener diode bias circuit comprising the resistors 603 and 604, the rectifier diodes 605 and 606, and the capacitor 613 ("position 2").

More specifically, in this circuit configuration, activating the switch 632 into position 1 causes the MOSFET switches 601 and 602 to turn "off" by disconnecting the gate terminals of the MOSFET switches 601 and 602 from the Zener diode bias circuit and shorting out $V_{GS}$ of the first and second MOSFET switches 601 and 602 This allows the capacitor 613 to charge to the Zener voltage of the Zener diode 608 until the capacitor 613 is either discharged through the external circuitry or until the switch 632 is placed into position 2, resulting in re-application of the stored Zener voltage to the gate terminals and the subsequent refreshing of the gate-to-source bias voltage during a negative half-cycle. In some embodiments, once charged, the capacitor 613 will never fully discharge no matter the phase or the position of the switch 632 as long as the values of the resistors 603 and 604 and the capacitor 613 are selected properly, until AC power is removed.

Figure 6G:
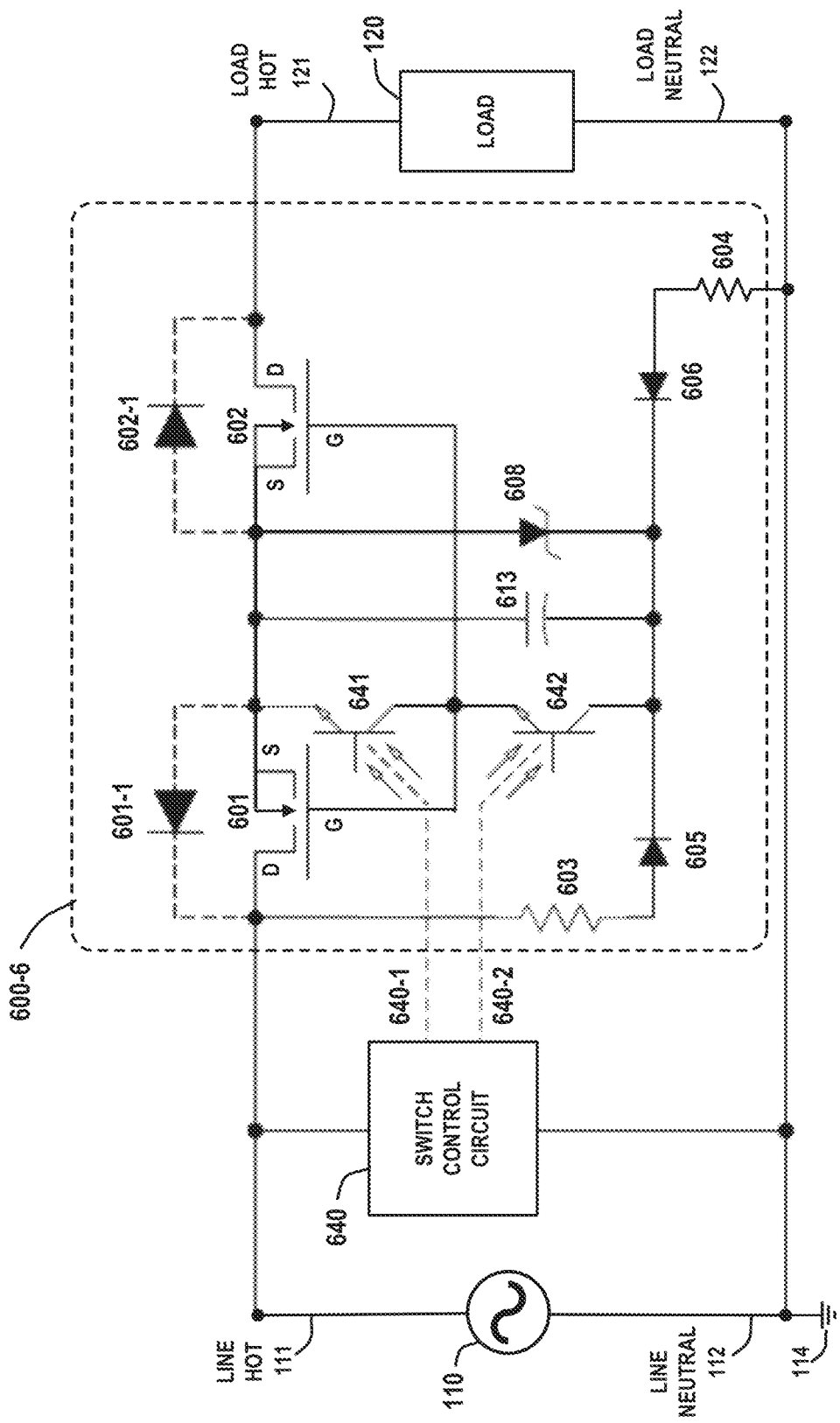
FIG. 6G is a schematic circuit diagram of a solid-state bidirectional switch that can be implemented in an intelligent circuit breaker, according to another embodiment of the disclosure.

FIG. 6G is a schematic circuit diagram of a solid-state bidirectional switch 600-6 that can be implemented in an intelligent circuit breaker, according to another embodiment of the disclosure. The solid-state bidirectional switch 600-6 is similar in circuit configuration to the solid-state bidirectional switch 600-5 of FIG. 6F, wherein the SPDT switch 632 (in FIG. 6F) is implemented using first and second control switches 641 and 642 that are controlled by a switch control circuit 640. The switch control circuit 640 comprises a first control line 640-1 that is coupled to the first control switch 641, and a second control line 640-2 that is coupled to the second control switch 642. In some embodiments, the first and second control switches 641 and 642 comprise phototransistors (e.g., optical bipolar junction transistors).

The switch control circuit 640 is configured to synchronize the optical control signal outputs 640-1 and 640-2 to the supply voltage waveform of the AC mains 110. The switch control circuit 640 monitors the voltage level of the supply voltage waveform on the line hot path 111. While the voltage level remains below a predetermined trigger level trigger level, $V_{TRIG}$, the switch control circuit 640 outputs an optical control signal on the control line 640-1 to drive the first control switch 641 (i.e., maintain switch 641 in an "on"

state), while the second control switch 642 is maintained in an off state. On the other hand, when the voltage level exceeds the predetermined trigger level trigger level, $V_{TRIG}$, the switch control circuit 640 outputs an optical control signal on the control line 640-2 to drive the second control switch 642 (i.e., maintain the second control switch 642 in an "on" state), while the first control switch 641 is maintained in an off state. In some embodiments, the switch control circuit 640 is configured such that the optical drive control signal outputs 640-1 and 640-2 do not overlap, thereby providing a "break before make" switch characteristic, which avoids discharging the capacitor 613 prematurely. The time constant for the switch control allows for the rapid switching of the optical drive signal outputs 640-1 and 640-2 in synchronism with the supply voltage waveform of the AC mains 110 through external control circuitry (not shown) to provide phase control of the applied AC waveform, as is used in dimmer applications.

Figure 6H:
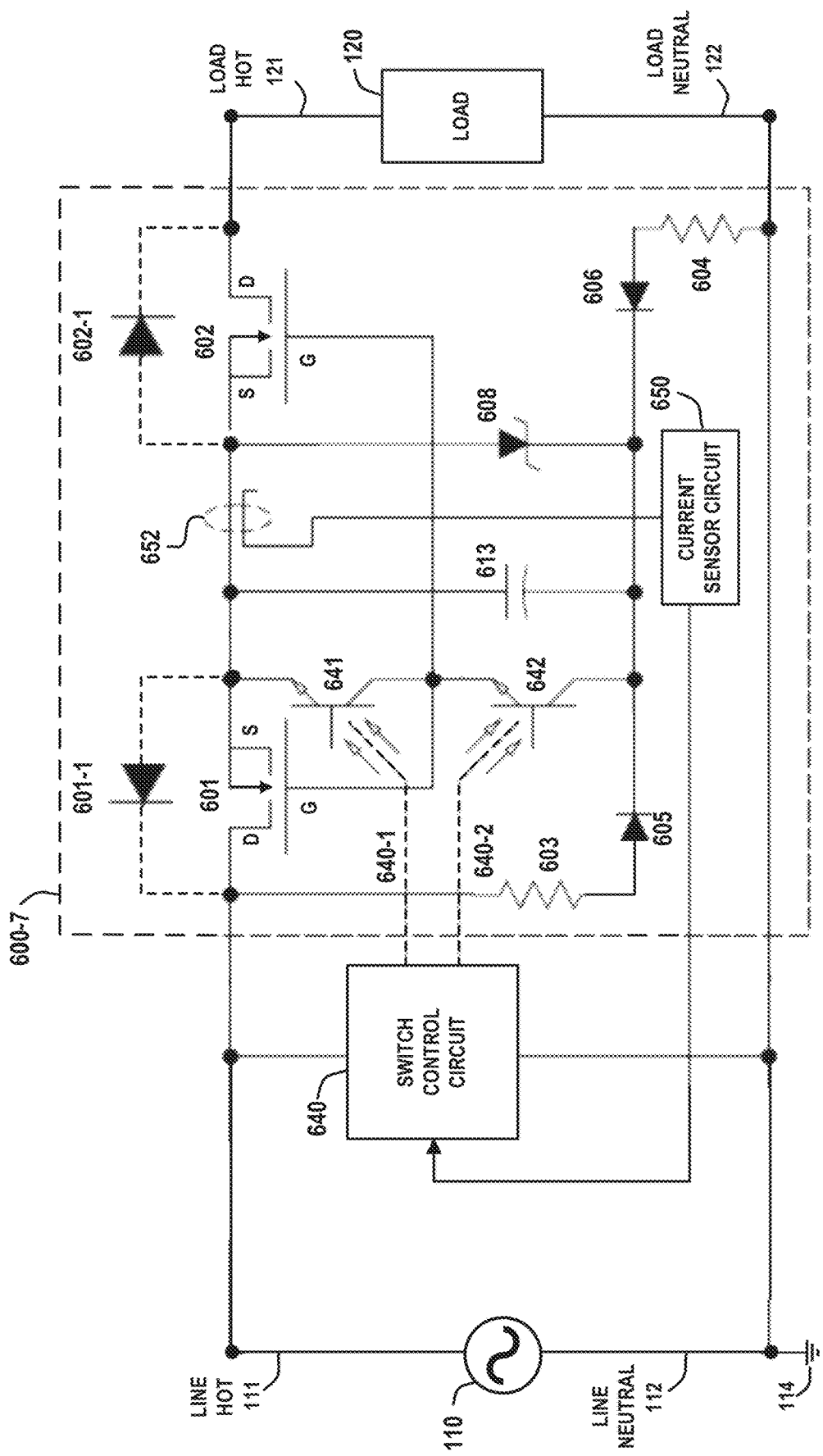
FIG. 6H is a schematic circuit diagram of a solid-state bidirectional switch that can be implemented in an intelligent circuit breaker, according to another embodiment of the disclosure.

FIG. 6H is a schematic circuit diagram of a solid-state bidirectional switch 600-7 that can be implemented in an intelligent circuit breaker, according to another embodiment of the disclosure. The solid-state bidirectional switch 600-7 is similar in circuit configuration to the solid-state bidirectional switch 600-6 of FIG. 6G, except that the solid-state bidirectional switch 600-7 comprises a current sensor circuit 650 and a current sensing element 652. The current sensor circuit 650 employs the current sensing element 652 to sense AC current that is delivered by the AC mains 110 to the load 120. In the exemplary embodiment of FIG. 6H, the current sensing element 652 is coupled to a node between the serially connected first and second MOSFET switches 601 and 602 (e.g., coupled to the node of the commonly connected source terminals S of the MOSFET switches 601 and 602). In some embodiments, the current sensing element 652 comprises a current transformer or a Hall-Effect sensing element.

The current sensor circuit 650 is configured to generate and output a control signal to the switch control circuit 640 to selectively control the activation and deactivation of the control switches 641 and 642. For example, when the current sensor circuit 650 determines that there is no current flow or excessive current flow in the hot line path between the line hot 111 and load hot 121, the current sensor circuit 650 will output a control signal to the switch control circuit 640 which causes the switch control circuit 640 to (i) turn off the control switch 642 to thereby disconnect the first and second MOSFET switches 601 and 602 from the bias circuitry, and (ii) turn on the control switch 641 to thereby deactivate the first and second MOSFET switches 601 and 602 and place the solid-state bidirectional switch 600-7 into a switched-off state.

In other exemplary embodiments, an intelligent circuit breaker can implement the same or similar solid-state AC switching circuitry and techniques as disclosed in any one of the following co-pending applications and issued patents: (1) U.S. patent application Ser. No. 16/093,044, filed Oct. 11, 2018 (Pub. No.: US 2019/0207375), entitled Solid-State Line Disturbance Circuit Interrupter; (2) U.S. Pat. No. 10,469,077, issued on Nov. 5, 2019, entitled Electronic Switch and Dimmer; (3) International Patent Application No. PCT/US2018/059564, filed Nov. 7, 2018 (WO 2019/133110), entitled Electronic Switch and Dimmer; (4) U.S. patent application Ser. No. 16/029,549, filed on Jul. 7, 2018, entitled Solid-State Power Interrupter; (5) U.S. patent application Ser. No. 16/149,094, filed Oct. 1, 2018, entitled Circuit Interrupter with Optical Connection; and (6) U.S. patent application Ser. No. 16/589,999, filed on Oct. 1, 2019, entitled Solid-State Circuit Interrupters, the disclosures of which are all fully incorporated herein by reference.

Figure 7B:
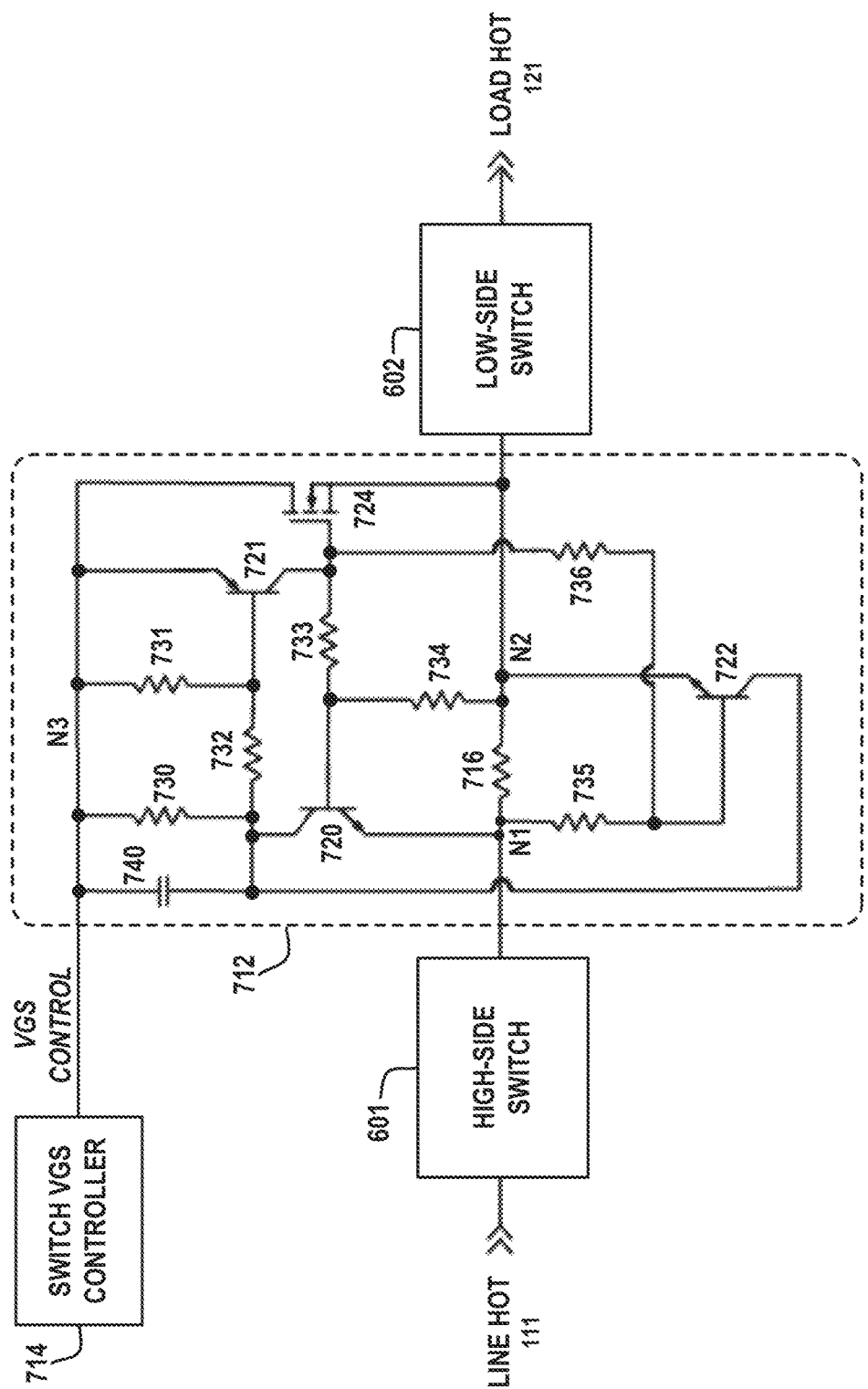

FIGS. 7A and 7B schematically illustrate a switch control circuit for controlling a solid-state bidirectional switch, according to an embodiment of the disclosure. In particular, FIG. 7A is a schematic block diagram of a switch control circuit that can be implemented in an intelligent circuit breaker for controlling a solid-state bidirectional switch, according to embodiment of the disclosure, and FIG. 7B is a schematic circuit diagram of the switch control circuit of FIG. 7A, according to embodiment of the disclosure. FIGS. 7A and 7B illustrate an exemplary embodiment of the switch control circuitry 308 for controlling the solid-state bidirectional switch 304 in the exemplary embodiments of FIGS. 3A and 3B.

FIG. 7A illustrates a solid-state bidirectional switch 700 comprising first and second MOSFET switches 601 and 602 and respective body diodes 601-1 and 602-1. The solid-state bidirectional switch is coupled to a control circuit 710 comprising a sense resistor 716, a short-circuit detection and protection circuit 712, and a switch VGS controller 714. The sense resistor 716 is connected between the source terminals S (e.g., nodes N1 and N2) of the first and second MOSFET switches 601 and 602. The short-circuit detection and protection circuit 712 is configured to detect a load-side short-circuit fault condition and operate in conjunction with the switch VGS controller 714 to provide a fast disconnect of the solid-state bidirectional switch in response to the detection of the short-circuit fault condition.

In particular, the short-circuit detection and protection circuit 712 is coupled to nodes N1 and N2 and is configured to measure a burden voltage across the sensor resistor 716 and determine when the burden voltage exceeds a pre-set value which is indicative of a short-circuit fault condition. The short-circuit detection and protection circuit 712 cooperates with the switch VGS controller 714 to rapidly shut-off the first and second MOSFET switches 601 and 602 when the burden voltage across the sense resistor 716 exceeds the pre-set value. In some embodiment, the short-circuit detection and protection circuit 712 is configured to provide notification of the fault to a processor (e.g., processor 220, FIGS. 3A and 3B).

As schematically illustrated in FIG. 7A, the switch VGS controller 714 is coupled to the gate terminals (e.g., node N3) of the first and second MOSFET switches 601 and 602. The switch $V_{GS}$ controller 714 is configured to control the activation and deactivation of the first and second MOSFET switches 601 and 602 during normal operation of the bidirectional switch (e.g., ON-state), and to deactivate both MOSFET switches 601 and 602 in response to fault conditions. In addition, the switch VGS controller 714 is configured to minimize leakage of the first and second MOSFET devices 601 and 602 during on OFF state of the solid-state bidirectional switch. In some embodiments, the switch VGS controller 714 is configured to receive control signals (e.g., switch control signal, leakage control signal) from a control processor (e.g., processor 220, FIGS. 3A and 3B) to implement the switch VGS control functionality.

While FIG. 7A illustrates an exemplary embodiment in which the sense resistor 716 is connected between the source terminals S of the first and second MOSFET switches 601 and 602, it is to be understood that the sense resistor 716 can be connected at other positions along a hot line path between the line hot 111 and the load hot 121. In addition, the sense resistor 716 may also be utilized as an energy sensing element of current sensor and energy metering circuitry 240 of FIG. 3B such that the burden voltage across the sense resistor 716 is utilized by the different sensing and control circuitry to implement the respective functions.

FIG. 7B schematically illustrates a circuit diagram of the short-circuit detection and protection circuit 712 according to an embodiment of the disclosure. The sense resistor 716 is connected between nodes N1 and N2, wherein node N1 is coupled to the source terminal of the first MOSFET switch 601 (denoted high-side switch) and wherein node N2 is coupled to the source terminal of the second MOSFET switch 602 (denoted low-side switch), such as shown in FIG. 7A. The switch VGS controller 714 is connected to a node N4 of the short-circuit detection and protection circuit 712.

The short-circuit detection and protection circuit 712 comprises a plurality of bipolar junction transistors 720, 721, and 722, a N-type MOSFET 724, a plurality of resistors 730, 731, 732, 733, 734, 735, and 736, and a capacitor 740, all arranged and connected as shown in FIG. 7B. The transistors 720, 721, and 722 are arranged to comprise a phase discriminator featuring a fundamentally bidirectional support for AC current. The short-circuit detection circuit 712 monitors the burden voltage across the sense resistor 716 (i.e., across nodes N1 and N2) and trips the VGS Control to the switches 601 and 602 when the burden voltage exceeds 0.7 Volts. More specifically, in this embodiment, the resistance value of the sense resistor 716 is chosen to generate a base-to-emitter ($V_{BE}$) which is sufficient to turn-on the bipolar junction transistors 720 and 722 when the current flow through the sense resistor 716 meets or exceeds a predetermined maximum current value (e.g., trip current threshold). For higher trip currents, the resistance value of the sense resistor 716 decreases, whereas for lower trip currents, the resistance value of the sense resistor 716 increases. For example, for a trip current of about 200 amperes, the sense resistor 716 would have a resistance value of about 30 milli-ohms.

One of ordinary skill in the art will understand that a ground-referenced sensing circuit may be utilized, but that such circuit provides an inferior, costly and complex solution requiring additional components including isolators. Also, the short-circuit trip current is adjustable by either changing the resistance value of the sensor resistor 716, or by adjusting its ability to influence the 0.7 Volt bias point with voltage dividers. In other embodiments, an additional mechanism, such as a digital-to-analog converter (DAC), may be utilized to influence and adjust the short-circuit current threshold in real-time, thereby allowing the system to be programmable with regard to the short-circuit current level. This programmability is particularly useful in extending the performance of the system to improve reaction times and reduce nuisance trips. As an example, a circuit breaker operating under a heavy load may be far closer to a short-circuit trip threshold than an unloaded breaker when both come to experience a short-circuited load.

FIG. 8A is a high-level schematic illustration of an intelligent circuit breaker according to another embodiment of the disclosure. In particular, FIG. 8A illustrates an intelligent circuit breaker 800 which comprises a solid-state bidirectional switch 801 and a load isolation switch 802. The solid-state bidirectional switch 801 is serially connected in the electrical path between a line input terminal (connected to the line hot 111) and a loud output terminal (connected to the load hot 121) of the intelligent circuit breaker 800. The load isolation switch 802 is connected across the load hot 121 and the load neutral 122. It is to be understood that for ease of illustration and discussion, various components of the intelligent circuit breaker 800 (e.g., processor, switch controllers, current sensors, voltage sensors, AC-to-DC converter circuitry, etc.) are not illustrated in FIG. 8A.

The intelligent circuit breaker 800 implements a control scheme to activate the load isolation switch 802 to bypass the load 120 and thereby isolate (e.g., galvanically isolate) the load 120 from the intelligent circuit breaker 800 when the solid-state bidirectional switch 801 is in a switched-off state. This allows any leakage current from the deactivated solid-state bidirectional switch 801 to flow through the isolation switch 802 to ground, and prevent such leakage current from flowing to the load 120. The load isolation switch 802 is deactivated when the solid-state bidirectional switch 801 is in a switched-on state with the intelligent circuit breaker 800 supplying power to the load 120.

Figure 8B:
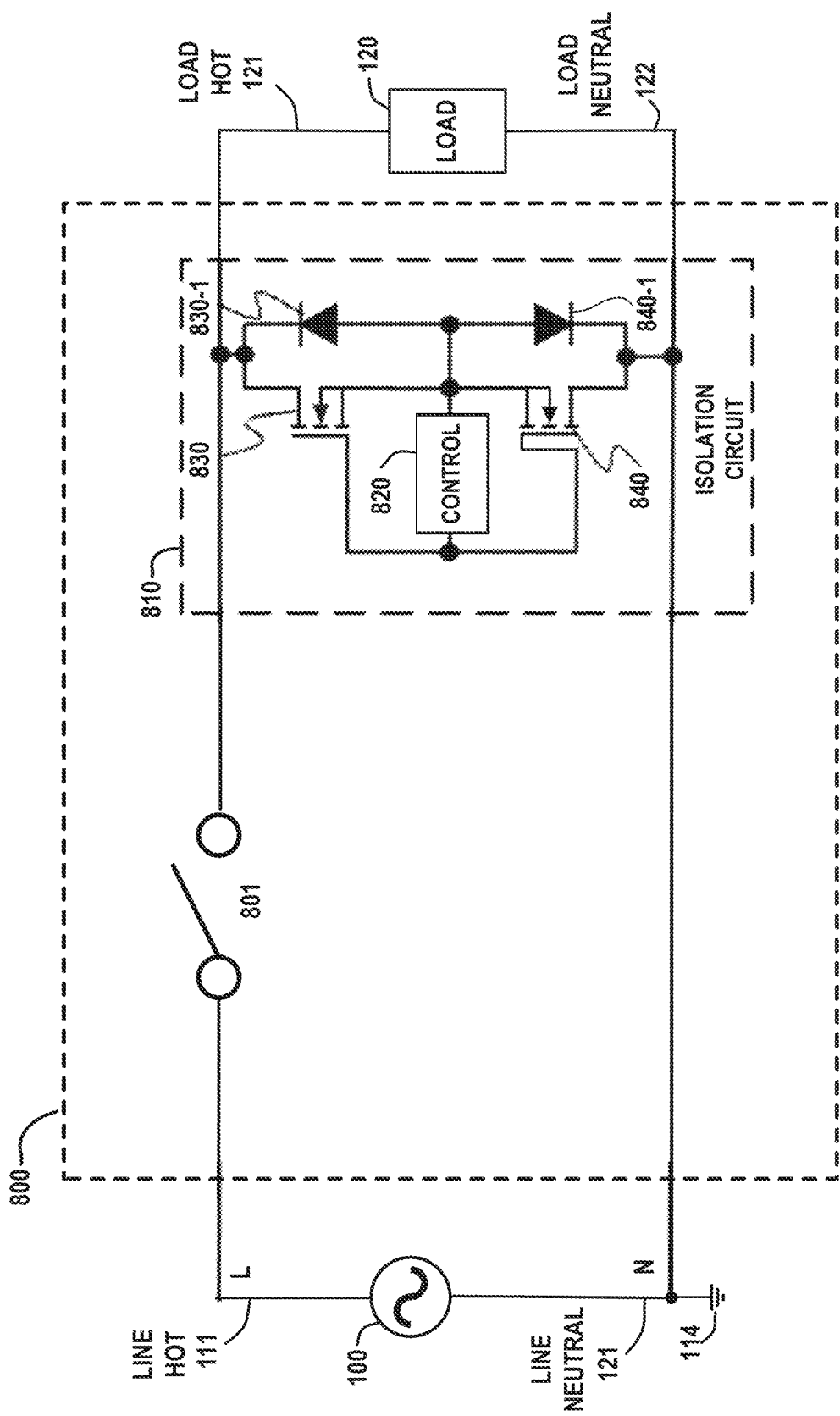
FIG. 8B is a high-level schematic illustration of an intelligent circuit breaker which comprises isolation circuitry that is configured to galvanically isolate the intelligent circuit breaker from a load, according to an embodiment of the disclosure.

FIG. 8B is a high-level schematic illustration of an intelligent circuit breaker which comprises isolation circuitry that is configured to isolate the intelligent circuit breaker from a load, according to an embodiment of the disclosure. More specifically, FIG. 8B illustrates an exemplary embodiment of the intelligent circuit breaker 800 of FIG. 8A, wherein the isolation switch 802 is implemented as part of an isolation circuit 810 that is configured to isolate (e.g., dielectric isolation) the intelligent circuit breaker 800 from the load 120 when the solid-state bidirectional switch 801 is in a switched-off state. As noted above, when the solid-state bidirectional switch 801 is in a switched-off state, the solid-state bidirectional switch can generate a small amount of leakage current. For example, even when the solid-state bidirectional switch 801 is biased to be in a completely switched-off state, a small amount of leakage current (e.g., 200 uA) can flow through the solid-state switch 801 and generate a sizable voltage drop across the load 120 when the load 120 comprises a high impedance load. The isolation circuit 810 serves to shunt the unwanted leakage current from the load 120 when the solid-state bidirectional switch 801 is deactivated.

The isolation circuit 810 comprises a controller 820, MOSFET devices 830 and 840 and associated body diodes 830-1 and 840-1. In this exemplary embodiment, the isolation switch 802 of FIG. 8A is implemented as a solid-state bidirectional switch comprising the MOSFET devices 830 and 840. When the solid-state bidirectional switch 801 is placed into a switched-off state, the controller 820 commands the MOSFET switches 830 and 840 to turn on, which prevents any leakage current from the deactivated solid-state bidirectional switch 801 from flowing to the load 120. The effect of bypassing or shunting leakage current away from the load 120 serves as an equivalent to a galvanic isolation technique which can be implemented with an air-gap switch between the AC mains 110 and the load 120. In this configuration, the isolation circuit 810 provides dielectric isolation and serves as a pseudo air-gap. It is to be appreciated that the isolation circuit 810 can be implemented in other exemplary embodiments of intelligent circuit breakers as discussed herein.

Figure 9B:
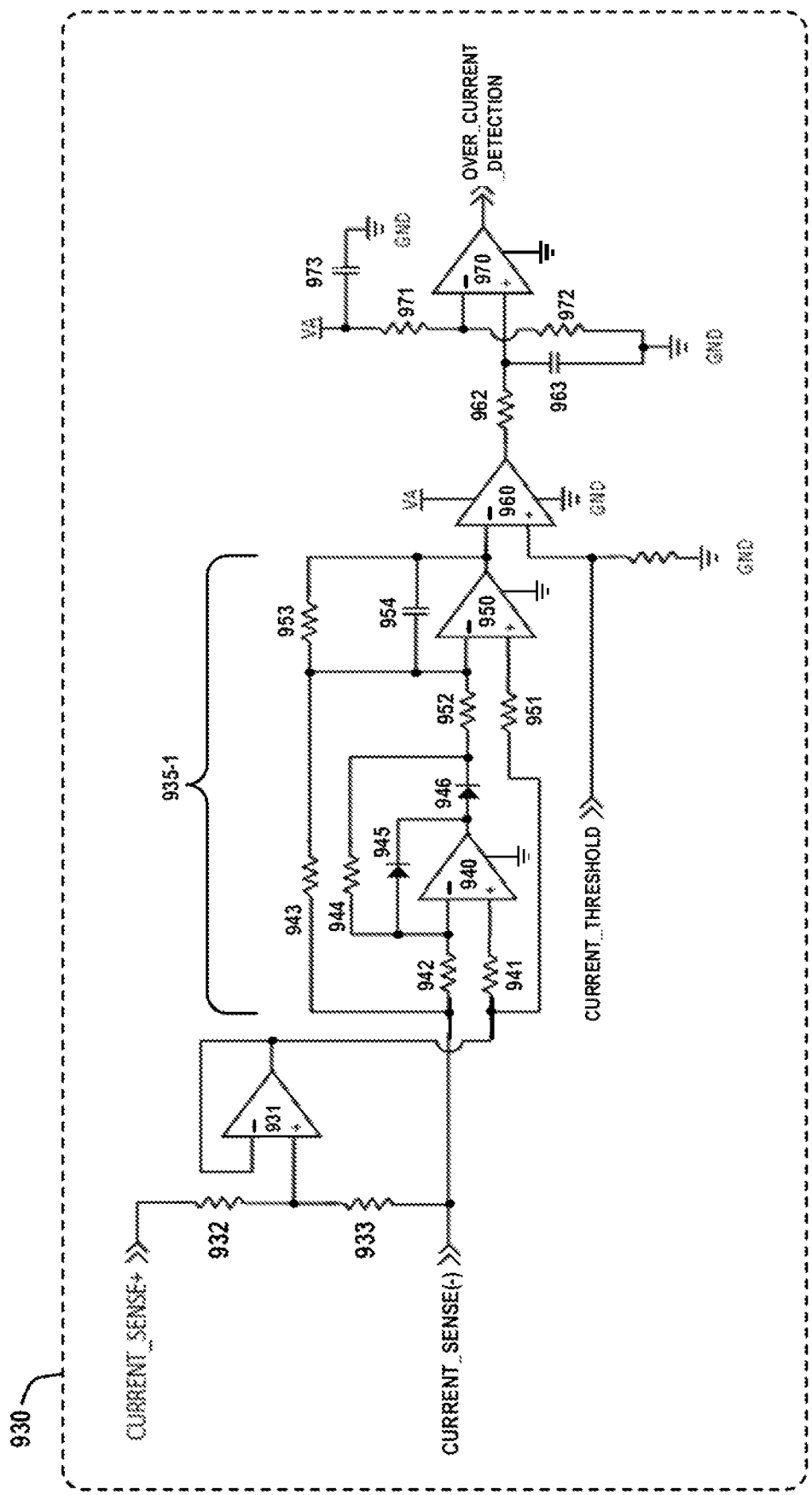
Figure 9C:
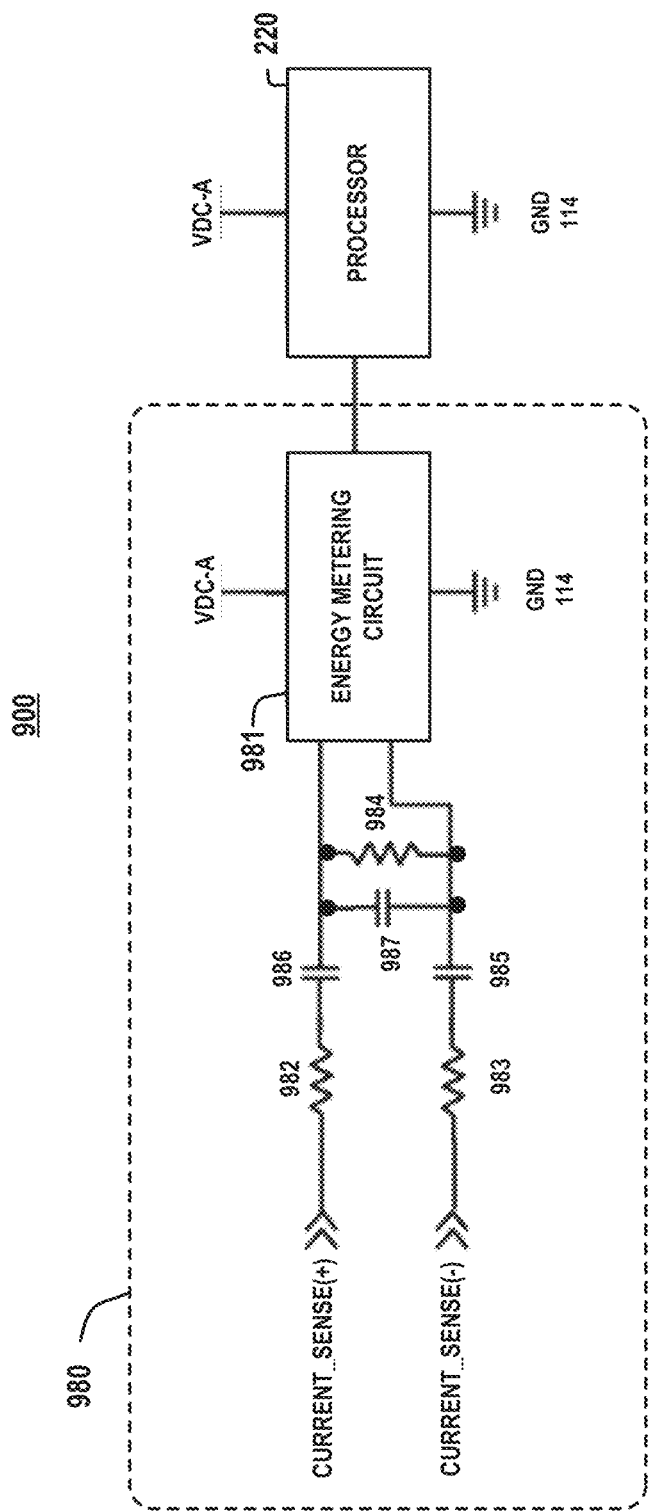

FIGS. 9A, 9B and 9C schematically illustrate an integrated current sensor and energy metering circuit 900 that can be implemented in an intelligent circuit breaker, according to an embodiment of the disclosure. In some embodiments, FIGS. 9A, 9B, and 9C illustrate an exemplary embodiment of the current sensor and energy metering circuit 240 shown in FIGS. 2B and 3B. FIGS. 9A, 9B, and 9C illustrate different circuit blocks of the current sensor and energy metering circuit 900, wherein FIG. 9A is a schematic diagram of a power supply block 910 and current sensor block 920, FIG. 9B is a schematic diagram of an over-current detection block 930, and FIG. 9C is a schematic diagram of an energy metering block 980.

Referring to FIG. 9A, the power supply block 910 comprises an isolation DC-to-DC converter 911, a ferrite bead 912, capacitors 914 and 916, and a virtual ground (HGND) 918, all arranged and connected as shown. The isolation DC-to-DC converter 911 is configured to convert a first DC supply voltage VDC-A to a second DC supply voltage VDC-on-Hot and provide isolation between the first and second DC supply voltages. The ferrite bead 912 is connected between the line hot 111 and a virtual ground (HGND) 918. The capacitor 914 serves as a bypass capacitor that is connected across the input terminals of the isolation DC-to-DC converter 911 and, thus, connected between a VDC-A voltage rail and neutral ground (GND) 114. Similarly, the capacitor 916 serves as bypass capacitor that is connected across the output terminals of the isolation DC-to-DC converter 911 and, thus, connected across a VDC-on-Hot voltage rail and the virtual ground HGND 918. The ferrite bead 912 and capacitors 914 and 916 serve to filter high frequency noise from the supply voltage rails.

In some embodiments, a first DC supply voltage VDC-A on the VDC-A voltage rail comprises a DC supply voltage (e.g., 5V) generated by the AC-to-DC converter circuitry 210 (see FIGS. 2B and 3B), and the isolation DC-to-DC converter 911 provides a 1:1 conversion to generate a second VDC-on-Hot supply voltage (e.g., 5V) which is applied to VDC-on-Hot voltage rail, which is connected to the line hot 111. In this regard, the isolation DC-to-DC converter 911 generates the second VDC-on-Hot voltage (e.g., 5V) that is applied to the hot line path to provide a 5V DC offset on the hot line path, which is measured relative to the virtual ground HGND 918, while the first DC supply voltage VDC-A is measured relative to the neutral ground GND 114.

The current sensor block 920 comprises an isolation amplifier 921 comprising a first block 921-1 and a second block 921-2, which are galvanically isolated from each other using, e.g., optical coupling techniques, capacitive coupling techniques, etc. The first block 921-1 is powered by the VDC-on-Hot supply voltage generated by the power supply block 910, and the second block 921-2 is powered by the VDC-A supply voltage. The current sensor block 920 further comprises a current sense resistor 922 and a low pass filter formed by resistors 923 and 924 and capacitor 925 at the input of the isolation amplifier 921. A bypass capacitor 926 is connected between the power supply rail VDC-A and ground 114.

As shown in FIG. 9A, in some embodiments, the sense resistor 922 is serially connected in the electrical path between the line hot 111 and an AC switch. The sense resistor 922 generates an AC voltage (referred to herein as burden voltage ($V_B$) or sense voltage ($V_{Sense}$) across a first node N1 (referred to as line side node) and a second node N2 (referred to as load side node) based on an AC load current that flows through the sense resistor 922 in the hot line path. In some embodiments, the sense resistor 922 comprises a high-power resistor that has a relatively low resistance value which can generate a sufficient sense voltage across the sense resistor 922 for purposes of measurement, while not consuming a large amount of energy. For example, in some embodiments, the sense resistor 922 comprises a resistance value of about 1 milli-Ohm.

In operation, the current sense resistor 922 generates a burden voltage $V_B$ in proportion to the load current flowing on the hot line path. The burden voltage $V_B$ is determined as: $V_B = I_L \times R_S$, where $I_L$ denotes the load current and $R_S$ denotes the resistance value of the sense resistor 922. The first block 921-1 of the isolation amplifier 921 amplifies and samples the voltage level of the burden voltage $V_B$ across the sense resistor 922, and transmits (e.g., optically, capacitively, etc.) the sampled voltage information to the second block 921-2 through the isolation barrier. In this circuit configuration, the biasing of the first block 921-1 of the isolation amplifier 921 using VDC-on-Hot and the virtual HGND 918 allows the first block 921-1 of the isolation amplifier 921 to measure the voltage across the sense resistor 922 (which is serially connected in the hot line path) relative to the virtual ground HGND 918. The isolation between the first and second blocks 921-1 and 921-2 of the isolation amplifier 921 allows the second block 921-2 and the downstream circuit components to be biased using VDC-A and the neutral ground GND 114.

The second block 921-2 of the isolation amplifier 921 utilizes the sampled voltage information provided from the first block 921-1 to generate and output a differential signal comprising first and second current sense control signals (denoted Current_Sense(+) and Current_Sense(−)) with respect the neutral ground GND 114. In some embodiments, the differential output of the isolation amplifier 921 is implemented as a differential signal having a DC offset (e.g., 1.3 V offset) and a desired gain (e.g., gain of 8). The first and second current sense control signals (Current_Sense(+) and Current_Sense(−)) are input to the over-current detection block 930 (FIG. 9B) and the energy metering block 980 (FIG. 9C).

In some embodiments, as shown in FIG. 9A, the isolation amplifier 921 is configured to have an adjustable gain that can be controlled by a processor or controller of the intelligent circuit breaker. In particular, as shown in FIG. 9A, the second block 921-2 of the isolation amplifier 921 comprises a Gain_Adjust control input that allows the processor or controller to adjust the gain of the isolation amplifier 921 and thereby adjust the level of the over-current condition at which the intelligent circuit breaker will trip. In this configuration, the isolation amplifier 921 provides an element of gain to amplify a relatively small sense voltage that is generated across the sense resistor 922 (i.e., across node N1 and N2) as a result of current flow on the hot line path between the line hot 111 and the load hot 121. As such, the sense resistor 922 can have a relatively small resistance value (e.g., 1 milliohm) which generates a relatively small sense voltage and minimizes power dissipation for normal circuit operation, but which is amplified by the isolation amplifier 921 to enable over-current detection using the small sense voltage. Moreover, the resistance value of the sense resistor 922 can remain fixed (e.g., 1 milliohm) while the gain of the isolation amplifier 921 is adjusted as desired to adjust the level of over-current detection.

In some embodiments, the processor or controller can be configured to adjust the gain of the amplifier 912 based on the temperature of the intelligent circuit breaker, as determined by a temperature sensor that is integrated with or otherwise coupled to the intelligent circuit breaker. For example, in instances where the temperature of the intelligent circuit breaker increases to a relatively high level (e.g., 115 degrees Celsius and above), the gain of the isolation amplifier 921 can be adjusted (e.g., increased) to reduce the level of the over-current at which the intelligent circuit breaker trips.

Referring to FIG. 9B, the over-current detection block 930 comprises a unity-gain amplifier 931, and a two-stage detection circuit 935 comprising an RMS stage 935-1 and a comparator stage 935-2. The unity-gain amplifier 931 has a non-inverting input connected to node N3 between resistors 932 and 933. The resistors 932 and 933 are serially connected between the differential outputs of the isolation amplifier 921 of the current sensor block 920 (FIG. 9A). The unity-gain amplifier 931 and resistors 932 and 933 serve as a level-shift input stage for the over-current detection block 930, wherein the resistors 932 and 933 are selected to have the same resistance value to address the DC offset (e.g., 1.3 V offset) of the differential output of the isolation amplifier 921. In this regard, the over-current detection block 930 utilizes only one side of the current sensing differential output of the isolation amplifier 921 so effectively the input to the over-current detection block 930 is given by Vin_OCD=1.3V+Aa/2×$I_L$×$R_S$, where A is 8, wherein "a" denotes the peak amplitude of the AC waveform that is amplified by the isolation amplifier 921 of the current sensor block 920.

The output of the unity-gain amplifier 931 is input to the RMS stage 935-1. The RMS stage 935-1 comprises an active peak detection circuit which is configured to generate an output signal that represent an RMS (root mean square) value of Vin_OCD. The RMS stage 935-1 comprises a first amplifier 940 and a second amplifier 950. The first and second amplifiers 940 and 950 comprise respective non-inverting inputs that are coupled to the output of the unity-gain amplifier 931 through resistors 941 and 951, respectively. The first and second amplifiers 940 and 950 comprise respective inverting inputs that are coupled to the Current_Sense(−) output of the current sensor block 920 through resistors 942 and 943, respectively. The output of the first amplifier 940 is coupled to an inverting input of the second amplifier 950 through a rectifier diode 946 and a resistor 952. The first amplifier 940 comprises a first negative feedback loop comprising a rectifier diode 945 and a second negative feedback loop comprising a resistor 944. The second amplifier 950 comprises a negative feedback look comprising a parallel connected resistor 953 and capacitor 954.

The RMS stage 935-1 is configured to generate a RMS voltage which is given by $V_{RMS}$=1.3V−RMS(Aa/2×$I_L$×$R_S$) or 1.3V−(0.707)×Aa/2×$I_L$×$R_S$, assuming a sinusoidal wave. The RMS voltage is generated at the output of the second amplifier 950, which is coupled to the input of the second (comparator) stage 935-2. The comparator stage 935-2 comprises a comparator 960 having an inverting input coupled to the output of the amplifier 950 to receive the RMS voltage $V_{RMS}$, and a non-inverting input which receives as input a Current_Threshold control signal. In some embodiments, the Current_Threshold control signal comprises a current that is generated by a current DAC (digital-to-analog converter) in a control processor (e.g., processor 220, FIGS. 2B and 3B). The Current_Threshold control signal generates a current threshold voltage, $V_{CT}$, across a resistor 961 which is connected to the non-inverting input of the comparator 960. In some embodiments, a resolution of the DAC is 2.4 μA/bit and the resistor 961 has a resistance value of 4320Ω. This results in the current threshold voltage $V_{CT}$ having a resolution of 10.368 mV/bit at the non-inverting input of the comparator 960. The relationship between the DAC code and the Current_Threshold (CT) is given by D=(1.3V−(Aa/2×CT×$R_S$)/(10.368 mV/bit) or D=(1.3V−16 mΩ×Ct)/(10.368 mV/bit) where CT is in Amps RMS.

Since the RMS voltage $V_{RMS}$ generated by the RMS stage 935-1 may have some voltage ripple, the comparator stage 935-2 is implemented as a two-stage comparator comprising the first comparator 960 and a second comparator 970. The comparator 960 compares $V_{CT}$ with $V_{RMS}$. If the $V_{CT}$ with $V_{RMS}$ signals are close to one another, the output of the first comparator 960 will dither with a duty cycle in relation to how much over or under current $V_{RMS}$ represents. The first comparator 960 has an output that is coupled to a non-inverting input of the second comparator 960 through a low pass filter formed by resistor 962 and capacitor 963. The second comparator 970 comprises an inverting input that is connected to a voltage divider network comprising first and second resistors 971 and 972 that are serially connected between the supply voltage VDC-A and ground GND 114. The voltage divider network generates a reference voltage $V_{REF}$ that is applied to the inverting input of the second comparator 970. The second comparator 970 generates an Over_Current_Detection signal when the duty cycle of the first comparator 960 is greater than 50%.

The Over_Current_Detection signal is input to control circuitry to deactivate an AC switch of the circuit breaker to protect against the over-current fault condition. An exemplary control process which can be implemented by a processor of an intelligent circuit breaker in conjunction with the current sensor circuitry 900 of FIGS. 9A and 9B for monitoring and detecting over-current fault conditions will be explained in further detail below with reference to FIG. 11.

Referring now to FIG. 9C, the energy metering block 980 comprises an energy metering circuit 981 and a passive bandpass filter comprising resistors 982, 983 and 984 and capacitors 985, 986, and 987. The energy metering circuit 981 comprises a differential input that is coupled to the differential output, Current_Sense(+) and Current_Sense(−), of the isolation amplifier 921 of the current sensor block 920 (FIG. 9A) through the passive bandpass filter. Effectively, the input voltage $V_{CM}$ to the energy metering circuitry 981 is provided by $V_{CM}$=(Aa×$I_L$×$R_S$)/$A_N$ (where $A_N$ denotes an attenuation of the bandpass filter), since the bandpass filter removes the DC offset (e.g., 1.3 V offset), attenuates the Current_Sense(+) and Current_Sense(−) signals, and highly attenuates unwanted high frequencies. From the perspective of energy metering software, a useful constant is the current-to-voltage ratio, Ks=Aa×$R_S$=0.032Ω (assuming that Aa=8 and $R_S$=0.004Ω), wherein 1/Ks=$A_N$/(Aa*$R_S$)=656.25 Amp/Volt.

It is to be understood that the various resistance and capacitance values of the circuit components in FIGS. 9A, 9B, and 9C can vary depending on the application. To provide some context, the following non-limiting examples of resistance and capacitance values can be implemented in the circuitry of FIGS. 9A, 9B, and 9C. For example, in FIG. 9A, the values of the resistors 922, 923 and 924 and the capacitor 925 are selected to provide desired input signal filtering.

Furthermore, in some embodiments, the resistance values and capacitor values in FIG. 9B are as follows. The resistors 932 and 933 have a resistance value of 5.9K. The resistor 941 has a resistance value of 4.7K. The resistors 942, 943 and 944 have a resistance value of 10K. The resistor 951 has a resistance value of 2.7K. The resistor 952 has a resistance value of 4.99K. The resistor 953 has a resistance value of 11K. The capacitor 954 has a capacitance value of 2.2 uF. The resistor 961 has a resistance value of 4.3K. The resistor 962 has a resistance value of 22K. The capacitor 963 has a capacitance value of 0.47 uF. The resistors 971 and 972 have a resistance value of 22K.

Moreover, in some embodiments, the resistance values and capacitor values in FIG. 9C are as follows. The resistors 982 and 983 have a resistance value of 4.7K. The resistor 984 has a resistance value of 470 Ohms. The capacitors 985 and 986 have capacitance values of 10 uF. The capacitor 987 has a capacitance value of 10 nF. In some embodiments, the energy metering circuit 981 comprises an application-specific integrated circuit (ASIC) which is specifically designed to measure power and energy in a power line system and process instantaneous voltage and current waveforms to compute RMS values of voltage and currents, active, reactive and apparent power and energies. In other embodiments, the energy metering circuit 981 comprises an "off-the-shelf" application-specific standard product (ASSP) chip that implements the desired energy metering functionalities.

The energy metering circuit 981 generates and outputs energy metering data to the processor 220 of the intelligent circuit breaker (e.g., FIGS. 2B and 3B), and the processor 220 stores and analyzes the energy metering data to determine energy usage of the load on a branch circuit that is protected by the intelligent circuit breaker. The processor 220 can provide energy usage information to a remote computing node or device via a wireless or wired network connection. This configuration allows remote energy monitoring and notification of energy usage and thereby improves energy awareness for various applications.

By way of example, a plurality of energy-aware intelligent circuit breakers can be configured to report real-time and accumulated energy usage from a plurality of branch circuits within a given residence or building. The energy-aware intelligent circuit breakers within the given residence or building can provide accumulated energy usage information which a property owner can utilize to validate or otherwise correlate the energy usage of the given residence or building as reported by a utility company. In addition, in multi-dwelling or multi-unit properties, such as strip malls, the intelligent energy metering using energy-aware intelligent circuit breakers allows a property owner to individually bill tenants without the need for multiple utility meters. As another example, intelligent energy metering by intelligent circuit breakers is also useful with renters or Airbnb rentals to prevent or report unnecessary waste of energy such as a renter sleeping with the window open on a cold night with an electric heater continuously operating at full power, or an AC unit on a maximum cooling setting while the renter sleeps beneath heavy covers on a warm night.

As another example, intelligent energy metering by intelligent circuit breakers provides a way of determining possible energy theft or unusual and unexpected energy consumption and can also reveal defective or malfunctioning utility meters. In other applications, intelligent energy-aware circuit breakers are also capable of sending alerts/notifications when electrical usage exceeds a settable "normal level" for devices on a branch or an aggregation of devices and branches. Furthermore, intelligent energy-aware circuit breakers are also useful to utility companies as they search for loads that can be disabled or power-reduced during peak load periods. For example, in some embodiments, an intelligent circuit breaker can implement the load profiling techniques as disclosed in U.S. patent application Ser. No. 16/682,627, filed on Nov. 13, 2019, entitled Managing Power for Residential and Commercial Networks, the disclosure of which is incorporated by reference herein in its entirety. These same smart devices, as disclosed, are capable of providing valuable outage information in the moments during the collapse of utility power and during the restoration of circuits. The timing of outages can help pin-point the location of downed or damaged power lines, assist in estimating the number of points of damage, and help generate more accurate utility restoration times. In other applications, intelligent energy-aware circuit breakers are also capable of measuring, diagnosing, and controlling the increasingly improperly synchronized bi-directional energy commonly experienced with renewable energy sources and electric vehicles connected to building infrastructures and utility energy supplies.

Figure 10:
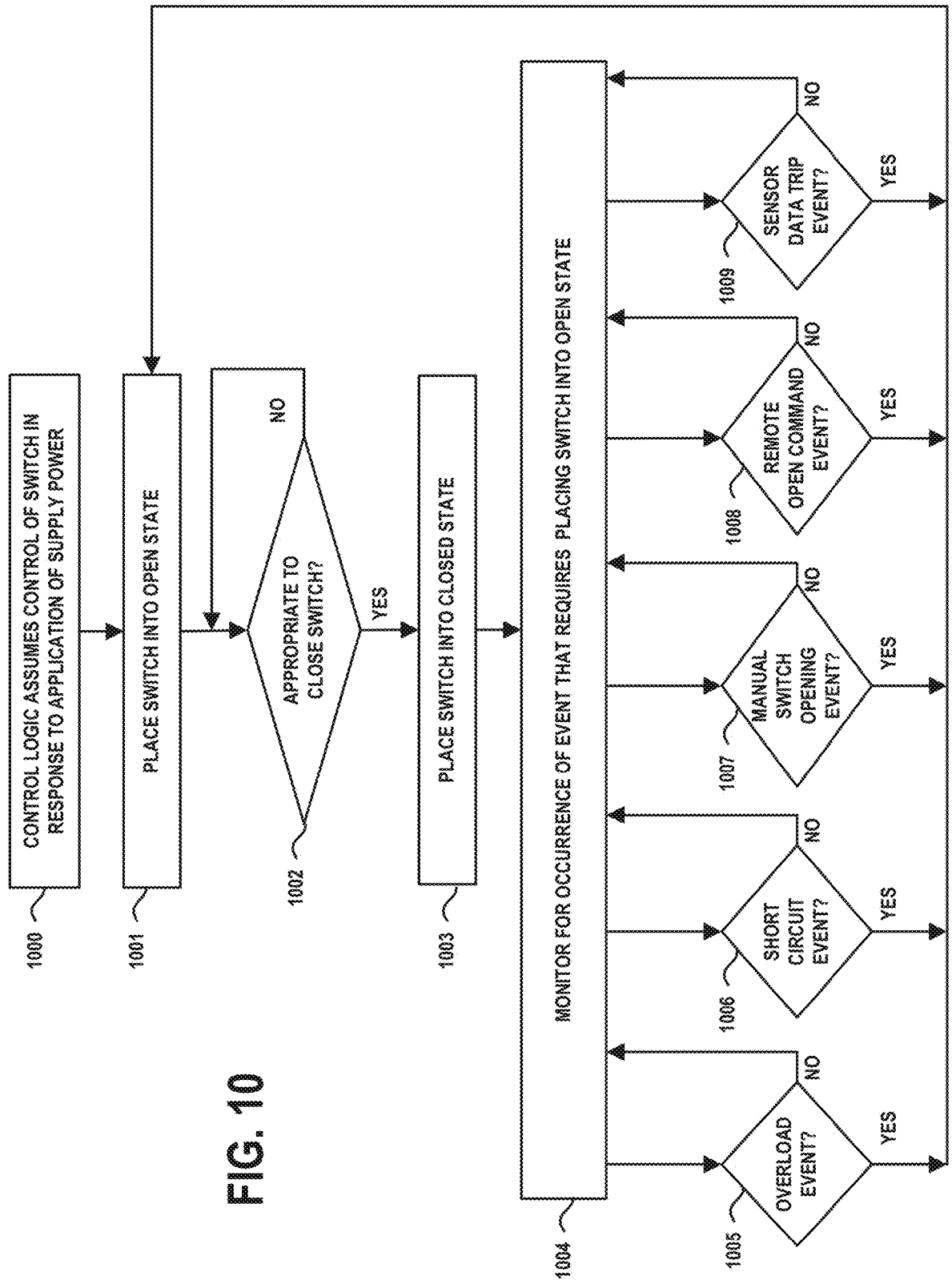
FIG. 10 is a flow diagram of a method for controlling switches of an intelligent circuit breaker in response to detection of fault conditions, according to an embodiment of the disclosure.

FIG. 10 is a flow diagram of a method for controlling a switch of an intelligent circuit breaker in response to detection of fault conditions, according to an embodiment of the disclosure. For illustrative purposes, the exemplary process flow of FIG. 10 will be discussed in the context of controlling a solid-state bidirectional switch of an intelligent circuit breaker, although the same or similar process flow may be implemented to control an electromagnetic switch (e.g., switch 302, FIGS. 3A and 3B) of an intelligent circuit breaker. Upon application of utility supply power, control logic of the intelligent circuit breaker assumes control of a solid-state bidirectional switch (block 1000). Initially, the control logic will place the solid-state bidirectional switch into an open state (or switched-off state) (block 1001), and proceed to determine when it is appropriate to place the solid-state bidirectional switch into a closed state (or switched-on state) (block 1002).

For example, the control logic may determine that is appropriate to close the solid-state bidirectional switch based on (i) the manual circuit breaker switch position (e.g., manual switched is closed), (ii) the switch condition at the time of loss of utility power (e.g., switch was closed at time of loss of power), (iii) commands received from a local processor or commands received wirelessly from a remote node, (iv) end-of-life disablement conditions, etc. Once the solid-state bidirectional switch is in a closed state (block 1003), the control logic will proceed to monitor for the occurrence of an event that is deemed to require placing the solid-state bidirectional switch into an open state, i.e., switched-off state (block 1004).

For example, the occurrence of a fault event such as a current overload event (block 1005) or a short-circuit event (block 1006) would trigger the deactivation (i.e., switched-off state) of the solid-state bidirectional switch. For example, as noted above, in some embodiments, a current overload event can be determined by a processor analyzing real-time current sensor data obtained using a current sensor configured to detect line current. In other embodiments, the intelligent circuit breaker comprises a current sensor that comprises current overload detection circuitry (e.g., FIGS. 9A and 9B) which is configured to detect a current overload event, and to generate a current overload detection signal that triggers the opening of the solid-state bidirectional switch.

In other embodiments, detecting the opening of the manual circuit breaker switch is deemed an event that would trigger the opening of the solid-state bidirectional switch (block 1007). As noted above, in this instance, the opening of the solid-state bidirectional switch before or concurrently with the manual switch opening event would serve to eliminate or minimize the occurrence of electrical arcing between the contacts of the electromechanical or electromagnetic switch of the intelligent circuit breaker. The occurrence of arcing causes degradation of the metal contacts of a circuit breaker and is a safety hazard in situations where flammable gasses may be present. In this regard, the ability to eliminate arcs during fault events or manual lever action are examples of how intelligent circuit breakers disclosed herein extending the safety of circuit breakers beyond simply protecting the downstream circuit wiring from thermal damage. Moreover, as noted above, the implementation of a solid-state bidirectional switch with a fast disconnect response time prevents the flow of dangerous current levels that could cause arcing in downstream wiring and loads.

In other embodiments, a remote switch open command event would trigger the opening of the solid-state bidirectional switch (block 1008). As noted above, the implementation of wireless transceiver within an intelligent circuit breaker enables wireless communication to remotely disconnect a branch circuit and load(s) protected by the intelligent circuit breaker. For example, the remote switch open command capability allows emergency service personnel to power-down part or all of a structure during a reported gas leak or flood event. The implementation of the wireless transceiver through a secure Internet Protocol (IP) address and IP network allows a remote commands to be issued to the control logic of the intelligent circuit breaker to switch off the solid-state bidirectional switch and, in effect, trip the intelligent circuit breaker.

In other embodiments, a sensor data trip event would trigger the opening of the solid-state bidirectional switch (block 1009). As noted above, the implementation of various sensors and a processor with control logic enables tripping of an intelligent circuit breaker in response to various sensed conditions. For example, in addition to current and voltage sensors, an intelligent circuit breaker can include other types of sensors such as temperature sensors, humidity sensors, etc. The ability to acquire sensor data combined with the implementation of control algorithms that are able to process the acquired sensor data and to predict for dangerous and problematic events and issue wireless alerts/notifications extends the safety capabilities of intelligent circuit breakers as disclosed herein.

For example, by acquiring and processing sensor data, an intelligent circuit breaker can be configured to initiate the opening of the solid-state switch just prior to a potential fault condition of a load by predicting an imminent failure of the load such as a spa pump, heater, or a compressor of a central air conditioning system, etc. In some embodiments, an intelligent circuit breaker can implement the predictive analytic techniques as disclosed in U.S. patent application Ser. No. 15/980,311, filed May 15, 2018, and entitled Predictive Analytics System, the disclosure of which is incorporated by reference herein in its entirety. Moreover, the ability of an intelligent circuit breaker to identifying a load type (e.g., a spa pump), can be very helpful in analyzing potentially unsafe conditions. In some embodiments, an intelligent circuit breaker can implement the circuit load characterization techniques as disclosed in U.S. patent application Ser. No. 16/340,474, filed on Apr. 9, 2019 (Pub. No.: US 2019/0245457), entitled Load Identifying AC Power Supply with Controls and Methods, the disclosure of which is incorporated by reference herein in its entirety. Furthermore, the wireless communications ability of an intelligent circuit breaker allows enhanced support for new types of load profiles, such as a new type of refrigeration motor, and unusual alternative energy feeds through automatic software, firmware, and algorithm updates from a remote site.

As another example, the sensors, when intelligently connected to downstream electrical devices, can detect unsafe conditions at specific receptacles or loads. A 20 Amp circuit breaker typically feeds numerous downstream receptacles. Each of these receptacles may be 15 Amp rated devices with the assumption that a 20 Amp load is shared across multiple receptacles. Sensors in the circuit breaker may alert a particular smart receptacle, smart load, or property owner to an unsafe condition, such as overloaded and daisy-chained power strips, or too many strings of holiday lights on a single receptacle. As discussed in further detail below in conjunction with FIG. 15, an intelligent circuit breaker could issue a wireless alert/notification, or direct the receptacle to disconnect, or simply trip the breaker itself until the situation is rectified and reset.

In another embodiment, the ability of an intelligent circuit breaker to characterize load types, whether through algorithms or with data provided by the property owner, allows the intelligent circuit breaker to detect or otherwise monitor for potential degradation in the performance of a given load type. This is particularly useful, for example, in providing information for preventative maintenance on a refrigeration unit prior to failure and any resulting spoilage and numerous other types of appliances or loads. In this regard, an intelligent circuit breaker can be configured to identify and profile many types of loads and compare the real-time operating profile of a given load with a nominal operation profile of the given load. Appliance manufacturers will benefit greatly from the big data gathering associated with energy usage profiling, communication, and analysis.

In other embodiments, an intelligent circuit breaker can be paired with a smart receptacle to detect an overload condition of the smart receptacle with an ability to wirelessly communicate before re-supplying power to its load, may trip a branch circuit given a dangerous fault condition, and re-apply power automatically by wirelessly directing the offending smart receptacle to remain in a load-disconnected state after power is reapplied to the branch circuit by the intelligent circuit breaker. This enables the intelligent circuit breaker to re-energize and continue servicing power to all the other loads on the given branch, details of which will be discussed below in conjunction with the flow diagram of FIG. 15. Further, an intelligent circuit breaker, when paired with smart receptacles with more than one individual branch feed or phase and a mechanism to switch between them, is able to direct smart receptacles to switch branch circuits in an effort to balance the load and more economically make use of phase balancing.

In other embodiments, an intelligent circuit breaker may comprise, or otherwise be connected to remote sensors, such as temperature, humidity, gas, smoke/fire, and water sensors. The intelligent circuit breaker can monitor environmental conditions using such sensors and react to unsafe conditions by disconnecting power from branch circuits in conditions where unsafe water levels may lead to electrocution or fire, or unsafe temperatures may lead to device failures within the circuit breaker panel. By way of specific example, a humidity sensor can be disposed within an intelligent circuit breaker, or within a breaker distribution panel, or within a wall, and be used to detect a roof or plumbing leak that may adversely impact the safety of the entire electrical system. The intelligent circuit breakers are also able to issue wireless alerts/notifications prior to or immediately after a fault event. Each of these examples may also include a wireless notification to local emergency services and, or, the local utility companies.

In other embodiments, intelligent circuit breakers comprising arc-fault and/or ground-fault sensors are also able to safely shut down branch circuits in unsafe conditions. The intelligent circuit breakers can issue wireless alerts/notifications prior to or immediately after such arc-fault or ground-fault events. Each of these examples may also include a wireless notification to local emergency services and, or, the local utility companies.

In other embodiments, additional information derived from external sensors or data available through wireless communications may also be utilized to cause a notification/alert or a trip event.

Figure 11:
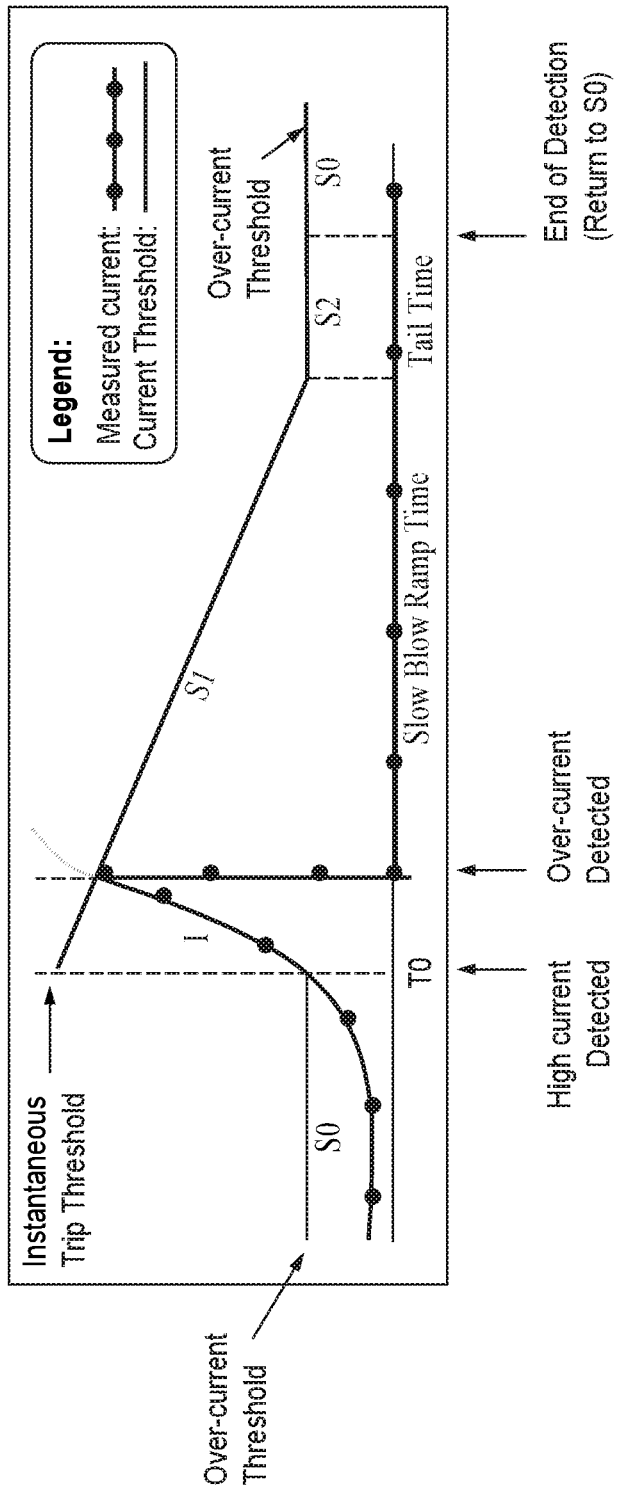
FIG. 11 is a state diagram that illustrates a control process which is implemented by an intelligent circuit breaker to detect and protect against fault conditions, according to an embodiment of the disclosure.

FIG. 11 is a state diagram that illustrates a control process which is implemented by an intelligent circuit breaker to detect and protect against fault conditions, according to an embodiment of the disclosure. In particular, FIG. 11 illustrates a fault detection state graph that illustrates a state machine which is implemented by a processor of an intelligent circuit breaker (e.g., processor 220 of intelligent circuit breakers 2B and 3B) to detect over-current fault conditions. In some embodiments, the processor 220 comprises a current digital to analog converter (current DAC) to generate programmable reference current (e.g., Current_Threshold, FIG. 9B) and a general-purpose input/output (GPIO) digital signal pin to receive an over-current detection signal generated by a current sensor (e.g., Over_Current_Detection signal generated by the over-voltage comparator 935-2 of the over-current detection block 930 of the current sensor 900, FIG. 9B).

In some embodiments, the processor 220 implements a 1 KHz state machine to detect over-current fault conditions, wherein the state machine comprises the following states: (i) Stopped; (ii) Reset; (iii) Over-Current Detection (S0); (iv) Slow Blow Ramp (S1); (v) Tail Detection (S2); and (vi) Tripped. In addition, in some embodiments, the state machine implements the following programmable parameters: (i) OCT, which denotes an Over-Current_Threshold (output during S0 and S2); (ii) ITT, which denotes an Instantaneous Trip Threshold (the start of the S1 Ramp); (iii) SBRT, which denotes a Slow Blow Ramp Time (the duration of S2); and (iv) TT, which denotes a Tail Time (S2 Duration).

The states are defined as follows. The Stopped state is used when a trip or fault condition has been detected to stop the current detection until set to the Reset state by a command. The Reset state is the initial state used to start the state machine, it initializes the DAC output to the over-current threshold detection circuitry and sets the state machine to the S0 state. In the S0 state, the current DAC is programmed to output the voltage that represents the desired over-current threshold (OCT) that is input into the comparator stage of the over-current detection block 930 of the current sensor 900, FIG. 9B. This is the steady state until the current rises higher than the output threshold as measured at the comparator circuit, at which point the comparator will output a logic level "1" as an Over_Current_Detection signal, which will be detected by the over-current state machine. At that time, the DAC is programmed to the instantaneous trip threshold and will setup the ramp duration and the length and duration of each step needed for the state S1, and the state machine transitions to the S1 state.

During the S1 state, anytime the comparator output transitions to logic "1" is considered a trip condition and the state machine will immediately move to the Tripped state. During the S1 state, the Slow Blow Ramp will be executed, with the DAC being adjusted in steps as time elapses from the Instantaneous Trip Threshold back to the Over-Current_Threshold. If the ramp completes without the comparator indicating a trip condition, then the state machine will be moved to the S2 state. While the ramp does not have to be linear as shown in FIG. 11, the ramp can be weighted or non-linear in any way desired to achieve the desired effect, e.g. the heating characteristics of the wiring being protected. In some embodiments, the S1 ramp could be perturbed (via software control) to compensate for an increased temperature of the intelligent circuit breaker.

During the S2 state, anytime the comparator output transitions to logic "1" will be considered a trip condition and the state machine will immediately move to the Tripped state. During the S2 state, the DAC will output the over-current threshold (the same as in state S0) for the programmed period of time, giving the state machine an opportunity to detect a condition where the current is steady and exactly at the over-current threshold reference level, instead of continuously cycling through the over-current states without actually declaring the trip condition. At the end of the S2 period, the state machine is set to the Reset state (which sets the DAC output to the over-current threshold and sets the state to S0).

When the Tripped state is entered, as a result of an over-current detection in either the S1 or S2 states, the AC Switch Off action is initiated, which will result in the AC switch control lines being switched to the off state on or before the next zero cross function execution.

In another embodiment, a "wire heating" process is implemented by varying the S0 output current based on how many times high current trips have occurred without exceeding the over-current detection. The process could implement a secondary state machine that is configured to vary (in durations of seconds or minutes) the S0 level, the instantaneous trip levels, and the slope of the slow blow ramp accordingly.

Figure 12:
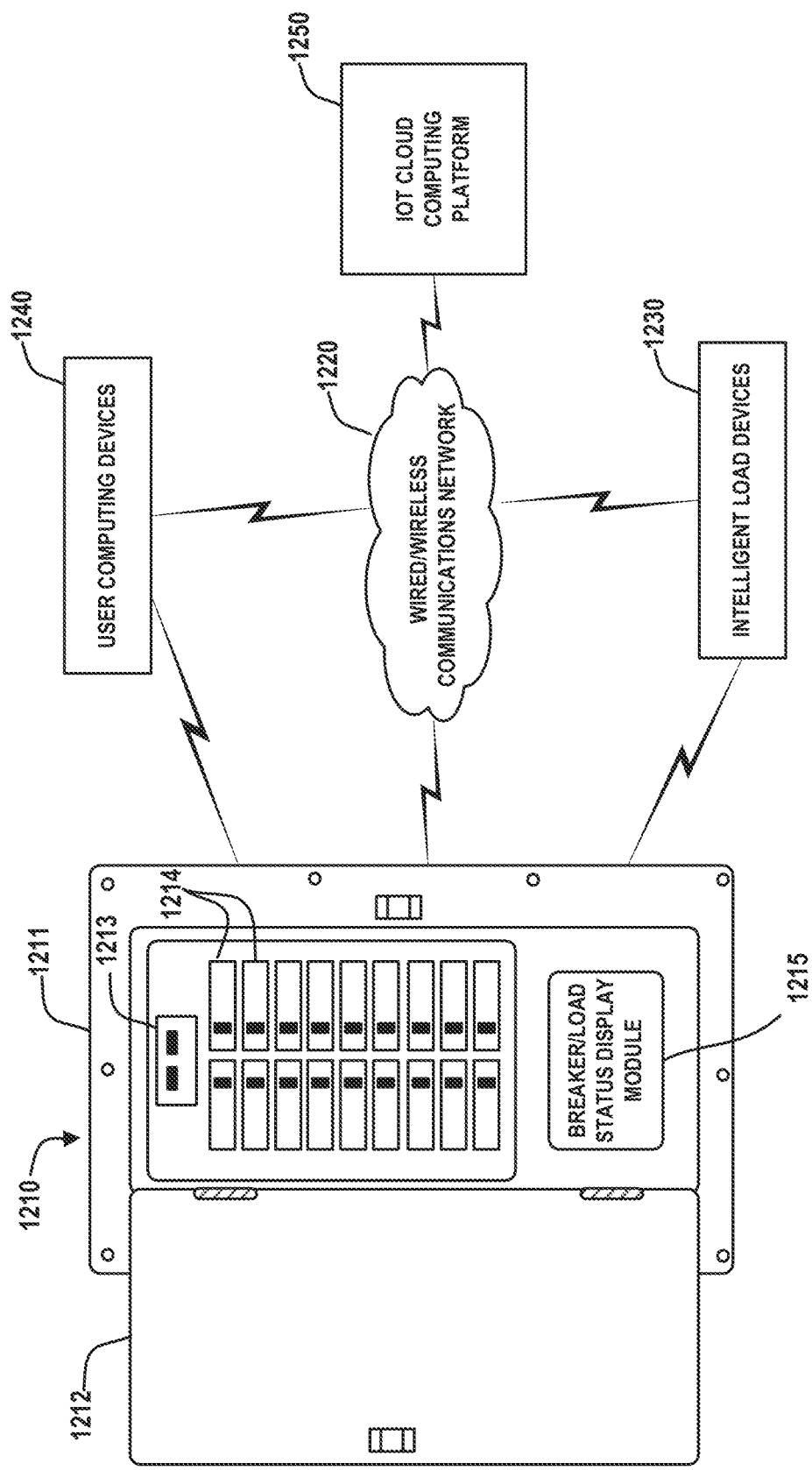
FIG. 12 schematically illustrates an intelligent power distribution and monitoring system which utilizes intelligent circuit breakers according to an embodiment of the disclosure.

FIG. 12 schematically illustrates an intelligent power distribution and monitoring system 1200 which utilizes intelligent circuit breakers according to an embodiment of the disclosure. The system 1200 comprises a circuit breaker distribution panel 1210, a wired and/or wireless communications network 1220, one or more intelligent load devices 1230, one or more user computing devices 1240, and an Internet of Things (IoT) computing platform 1250. The circuit breaker distribution panel 1210 comprises a front panel 1211 and cover 1212 which is opened to access a main circuit breaker 1213 and a plurality of branch circuit breakers 1214 that protect branch circuits in a given dwelling or building, and a breaker and load status display module 1215.

The configuration of the circuit breaker distribution panel 1210 will vary depending on the type of electrical service that is provided. For example, residential electric service in the United States (120/240 VAC) comprises a single-phase service comprising two hot voltage lines and one neutral line, wherein both line voltages are derived from a single phase of a distribution transformer with a center tapped neutral and are 180° out of phase with each other. In this type of electrical service, two hot line service wires that feed the circuit breaker panel 1210 are connected to the main circuit breaker 1213, and the main circuit breaker 1213 is connected to two hot bus bars within the circuit breaker panel 1210. In addition, an incoming neutral line service wire is connected to a neutral bus bar in the circuit breaker panel 1210, and the neutral bus bar is coupled to a separate grounding bus bar in the circuit breaker panel 1210.

The two hot line service wires feeding the main circuit breaker 1213 each provide 120V from, e.g., an electric meter, and feed the two hot bus bars in the circuit breaker panel 1210 through the main circuit breaker 1213 (when the main circuit breaker 1213 is switched on). The branch circuit breakers 1214 have line input terminals that connect to one or both of the hot bus bars to provide power to the circuits (e.g., a single-pole circuit breaker has one input line terminal which connects to one hot bus bar to provide 120V to a branch circuit, while a double-pole circuit breaker comprises two input line terminals which connect to both hot bus bars to provides 240V to a branch circuit). In accordance with embodiments of the disclosure, some or all of the main circuit breaker 1213 and the branch circuit breakers 1214 comprise intelligent circuit breakers that are implemented using intelligent circuitry and functionalities as discussed herein. In this instance, the intelligent circuit breakers 1213 and 1214 would have a connection to the neutral line, e.g., a wire that connects the ground plane for the solid-state circuitry to the neutral bus bar in the circuit breaker panel 1210.

The intelligent load devices 1230 may comprise various types of intelligent devices such as intelligent electrical receptacles or intelligent energy consuming load devices, including, but not limited to, switches, power outlets, light bulbs, appliances, heating systems, ventilation systems, air conditioning systems, appliances, communication systems, entertainment systems, home security devices, etc., and other types of smart electrical and electronic devices and systems that are utilized in residential, commercial or industrial buildings.

In the context of IoT computing, the intelligent circuit breakers 1213 and 1214 and the intelligent load devices 1230 comprise smart IoT devices that operate and communicate within a IoT device network and are configured to support an IoT applications for a given application domain. The IoT devices (e.g., 1213, 1214 and 1230) generate data which is uploaded to the IoT cloud computing platform 1250 over the communications network 1220 for data processing, data storage and data management by the cloud computing platform 1220. In addition, the IoT devices can access and download data from the IoT cloud computing platform 1250 over the communications network 1220. Moreover, depending on the types of devices and network configuration, some or all of the IoT devices (e.g., 1213, 1214 and 1230) are configured for peer-to-peer communication within the IoT device network. The IoT devices are configured to form a network (e.g., mesh network) through self-organization using known methods.

The user computing devices 1240 comprise one of various types of computing devices such as a desktop computer, a laptop computer, a server, a smart phone, an electronic tablet, etc., which allows a user or administrator to access the IoT cloud computing platform 1250 and the intelligent devices 1213, 1214, and 1230 over the communications network 1220. The user computing devices 1240 can host a client-side IoT application that is utilized to configure and manage the network intelligent devices 1213, 1214, and 1230, either directly or through the IoT cloud computing platform 1250.

While the communications network 1220 is generically depicted in FIG. 1, it is to be understood that the communications network 1220 may comprise any combination of known wired and/or wireless communication networks such as, a global computer network (e.g., the Internet), a wide area network (WAN), a local area network (LAN), a satellite network, a telephone or cable network, a cellular network, a wireless network such as Wi-Fi or WiMAX, Bluetooth, or various portions or combinations of these and other types of networks. The term "communications network" is broadly construed so as to encompass a wide variety of different network arrangements, including combinations of multiple networks possibly of different types. In this regard, in some embodiments, the communications network 1220 comprises combinations of multiple different types of communications networks each comprising network devices configured to communicate using Internet Protocol (IP) or other related communication protocols. The communications network 1120 comprises intermediate points (such as routers, switches, etc.) and other elements (e.g., gateways) that form a network backbone to establish communication paths and enable communication between network endpoints.

In the context of IoT computing, the communications network 1220 comprises an IoT device network, wherein the intelligent circuit breakers 1213 and 1214 and the intelligent load devices 1230 (and other wireless/wired sensors such as humidity sensors, temperature sensors, etc.) comprise smart IoT devices that operate and communicate within the IoT device network and are configured to support an IoT application for a given application domain (e.g., controlling and managing intelligent circuit breakers and smart electrical devices within a given dwelling or building, collecting and analyzing energy usage information for the given dwelling or building, etc.).

The IoT devices (e.g., 1213, 1214 and 1230) generate data which is uploaded to the IoT cloud computing platform 1250 over the communications network 1220 for data processing, data storage and data management by the cloud computing platform 1220. In addition, the IoT devices can access and download data from the IoT cloud computing platform 1250 over the communications network 1220. The IoT cloud computing platform 1250 manages and processes IoT data received from the various IoT devices 1213, 1214, and 1230. In some embodiments, the IoT cloud computing platform 1250 performs data processing, data storage, and data management functions and support one or more IoT network applications and/or other types of high performance computing applications such as deep learning applications, machine learning, big data analytics, or other types of high performance computing applications that are useful for supporting a home or building automation system which comprises network of smart electrical devices that can be monitored and controlled using techniques as disclosed herein.

Moreover, depending on the types of devices and network configuration, some or all of the IoT devices (e.g., 1213, 1214 and 1230) are configured for peer-to-peer communication within the IoT device network. The IoT devices are configured to form a network (e.g., mesh network) through self-organization using known methods. In some embodiments, wireless communication between the IoT devices (e.g., 1213, 1214 and 1230) and wireless communication between the user computing devices 1240 and the IoT devices (e.g., 1213, 1214, and 1230) can be implemented through radio frequency communication protocols and systems such as Bluetooth®, near-field communication, Wi-Fi devices, Zigbee®, and other proprietary and non-proprietary protocols. In addition, various sensors such as temperature, humidity, motion and sound sensors may be included as part of the IoT device network to provide environmental information that is used by the intelligent circuit breakers 1213 and 1214 to protect against potential electrical hazards that may result from adverse environmental conditions.

In some embodiments, the breaker and load status display module 1215 comprises a master processor that communicates with the processors of the intelligent circuit breakers 1213 and 1214 and the intelligent load devices 1230 to obtain, process, and display operating status data of such devices. The master processor is configured to display analog or digital data received from various intelligent devices and sensors and provide status of the breakers (e.g., tripped, overload, etc.) and activate alarms/notifications when sensor readings are outside of pre-selected limits. The alarms include a visual display on the user interface of the faceplate, an audible sound from the audio output device, a communication signal sent through the electronic communication module and signal sent to a light or audio alarm. In some embodiments, the user computing devices 1240 can access the breaker/load status display module 1215 to obtain status information regarding the IoT devices and issue commands to perform certain functions (e.g., trip an intelligent breaker, reset and intelligent breaker, etc.). In some embodiments, the system 1200 of FIG. 12 implements home/building automation and controls systems and methods as disclosed in International Application No. PCT/US2017/057309, filed on Oct. 19, 2017 (published as WO 2018/075726), entitled Building Automation System, the disclosure of which is fully incorporated herein by reference. This application discloses techniques for implementing intelligent electrical receptacles which can be extended using intelligent circuit breakers as discussed herein for enhanced safety and security, power metering, power control, and home diagnostics.

In some embodiments, the master processor is configured to control and manage the IoT communication for all intelligent circuit breakers and components within the distribution panel, and communicate to the individual intelligent circuit breakers within the distribution panel using wire communications (e.g., Controller Area Network (CAN) bus) or bus) or using wireless communication to individual intelligent breakers within the distribution panel using a local Bluetooth Low-Energy (BLE) mesh network, with the master processor implementing or otherwise utilizing any suitable broadband communications technology to communicate to remote IoT devices, systems, etc.

Figure 13:
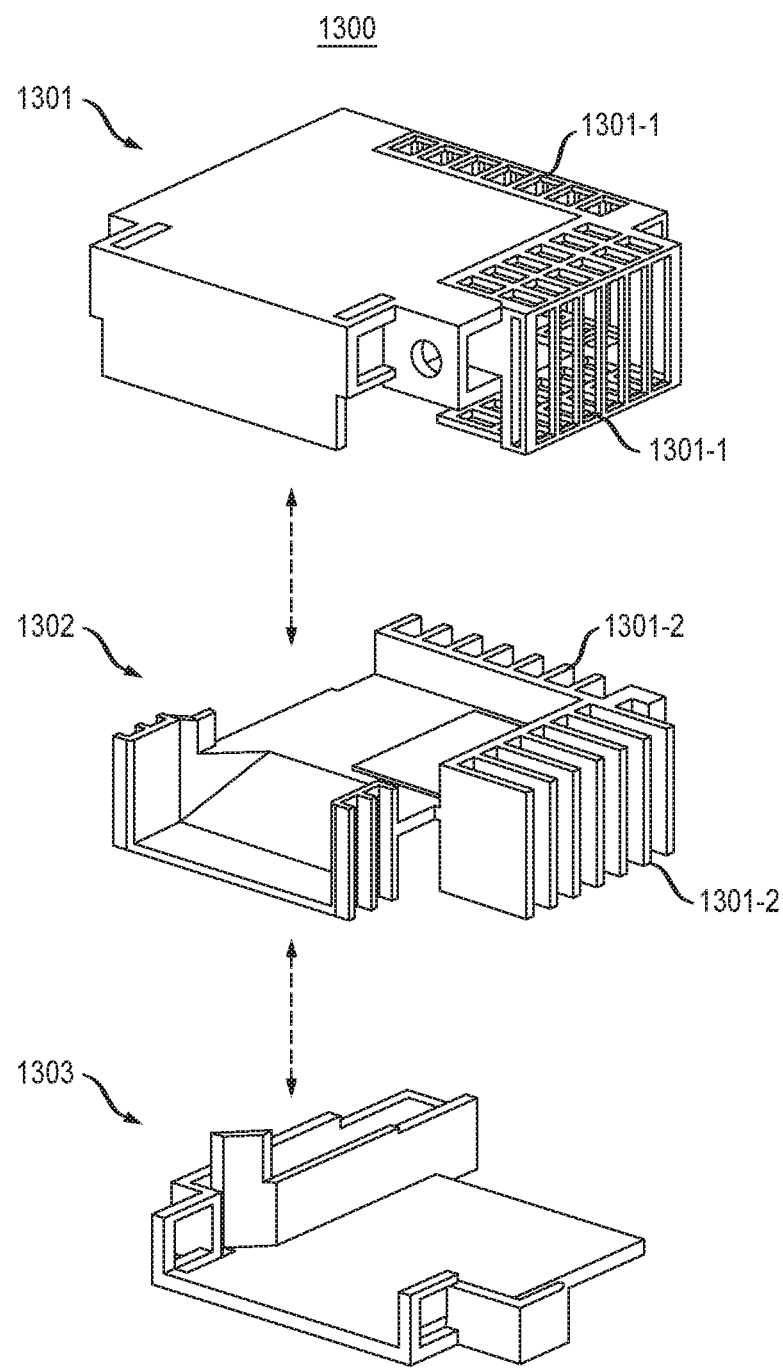
FIG. 13 is an exploded view of a housing structure which can be utilized to house switches and intelligent circuitry of an intelligent circuit breaker, according to an embodiment of the disclosure.

FIG. 13 is an exploded view of a circuit breaker housing structure 1300 which can be utilized to house switches, circuitry, sensors, and other components of an intelligent circuit breaker, according to an embodiment of the disclosure. The housing structure 1300 comprises a first housing member 1301, a heat sink element 1302, and a second housing member 1303. The heat sink element 1302 is disposed within the housing structure 1300 formed by the coupling of the first and second housing members 1301 and 1303. The first and second housing members 1301 and 1303 comprise molded plastic enclosures for the heat sink element 1302 and other components of the circuit breaker. The heat sink element 1302 is formed of a metallic material such as aluminum, or other suitable materials or alloys that would have sufficient thermal conductivity for the given application.

The first housing member 1301 comprises a plurality of open slots 1301-1, and the heat sink element 1302 comprises a plurality of cooling fins 1302-1. When the housing structure 1300 is assembled, the cooling fins 1302-1 of the heat sink element 1302 are aligned with corresponding slots 1301-1 of the first housing member 1301 to enable an air-cooled heat sink mechanism. The various integrated circuit chip components (e.g., processor, solid-state bidirectional switch, etc.) are thermally coupled to the heat sink element 1302 to serve as a cooling plate for the integrated circuit chips. The integrated heat sink cooling allows for enhanced thermal exchange and a relaxation in the total ON resistance of the solid-state bidirectional switch during heavy circuit breaker load conditions. A line neutral wire (not shown) is added in the traditional industry-standard approach used for AFCI and GFCI products and for intelligent circuit breakers. One skilled in the art will recognize that the various circuits, algorithms, heat exchangers, and other aspects of the disclosed configuration of intelligent circuit breakers can be adjusted to various form factors required in other locations or countries.

Figure 14:
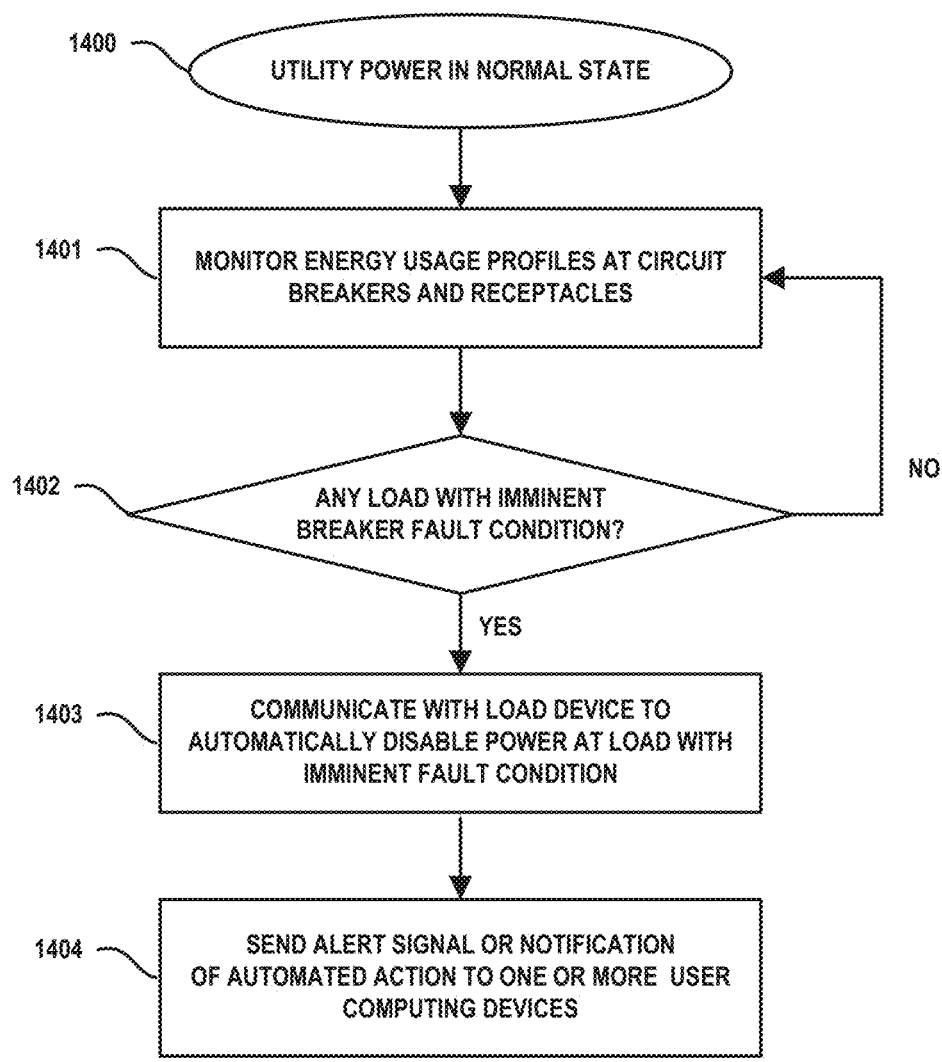
FIG. 14 is a flow diagram of a process which is implemented by an intelligent circuit breaker to monitor energy usage on a branch circuit and protect against fault conditions on the branch circuit, according to an embodiment of the disclosure.

FIG. 14 is a flow diagram of a process which is implemented by an intelligent circuit breaker to monitor energy usage on a branch circuit and protect against fault conditions on the branch circuit, according to an embodiment of the disclosure. In some embodiments, FIG. 14 illustrates an automated process that is implemented by the intelligent power distribution and monitoring system 1200 of FIG. 12 when the utility supply power is in a normal state (e.g., no power outage) (block 1400). The intelligent circuit breakers will utilize intelligent energy metering methods as discussed herein to monitor energy usage profiles of the circuit breakers and intelligent receptacles or electrical devices (block 1401). Based on the monitored energy usage, if an intelligent circuit breaker determines that a given load has an imminent fault condition (affirmative determination in block 1402), the intelligent circuit breaker will communicate with the intelligent receptacle or device to automatically disable power delivery to the given load (block 1403). In some embodiments, an "imminent fault" comprises a user/machine programmable threshold (e.g., determined using artificial intelligence techniques based on historical information). In this instance, the intelligent circuit breaker would compare the monitored energy usage to a programmed threshold setting (or "Imminent Fault Threshold") that is held in the device being monitored. The intelligent circuit breakers (or master processor) will send an alert signal or notification of the automated action to one or more user computing devices to notify users of the action taken (block 1404).

For example, assume an intelligent circuit breaker or sensor which is intelligently connected to downstream electrical devices, detects an unsafe condition at a specific receptacle or load. By way of specific example, a 20 Amp circuit breaker typically feeds numerous downstream receptacles. Each of these receptacles may be 15 Amp rated devices with the assumption that a 20 Amp load is shared across multiple receptacles. Sensors in the intelligent circuit breaker may alert a particular smart receptacle, smart load, or property owner to an unsafe condition, such as overloaded and daisy-chained power strips, or too many strings of holiday lights on a single receptacle. In this instance, the intelligent circuit breaker could issue a wireless alert/notification, or direct the receptacle to disconnect, or simply trip the breaker itself until the situation is rectified and reset.

Figure 15:
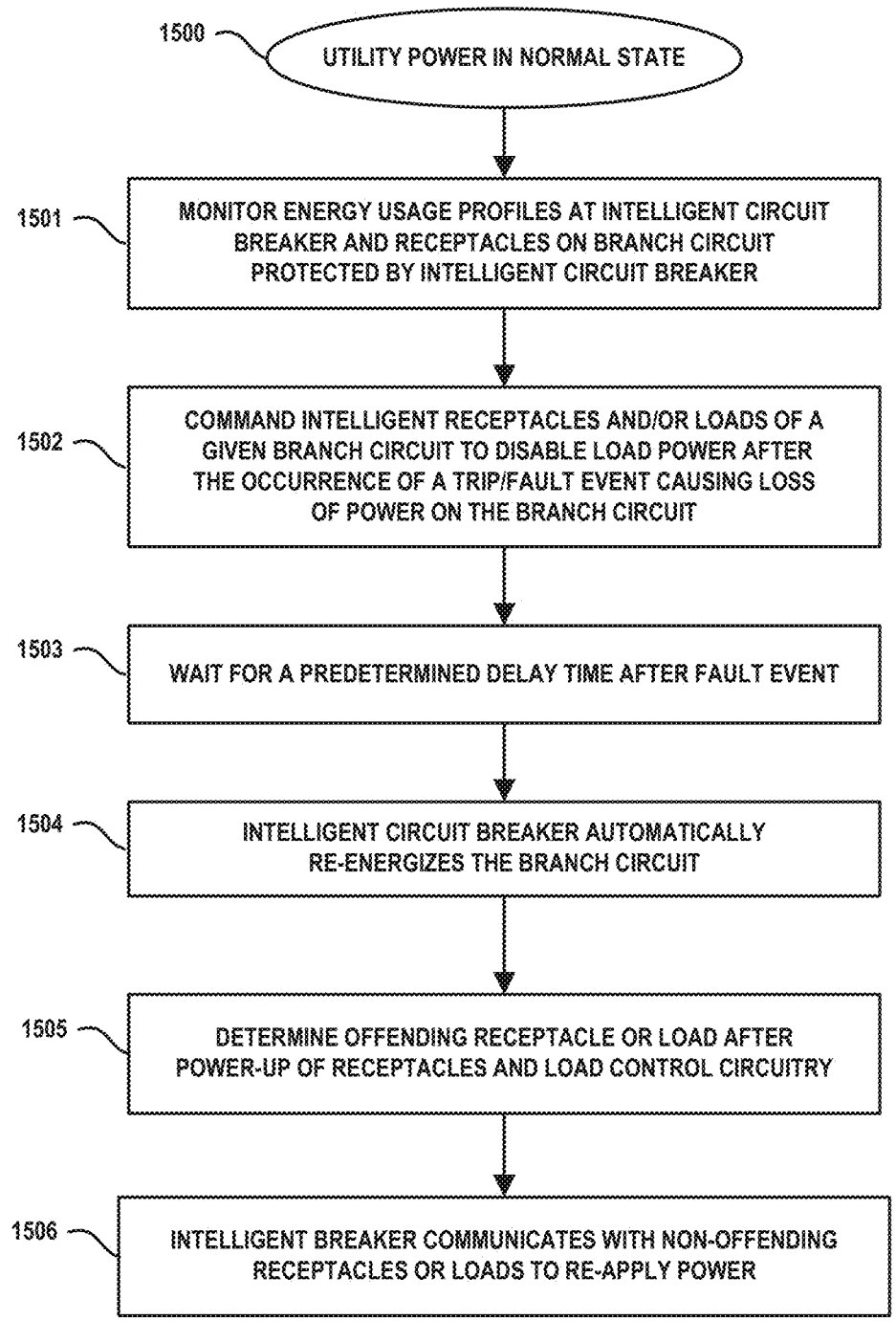
FIG. 15 is a flow diagram of a process which is implemented by an intelligent circuit breaker to monitor energy usage on a branch circuit and protect against fault conditions on the branch circuit, according to an embodiment of the disclosure.

FIG. 15 is a flow diagram of a process which is implemented by an intelligent circuit breaker to monitor energy usage on a branch circuit and protect against fault conditions on the branch circuit, according to an embodiment of the disclosure. FIG. 15 illustrates an automated process that is implemented by the intelligent power distribution and monitoring system 1200 of FIG. 12 when the utility supply power is in a normal state (e.g., no power outage) (block 1500). The intelligent circuit breakers will utilize intelligent energy metering methods as discussed herein to monitor energy usage profiles of the circuit breakers and intelligent receptacles or electrical devices (block 1501). When a breaker trip or fault event occurs on given branch circuit which causes loss of power on the branch circuit, the intelligent circuit breaker that protects the given branch circuit will communicate with the intelligent devices (e.g., intelligent receptacles and load devices) on the given branch circuit and command such intelligent devices to disable power to the load devices (block 1502).

The intelligent circuit breaker will wait for a predetermined amount of time following the fault event (block 1503) and then automatically re-energize the branch circuit (block 1504). After power up of the branch circuit, the intelligent circuit breaker will proceed to determine or otherwise identify which receptacle or load was the source of the fault event (block 1505). The intelligent circuit breaker will communicate with the other non-offending receptacles or loads to re-apply power (block 1506).

With this control process, an intelligent circuit breaker, when paired with an overloaded intelligent receptacle with an ability to wirelessly communicate before re-supplying power to its load, may trip a branch circuit given a dangerous fault condition, and re-apply power automatically by wirelessly directing the offending smart receptacle to remain in a load-disconnected state after power-on. This enables the intelligent circuit breaker to re-energize to continue servicing power to all the other loads on the branch, while still isolating the fault. As a further example, when an intelligent circuit breaker is paired with intelligent receptacles with more than one individual branch feed or phase and a mechanism to switch between them, the intelligent circuit breaker can direct an intelligent receptacle to switch branch circuits in an effort to balance the load and more economically make use of phase balancing.

Figure 16:
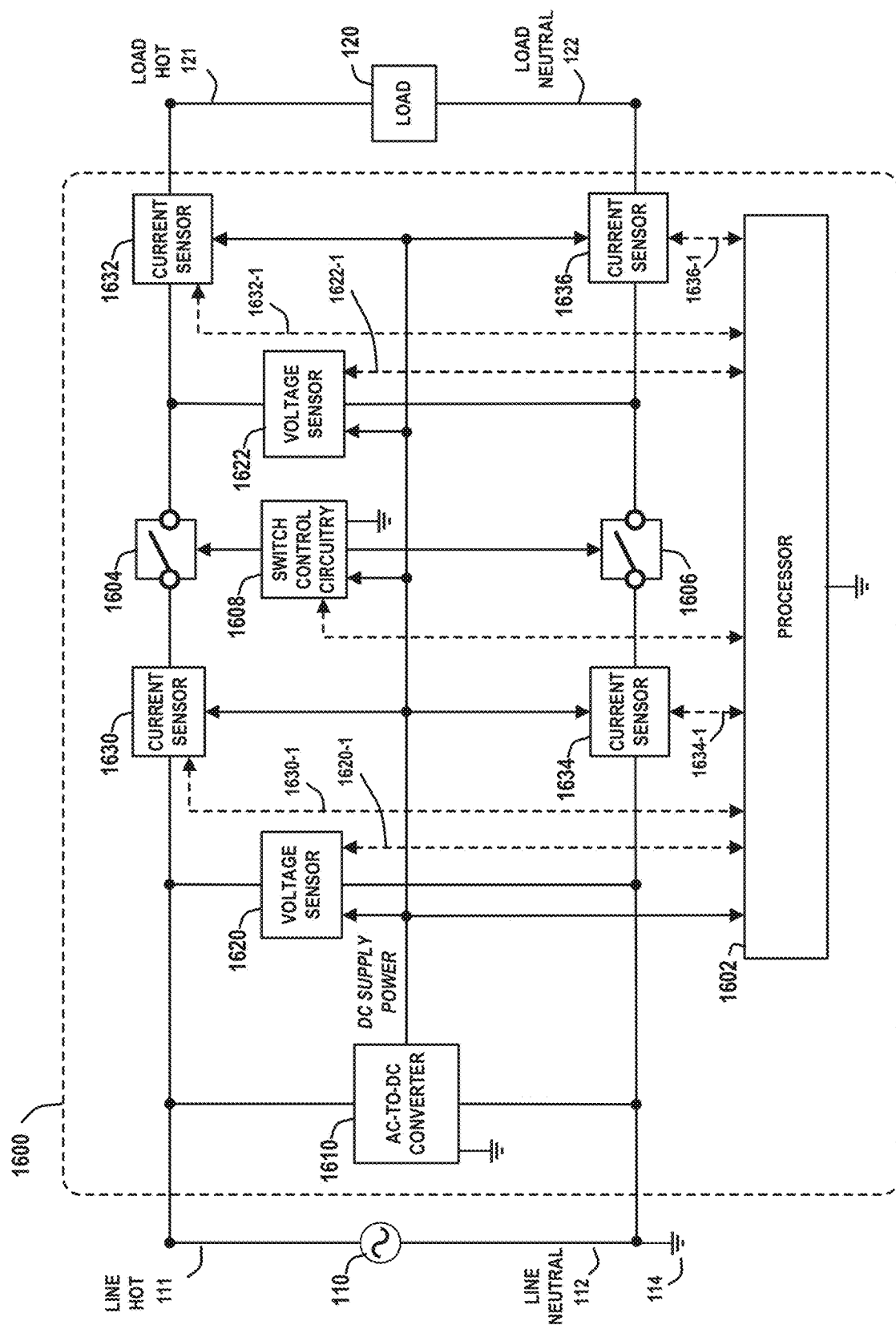
FIG. 16 is a schematic block diagram of an intelligent circuit breaker which is configured to identify a type of load connected to the circuit breaker and to control the load on the basis of the identified load type, according to an embodiment of the disclosure.

In other embodiments, an intelligent circuit breaker can be configured to identify a type of load that is connected to the circuit breaker and the control the identified load using predefined control rules that are based on the identified load type, using control circuitry and control processes as disclosed in U.S. patent application Ser. No. 16/340,474 filed on Apr. 9, 2019, entitled "Load Identifying AC Power Supply With Control and Methods," the disclosure of which is fully incorporated herein by reference. For example, FIG. 16 is a schematic block diagram of an intelligent circuit breaker 1600 which is configured to identify a type of load connected to the circuit breaker and to control the load on the basis of the identified load type, according to an embodiment of the disclosure. In particular, FIG. 16 schematically illustrates an intelligent circuit breaker 1600 connected between an AC mains 110 and a load 120. The intelligent circuit breaker 1600 comprises a processor 1602, a first switch 1604, a second switch 1606, switch control circuitry 1608, AC-to-DC converter circuitry 1610, a first voltage sensor 1620, a second voltage sensor 1622, a first current sensor 1630, a second current sensor 1632, a third current sensor 1634, and a fourth current sensor 1636.

The first switch 1604 is serially connected in a hot line path between a line input terminal and a load output terminal of the circuit breaker 1600, wherein the line hot 111 of the AC mains 110 is connected the line input terminal and the load hot 121 of the load 120 is connected to the load output terminal. The second switch 1606 is serially connected in a neutral line path between the line neutral 112 and the load neutral 122. The line hot 111 of the AC mains 110 is connected to the load hot 121 when the first switch 1604 is in a switched-on state and the line neutral 112 is connected to the load neutral 122 when the second switch 1606 is in a switched-on state. As in other embodiments of intelligent discussed above, the line neutral 112 (which, for example, is bonded to the earth ground 114 in the breaker distribution panel) serves as a low-side voltage reference (e.g., ground) for the electronic circuitry of the intelligent circuit breaker 1600.

In some embodiments, the first and second switches 1604 and 1606 comprise solid-state bidirectional switches that may be configured using one of the exemplary switching circuits as discussed above in conjunction with FIGS. 6A-6H. The switch control circuitry 1608 is configured to control operation of the first and second switches 1604 and 1606 using switch control circuitry and techniques as discussed herein. The load identifying AC power supply includes an AC-to-DC converter 1610 that supplies power to the current sensors 1630, 1632, 1634, and 1636 and to the voltage sensors 1620 and 1622, which acquire the AC mains data and the load data. The AC-to-DC converter circuitry 1610 is configured to provide DC supply power to various circuitry and elements of the intelligent circuit breaker 1600 including the processor 1602, the voltage sensors 1620 and 1622, the current sensors 1630, 1632, 1634, and 1636, and the switch control circuitry 1608. The AC-to-DC converter circuitry 1610 can be implemented using the exemplary frameworks as discussed above in conjunction with FIGS. 4A, 4B, and 5.

The first and second voltage sensors 1620 and 1622 are configured to monitor the voltage at different points along the hot line path through the circuit breaker 1600. For example, as shown in FIG. 16, the first voltage sensor 1620 is coupled to the hot line path upstream of the first switch 1604 to monitor the AC supply voltage of the AC mains 110, and the second voltage sensor 1622 is coupled to the hot line path downstream of the first switch 1604 to monitor the load voltage on the branch circuit which is connected to, and protected by, the intelligent circuit breaker 1600. The voltage sensors 1620 and 1622 are each coupled to the processor 1602 by one or more data acquisition and control lines 1620-1 and 1622-1, respectively. The voltage sensors 1620 and 1622 can be implemented using any suitable type of voltage sensing circuitry including, but not limited to, zero crossing detector circuits, resistive voltage dividers, etc.

The current sensors 1630, 1632, 1634, and 1636 are configured to monitor the current at different points along the hot line path and neutral line path through the circuit breaker 1600. For example, as shown in FIG. 16, the first current sensor 1630 is coupled to the hot line path upstream of the first switch 1604 to monitor the line side supply current, and the second current sensor 1632 is coupled to the hot line path downstream of the first switch 1604 to monitor the load side supply current. The third current sensor 1634 is coupled to the neutral line path upstream of the second switch 1606 to monitor the line side return current, and the fourth current sensor 1636 is coupled to the neutral line path downstream of the second switch 1606 to monitor the load side return current. The current sensors 1630, 1632, 1634, and 1636 are each coupled to the processor 1602 by one or more data acquisition and control lines 1630-1, 1632-1, 1634-1, and 1636-1, respectively. The current sensors 1630, 1632, 1634, and 1636 can be implemented using any suitable type of current sensing circuit including, but not limited to, a current-sensing resistor, a current amplifier, a Hall Effect current sensor, etc.

The processor 1602 operates in conjunction with the voltage sensors 1620 and 1622 and current sensors 1630, 1632, 1634, and 1636 to sample the analog supply voltage and current waveforms of the AC mains 110 and the voltage and current waveforms across and through the load 120. The processor 1602 is configured to sample the sensed current and voltage waveforms at a sampling frequency that is significantly greater than the cycle time of a single period of the power supply voltage of the AC mains 110. The sampling frequency of the voltage and current waveforms are selected as required to distinguish load types. In some embodiments, the sampling frequency is in the kilohertz range. In other embodiments, the sampling frequency is in the megahertz range. In some embodiments, a programmed variation of the power (or power modulation) is applied to the load 120 so as to optimize differentiation in the acquired waveforms between anticipated load types.

In some embodiments, the processor 1602 comprises circuitry to capture, process and record the current and voltage samples, wherein the circuitry comprises comparators, analog-to-digital converters, etc., as well as data storage elements such as random access memory (RAM), read only memory (ROM) and other types of solid-state memory and non-solid-state memory devices as are known in the art. In some embodiments, the processor 1602 comprises control logic and associated computing resources to analyze the recorded current and voltage samples (e.g., neural network analysis and classification of the load data) to identify a load type of the load 120.

For example, analysis of the sampled current and voltage waveforms includes matching patterns in the high frequency components of the voltage and current waveforms from the load 120. In other embodiments, the analysis of the waveforms includes determining a delay in timing of the load drawing power after power is first applied to the load. In other embodiments, analysis comprises classifying the acquired waveforms, including high frequency components thereof, into groups that are indicative of different load types. Non-limiting examples of groups include waveforms indicative of a primarily resistive load, a capacitive load, an inductive load, loads that include power factor correction and loads that include power control such that there is a delay in the power to the load at initial application of power form the source.

In other embodiments, the processor 1602 can access and utilized a remote server for analyzing the recorded current and voltage waveform samples. In this instance, the processor 1602 would transmit the recorded samples (via wired or wireless communication links through an IP (internet protocol) network) to a remote server for processing, and then receive the process results from the remote server. In some embodiments, the processor 1602 is configured to execute a process flow as illustrated in FIG. 17.

Figure 17:
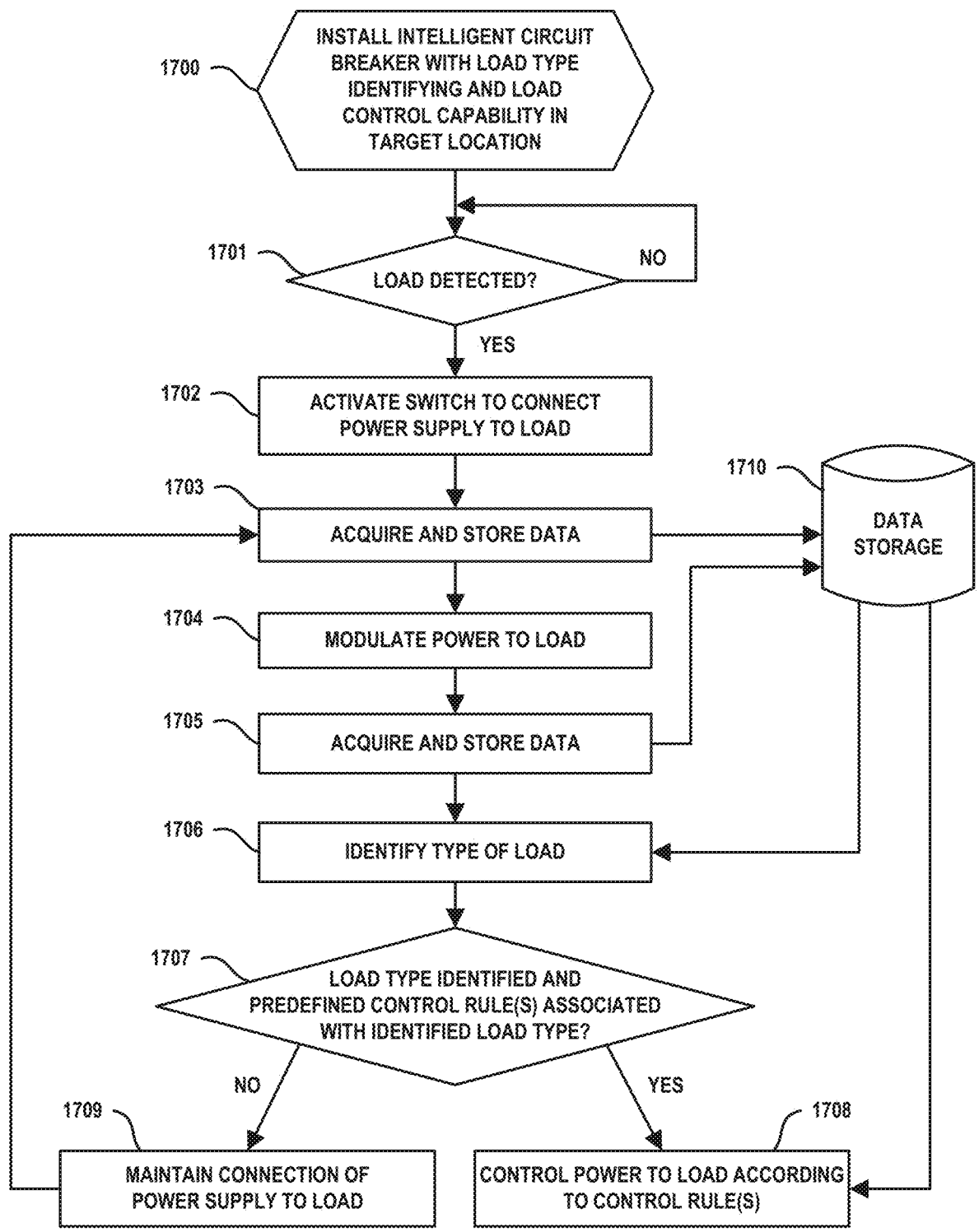
FIG. 17 is a flow diagram of a method of a load identifying and control process which is implemented by an intelligent circuit breaker, according to an embodiment of the disclosure.

In particular, FIG. 17 is a flow diagram of a method of a load identifying and control process which is implemented by an intelligent circuit breaker, according to an embodiment of the disclosure. An intelligent circuit breaker having a load type identifying and load control capability is installed at a target location between the AC mains and a load (block 1700). For illustrative purposes, FIG. 17 will be described in the context of the intelligent circuit breaker 1600 of FIG. 16. In some embodiments, the intelligent circuit breaker 1600 is installed in a circuit breaker distribution panel. In some embodiments, the intelligent circuit breaker 1600 comprises a device that is installed in a separate junction box between the AC mains and the load. In other embodiments, the intelligent circuit breaker 1600 is a component of an electrical receptacle. In some embodiments, the intelligent circuit breaker 1600 is a component of an electronic supply strip or smart extension cord.

Once installed and supply power is applied, the intelligent circuit breaker 1600 will proceed to monitor the connection of a load (block 1701). In response to detecting a load (affirmative determination in block 1701), the intelligent circuit breaker 1600 will activate the switches 1604 and 1606 to connect the power supply voltage of the AC mains to the load (block 1702). The intelligent circuit breaker 1600 then proceeds to acquire and store various types of data for subsequent analysis (block 1703). The acquired data is stored in a data storage device 1710.

For example, data acquisition comprises recording timing information with regard to the time that the load is connected to the AC mains power supply, the time that power is applied to the load, and the time that power is used by the load. In addition, data acquisition comprises acquiring waveform data. Any data acquired once a load is detected that is specific to a load is termed "load data." Load data includes the turn on timing of the load as well as waveform data. Waveform data includes acquiring values of the AC main voltage, the load voltage the load current and the power consumed by the load as a function of time.

The data is acquired at a frequency which is optimized for detection of the type of load. In some embodiments, data is acquired at a frequency that is a multiple higher than the frequency of the AC mains source. For example, in one embodiment, data for a 50 to 60 cycle AC source data is acquired at a kilohertz rate. In other embodiments where high frequency components of the voltage and current waveforms are needed to properly identify a given type of load, the data is acquired at a megahertz rate.

In some embodiments, the acquired data is stored in a RAM of the processor 1602 for real-time or near real-time processing. In other embodiments, the acquired data is stored in persistent memory or storage for subsequent access and analysis, e.g., pattern matching, to identify the identical or similar loads based upon matching of the waveform patterns obtained at the first connection of the load (block 1701) with connection of the same or different loads at later times. In some embodiments, the data storage 1710 is accessible by a plurality of intelligent circuit breaker devices with load identifying and load control capabilities. Such storage is accessible by devices that are wired or wirelessly connected to the intelligent circuit breaker 1600 or by transfer of the stored load data from an intelligent circuit breaker 1600 to another device such as an intelligent circuit breaker device.

Subsequent to the initial data acquisition (block 1703), the intelligent circuit breaker 1600 can modulate the power that is supplied to the load (block 1704). In particular, in some embodiments, power modulation comprises controlling one or more of the switches 1604 and 1606 to vary the power that is delivered to the load. Additional load data is acquired and stored both during and after the power modulation (block 1705). The intelligent circuit breaker 1600 proceeds to perform a load identification process to identify the load type of the connected load based on the acquired load data which is captured, before, during and after the power modulation (block 1706).

In some embodiments, the load identification process is performed by comparing the waveforms of the load data with previous acquired waveforms in load data of known load devices. In other embodiments, the load identification process is based on both the timing around the turn on of the power to the load, as already discussed, and matching of the wave form data. In other embodiments, a neural network analysis is used to classify the load data into a category of load types by comparison with a library of prior load data. In other embodiments, the load identification process can implement any suitable classification process using a trained model to classify the connected load into a particular category of load based upon the phase relationship between the load voltage and current wave forms and the AC mains voltage wave form both before, during and after modulation of the power to the connected load using the switches 1604 and/or 1606.

For example, a load type of a given load can be classified as one of:

(1) Pure Resistive Load: Voltage and current zero crossing and peak synchronously both before during and after modulation of the supply voltage. Power is reduced when voltage is reduced, power returns to pre-modulation level when modulation of supply voltage is stopped and supply voltage returns to full voltage;

(2) Constant power Resistive load with power correction. Voltage and current peak synchronously before modulation, power is constant before, during and after modulation;

(3) Pure Reactive (capacitive or inductive) load. Voltage and current are out of phase before, during and after modulation, power is reduced during modulation of the supply voltage, Power returns to pre-modulation level when modulation of supply voltage ends and returns to full voltage.

(4) Constant Power Reactive load. Voltage and current are out of phase before, during and after modulation, power is constant before, during and after modulation of the supply voltage.

In some embodiments, modulation of the supply voltage results in a reduction of the RMS supply voltage by an amount between 1 and 20%. In some embodiments, the load identification process (block 1706) further comprises determining a confidence level for the identification. In one embodiment the confidence level is determined by the goodness of fit of a match of the load data obtained during the data acquisition steps 1703 and 1705 with data obtained previously on known loads and stored in data storage 1701. Once the identification process (block 1706) is complete, a determination is made as to whether the load-type of the connected load has been properly identified with a given level of confidence and whether there are control rules associated with the identified type of load (block 1707). In some embodiments, such determination (block 1707) is done by comparing a confidence level in the identification with a pre-selected confidence level defined as positive identification.

If the load is positively identified and there are pre-selected control rules associated with the identified load (affirmative determination in block 1707), then the intelligent circuit breaker 1600 can control power to the connected load according to one or more of the associated control rules (block 1708). For example, power to the connected load is controlled by controlling the switches 1604 and/or 1606 in series with the load. Non-limiting examples of pre-selected control rules include:

(1) during daylight hours, a pure resistive load such as a light bulb is dimmed to reduce power usage, especially during peak demand;

(2) in constant power load, when load demands drop, the input power will drop accordingly to minimize the power consumption of no load/minimum load requirements;

(3) in remote location (no human presence), a pure resistive load and a constant power resistive load will be disconnected and reconnected automatically by the demand of the load; and (4) devices that produce an arc during normal operation (e.g. an electric motor having brush connections to the rotor) are ignored by an arc-fault circuit interrupter to prevent nuisance disconnects.

In other embodiments, there are a pre-selected set of rules based upon whether the load type is one of: a pure resistive load; a constant power resistive load, a pure reactive load, and a constant power reactive load. In one non-limiting example of pre-selected rules, the loads identified as having an included power factor correction, that is constant power loads, are not turned off by the controller and a pure resistive loads are turned off during pre-selected periods of time and power to pure reactive loads is reduced during pre-selected periods of time. On the other hand, if either the load type is not identified or there are no predefined control rules associated with the identified load type (negative determination in block 1707), the intelligent circuit breaker will simply maintain the connection of the power supply and load (block 1709), and disconnect in response to fault conditions as discussed herein.

Figure 18A:
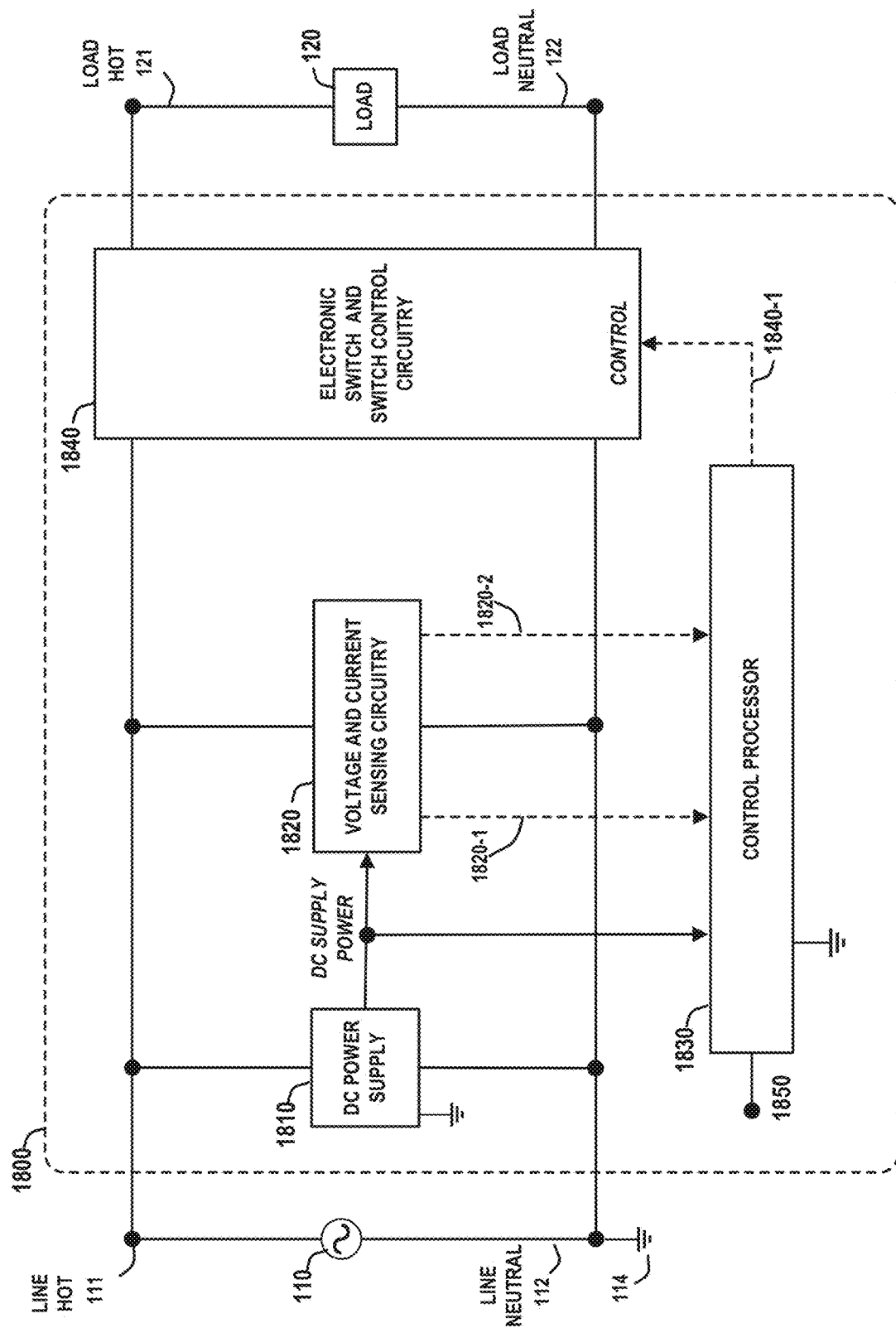
FIG. 18A is a schematic block diagram of an intelligent circuit breaker which is configured to monitor for ground-fault and arc-fault conditions and provide circuit interruption in response to detected fault conditions, according to an embodiment of the disclosure.

In other embodiments, an intelligent circuit breaker can be configured to include fault detection sensors and circuitry to support arc-fault circuit interrupt (AFCI) and/or ground-fault circuit interrupt (GFCI) functions using control circuitry and methods as disclosed in U.S. patent application Ser. No. 16/093,044, filed on Oct. 11, 2018, entitled "Solid-State Line Disturbance Circuit Interrupter," the disclosure of which is fully incorporated herein by reference. An intelligent AFCI circuit breaker according to an embodiment of the disclosure is configured to provide protection against parallel arcing (line to neutral), series arcing (a loose, broken, or otherwise high resistance segment in a given line, and ground arcing (from line, or neutral, to ground). An intelligent GFCI circuit breaker according to an embodiment of the disclosure is configured to provide protection against ground-faults which occur when electrical current in given device or appliance leaks from the normal path from line to neutral an appliance. A GFCI circuit breaker monitors the difference in current between the hot and neutral lines, and when the current input to a given load on the hot line is greater that the return current from the load on the neutral line by a predefined amount (e.g., 5 mA), the GFCI breaker will trip to stop of flow of current. FIG. 18A is a schematic block diagram of an intelligent circuit breaker 1800 which is configured to monitor for ground-fault and arc-fault conditions and provide circuit interruption in response to detected fault conditions, according to an embodiment of the disclosure. The intelligent circuit breaker 1800 comprises a low voltage DC power supply 1804, voltage and current sensing circuitry 1820, a control processor 1830, and electronic switch and switch control circuitry 1840. The low voltage DC power supply 1810 efficiently provides DC power for the voltage and current sensing circuitry 1820, and the control processor 1830. Sense inputs 1820-1 and 1820-2 to the control processor 1830 are provided from the voltage and current sensing circuitry 1820. The voltage and current sensing circuitry 1820 comprises sensors that sense the waveforms of the voltage and current applied to the load circuit, and, develop proportional analog waveforms. The control processor 1830 processes the proportional analog waveforms and upon detection of either a ground-fault or an arc-fault generates a fault output on control line 1840-1, which is coupled to switch control circuitry 1840. Upon detection of a fault, a fault output signal applied on control line 1840-1 is latched and fed to a CONTROL input of the switch control circuitry and causes the electronic switch to disconnect the load 120 from the AC mains 110 until a reset 1850 is applied to the fault detection control processor 1830.

In other embodiments, an output voltage of the electronic switch 1840 can be varied through the switch control circuitry. For example, upon detection of an arc-fault, the output voltage can be reduced to a value that is less than a threshold for arcing yet greater than zero. Such an embodiment allows the load circuit to continue operation at a reduced voltage while reducing the chance for a damaging arc. The operation at reduced voltage also allows for continued characterization of the load and mains supply circuit to determine the location of an arc-fault for subsequent replacement or repair.

Figure 18B:
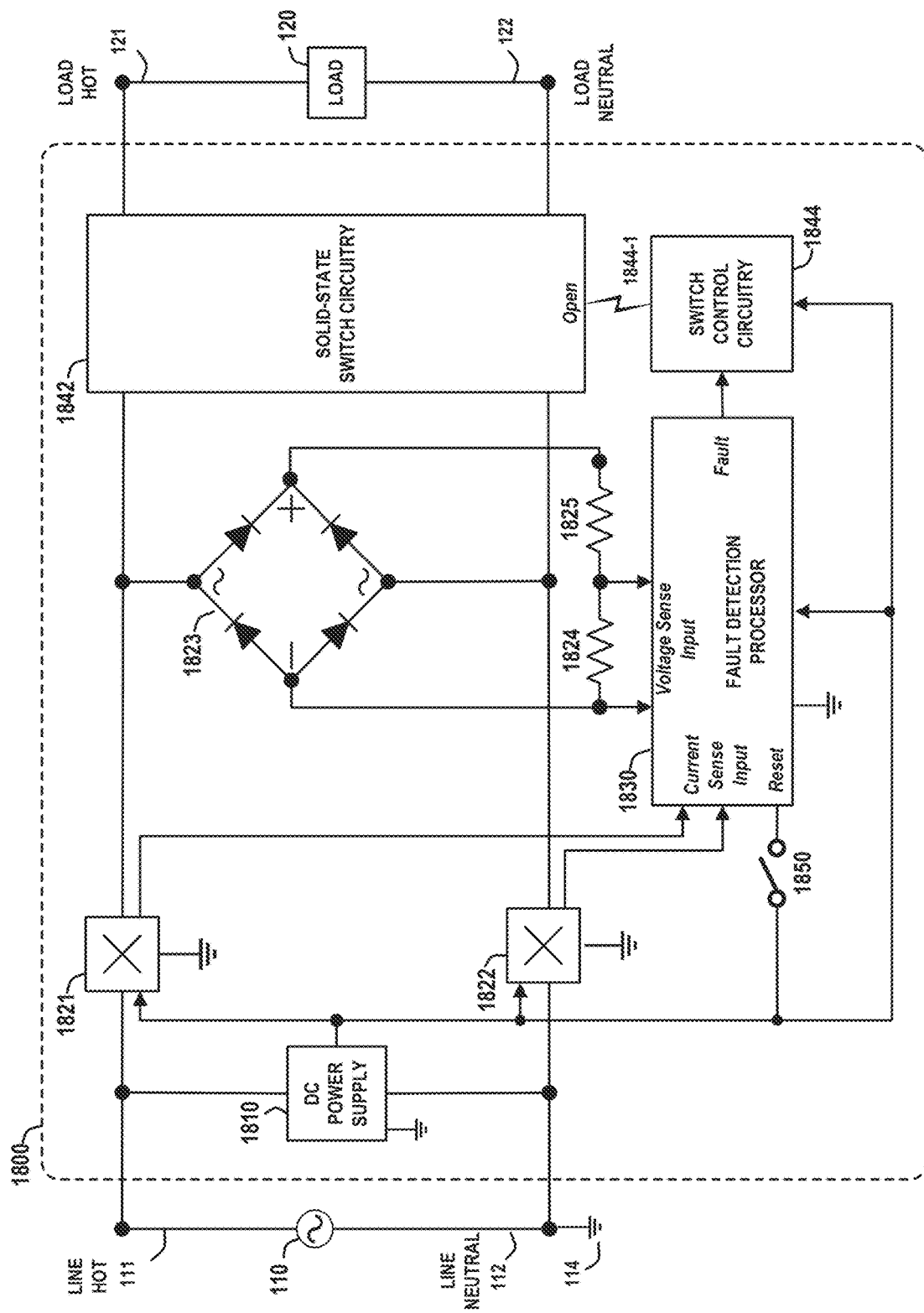
FIG. 18B is a schematic circuit diagram of the intelligent circuit breaker of FIG. 18A, according to an embodiment of the disclosure.

FIG. 18B is a schematic circuit diagram of the intelligent circuit breaker 1800 of FIG. 18A, according to an embodiment of the disclosure. In the exemplary embodiment of FIG. 18B, the voltage and current sensing circuitry (1820, FIG. 18A) comprises a first current sensor 1821, a second current sensor 1822, a full-wave rectifier 1823, and sense resistors 1824 and 1825. The electronic switch and control circuitry (1840, FIG. 18A) comprises solid-state switch circuitry 1842 (e.g., solid state bidirectional switch) to connect the AC mains 110 to the load 120, and switch control circuit 1844 that controls the solid-state switch circuitry 1842 via an optical signal interface 1844-1. The low voltage AC-to-DC power supply 1810 provides DC supply power for the current sensors 1821 and 1822, the fault detection processor 1830, and the switch control circuitry 1844. The fault detection processor 1830 comprises current sense inputs for each of the current sensors 1821 and 1822 and voltage sense inputs that sense voltage across the sense resistors 1824 and 1825.

In some embodiments, as shown in FIG. 18B, the first and second current sensors 1821 and 1822 comprise solid-state Hall Effect sensors which generate an output voltage proportional to the current flowing in the line hot 111 and line neutral 112 paths. The voltages generated by the Hall Effect sensor outputs are fed to the current sense inputs of the fault detection processor 1830. Further, in some embodiments, the voltage sensor comprises a full-wave rectifier bridge 1823 which is configured to convert both half cycles of the AC supply voltage waveform of the AC mains 110 into a pulsating DC voltage. The full-wave rectified waveform is attenuated using a resistive divider network comprising resistors 1824 and 1825 and applied to the voltage sense inputs of the fault detection processor 1830. In some embodiments, the full-wave rectifier bridge 1823 can be eliminated and the full-wave rectified waveform obtained directly from the output of the AC-DC converter circuit 1810.

Upon detection of a fault by the fault detection processor 1830, a fault output of the fault detection processor 1830 is latched and fed to a control input of the switch control circuitry 1844, which then generates an optical control signal 1844-1 to the solid-state bidirectional switch circuitry 1842 to disconnect the load 120 from the AC mains 110 until a reset switch 1850 is activated to reset the fault detection processor 1830. As noted above, in other embodiments, the output voltage of the solid-state switch circuitry 1842 is varied through the switch control circuitry 1844 such that upon detection of an arc-fault, the output voltage is reduced to a value that is less than a threshold for arcing yet greater than zero. This allows the load 120 to continue operation at a reduced voltage while reducing the chance for a damaging arc. The operation at reduced voltage also allows for continued characterization of the load and mains supply circuit to determine the location of an arc-fault for subsequent replacement or repair.

Figure 19:
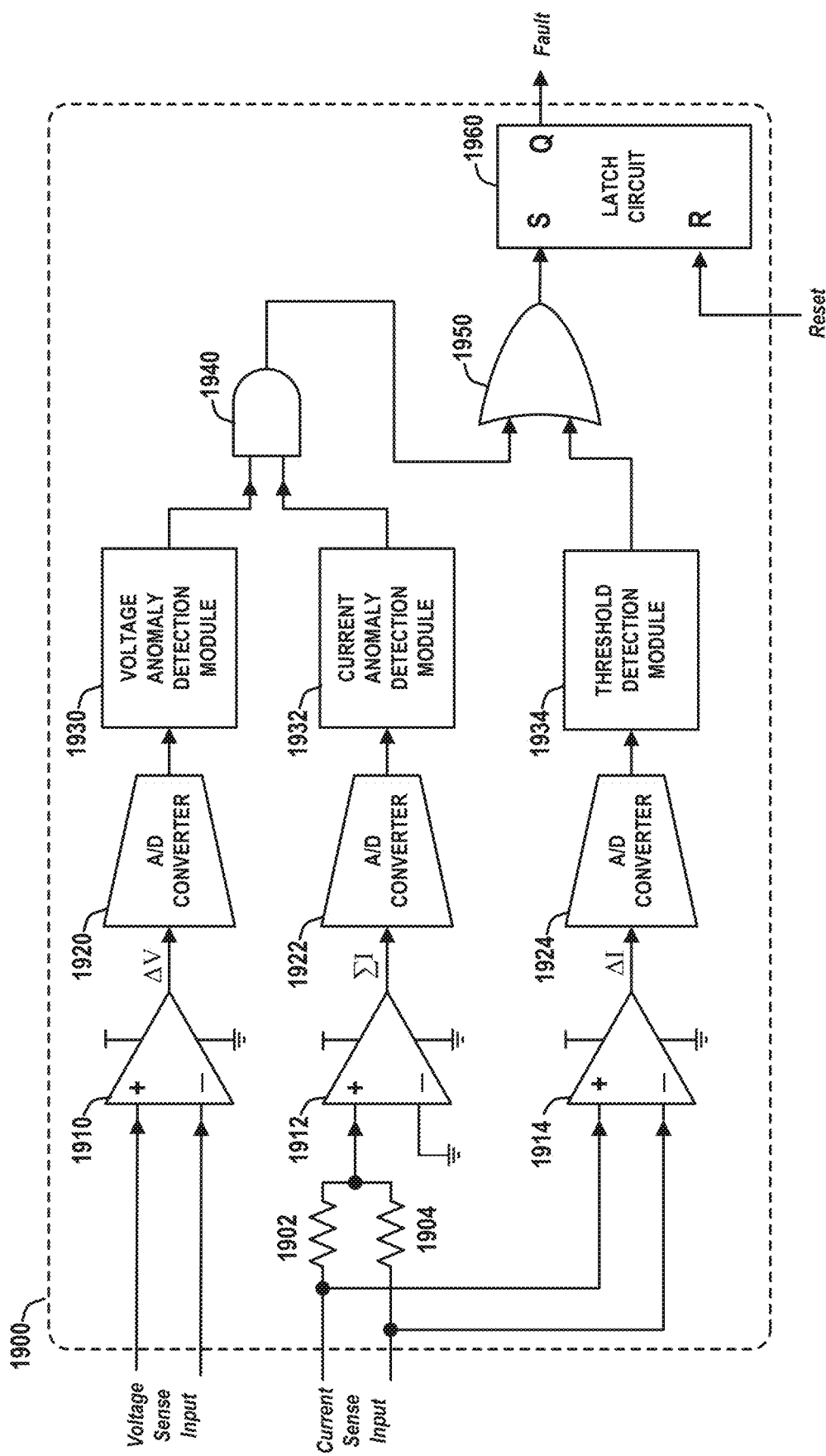
FIG. 19 is a schematic block diagram of a fault detection processor which can be implemented in the intelligent circuit breaker of FIG. 18B, according to an embodiment of the disclosure.

FIG. 19 is a schematic block diagram of a fault detection processor 1900 which can be implemented in the intelligent circuit breaker of FIG. 18B, according to an embodiment of the disclosure. The fault detection processor 1900 comprises input resistors 1902 and 1904, amplifiers 1910, 1912, and 1914, A/D converters 1920, 1922, and 1924, a voltage anomaly detection module 1930, a current anomaly detection module 1932, and threshold detection module 1934, an AND gate 1940, and OR gate 1950, and a latch circuit 1960. The voltage sense signals are applied to the inverting and non-inverting input terminals of the amplifier 1910. The amplifier 1910 is configured as a differential amplifier which generates a difference signal $\Delta V$ that is input to the A/D converter 1920. The current sense inputs are applied to the non-inverting input of the amplifier 1912 through the resistors 1902 and 1904. The sense inputs are summed by the input circuit (1902, 1904) and the operational amplifier 1912 outputs a signal that is proportional to the sum of the currents $\Sigma I$ in the line and neutral legs of the AC mains 110. The $\Sigma I$ signal is also applied to the input of the A/D converter 1922. The digitized $\Delta V$ signal is processed by the voltage anomaly detection module 1930 (e.g., subprogram) that is executed by the fault detection processor 1900 to detect anomalies in the voltage waveform over several cycles that indicate the presence of an arc-fault. One non-limiting example of such a voltage anomaly is the presence of excess high frequency energy impressed upon the normally low frequency AC mains voltage waveform.

The digitized $\Sigma I$ signal is processed by the current anomaly detection module 1932 (subprogram) that is executed by the fault detection processor 1900 to detect anomalies in the current waveforms over several cycles that indicate the presence of an arc-fault. One non-limiting example of such a current anomaly is the occurrence of "shoulders" (flat spots) in the current waveform that occur near zero-crossings of the current waveform. The outputs of the detection modules 1930 and 1932 are input to the AND gate 1940, wherein a combined appearance of a voltage waveform anomaly and a current waveform anomaly is one indicator of an arc-fault.

The current sense signals are also applied to the inputs of the amplifier 1914 which forms a difference signal $\Delta I$ proportional to the difference between the currents in the line and neutral legs. The $\Delta I$ signal is digitized by the A/D converter 1924 and processed by the threshold detection module 1934 which generates a threshold detection signal which indicates a ground-fault. The arc-fault signal at the output of the AND gate 1940 and the ground-fault signal at the output of the threshold detection module 1934 are logically OR'ed via the OR gate 1950, and the output of the OR gate 1950 is input to the latch circuit 1960. The latch circuit 1960 outputs a fault detection signal and stores the fault condition until cleared by an external reset signal.

Figure 20:
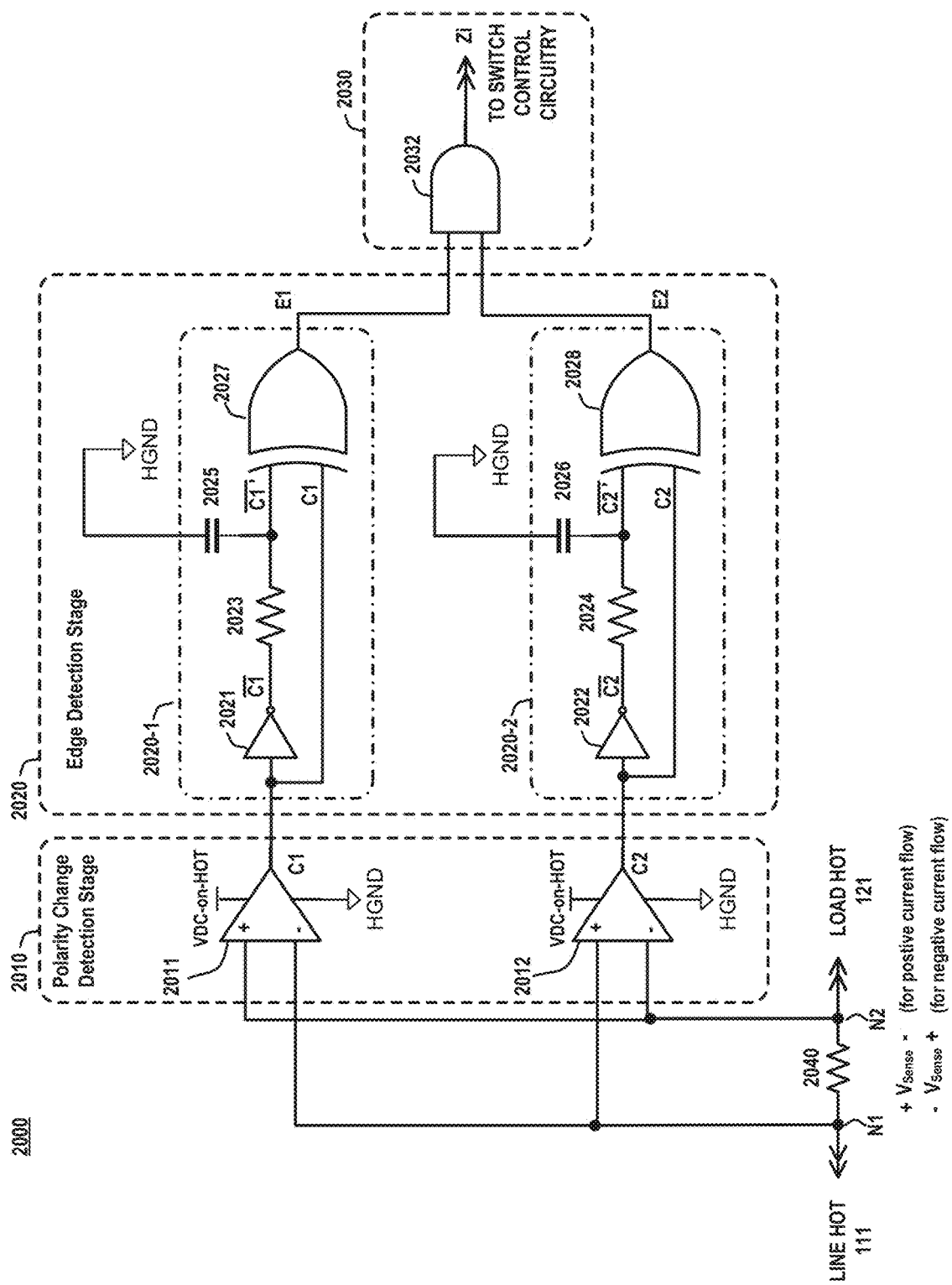
FIG. 20 schematically illustrates a current zero-crossing detector circuit according to an embodiment of the disclosure.

FIG. 20 schematically illustrates a current zero-crossing detector circuit according to an embodiment of the disclosure. In particular, FIG. 20 schematically illustrates a current zero-crossing detector circuit 2000 comprising a polarity change detection stage 2010, an edge detection stage 2020, an output stage 2030, and a sense resistor 2040. In some embodiments, the sense resistor 2040 is connected in series in an electrical path between the line hot 111 and the load hot 121. The polarity change detection stage 2010 comprises a first comparator 2011 and a second comparator 2012. The edge detection stage 2020 comprises a first edge detection circuit 2020-1 connected to an output of the first comparator 2011, and a second edge detection circuit 2020-2 connected to an output of the second comparator 2012. The first and second edge detection circuits 2020-1 and 2020-2 comprise respective inverters 2021 and 2022, respective resistors 2023 and 2034, respective capacitors 2025 and 2026, and respective exclusive-OR (XOR) gates 2027 and 2028. The output stage 2030 comprises an AND gate 2032 having inputs connected to the outputs of the XOR gates 2027 and 2028 of the edge detection stage 2020.

The sense resistor 2040 generates an AC voltage (referred to as sense voltage, $V_{Sense}$) across a first node N1 (line side node) and a second node N2 (load side node) based on an AC load current that flows through the sense resistor 2040 in the electrical path between the line hot 111 and the load hot 121. As noted above, in some embodiments, the sense resistor 2040 comprises a high-power resistor that has a relatively low resistance value which can generate a sufficient sense voltage across the sense resistor 2040 for purposes of measurement, while not consuming a large amount of energy. For example, in some embodiments, the sense resistor 2040 comprises a resistance value of about 1 milli-Ohm. In some embodiments, the sense resistor 2040 shown in FIG. 20 is the same sense resistor 922 shown in FIG. 9A, wherein multiple detection circuits of an intelligent circuit breaker are tapped off the same sense resistor to provide various functionalities.

The polarity change detection stage 2010 is configured to detect a polarity change of the sense voltage $V_{Sense}$ that is generated across the sense resistor 2040 as a result of AC current flow through the sense resistor 2040. The first and second comparators 2011 and 2012 are each configured as a voltage comparator which compares a reference voltage applied to a inverting input (−) of the comparator with an input voltage applied to a non-inverting input (+) of the comparator, and generates a logic "1" output when the input voltage is greater than the reference voltage, and generates a logic "0" output when the input voltage is less than the reference voltage. More specifically, in the exemplary embodiment of FIG. 20, the first comparator 2011 comprises a non-inverting input (+) connected to a load side (node N2) of the sense resistor 2040 and an inverting input (−) connected to a line side (node N1) of the sense resistor 2040. The second comparator 2012 comprises a non-inverting input (+) connected to the line side (node N1) of the sense resistor 2040 and an inverting input (−) connected to the load side (node N2) of the sense resistor 2040.

During positive half-cycles of the voltage waveform of the AC mains 110, positive current flows through the sense resistor 2040 from node N1 to node N2, which results in a positive sense voltage (+$V_{Sense}$) drop across the sense resistor 2040 (i.e. VN1-VN2>0). With a positive sense voltage (+$V_{Sense}$), an output compare signal C1 of the first comparator 2011 will be logic "0", and an output compare signal C2 of the second comparator 2012 will be logic "1." On the other hand, during negative half-cycles of the voltage waveform of the AC mains 110, negative current flows through the sense resistor 2040 from node N2 to node N1, which results in a negative sense voltage (−$V_{Sense}$) drop across the sense resistor 2040 (i.e., VN1-VN2<0). With a negative sense voltage (−$V_{Sense}$), the output compare signal C1 of the first comparator 2011 will be logic "1", and the output compare signal C2 of the second comparator 2012 will be logic "0".

When the sense voltage $V_{Sense}$ transitions from positive (+$V_{Sense}$) to negative (−$V_{Sense}$), the output compare signal C1 of the first comparator 2011 transitions from logic 0 to logic 1, and the output compare signal C2 of the second comparator 2012 transitions from logic 1 to logic 0. On the other hand, when the sense voltage $V_{Sense}$ transitions from negative (−$V_{Sense}$) to positive (+$V_{Sense}$), the output compare signal C1 of the first comparator 2011 transitions from logic 1 to logic 0, and the output compare signal C2 of the second comparator 2012 transitions from logic 0 to logic 1.

The transitions (or edges) of the compare signals C1 and C2 are detected by the respective edge detection circuits 2020-1 and 2020-2 of the edge detection stage 2020. More specifically, in the first edge detection circuit 2020-1, the XOR gate 2027 has a first input terminal which receives the compare signal C1, and a second input terminal which receives a delayed complementary compare signal $\overline{C1'}$. The delayed complementary compare signal $\overline{C1'}$ is generated by the inverter 2021 and a delay circuit implemented by the resistor 2023 and the capacitor 2025, wherein the inverter 2021 is configured to generate and output an inverted (complementary) compare signal $\overline{C1}$, and wherein the resistor 2023 and the capacitor 2025 are configured to apply an RC delay to the complementary compare signal $\overline{C1}$ and thereby generate the delayed complementary compare signal Cr. In an exemplary embodiment, the resistor 2023 has a resistance of 1 kilo-ohm, and the capacitor 2025 has a capacitance of 3.3 nano-farads. The XOR gate 2027 generates a short logic 0 edge pulse signal E1 during a period of time when the input signals C1 and $\overline{C1'}$ have the same logic level (e.g., both logic 0 or both or logic 1).

Similarly, in the second edge detection circuit 2020-2, the XOR gate 2028 has a first input terminal which receives the compare signal C2, and a second input terminal which receives a delayed complementary compare signal $\overline{C2'}$. The delayed complementary compare signal $\overline{C2'}$ is generated by the inverter 2022 and a delay circuit implemented by the resistor 2024 and the capacitor 2026, wherein the inverter 2022 is configured to generate and output an inverted (complementary) compare signal $\overline{C2}$, and wherein the resistor 2024 and the capacitor 2026 are configured to apply an RC delay to the complementary compare signal $\overline{C2}$ and thereby generate the delayed complementary compare signal $\overline{C2'}$. In an exemplary embodiment, the resistor 2024 has a resistance of 1 kilo-ohm, and the capacitor 2026 has a capacitance of 3.3 nano-farads. The XOR gate 2028 generates a short logic 0 edge pulse signal E2 during a period of time when the input signals C2 and $\overline{C2'}$ have the same logic level (e.g., both are logic 0 or both are logic 1).

In operation, the XOR gates 2027 and 2028 generate the respective edge pulse signals E1 and E2 just prior to the current zero-crossing and just after the zero-current crossing. The AND gate 2032 has first and second input terminals connected to the respective outputs of the XOR gates 2027 and 2028. The AND gate 2032 generates and outputs a current zero-crossing detection signal Zi based on a logical ANDing of the output signals E1 and E2. The current zero-crossing detection signal Zi is applied to switch control circuitry which controls one or more switches (e.g., solid-state bi-directional switch and/or a solenoid of an electromechanical switch) of the intelligent circuit breaker. In the exemplary circuit configuration of FIG. 20, the AND gate 2032 outputs two zero-going pulses, one before and one after current zero-crossing. The two pulses are closer together with increasing sense current. At large currents (e.g., 100 amps), the two pulses are essentially one pulse. Given that the outputs of the edge detection circuits 2020-1 and 2020-2 are "ground-true," the AND gate 2032 in this configuration functions as "ground-true" OR gate because anytime a logic "0" is on one of the inputs of the AND gate 2032, the output of the AND gate 2032 will be logic "0."

Figure 21A:
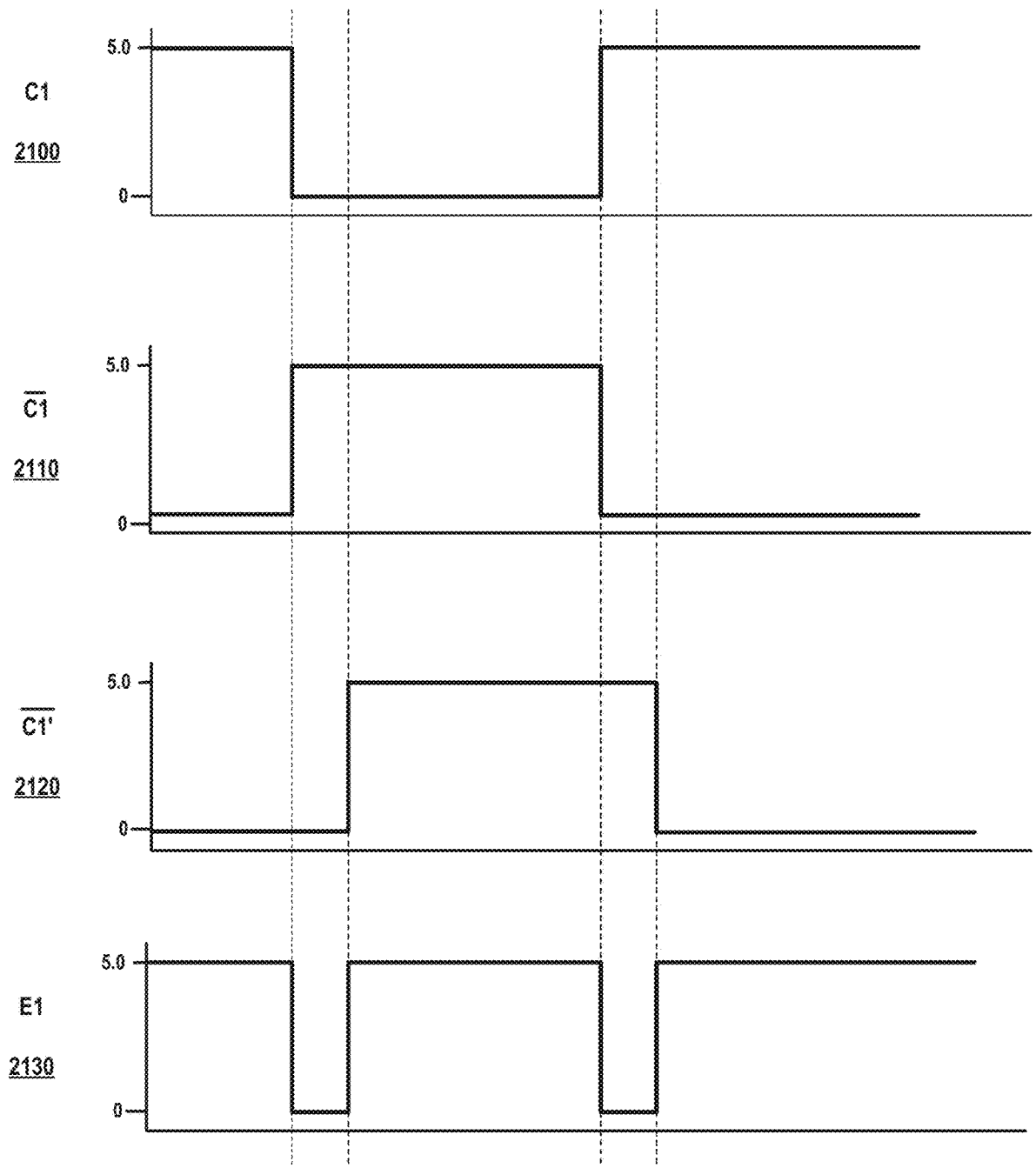
Figure 21B:
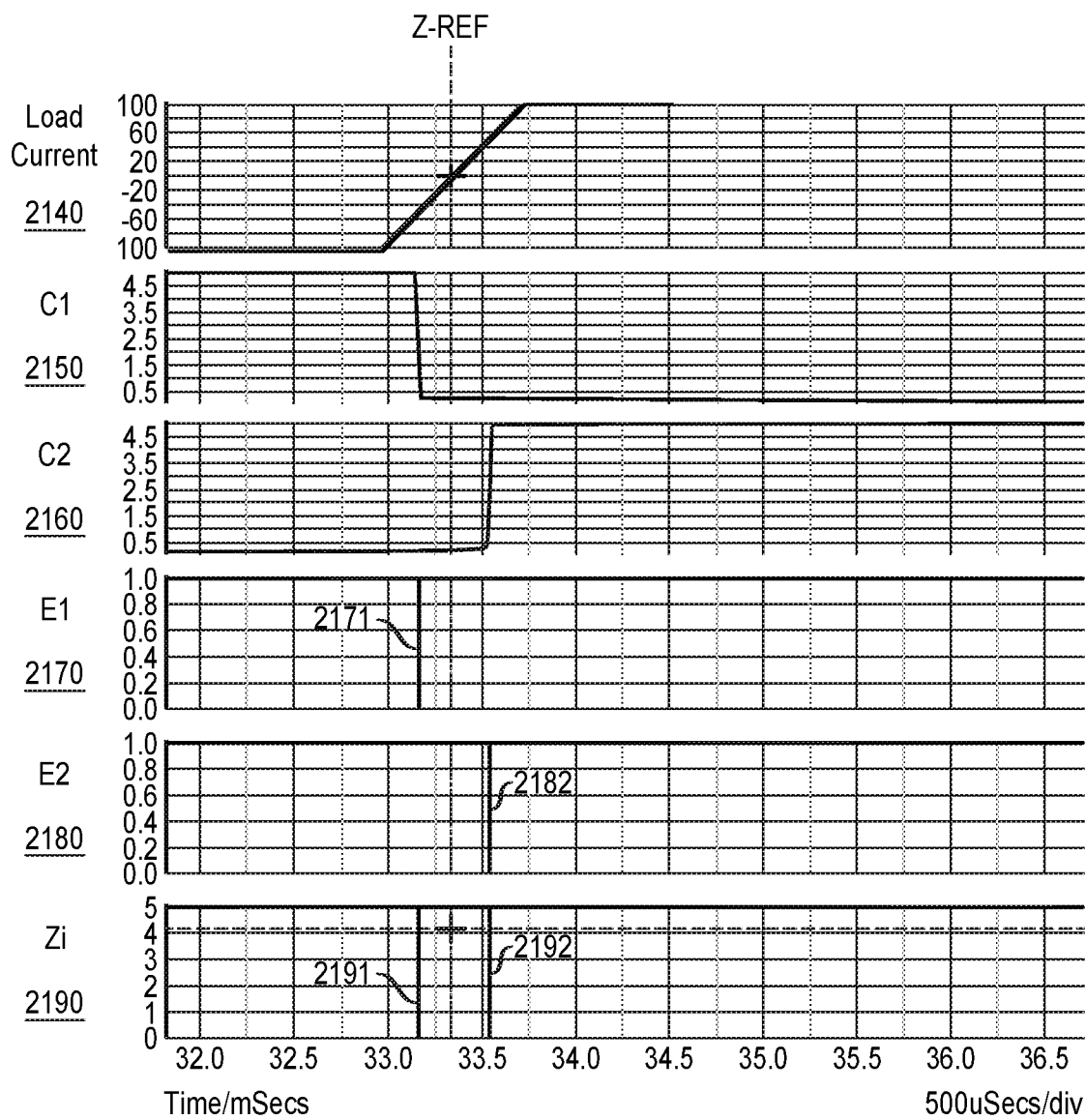

FIGS. 21A and 21B depict various waveforms that illustrate operating modes of the current zero-crossing detection circuit of FIG. 20, according to an embodiment of the disclosure. For example, FIG. 21A depicts waveforms that illustrate a mode of operation of the edge detection stage 2020 of FIG. 20, in particular, an operating mode of the first edge detection circuit 2020-1. In particular, FIG. 21A illustrates a timing diagram for plurality of signal waveforms 2100, 2110, 2120, and 2130, wherein waveform 2100 represents an exemplary compare signal C1 which is generated by the first comparator 2011, wherein waveform 2110 represents an exemplary complementary compare signal $\overline{C1}$ which output from the inverter 2021, wherein waveform 2120 represents an exemplary delayed complementary compare signal $\overline{C1'}$ which is generated as a result of the RC delay circuit at the output of the inverter 2021, and wherein waveform 2130 represents an exemplary edge detection signal E1 that is generated by the XOR gate 2027 in response to the waveforms 2100 and 2120 applied to the inputs of the XOR gate 2027.

As shown in FIG. 21A, the waveform 2130 of the edge detection signal E1 generates a zero-going pulse in response to each logic transition of the waveform 2100 of the compare signal C1 output from the first comparator 2011. The edge detection circuit 2020-2 operates in a similar manner to the edge detection circuit 2020-1, as depicted in the timing diagram of FIG. 21A. In particular, the waveforms 2100, 2110, 2120, and 2130 can represent, respectively, the compare signal C2 generated by the second comparator 2012, the complementary compare signal $\overline{C2}$ generated by the inverter 2022, the delayed complementary compare signal $\overline{C2'}$ generated by the RC delay circuit (resistor 2024, and capacitor 2026), and the edge detection signal E2 output from the XOR gate 2028 in response to the waveforms C2 and $\overline{C2'}$ applied to the inputs of the XOR gate 2028. It is to be understood that the waveforms 2100, 2110, 2120, and 2130 are generically depicted in FIG. 21A and do not take into account, e.g., slew rates (of rising and falling edges) of the signals, propagation delays through the logic gates, etc.

FIG. 21B illustrates simulated signal waveforms that illustrate an operating mode of the current zero-crossing detection circuit 2000 of FIG. 20, according to an embodiment of the disclosure. In particular, FIG. 21B illustrates a timing diagram for plurality of simulated signal waveforms 2140, 2150, 2160, 2170, 2180, and 2190. The waveform 2140 represents an exemplary current waveform of load current that flows through the sense resistor 2040. The waveform 2150 represents an exemplary compare signal C1 which is generated by the first comparator 2011. The waveform 2160 represents an exemplary compare signal C2 which is generated by the second comparator 2012. The waveform 2170 represents an exemplary edge detection signal E1 generated by the first edge detection circuit 2020-1. The waveform 2180 represents an exemplary edge detection signal E2 generated by the second edge detection circuit 2020-2. The waveform 2190 represents a current zero-crossing detection signal Zi which is generated by the AND gate 2032 in response to the waveforms (D) and (E). In addition, FIG. 21B depicts a Z-REF dashed line, which represents a time of a current zero crossing of the current waveform 2140.

In FIG. 21B, the waveform 2140 of the load current is shown to rise from negative to positive, which indicates a transitioning of the AC current waveform through the sense resistor 2040 from a negative half-cycle to a positive half-cycle. In this instance, the sense voltage, $V_{Sense}$, transitions from negative ($-V_{Sense}$) to positive ($+V_{Sense}$). In reality, the zero cross of the load current through the sense resistor 2040 does not necessarily coincide with the zero cross of the voltage, as there can be a phase difference between the voltage and current due to, e.g., an inductive load (current phase trails voltage phase) or other instances when the power factor is less than 1 resulting in a phase difference between the load current and voltage waveforms.

As shown in FIG. 21B, the waveform 2150 illustrates the first compare signal C1 transitioning from logic "1" to logic "0" in response to a transitioning of the sense voltage $V_{Sense}$ from negative to positive, and the waveform 2160 illustrates the second compare signal C2 transitioning from logic "0" to logic "1" in response to the transitioning of the sense voltage $V_{Sense}$ from negative to positive. Further, the waveform 2170 illustrates that the first edge detection signal E1 output from the XOR gate 2027 comprises a short zero-going edge detection pulse 2171 which corresponds to the edge transition of the first compare signal C1 of waveform 2150. Similarly, the waveform 2180 illustrates that the second edge detection signal E2 output from the XOR gate 2028 comprises a short zero-going edge detection pulse 2182 which corresponds to the edge transition of the second compare signal C2 of waveform 2160.

It is to be noted that as shown in FIG. 21B, the falling edge of first compare signal C1 waveform 2150 precedes the zero current cross Z-REF and that the rising edge of the second compare signal C2 of waveform 2160 follows the zero current cross Z-REF. On a negative going cycle of the load current 2140 (not specifically shown), the roles reverse. In particular, the falling edge of the second compare signal C2 will precede the zero crossing of the load current, and the rising edge of first compare signal C1 will follow the zero crossing of the load current. This is due to asymmetry in the rising edge and falling edge propagation delay of the comparator circuitry in the polarity change detection stage 2010, and is a reason for the dual circuit configuration.

Moreover, the waveform 2190 of the zero-crossing detection signal Zi comprises a first zero-crossing detection pulse 2191 (zero-going pulse) and a second zero-crossing detection pulse 2192 (zero-going pulse) which are generated just before and just after the actual zero-crossing of the load current waveform 2140. As noted above, the waveform 2190 of the zero-crossing detection signal Zi is generated by logically ANDing the waveforms 2170 and 2180 of the edge detection signals E1 and E2, wherein the first zero-crossing detection pulse 2191 corresponds to the first edge detection pulse 2171 in the E1 waveform 2170, and wherein the second zero-crossing detection pulse 2192 corresponds to the second edge detection pulse 2182 in the E2 waveform 2180. In this regard, as noted above, in the exemplary circuit configuration of FIG. 20, the AND gate 2032 outputs two zero-going pulses 2191 and 2192, one before and one after the current zero-crossing.

Further simulations show that the zero-crossing detection pulses move closer together with increasing load current through the sense resistor 2040. At large currents (e.g., 100 amps), the two zero-crossing detection pulses are essentially one pulse, and are generated at essentially the same time as the actual current zero-crossing, where the load current through the sense resistor 2040 is substantially or actually zero. In particular, as the load current increases, the slope of the load current (dv/dt) increases. A benefit of the current zero-crossing detector circuit 2000 of FIG. 20 is that as the load current increases, the dual negative going pulses of Zi move closer in time towards one another and towards the point in time of the current zero crossing. Given that a goal of an intelligent circuit breaker (in which the current zero-crossing detector circuit 2000 is integrated) is to open an AC switch as close in time to the zero crossing as possible, it is beneficial to utilize the first of the dual pulses of Zi (as it precedes the zero current cross) to invoke action and get "head start" to open the AC switch, given that there are unavoidable delays in the switch control circuitry that invokes such action. In addition, as noted above, another benefit is that the pulses of Zi are closest to the current zero crossing when it is most important, at high current loads. At the highest loads (e.g., greater than 100 A) the dual pulses of Zi move so close together that they essentially merge into one pulse that is nearly coincident with current zero crossing.

FIG. 22 schematically illustrates a short-circuit detection circuit according to an embodiment of the disclosure. In particular, FIG. 22 schematically illustrates a short-circuit detection circuit 2200 comprising a first comparator 2202, a second comparator 2204, a NOR gate 2210, a plurality of resistors 2212, 2213, 2213, and 2215, and a sense resistor 2040. The sense resistor 2040 is connected in series between nodes N1 and N2 in the electrical path between the line hot 111 and the load hot 121. In some embodiments, the sense resistor 2040 is the same sense resistor 2040 that is utilized for the current zero-crossing detector circuit 2000 of FIG. 20.

The first comparator 2202 comprises a non-inverting input (+) connected to a load side (node N2) of the sense resistor 2040 and an inverting input (−) connected to a node N3 between the resistors 2212 and 2213. The second comparator 2204 comprises a non-inverting input (+) connected to the line side (node N1) of the sense resistor 2040 and an inverting input (−) connected to a node N4 between the resistors 2214 and 2215. The resistors 2212 and 2213 implement a first voltage divider circuit (connected across VDC on Hot and node N1) which is configured to generate a first reference voltage VREF1 at node N3 which is applied to the inverting input (−) of the first comparator 2202. The resistors 2214 and 2215 implement a second voltage divider network (connected across VDC on Hot and node N2) which is configured to generate a second reference voltage VREF2 at node N4 which is applied to the inverting input (−) of the second comparator 2204. The first and second comparators 2202 and 2204 have output terminals connected to input terminals of the NOR gate 2210.

In operation, the first comparator 2202 compares the sense voltage $V_{Sense}$ at node N2 with the first reference voltage VREF1 and generates and outputs a first compare signal HC1. The second comparator 2204 compares the sense voltage $V_{Sense}$ at node N1 with the second reference voltage VREF2 and generates and outputs a second compare signal HC2. The NOR gate 2210 logically NOR's the first and second compare signals HC1 and HC2 to generate and output a high-current detection signal HC which is applied to switch control circuitry which controls one or more switches (e.g., solid-state bi-directional switch and/or a solenoid of an electromechanical switch) of the intelligent circuit breaker.

More specifically, the first comparator 2202 generates and outputs a logic "1" signal (HC1) when the sense voltage $V_{Sense}$ at node N2 exceeds the first reference voltage VREF1, and the second comparator 2204 generates and outputs a logic 1 signal (HC2) when the sense voltage $V_{Sense}$ at node N1 exceeds the second reference voltage VREF2. In other words, in the exemplary embodiment of FIG. 22, the first comparator 2202 is configured to detect an extreme over-current condition of the load (i.e., short-circuit) during negative half-cycles of the AC supply voltage waveform, and the second comparator 2204 is configured to detect an extreme over-current condition of the load (i.e., short-circuit) during positive half-cycles of the AC supply voltage waveform. The NOR gate 2210 will output a logic "0" signal (HC) when either of the half-cycles is detected to have an extreme over-current condition (e.g., when either HC1 or HC2 is logic "1").

The resistance values of the resistors 2212, 2213, 2214 and 2215 are selected to generate reference voltages VREF1 and VREF2 which allow the short-circuit detection circuit 2200 to detect over-current conditions that exceed a target over-current threshold level. For example, for a 20 A breaker, the short-circuit detection circuit 2220 can be configured to detect short-circuit conditions in which the load current is 200 A or more. The ratio of the resistance values of resistors 2212 and 2213 is selected to achieve a desired value of the first reference voltage VREF1, and the ratio of the resistance values of resistors 2214 and 2215 is selected to achieve a desired value of the second reference voltage VREF2. In some embodiments, the resistance value of the resistor 2215 is selected to be substantially equal to a resistance value of the resistors 2212 and 2213 in parallel, which effectively compensates for the voltage drop across the sense resistor 2040.

Figure 23:
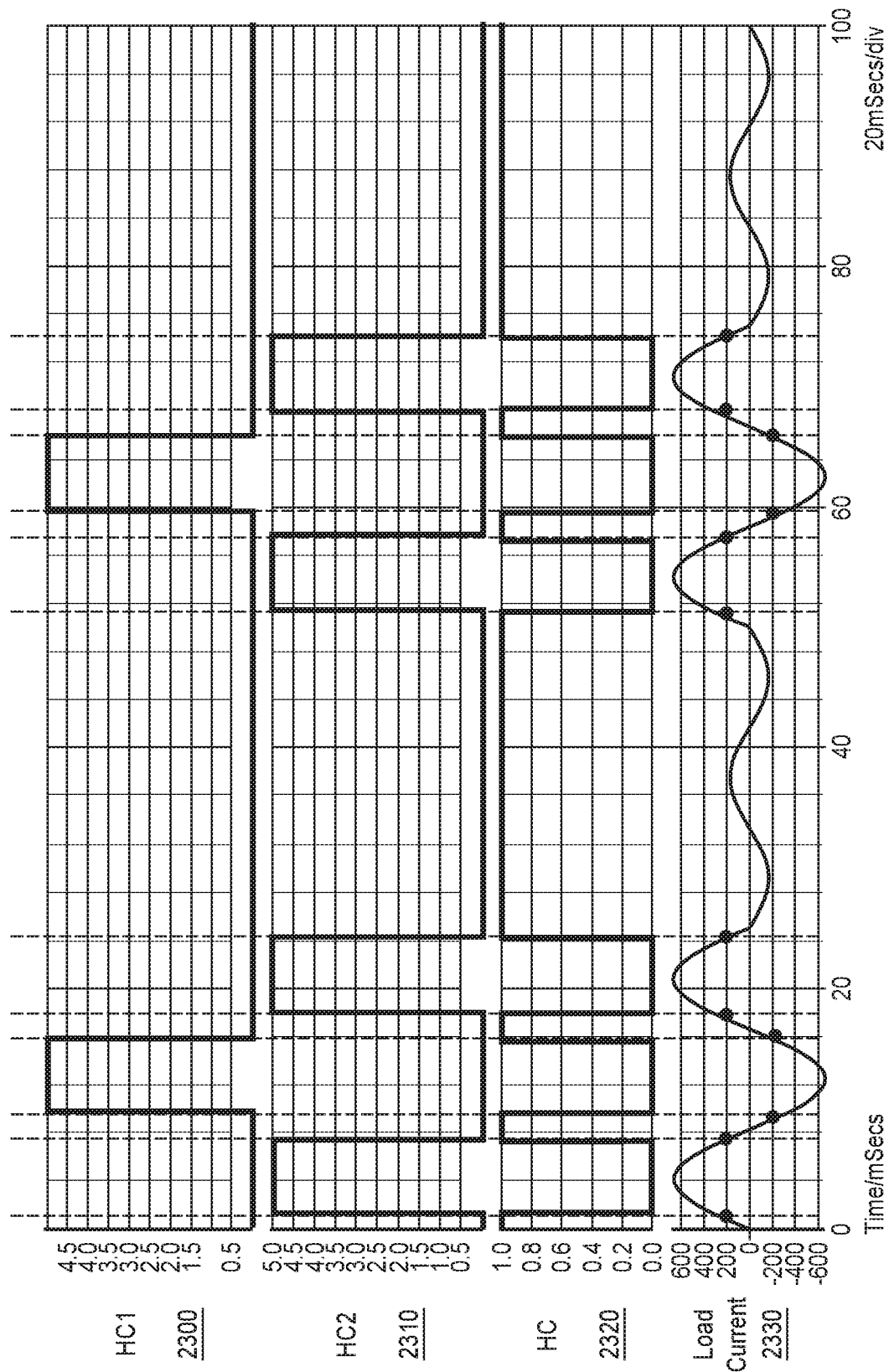
FIG. 23 illustrates simulated signal waveforms that illustrate a mode of operation of the short-circuit detection circuit of FIG. 22, according to an embodiment of the disclosure.

FIG. 23 illustrates simulated signal waveforms that illustrate a mode of operation of the short-circuit detection circuit 2200 of FIG. 22, according to an embodiment of the disclosure. In particular, FIG. 23 illustrates a timing diagram for plurality of signal waveforms 2300, 2310, 2320, and 2330. The waveform 2300 represents an exemplary first compare signal HC1 which is generated by the first comparator 2202. The waveform 2310 represents an exemplary second compare signal HC2 which is generated by the second comparator 2204. The waveform 2320 represents an exemplary high-current detection signal HC which is generated by the NOR gate 2210. The waveform 2330 represents a simulated AC current waveform of load current that flows through the sense resistor 2040.

In the exemplary embodiment of FIG. 23, it is assumed that the short-circuit detection circuit 2200 is configured to detect over-current conditions when the load current waveform 2330 reaches or exceed 200 A or more in either half-cycle. As shown in FIG. 23, the waveform 2300 illustrates that the first compare signal HC1 is set to a logic "1" level during a period of time in each negative half-cycle in which the load current waveform 2330 reaches or exceeds 200 A. The waveform 2310 illustrates that the second compare signal HC2 is set to a logic "1" during a period of time in each positive half-cycle in which the load current waveform 2330 reaches or exceeds 200 A. The waveform 2320 illustrates the high-current detection signal HC which is generated by logically NOR'ing the waveforms 2300 and 2310. In this exemplary embodiment, the waveform 2320 illustrates that the NOR gate 2210 generates a logic "0" pulse for each period of time in which the load current waveform 2330 reaches and exceeds 200 A in either half-cycle of the load current.

It is to be appreciated that the hardware detection circuits of FIGS. 20 and 22 allow for fast and efficient detection of current zero-crossing events, and fast and efficient detection and response to extreme over-current and short-circuit conditions. While such detection can be implemented using software that is executed by a processor, the use of the hardware detection enables fast detection and response times and, as compared to the delay in the detection and response that may occur as a result of the indeterministic processing time that a processor might impose by analyzing sensor data using software. In addition, the current zero-crossing detection circuit 2000 of FIG. 20 allows an intelligent circuit breaker to place a solid-state switch in a switched-off state at a time when the load current is at a near zero. In this instance, the solid-state switch can be switched-off when the load current is at a near zero to avoid kick-back from inductive loads, wherein high-voltage kick-back spikes can damage the MOSFETS of the solid-state switch or the MOSFETS of a leakage clamp (e.g., isolation circuitry 810, FIG. 8B). The hardware detection circuits of FIGS. 20 and 22 are powered by a DC supply (e.g., VDC-on-Hot) that is referenced from the line hot 110. This provides the advantage of avoiding the delay that comes with opto-isolators or other circuits that would be required if these circuits were powered from a neutral-referenced DC power supply.

Figure 24:
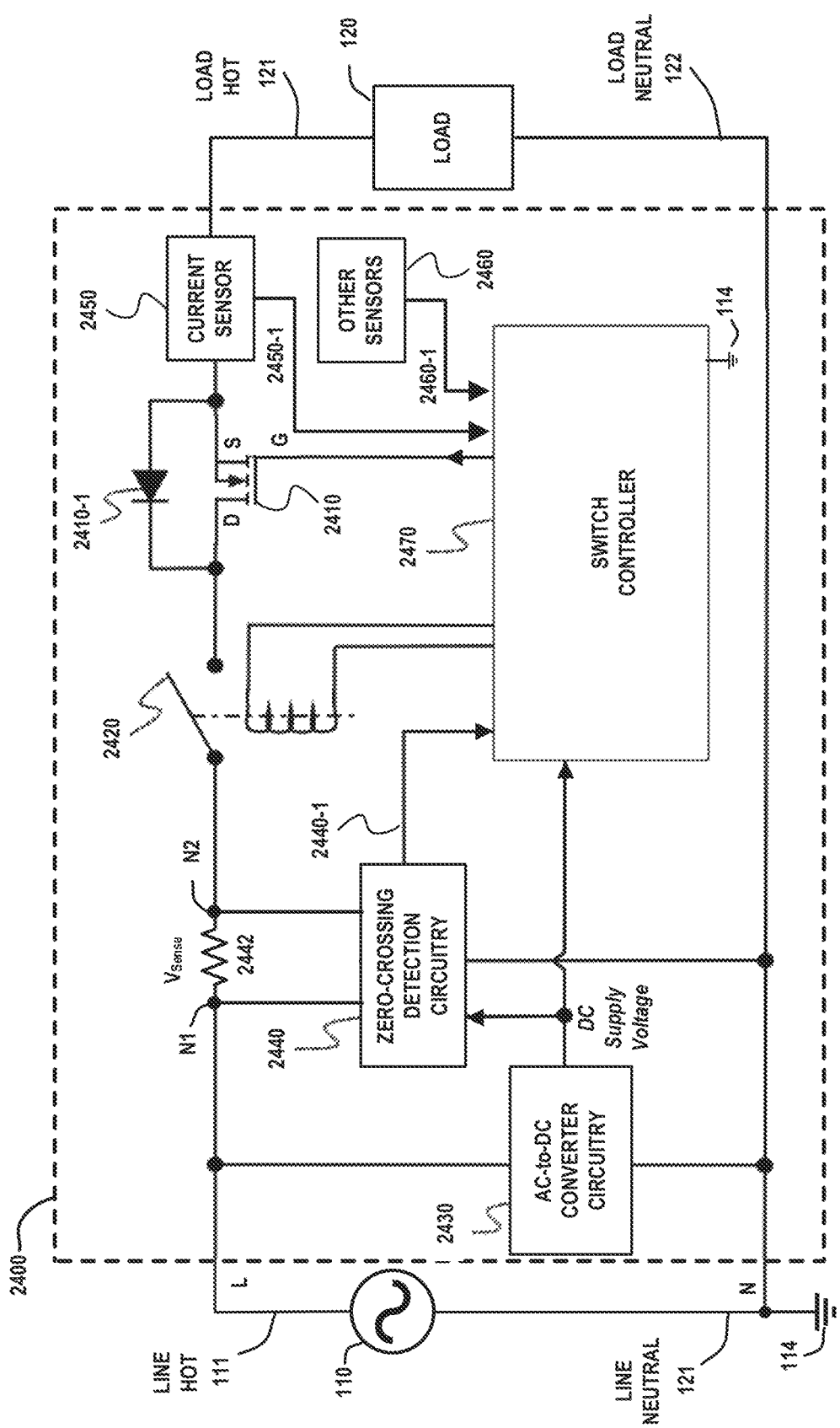
FIG. 24 schematically illustrates an intelligent circuit breaker according to another embodiment of the disclosure.

FIG. 24 schematically illustrates an intelligent circuit breaker according to another embodiment of the disclosure. In particular, FIG. 24 schematically illustrates an intelligent circuit breaker 2400 connected between an AC mains 110 and a load 120, wherein the intelligent circuit breaker 2400 comprises a single pole hybrid solid-state and mechanical circuit breaker architecture. The intelligent circuit breaker 2400 comprises a solid-state switch 2410 and an air-gap electromagnetic switch 2420 connected in series in an electrical path between the line hot 111 of the AC mains 110 and the load hot 121 of the load 120 (e.g., the air-gap electromagnetic switch 2420 and the solid-state switch 2410 are connected in series between a line input terminal and a load output terminal of the intelligent circuit breaker 2400). The intelligent circuit breaker 2400 further comprises an AC-to-DC converter circuit 2430, a zero-crossing detection circuitry 2440, a sense resistor 2442, a current sensor 2450, other types of sensors 2460 (e.g., environmental sensors, light sensors, etc.), and a switch controller 2470.

In some embodiments as shown in FIG. 24, the solid-state switch 2410 comprises a power MOSFET switch 2410 (e.g., N-type enhancement MOSFET device) having gate terminals (G), drain terminals (D), and source terminals (S) as shown, and an intrinsic body diode 2410-1. The air-gap electromagnetic switch 2420 comprises any suitable type of electromagnetic switch mechanism which is configured to physically open and close a set of electrical contacts, wherein an air gap is created between the electrical contacts when the air-gap electromagnetic switch 2420 is in a switched-open state. For example, the air-gap electromagnetic switch 2420 may comprise a latching solenoid or relay contact element that is responsive to control signals from the switch controller 2470 to automatically open or close the electrical contacts of the air-gap electromagnetic switch 2420.

The creation of an air gap in the line path between the line hot 111 and load hot 121 provides complete isolation of the AC mains 110 from the load 120, as it prevents the flow of current from the line hot 111 to the load hot 121. The air-gap electromagnetic switch 2420 may be disposed on either the line side (as shown in FIG. 24) of the solid-state switch 2410 or on the load side of the solid-state switch 2410. The intelligent circuit breaker 2400 provides a cost-effective solution which allows one solid-state switch to be utilized (as compared to several solid-state switches in the exemplary embodiments described above) in an instance where electrical codes require the implementation of an air-gap in the circuit breaker for complete isolation.

The AC-to-DC converter circuitry 2430 is configured to provide DC supply power to various circuitry and elements of the intelligent circuit breaker 2400 including the zero-crossing detection circuitry 2440, the switch controller 2470, and optionally the current sensor 2450 and other sensors 2460 (depending on the configuration of such sensors 2450 and 2460). The AC-to-DC converter circuitry 2430 is configured to remain powered during faults when the solid-state switch 2410 is in a switched-off state or when the electromagnetic switch 2420 is in a switched-open state. In some embodiments, the AC-to-DC converter circuitry 2430 comprises sufficient storage capacitance to power the DC subsystems immediately following a utility outage such that relevant power outage or short-circuit information may be obtained and stored by the switch controller 2470 as the utility power collapses, and then wirelessly transmitted to a remote node, device, or system using a radio frequency transceiver (not shown) which is either coupled to the switch controller 2470 or integrated with the switch controller 2470.

In some embodiments, the zero-crossing detection circuitry 2440 is configured to monitor the voltage and/or current at a target point along the hot line electrical path of the intelligent circuit breaker 2400 and detect zero current and/or zero voltage crossings of the AC waveform on the hot line electrical path. For example, as shown in FIG. 24, the zero-crossing detection circuitry 2440 is coupled to the hot line electrical path upstream of the switches 2420 and 2410 to detect instances of zero current and/or zero voltage crossings of the AC power waveform on the line side of the intelligent circuit breaker 2400. The zero-crossing detection circuitry 2440 is coupled to the switch controller 2470 by one or more data acquisition and control lines 2440-1.

The zero-crossing detection circuitry 2440 can be implemented using any suitable type of voltage zero-crossing and/or current zero-crossing detection circuitry that is configured to sense zero crossings of current and/or voltage of the AC power supply waveform and generate a detection signal which indicates a zero-crossing event and an associated transition direction of the zero-crossing event of the current or voltage waveform (e.g., the AC waveform transitioning from negative to positive (referred to as "positive transition direction"), or the AC waveform transitioning from positive to negative (referred to as a "negative transition direction")).

In some embodiments, the zero-crossing detection circuitry 2440 is configured to receive as input a sampling of the AC waveform on the hot line path (on the line side of the switches 2420 and 2410), compare the AC waveform sample to a zero reference voltage (e.g., line neutral voltage) to determine the polarity of the AC waveform on the hot line path, and detect a zero-crossing event and the associated transition direction of the zero-crossing of the AC waveform. In some embodiments, the comparing is performed using a voltage comparator which has a non-inverting input connected to the hot line path, and an inverting input that receives a reference voltage. The output of the voltage comparator switches (i) from logic 1 to logic 0 when the input voltage transitions from positive to negative and (ii) from logic 0 to logic 1 when the input voltage transitions from negative to positive. In this instance, the output of the zero-crossing detection circuitry 2440 will transition between a logic "1" and logic "0" output upon each detected zero crossing of the AC voltage waveform.

In some embodiments, the zero-crossing detection circuitry 2420 implements the current zero-crossing detection circuit 2000 of FIG. 20. In this instance, the sense resistor 2442 in FIG. 24 is utilized in a manner similar to the sense resistor 2040 shown in FIG. 20. The current zero-crossing detection circuitry is utilized instead of, or in addition to, a voltage zero-crossing detection circuitry to determine when the AC current waveform (i.e., AC load current) on the hot line is zero and the transition direction of the AC current waveform. This is desired in instances, for example, when there is an inductive load which causes the voltage and current waveforms on the hot line path to be out of phase.

In some embodiments, the current sensor 2450 is configured to detect a magnitude of current being drawn by the load 120 in the hot line path through the intelligent circuit breaker 2400. The current sensor 2450 can be implemented using any suitable type of current sensing circuit including, but not limited to, a current-sensing resistor, a current amplifier, a Hall Effect current sensor, etc. The current sensor 2450 is coupled to the switch controller 2470 by one or more data acquisition and control lines 2450-1. In some embodiments, the current sensor 2450 implements the short-circuit detection circuit 2200 of FIG. 22, wherein the current sensor 2450 comprises a sense resistor that is serially connected between the load side of the solid-state switch 2410 and the load hot 121. In some embodiments, the current sensor 2450 utilizes the same sense resistor 2442 as the zero-crossing detection circuitry 2440, wherein the current sensor 2450 would have inputs connected to nodes N1 and N2 to sample the sense voltage $V_{Sense}$.

The sensors 2460 include one or more optional sensors that are configured to sense environmental conditions (e.g., chemical, gas, humidity, water, temperature, light, etc.) and generate sensor data that is indicative of potentially hazardous environmental conditions. The sensors 2460 are coupled to the switch controller 2470 by one or more data acquisition and control lines 2460-1. By way of example, the sensors 2460 can include one or more of (i) a chemical sensitive detector that is configured to detect the presence of hazardous chemicals, (ii) a gas sensitive detector that is configured to detect the presence of hazardous gases, (iii) a temperature sensor that is configured to detect high temperatures indicative of, e.g., a fire; a (iv) a piezoelectric detector that is configured to detect large vibrations associated with, e.g., explosions, earthquakes, etc., (v) a humidity sensor or water sensor that is configured to detect floods or damp conditions, and other types of sensors that are configured to detect for the presence or occurrence of hazardous environmental conditions that would warrant circuit interruption.

The switch controller 2470 operates in conjunction with the zero-crossing detection circuitry 2440, the current sensor 2450 and the sensors 2460 to perform functions such as detecting fault conditions (e.g., short-circuit faults, over-current faults, arc-faults, ground-faults, etc.), detecting hazardous environmental conditions (e.g., gas leaks, chemical spills, fire, floods, etc.), and to provide timing control for the opening and closing of the switches 2410 and 2420 in response to detected fault conditions or hazardous environmental conditions, to thereby avoid creating electrical arcs in the air-gap electromagnetic switch 2420. The switch controller 2470 generates gate control signals that are applied to the gate terminal (G) of the solid-state switch 2410 to place the solid-state switch 2410 into a switched-on or a switched-off state. In some embodiments, the switch controller 2470 generates a gate control signal to place the solid-state switch 2410 into a switched-off state in response to fault conditions such as short-circuit faults, over-current faults, over-voltage conditions, and other faults or hazards that are detected by the switch controller 2470 as a result of analyzing sensor data obtained from the current sensor 2450 and/or the other sensors 2460.

The switch controller 2470 can be implemented using a processor that is configured to process sensor data and implement switch control timing protocols as discussed herein for controlling the switches 2410 and 2420. In addition, the switch controller 2470 can implement circuitry for converting the sensor data into proper formats that are suitable for processing by the processor. In other embodiments, the switch control 2470 implements hardware-based switch control circuitry (as in the exemplary embodiments discussed above) to enable hardware-based control, as opposed to software-based control.

The switch controller 2470 can include an RF transceiver to wirelessly communicate with a remote node, device, system, etc., to support remote monitoring and detection of fault conditions and to receive remote commands for controlling the intelligent circuit breaker 2400. The processor may comprise a central processing unit, a microprocessor, a microcontroller, an application-specific integrated circuit (ASIC), a field programmable gate array (FPGA), and other types of processors, as well as portions or combinations of such processors, which can perform processing functions based on software, hardware, firmware, etc. In other embodiments, the solid-state circuitry of the various components (e.g., 2430, 2440, and 2470) of the intelligent circuit breaker 2400 can be implemented on a single die as a system-on-chip.

To prevent the generation of electrical arcs between the electrical contacts of the electromagnetic switch 2420, the switch controller 2470 is configured to place the solid-state switch 2410 into a switched-off state before placing the air-gap electromagnetic switch 2420 into a switched-open or switched-closed state. However, in the configuration of FIG. 24, even when the solid-state switch 2410 is in a switched-off state, and assuming the air-gap electromagnetic switch 2420 is in a switched-closed state, the body diode 2410-1 of the solid-state switch 2410 will allow negative current to conduct from the load 120 to the AC mains 110 when the AC power supply waveform of the AC mains 110 is in a negative half-cycle.

In this instance, if the air-gap electromagnetic switch 2420 is opened during the negative half cycle of the AC power supply waveform, the flow of negative current would generate electrical arcs between the electrical contacts of the air-gap electromagnetic switch 2420. In addition to generation of electrical arcs, it could be difficult or not possible to open the air-gap electromagnetic switch 2420 due to relatively strong electro-magnetic forces that would be generated due to short-circuit current conditions and the negative current flow at the given time.

To avoid creating such electrical arcs, and enable ease of opening the air-gap electromagnetic switch 2420, the switch controller 2470 is configured to place the solid-state switch 2410 in a switched-off state in response to detecting a fault or hazardous condition, and process the sensor data obtained from the zero-crossing detection circuitry 2440 to determine a zero-crossing event of the AC voltage and/or current on the line side (e.g., line hot 111) of the intelligent circuit breaker 2400 and associated transition direction of the zero-crossing event, and then open the air-gap electromagnetic switch 2420 in response to the detected zero-crossing event if the polarity of the AC voltage and/or current on the line side is determined to be transitioning to a positive half cycle.

On the other hand, when the switch controller 2470 determines, at a given time, that the associated transition direction of the zero-crossing event is a negative transition where the polarity of the AC voltage and/or current on the line side is transitioning to a negative half cycle, the switch controller 2470 will not open the air-gap electromagnetic switch 2420, but rather delay opening the air-gap electromagnetic switch 2420 until the next instance of a zero-crossing event with a positive transition as detected by the zero-crossing detection circuitry 2440. In this instance, the air-gap electromagnetic switch 2420 would be opened during the half-cycle in which the solid-state switch 2410 is preventing all current flow (less any leakage). This switch control protocol enables a significant down-sizing of the size and strength requirements of the electro-mechanical mechanism for opening the air-gap electromagnetic switch 2420.

The switch timing control implemented by the switch controller 2470 will now be discussed in further detail with reference to FIGS. 25A, 25B and 26. For example, FIG. 25A illustrates a power supply voltage waveform that is input to a line side of the intelligent circuit breaker 2400 of FIG. 24. In particular, FIG. 25A, illustrates an input voltage waveform 2500 which represents a power supply voltage waveform of the AC mains 110. The input voltage waveform 2500 comprises positive half cycles 2502, negative half cycles 2504, and zero voltage crossings 2510 at times T0, T1, T2, T3, and T4. When the solid-state switch 2410 is in switched-on state and the air-gap electromagnetic switch 2420 is in switched-closed state, the input voltage waveform 2500 is applied to the load hot line 121 of the load 120. When the switch controller 2470 determines that power should be disconnected from the load 120, the switch controller 2470 will generate a gate control signal that is applied to the gate terminal G of the solid-state switch 2410 to place the solid-state switch 2410 into a switched-off state.

FIG. 25B illustrates an output voltage waveform 2520 on a load side of the intelligent circuit breaker 2400 of FIG. 24 when the solid-state switch 2410 is in a switched-off state and the air-gap electromagnetic switch 2420 is in a switched-closed state. In this state, the body diode 2410-1 of the solid-state switch 2410 is forward biased during the negative half cycles 2504 of the input voltage waveform 2500, which rectifies the input voltage waveform 2500 and results in the output voltage waveform 2520 shown in FIG. 25B wherein portions 2522 of the output voltage waveform 2520 which correspond to the positive half cycles 2502 of the input waveform 2500 are at 0V, and wherein portions 2524 of the output voltage waveform 2520 track the voltage of the negative half cycles 2504 of the input waveform 2500. In this instance, negative current would flow from the load 120 to the AC mains 110 during each negative half cycle 2524 until the air-gap electromagnetic switch 2420 was opened.

As noted above, after the solid-state switch 2410 is switched-off, the switch controller 2470 will process the sensor data obtained from the zero-crossing detection circuitry 2440 to determine a zero-crossing event of the AC voltage waveform (and/or a AC current waveform) on the hot line path of the intelligent circuit breaker 2400 and the transition direction of the zero-crossing event. The switch controller 2470 will generate a control signal to open the air-gap electromagnetic switch 2420 in response to the detected zero-crossing event if the AC voltage waveform is transitioning to a positive half-cycle. For instance, while FIG. 25A shows zero-crossing events 2510 of the AC waveform 2500 at times T0, T1, T2, T3 and T4, only the zero-crossing events 2510 at times T0, T2 and T4 have positive transition direction where the AC waveform 2500 transitions to a positive half-cycle.

In this instance, the switch controller 2470 will generate a control signal to open the air-gap electromagnetic switch 2420 to fully disconnect power to the load 120, in response to a zero-crossing event at times T0, T2 or T4. In particular, as shown in FIG. 25A, in some embodiments, in response to detecting a positive transitioning zero-crossing event (e.g., at times T0 or T2), the switch controller 2470 will wait for a short time delay $T_S$ (e.g., about 10 μs) before generating a switch control signal to open the air-gap electromagnetic switch 2420. This brief delay time $T_S$ ensures that the AC waveform is slightly positive and that no current is flowing in the hot line path, thereby preventing possible electrical arc formation in the air-gap electromagnetic switch 2420 and allowing the air-gap electromagnetic switch 2420 to easily open without jitter due small current flow.

On the other hand, assume that a fault condition occurs and the solid-state switch 2410 is switched-off in the time period between T0 and T1 in FIGS. 25A and 25B. In this example, the switch controller 2470 would determine that a next zero-crossing event 2510 of the AC waveform 2500 at time T1 is a negative transitioning zero-crossing event. In this instance, the switch controller 2470 would wait for the next positive transitioning zero-crossing event 2510 at time T2 before generating a control signal (at a delayed time $T_S$ after detecting the zero-crossing event at time T2) to open the air-gap electromagnetic switch 2420. Again, this ensures that AC waveform 2500 is slightly positive and that no current is flowing in the hot line path, thereby preventing possible electrical arc formation in the air-gap electromagnetic switch 2420 and allowing the air-gap electromagnetic switch 2420 to easily open without jitter due small current flow.

It is to be understood that the exemplary voltage waveforms 25A and 25B represent a load 120 having a power factor of about one (1) where it is assumed that AC voltage waveform and the current drawn by the load 120 are in phase. In such instance, the zero voltage crossings are assumed to be zero current crossings. However, in instances where the load 120 has a power factor that is less than 1 (e.g., capacitive or inductive load), the voltage waveform and current drawn by the load 120 will be out of phase. In this regard, the zero-crossing detection circuitry 2440 can include a current zero-crossing detector to determine zero current crossings, or positive transitioning zero current crossings, of a current waveform on the line side of the switches 2420 and 2410 to ensure that no positive current is flowing in the line hot path before opening the air-gap electromagnetic switch 2420. For example, as noted above, in some embodiments, the zero-crossing detection circuitry 2420 implements the current zero-crossing detection circuit 2000 of FIG. 20.

Figure 26:
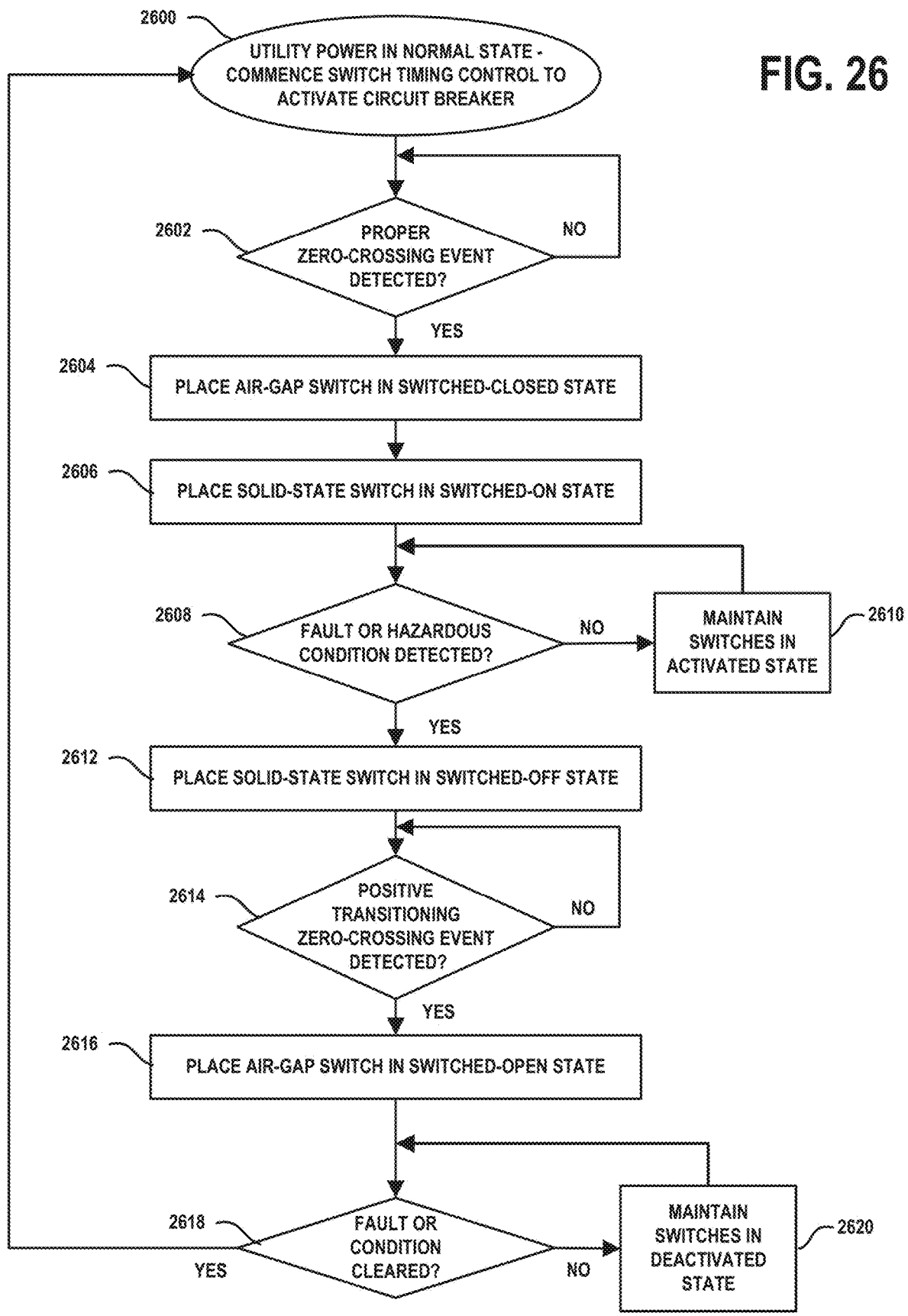
FIG. 26 is a flow diagram of a switch control process which is implemented by a switch controller of the intelligent circuit breaker of FIG. 24, according to an embodiment of the disclosure.

FIG. 26 is a flow diagram of a switch control process which is implemented by the switch controller 2470 of the intelligent circuit breaker 2400 of FIG. 24, according to an embodiment of the disclosure. The switch control process of FIG. 26 represents a non-limiting exemplary embodiment for recovery of utility power or a manual, automatic, or remote activation control to activate the intelligent circuit breaker 2400 (block 2600). In this example, it is assumed that the solid-state switch 2410 is in a switched-off state, and the air-gap electromagnetic switch 2420 is in a switched-closed state.

The switch controller 2470 waits to detect a proper zero crossing (block 2602) before closing the air-gap electromagnetic switch 2420 (block 2604). While it is ideal to wait for a voltage and/or current zero cross event prior to closing the air-gap electromagnetic switch 2420, one of ordinary skill in the art will understand that this is not a mandatory condition for closure. The zero-crossing event can be a positive transitioning zero-crossing event or a negative transitioning zero-crossing event. As noted above, in some embodiments, it is preferable to close the air-gap electromagnetic switch 2420 at the zero-crossing of an upcoming half cycle in which the body diode (e.g., diode 2410-1) of the solid-state switch (e.g., switch 2410) is not forward biased and conducting. For example, in the exemplary embodiment of FIG. 24, the body diode 2410-1 of the solid-state switch 2410 is reversed biased and non-conducting during positive half cycles of the supply voltage waveform of the AC mains 110. In such an embodiment, it is ideal to place the air-gap electromagnetic switch into a switched-closed state (block 2604) upon detecting a positive transitioning (current or voltage) zero-crossing event.

In other embodiments, depending on the type of MOSFET that is used to implement the solid-state switch 2410, it may be ideal to close the air-gap electromagnetic switch 2420 upon detecting a negative transitioning (current or voltage) zero-crossing event. For example, in an exemplary embodiment where the solid-state switch 2410 in FIG. 24 is implemented as a P-type enhancement MOSFET with a drain terminal coupled (line side) to the air-gap switch 2420 and a source terminal coupled (load side), the body diode of the P-type MOSFET would have its anode connected line side and its cathode disposed load side. In such instance, the body diode of the P-type solid-state switch would be reversed biased and non-conducting during negative half cycles of the supply voltage waveform of the AC mains 110. As such, when the P-type solid-sate switch is in a switched-off state, it would be ideal to close the air-gap electromagnetic switch 2420 upon detecting a negative transitioning (current or voltage) zero-crossing event. The same would apply for a circuit configuration in which the N-type solid-state switch 2410 as shown in FIG. 24 is reversed with the source terminal connected line side and the drain terminal connected load side.

When the air-gap electromagnetic switch 2420 is closed, the switch controller 2470 will proceed to generate a gate control signal to place the solid-state switch 2410 into a switched-on state (block 2606). The solid-state switch 2410 may be switched-on at any time after the air-gap electromagnetic switch 2420 is closed. For example, the intelligent circuit breaker 2400 may operate in a "stand-by" mode where the air-gap electromagnetic switch 2420 is maintained in switched-closed state, and the switch controller 2470 waits for the occurrence of some triggering event (e.g., remote command) to proceed with activating the solid-state switch 2410.

When both switches 2410 and 2420 are activated, the switch controller 2470 will enter a waiting state for some event or command to interrupt the circuit connection between power and load (block 2608). During the waiting period, the solid-state switch 2410 and the air-gap electromagnetic switch 2420 will be maintained in an activated state (block 2610). The event can be the detection of a given fault condition or hazardous condition as determined by the switch controller 2470 processing sensor data received from the various sensors 2450 and 2460. The command can be a manual command or automated command to interrupt the circuit connection.

Upon detecting a fault or hazardous condition (affirmative determination in block 2608) or in response to a manual or automated command to trip the circuit breaker, the switch controller 2470 will generate a gate control signal to place the solid-state switch 2410 into a switched-off state (block 2612). The switch controller 2470 will then proceed to process data from the zero-crossing detection circuitry 2440 to detect a target zero-crossing event (e.g., a positive transitioning zero-crossing event) on the line hot path (block 2614), and in response to detecting the target zero-crossing event (affirmative determination in block 2614), the switch controller 2470 will generate a switch control signal to place the air-gap electromagnetic switch 2420 into a switched-open state (block 2616).

The switch controller 2470 will enter a wait state (block 2618) to wait for the fault event or hazardous condition to be cleared, and maintain the solid-state and air-gap electromagnetic switches in a deactivate state (block 2620). When the fault event or hazardous condition is cleared (affirmative determination in block 2618), or when the switch controller 2470 otherwise receives a manual or remote command indicating to reconnect power to the load, the control process returns to block 2600, wherein the switch controller 2470 proceeds to reactivate the air-gap and solid-state switches and, thereby reconnect the power supply to the load. It is to be understood that while the process flow of FIG. 26 does not explicitly include process steps for performing zero-crossing detection prior to opening and closing the solid-state switch 2410, one of ordinary skill in the art will recognize and appreciate that for certain applications, the switching on and off of the solid-state switch 2410 may be timed with either a voltage or current zero-crossing event, as desired.

Figure 27:
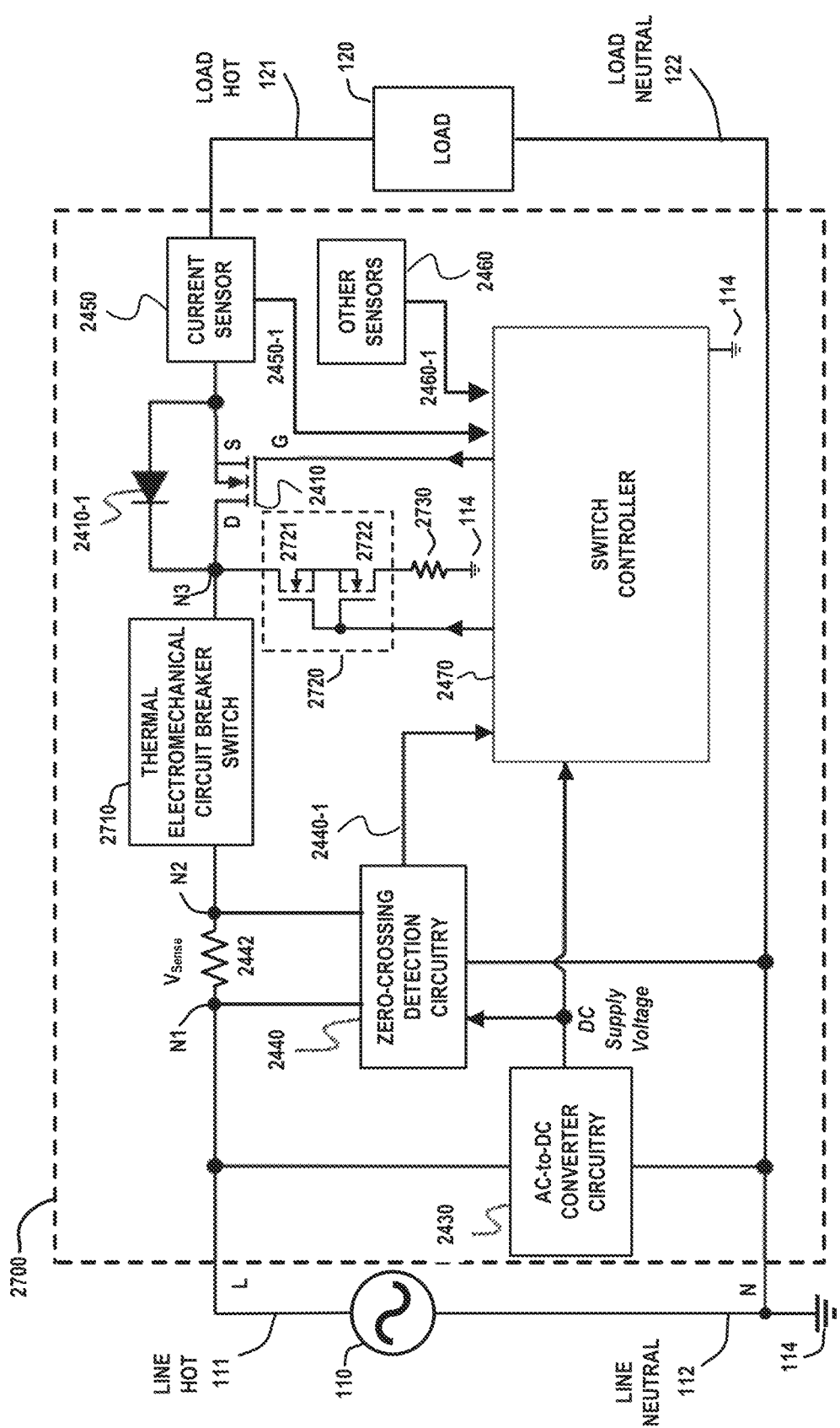
FIG. 27 schematically illustrates an intelligent circuit breaker according to another embodiment of the disclosure.

FIG. 27 schematically illustrates an intelligent circuit breaker according to another embodiment of the disclosure. In particular, FIG. 27 schematically illustrates an intelligent circuit breaker 2700 connected between an AC mains 110 and a load 120. The intelligent circuit breaker 2700 is similar to the intelligent circuit breaker 2400 of FIG. 24, except that the intelligent circuit breaker 2700 of FIG. 27 implements a thermal electromechanical circuit breaker switch 2710 (in place of the air-gap electromagnetic switch 2420 in FIG. 24), an internal switch 2720, and a shunt resistor 2730. In some embodiments, the thermal electromechanical circuit breaker switch 2710 comprises a conventional circuit breaker architecture, such as discussed above in conjunction with FIG. 1A.

The internal switch 2720 and the shunt resistor 2730 are serially connected between a node N3 and ground (neutral) 114, wherein the node N3 comprises a connection point between the thermal electromechanical circuit breaker switch 2710 and the solid-state switch 2410. In some embodiments, as shown in FIG. 27, the internal switch 2720 comprises a solid-state bidirectional switch comprising a first MOSFET switch 2721 and a second MOSFET switch 2722 (e.g., N-channel MOSFET switches) which are serially connected back-to-back with commonly connected source terminals and commonly connected gate terminals. The commonly connected gate terminals of the first and second MOSFET switches 2721 and 2722 are connected to a control output port of the switch controller 2470. The first and second MOSFET switches 2721 and 2722 have intrinsic body diodes (not specifically shown in FIG. 27).

As in the exemplary embodiment of FIG. 24, the switch controller 2470 operates in conjunction with the zero-crossing detection circuitry 2440, the current sensor 2450 and the other sensors 2460 to perform functions such as detecting fault conditions (e.g., short-circuit conditions, over-current conditions, over-voltage conditions, arc-faults, ground-faults, etc.), and detecting hazardous environmental conditions (e.g., gas leaks, chemical spills, fire, floods, etc.). The switch controller 2470 is configured to apply a control signal to the gate terminal (G) of the solid-state switch 2410 to control the activation (switched-on) and deactivation (switched-off) of the solid-state switch 2410. In addition, the switch controller 2470 is configured to generate a control signal to control the activation and deactivation of the internal switch 2720. The switch controller 2470 implements a timing control protocol that is configured to control the timing of the activation/deactivation of solid-state switch 2410 and the internal switch 2720 under different operating conditions of the intelligent circuit breaker 2700.

For instance, the switch controller 2470 generates a gate control signal to place the solid-state switch 2410 into a switched-off state in response to detected fault conditions such as short-circuit faults, over-current faults, over-voltage conditions, and other faults or hazards which are detected by the switch controller 2470 as a result of analyzing sensor data obtained from the current sensor 2450 and/or the other sensors 2460. In addition, after the solid-state switch 2410 is switched-off, the switch controller 2470 generates a control signal to activate the internal switch 2720 and thereby generate an internal short-circuit between the node N3 and ground 114. The internal short-circuit between the node N3 and ground 114 causes over-current to flow through the thermal electromechanical circuit breaker switch 2710 and thereby trip the thermal electromechanical circuit breaker switch 2710 and create an air-gap in the electrical path between the line hot 110 and the load hot 121.

In other words, in this embodiment, the switch controller 2470 does not generate a control signal which is applied directly to the thermal electromechanical circuit breaker switch 2710 to trip the thermal electromechanical circuit breaker switch 2710. Instead, the switch controller 2470 applies a gate control signal to the commonly connected gate terminals of the first and second MOSFET switches 2721 and 2722 to turn on the first and second MOSFET switches 2721 and 2722. This creates an internal short-circuit between the node N3 and ground 114 with current flowing through the shunt resistor 2730, which causes the thermal electromechanical circuit breaker switch 2710 to trip. The internal switch 2720 is deactivated (e.g., the first and second MOSFET switches 2721 and 2722 are switched-off) at some point in time after the thermal electromechanical circuit breaker switch 2710 is tripped and before the intelligent circuit breaker 2700 is reset for normal operation.

In some embodiments, the resistance of the shunt resistor 2730 is selected so that the short-circuit current flow from the node N3 to ground 114 is in range of about 2× to 3× the current rating of the thermal electromechanical circuit breaker switch 2710. For example, if the thermal electromechanical circuit breaker switch 2710 has a current rating of 20 amperes, the resistance of the shunt resistor 2730 is selected so that a maximum of approximately 40 to 60 amperes of current flows through the thermal electromechanical circuit breaker switch 2710 and through the short-circuit branch between the node N3 and ground 114 to cause the thermal electromechanical circuit breaker switch 2710 to trip and generate an air-gap in the electrical path between the line hot 110 and the load hot 121.

In some embodiments, the switch controller 2470 is configured to utilize zero-crossing detection signals output from the zero-crossing detection circuit 2440 to determine when to activate the internal switch 2720 and thereby create the short-circuit between the node N3 and ground 114, which causes the thermal electromechanical circuit breaker switch 2710 to trip. For example, similar to the exemplary embodiments discussed above in connection with FIGS. 24-26, when the zero-crossing detection circuit 2440 is configured to detect a direction of polarity transitioning between opposing half cycles of the AC voltage waveform or the AC current waveform on the line side of the thermal electromechanical circuit breaker switch 2710, the switch controller 2470 is configured to activate the internal switch 2720 at a time when the polarity transitioning causes the body diode 2410-1 of the deactivated solid-state switch 2410 to be reversed-biased.

In the exemplary embodiment of FIG. 27, the body diode 2410-1 of the solid-state switch 2410 is reversed-biased during positive half cycles of the AC voltage waveform or the AC current waveform on the line side of the thermal electromechanical circuit breaker switch 2710. However, the body diode 2410-1 of the solid-state switch 2410 will be forward-biased and allow negative current to conduct from the load 120 to the AC mains 110 through the thermal electromechanical circuit breaker switch 2710 when, e.g., the AC power supply waveform of the AC mains 110 is in a negative half-cycle.

In this instance, if the internal switch 2720 is activated during the negative half cycle of the AC power supply waveform, the current flow through the thermal electromechanical circuit breaker switch 2710 would be a combination of (i) the negative current flow from the load 120 to the AC mains 110 and (ii) the current flow that is generated in the short-circuit path from the ground 114 to the node N3, thereby providing an increased current flow through the thermal electromechanical circuit breaker switch 2710 to trip the thermal electromechanical circuit breaker switch 2710. This can result in the generation of high-energy electrical arcs between the electrical contacts of the thermal electromechanical circuit breaker switch 2710 when tripped.

In contrast, by ensuring that the internal switch 2720 is activated at a time when the polarity transitioning causes the body diode 2410-1 of the solid-state switch 2410 to be reversed-biased, the amount of current flow through the thermal electromechanical circuit breaker switch 2710 is at least initially limited to the current that is generated in the short-circuit path between the node N3 and ground 114 based on the resistance value of the shunt resistor 2730. In this instance, the amount of short-circuit current that is generated to trip the thermal electromechanical circuit breaker switch 2710 can be controlled/limited by the shunt resistor 2730 and thus limit the amount of electrical arcing that is generated between the electrical contacts of the thermal electromechanical circuit breaker switch 2710 when tripped. In other words, by timing the activation of the internal switch 2720 to a time when the body diode 2410-1 of the deactivated solid-state switch 2140 is reversed-biased, the intelligent circuit breaker 2700 avoids using the actual short-circuit load current to trip the conventional thermal electromechanical circuit breaker switch 2710, and instead, utilizes the limited/controlled internal short-circuit current (which is generated by activation of the internal switch 2720) to trip the circuit breaker switch 2710.

Figure 28A:
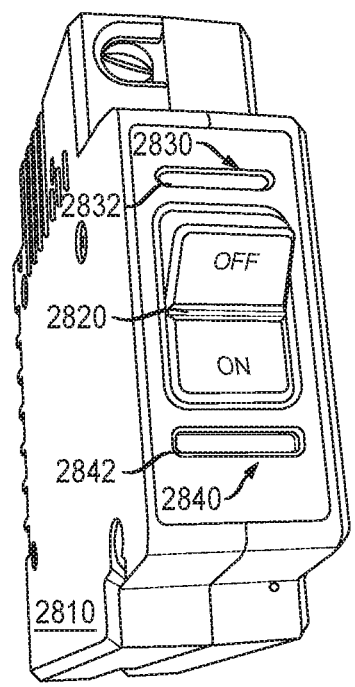
Figure 28B:
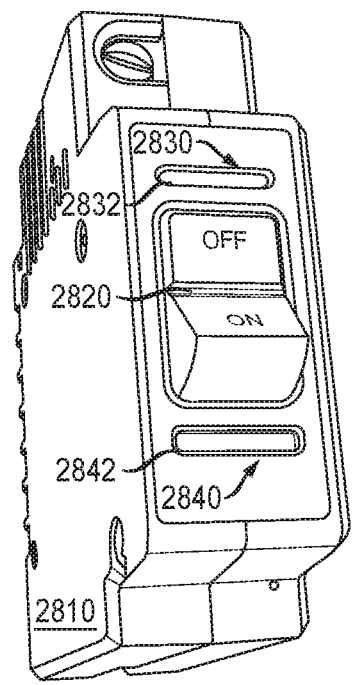
Figure 28C:
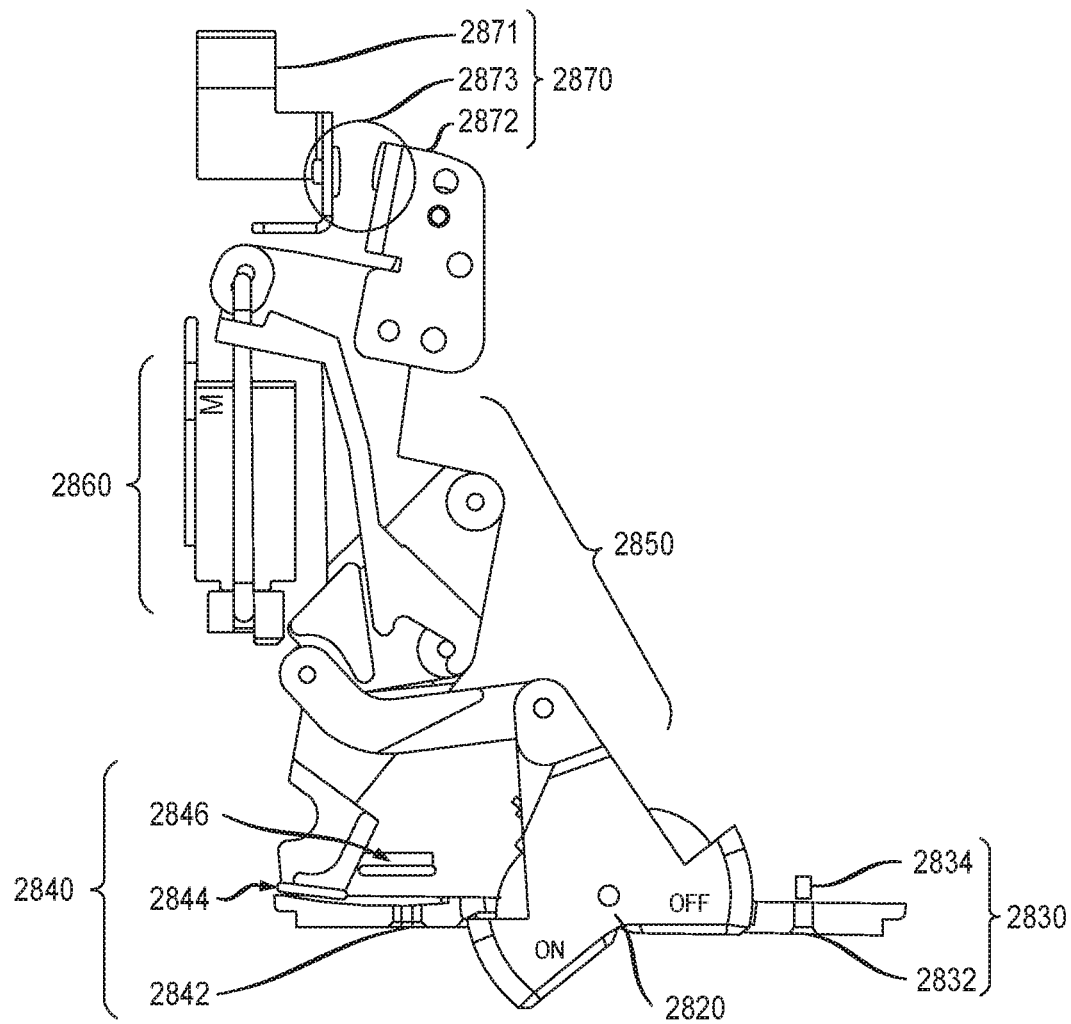
Figure 28D:
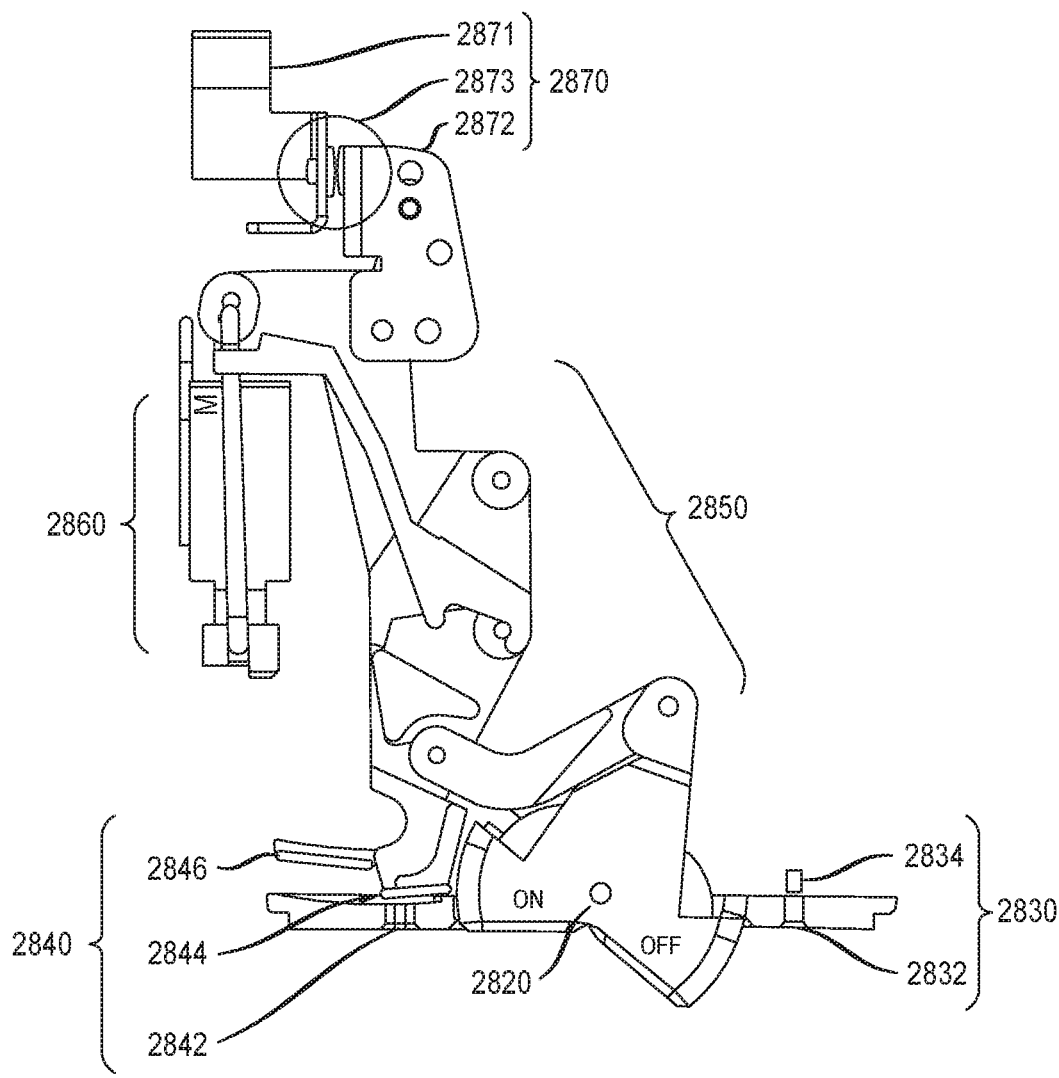

In other embodiments, an intelligent circuit breaker is designed to include one or more visual indicators that allow an individual to determine an operational state of the intelligent circuit breaker. For example, FIGS. 28A, 28B, 28C, 28D and 28E are perspective and schematic views of an intelligent circuit breaker 2800 which comprises multiple visual indictors that are configured to indicate operational states of the intelligent circuit breaker 2800. In particular, FIGS. 28A and 28B are perspective views of the intelligent circuit breaker 2800 which comprises a circuit breaker housing 2810 (or enclosure), a manual rocker switch 2820, a first visual indicator 2830, and a second visual indicator 2840. The manual rocker switch 2820 comprises an OFF position and an ON position which allows an individual to manually trip and reset the intelligent circuit breaker 2800. As explained in further detail below, the first and second visual indictors 2830 and 2840 are configured to provide a visual status of the operational state(s) of the intelligent circuit breaker 2800. FIGS. 28C, 28D, and 28E schematically illustrate various components within the circuit breaker housing 2810 of the intelligent circuit breaker 2800. For example, as shown in FIGS. 28C-28E, the components include an actuator mechanism 2850, a solenoid 2860, and an air-gap switch 2870. The air-gap switch 2870 comprises a first fixed contact 2871 and a second movable contact 2872 which is connected to the actuator mechanism 2850. The manual rocker switch 2820 and solenoid 2860 are connected to the actuator mechanism 2850. The actuator mechanism 2850 is configured to control the position of the movable contact 2872 in relation to the fixed contact 2871 in response to (i) a manual actuation of the rocker switch 2820 and (ii) a magnetic actuation of the solenoid 2860. In this configuration, the solenoid 2850 is configured to be magnetically actuated in response to high over-currents, wherein magnetic actuation of the solenoid 2860 results in a mechanical actuation of the actuator mechanism 2850 to cause the movable contact 2872 to separate from the fixed contact 2871 of the air-gap switch 2870. For ease of illustration and explanation, FIGS. 28C, 28D, and 28E do not illustrate the circuit board(s) and associated solid-state circuitry which is used to implement the various intelligent functionalities of the intelligent circuit breaker 2800, as discussed above.

FIGS. 28C, 28D, and 28E illustrate different operational states of the intelligent circuit breaker 2800. In particular, FIG. 28C illustrates an operational state in which the air-gap switch 2870 is "Open" with the first and second contacts 2871 and 2872 separated to form an air-gap 2873. In FIG. 28C, the manual rocker switch 2820 is in an "OFF" position. In this instance, the air-gap switch 2870 is manually opened by moving the rocker switch 2820 from the ON position to the OFF position, wherein the actuation of the rocker switch 2820 in this instance causes the actuator mechanism 2850 to move the movable contact 2872 away from the fixed contact 2871.

Next, FIG. 28D illustrates an operational state in which the air-gap switch 2870 is "Closed" with the first and second contacts 2871 and 2872 making electrical contact with the air-gap 2873 closed. In FIG. 28D, the manual rocker switch 2820 is in an "ON" position, and the solenoid 2860 is in a closed position. In this instance, the air-gap switch 2870 is manually closed by moving the rocker switch 2820 from the OFF position to the ON position, wherein the actuation of the rocker switch 2820 in this instance causes the actuator mechanism 2850 to move the movable contact 2872 against the fixed contact 2871. FIG. 28D illustrates a normal operating state of the intelligent circuit breaker 2800.

Next, FIG. 28E illustrates an operational state in which the air-gap switch 2870 is "Open" with the first and second contacts 2871 and 2872 separated to form an air-gap 2873. In FIG. 28E, it is assumed that the manual rocker switch 2820 is in an "ON" position, and that the intelligent circuit breaker 2800 is in a "tripped" state as a result of the magnetic actuation of the solenoid 2860 (e.g., solenoid 2860 in an open position) causing the actuator mechanism 2850 to move the movable contact 2872 away from the fixed contact 2871 and thereby open the air-gap switch 2870 to form the air-gap 2873. In this instance, the intelligent circuit breaker 2800 is tripped electromechanically, and the intelligent circuit breaker 2800 is reset by moving the manual rocker switch 2820 from the ON position, to the OFF position, and then back to the ON position.

As collectively shown in FIGS. 28A-28E, the first visual indicator 2830 comprises a window 2832 (e.g., glass or plastic window) that is formed as part of the circuit breaker housing 2810 and a status LED 2834 which is disposed within the circuit breaker housing 2810 behind the window 2832. The status LED 2834 is illuminated to indicate a status (e.g., On, Off, Standby, wireless status, provisioning, etc.) of the intelligent circuit breaker 2800. The status LED 2834 can emit different colors (e.g., red, green, etc.) and/or have different illumination patterns (e.g., continuous, blinking, etc.) to represent different operational states. In some embodiments, the status LED 2834 is only operational when utility power is present.

FIG. 28A illustrates an exemplary embodiment in which the status LED 2834 of the first visual indicator 2830 is illuminated with a first color (e.g., red) when the intelligent circuit breaker 2800 is in a "tripped" state in which the manual rocker switch 2820 is in an ON position but the air-gap switch is in an Open state. In other embodiments, the status LED 2834 of the first visual indicator 2830 can be illuminated with another color (e.g., green) when the intelligent circuit breaker 2800 is operating normally (e.g., non-tripped state) with the manual rocker switch 2820 in the ON position.

FIG. 28B illustrates an exemplary embodiment in which the status LED 2834 of the first visual indicator 2830 is not illuminated when the intelligent circuit breaker 2800 is in an Off state (e.g., not connected to utility power, or connected to utility power but the manual rocker switch 2820 is in the OFF position). In this instance, when the status LED 2834 is not illuminated, the viewing window 2832 can have a translucent colored coating with a color that is the same or similar to the color of the circuit breaker housing 2810.

Furthermore, as collectively shown in FIGS. 28A-28E, the second visual indicator 2840 comprises a window 2842 (e.g., glass or plastic window) that is formed as part of the circuit breaker housing 2810, and a first colored element 2844 (or more generally, a first indicator element), and a second colored element 2846 (or more generally, a second indicator element) which are disposed within the circuit breaker housing 2810 and selectively positioned behind the window 2832 to show different operational states of the intelligent circuit breaker. More specifically, in some embodiments, the second visual indicator 2840 is configured to provide a status of the air-gap switch 2870 (Open or Closed).

For example, the first and second colored elements 2844 and 2846 comprise colored pieces of plastic that are bonded to portions of the actuator mechanism 2850 or otherwise comprise painted surfaces on portion of the actuator mechanism 2850. The first and second colored elements 2844 and 2846 are selectively disposed behind the viewing window 2842 to allow an individual to view the color and thereby determine the status of the air-gap switch 2870 based on the color seen through the viewing window 2842. For example, the second colored element 2846 can be a red color which indicates that the air-gap is in an "Open" state, while the first colored element 2844 can be a non-red color (e.g., black) which indicates that the air-gap is in a "Closed" state. In other embodiments, the first and second indicator elements 2844 and 2846 can implement other means of indicating the status of the air-gap switch 2870, such as words, patterns, etc., in addition to and/or in place of the different colors.

For example, FIGS. 28C and 28E schematically illustrate a state in which the air-gap switch 2870 is in an "Open" state by virtue of the manual actuation of the rocker switch 2820 to the OFF position (FIG. 28C) or by virtue of the magnetic actuation of the solenoid 2860 which causes the air-gap switch 2870 to open and trip the intelligent circuit breaker 2800. In this state, the second colored element 2846 is positioned behind the viewing window 2842 by the movement of actuator mechanism 2850 to open the air-gap switch 2870, while the first colored element 2844 is positioned away from the viewing window 2842.

On the other hand, FIG. 28D schematically illustrates a state in which the air-gap switch 2870 is in a "Closed" state by virtue of the manual actuation of the rocker switch 2820 which causes the air-gap switch 2870 to close. In this state, the first colored element 2844 is positioned behind the viewing window 2842 by the movement of actuator mechanism 2850 to close the air-gap switch 2870, while the second colored element 2846 is positioned away from the viewing window 2842. In this regard, the second the second visual indicator 2840 is fully-functional even when utility power is absent, and provides an "air-gap open" indicator for safety.

FIG. 29 schematically illustrates an intelligent circuit breaker 2900 according to another embodiment of the disclosure. The intelligent circuit breaker 2900 is similar to the intelligent circuit breaker 2800 of FIGS. 28A-28E, except that the intelligent circuit breaker 2900 comprises a secondary internal sensing switch 2910 (e.g., electromechanical detector) which is coupled to the manual rocker switch 2820. The sensing switch 2910 is configured to detect an anticipated manual state change of the rocker switch 2820 from, e.g., an ON position (air-gap switch 2870 closed) to an OFF (air-gap switch 2870 open). The sensing switch 2910 triggers the electronics (e.g., solid-state switch control circuitry) of the intelligent circuit breaker 2900 to activate or deactivate the solid-state switch (e.g., bidirectional solid-state switch) before the air-gap switch 2870 finishes its motion of opening or closing, which takes a moment of time, e.g., an order of magnitude or two longer than it takes to open/close the solid-state switch. The internal sensing switch 2910 ensures that, e.g., air-gap switch 2870 is not opened under high load current, or that the air-gap switch 2870 is closed before the solid-state switch is activated.

While exemplary embodiments have been discussed above in the context of intelligent circuit breakers for use with AC supply power, it is to be appreciated that the intelligent circuit breakers can be configured for use with DC supply power. There are various systems (e.g. telecommunications systems) that operate on DC supply power instead of AC supply power. In these systems, the AC power delivered/provided by a utility company can be converted on site to DC supply power (using an AC-to-DC power conversion system), wherein the DC supply power is then fed to one or more DC distribution panels with DC circuit breakers that feed downstream branch circuits and loads.

The exemplary embodiments of intelligent circuit breakers as discussed herein can be configured to operate in either an "AC protection mode" or a "DC protection mode" depending on whether AC power or DC power is applied to the line input terminal of the intelligent circuit breaker. For example, upon power-up of the intelligent circuit breaker, the solid-state circuitry (e.g., sensors, processor, etc.) of the intelligent circuit breaker can be configured to detect whether AC power or DC power is applied to the line input terminal of the intelligent circuit breaker, and then automatically configure the intelligent circuit breaker to operate in either the AC protection mode or the DC protection mode, depending on the detected input power.

More specifically, in some embodiments, when power is initially applied to the line input terminal of the intelligent circuit breaker, a voltage sensor or zero-crossing detector coupled to the line side of the switches of the intelligent breaker can monitor the voltage waveform and send sensor data to the processor. The processor of the intelligent circuit breaker can analyze the sensor data to determine whether the input power is AC or DC. For example, the processor can determine that DC power is applied to the line input terminal when the voltage sensor data indicates that a magnitude of the input voltage remains at a constant level for a predetermined period of time, and/or when the zero-crossing detection circuitry does not output a zero-crossing event signal within the predetermined period of time. On the other hand, the processor can determine that AC power is applied to the line input terminal when the voltage sensor data indicates that the magnitude of the input voltage is varying and/or when the zero-crossing detection circuitry outputs multiple zero-crossing event signals within the predetermined period of time.

In some embodiments, the processor (e.g., microprocessor, controllers, etc.) of the intelligent circuit breaker can be configured to process different embedded software programs (e.g., different state machines) for the different protection modes. The embedded software programs for the different protection modes comprise different program instructions and utilize different pre-defined parameters or register values to enable the processor to make intelligent control decisions in response to detecting and responding to fault conditions (e.g., short-circuit, over-current, over-voltage, etc.) depending on the detected supply power (AC or DC power). For example, different threshold values and timing considerations for identifying and protecting against over-current or over-voltage conditions will vary depending on whether the intelligent circuit breaker is operating in a DC protection mode of an AC protection mode.

In addition, the switch control protocols for controlling the activation and deactivation of the switches (e.g., solid-state bidirectional switches) of the intelligent circuit breaker will vary depending on whether the intelligent circuit breaker is operating in a DC or an AC protection mode. For example, in a DC protection mode, the gate-to-source voltage of both MOSFET devices of a solid-state bidirectional switch is controlled so that both MOSFET devices are switched-on during normal operation, and both are switched-off in response to detection of fault condition. Moreover, to conserve power, some hardware circuitry of the intelligent circuit breaker can be disabled depending on the whether the intelligent circuit breaker is operating in a DC or AC protection mode. For example, a zero-crossing detection circuit of the intelligent circuit breaker can be disabled when the intelligent circuit breaker is operating in in a DC protection mode. In addition, in a DC protection mode, an AC-to-DC converter of the intelligent circuit breaker can be disabled, and a DC-to-DC converter of the intelligent circuit breaker can be selectively enabled to convert the DC supply voltage (applied to the line input terminal of the intelligent breaker) to a lower DC voltage to power the solid-state circuitry of the intelligent circuit breaker.

The exemplary embodiments of intelligent circuit breakers as discussed herein and illustrated through the drawings comprise various features, functions, components, etc., that can be utilized to implement different types of intelligent circuit breakers with various functions for different applications. In this regard, it is to be understood that an intelligent circuit breaker illustrated in one figure can incorporate or more additional features illustrated in one or more other figures to implement another architecture of an intelligent circuit breaker. For example, all exemplary embodiments of intelligent circuit breakers as illustrated throughout the figures can be configured to include arc-fault and/or ground-fault sensing and protection capabilities.

In this regard, it to be understood that exemplary embodiments of the disclosure include various embodiments of circuit breakers, and associated systems and methods as discussed herein, which can be summarized or otherwise expanded upon, as follows.

In some embodiments, a circuit breaker comprises: an electromechanical switch serially connected between a line input terminal and a load output terminal of the circuit breaker, and configured to be placed in one of (i) a switched-closed state and (ii) a switched-open state; a current sensor configured to sense a magnitude of current flowing in an electrical path between the line input terminal and the load output terminal and generate a current sense signal; a voltage sensor configured to sense a magnitude of voltage at a point on the electrical path between the line input terminal and the load output terminal and generate a voltage sense signal; and a processor configured to receive and process the current sense signal and the voltage sense signal to determine operational status information of the circuit breaker and determine power usage information of a load connected to the load output terminal.

In some embodiments, the circuit breaker further comprises a radio frequency transceiver coupled to the processor, wherein radio frequency transceiver is configured to transmit the operational status information and power usage information to a remote computing node, and to receive remote control commands transmitted from the remote computing node for processing by the processor.

In some embodiments, the voltage sensor comprises: a first voltage sensor coupled to the electrical path upstream of the electromechanical switch and configured to sense a magnitude of the AC supply voltage applied to the power input terminal; and a second voltage sensor coupled to the electrical path downstream of the electromechanical switch and configured to sense a magnitude of load voltage of a load connected to the load output terminal.

In some embodiments, the current sensor comprises circuitry that is configured to detect an over-current condition, generate a control signal which is indicative of the detected over-current condition, and output the control signal to the processor to notify the processor of the over-current condition. In some embodiments, the current sensor detects the over-current condition based on a programmable over-current threshold value. In some embodiments, the over-current threshold value comprises a reference threshold current that is generated by a current digital-to-analog converter, and applied to an input of a comparator of the current sensor.

In some embodiments, the electromechanical switch comprises an air-gap electromagnetic switch, wherein in some embodiments, the processor generates a switch control signal to cause the air-gap electromagnetic switch to open in response to sensor data that indicates an impending fault event.

In some embodiments, the circuit breaker further comprises an internal short-circuit switch which is configured to generate an internal short-circuit within the circuit breaker in response to a switch control signal output from the processor, wherein the internal short-circuit is generated to cause the electromechanical switch to trip or to blow a fuse of the circuit breaker.

In some embodiments, the current sensor of the circuit breaker comprises energy metering circuitry, wherein the energy metering circuitry is configured to generate energy usage data based on sensed current flowing through the circuit breaker, and output the energy usage data to the processor for analysis.

In some embodiments, the processor of the circuit breaker is configured to utilize current and voltage sensor data to identify a type of load connected to the circuit breaker and control power applied to the load based on the identified type of load.

In some embodiments, the circuit breaker further comprises a power converter circuit configured to generate a DC supply voltage from an AC supply voltage applied to the power input terminal, wherein the DC supply voltage is utilized to provide DC power to the processor, the current sensor, and the voltage sensor.

In another embodiment, a method comprises: connecting a circuit breaker between a utility power source and a branch circuit comprising a load, wherein the circuit breaker comprises an electromechanical switch which is configured to be placed in one of (i) a switched-closed state to connect the utility power source to the branch circuit and (ii) a switched-open state to disconnect the utility power source from the branch circuit; sensing current flow through the circuit breaker and generating a current sense signal that is indicative of a magnitude of the sensed current flow through the circuit breaker; sensing a voltage at a point on an electrical path through the circuit breaker and generating a voltage sense signal that is indicative of a magnitude of the sensed voltage; and processing the current sense signal and the voltage sense signal to determine operational status information of the circuit breaker and determine power usage information of the load.

In some embodiments, the method further comprises: transmitting, by the circuit breaker, the operational status information and power usage information to a remote computing node; and receiving, by the circuit breaker, remote control commands transmitted from the remote computing node, wherein the operational status information is transmitted on a wireless communications channel and/or a wired communication channel, and wherein the remote computing node comprises a master controller.

In some embodiments, the process of sensing the current flow through the circuit breaker comprises detecting an over-current condition, generating a control signal which is indicative of the detected over-current condition, and outputting the control signal to a processor of the circuit breaker to notify the processor of the over-current condition. In some embodiments, the over-current condition is detected based on a programmable over-current threshold value. In some embodiments, the method further comprises generating a reference threshold current using a current digital-to-analog converter, wherein the reference threshold current serves as the programmable over-current threshold value.

In some embodiments, the electromechanical switch comprises an air-gap electromagnetic switch, wherein the method further comprises generating a switch control signal to cause the air-gap electromagnetic switch to open in response to at least one of the sensed voltage and sensed current indicating an impending fault event.

In other embodiments, a system, comprises a circuit breaker distribution panel comprising a bus bar coupled to a utility power source, and a circuit breaker disposed within the circuit breaker distribution panel. The circuit breaker comprises a line input terminal coupled to the bus bar, and a load output terminal connected to a branch circuit. The circuit breaker further comprises: an electromechanical switch which is configured to be placed in one of (i) a switched-closed state to connect the utility power source to the branch circuit and (ii) a switched-open state to disconnect the utility power source from the branch circuit; a current sensor configured to sense a magnitude of current flowing in an electrical path between the line input terminal and the load output terminal and generate a current sense signal; a voltage sensor configured to sense a magnitude of voltage at a point on the electrical path between the line input terminal and the load output terminal and generate a voltage sense signal; and a processor configured to receive and process the current sense signal and the voltage sense signal to determine operational status information of the circuit breaker and determine power usage information of a load connected to the load output terminal.

In some embodiments, the system further comprises a status display system comprising a display and a master processor, wherein the master processor is configured to communicate with the processor of the circuit breaker to obtain, process, and display the operational status information and power usage information received from the processor of the circuit breaker, and wherein the master processor is configured to transmit the operational status information and power usage information to a remote computing node.

In other embodiments, a circuit breaker comprises: a solid-state bidirectional switch serially connected between a line input terminal and a load output terminal of the circuit breaker, wherein the solid-state bidirectional switch is configured to be placed in one of (i) a switched-on state and (ii) a switched-off state; a first switch control circuit configured to generate control signals to control operation of the solid-state bidirectional switch; a current sensor configured to sense a magnitude of current flowing in an electrical path between the line input terminal and the load output terminal and generate a current sense signal; a voltage sensor configured to sense a magnitude of voltage at a point on the electrical path between the line input terminal and the load output terminal and generate a voltage sense signal; and a processor configured to receive and process the current sense signals and voltage sense signals to determine operational status information of the circuit breaker, to determine a fault event, and to determine power usage information of a load connected to the load output terminal.

In some embodiments, the circuit breaker further comprises a radio frequency transceiver coupled to the processor, wherein radio frequency transceiver is configured to transmit the operational status information and power usage information to a remote computing node, and to receive remote control commands transmitted from the remote computing node for processing by the processor to perform actions directed by the remote control commands.

In some embodiments, the voltage sensor comprises: a first voltage sensor coupled to the electrical path upstream of the electromechanical switch and configured to sense a magnitude of the AC supply voltage applied to the power input terminal; and a second voltage sensor coupled to the electrical path downstream of the electromechanical switch and configured to sense a magnitude of load voltage of a load connected to the load output terminal.

In some embodiments, the current sensor comprises circuitry that is configured to detect an over-current condition, generate a control signal which is indicative of the detected over-current condition, and output the control signal to the processor to notify the processor of the over-current condition. Further, in some embodiments, the current sensor detects the over-current condition based on a programmable over-current threshold value, wherein the over-current threshold value comprises a reference threshold current that is generated by a current digital-to-analog converter, and applied to an input of a comparator of the current sensor.

In some embodiments, the circuit breaker further comprises: an air-gap electromagnetic switch connected in series with the solid-state bidirectional switch; and a second switch control circuit configured to generate control signals to control operation of the air-gap electromagnetic switch. The processor is configured to generate switch control signals to the first and second switch control circuits so that the air-gap electromagnetic switch is (i) placed in a switched-closed state prior to placing the solid-state bidirectional switch into a switched-on state, and (ii) placed in a switched-open state in response to the solid-state bidirectional switch being placed into a switched-off state. In some embodiments, the circuit breaker further comprises a manual switch that is configured to trigger an opening of the air-gap electromagnetic switch in response actuation of the manual switch by an individual, wherein the processor is configured to monitor and detect for actuation of the manual switch and generate and output a control signal to the first switch control circuit to place the solid-state bidirectional switch into a switched-off state, in response to the processor detecting an actuation of the manual switch.

In some embodiments, the first and second switch control circuits of the circuit breaker are configured to operate the circuit breaker in a standby state, wherein the solid-state bidirectional switch is in a switched-off state, and the air-gap electromagnetic switch in a switched-closed state.

In some embodiments, the processor of the circuit breaker is configured to analyze real-time sensor data obtained from the voltage and current sensors and detect a failure of the solid-state bidirectional switch, and generate and output a control signal to the second switch control circuit to place the air-gap electromagnetic switch into a switched-closed state, in response to detecting a failure of the solid-state bidirectional switch.

In some embodiments, the current sensor comprises energy metering circuitry, wherein the energy metering circuitry is configured to generate energy usage data based on sensed current flowing through the circuit breaker, and output the energy usage data to the processor for analysis.

In some embodiments, the processor is configured to utilize current and voltage sensor data to identify a type of load connected to the circuit breaker and control power applied to the load based on the identified type of load.

In some embodiments, the current sensor, the voltage sensor and the processor are configured to support at least one of (i) arc-fault circuit interruption and ground-fault circuit interruption.

In some embodiments, the first switch control circuit comprises a short-circuit detection circuit coupled to the solid-state bidirectional switch, wherein the short-circuit detection circuit is configured to detect current flow through the solid-state bidirectional switch, and generate a gating control signal to place the solid-state bidirectional switch into a switched-off state in response the detected current flow being indicative of a short-circuit fault event of a load connected to the load output terminal of the circuit breaker. The short-circuit detection circuit is configured to sense a voltage across a sense resistor disposed between a first solid-state switch and a second solid state switch of the solid-state bidirectional switch, and utilize the sensed voltage to detect a level of current flow that is indicative of a short-circuit fault event.

In some embodiments, the circuit breaker comprises a power converter circuit configured to generate a DC supply voltage from an AC supply voltage applied to the power input terminal, wherein the DC supply voltage is utilized to provide DC power to the processor, the first switch control circuit, the current sensor and the voltage sensor.

In another embodiment, a method comprises: connecting a circuit breaker between a utility power source and a branch circuit comprising a load, wherein the circuit breaker comprises a solid-state bidirectional switch which is configured to be placed in one of (i) a switched-on state to connect the utility power source to the branch circuit and (ii) a switched-off state to disconnect the utility power source from the branch circuit; sensing current flow through the circuit breaker and generating a current sense signal that is indicative of a magnitude of the sensed current flow through the circuit breaker; sensing a voltage at a point on an electrical path through the circuit breaker and generating a voltage sense signal that is indicative of a magnitude of the sensed voltage; generating a control signal to place the solid-state bidirectional switch into a switched-off state in response to detection of a fault event based on at least one of the current sense signal and the voltage sense signal; and processing the current sense signal and the voltage sense signal to determine operational status information of the circuit breaker and to determine power usage information of the load.

In some embodiments, the circuit breaker comprises an air-gap electromagnetic switch connected in series with the solid-state bidirectional switch, and wherein the method further comprises generating control signals to synchronize switching operations of the air-gap electromagnetic switch and the solid-state bidirectional switch, such that the air-gap electromagnetic switch is (i) placed in a switched-closed state prior to placing the solid-state bidirectional switch into a switched-on state, and (ii) placed in a switched-open state in response to the solid-state bidirectional switch being placed into a switched-off state.

In some embodiments, the method further comprises: sensing an actuation of a manual switch which is configured to trigger an opening of the air-gap electromagnetic switch; and generating a control signal to place the solid-state bidirectional switch into a switched-off state, in response to sensing the actuation of the manual switch.

In some embodiments, the method further comprises: analyzing sensor data obtained from the voltage and current sensors to detect a failure of the solid-state bidirectional switch; and generating a control signal to place the air-gap electromagnetic switch into a switched-closed state, in response to detecting a failure of the solid-state bidirectional switch.

In another embodiment, a system comprises: a circuit breaker distribution panel comprising a bus bar coupled to a utility power source; and a circuit breaker disposed within the circuit breaker distribution panel. The circuit breaker comprises a line input terminal coupled to the bus bar, and a load output terminal connected to a branch circuit. The circuit breaker further comprises: a solid-state bidirectional switch serially connected between the line input terminal and the load output terminal of the circuit breaker, and configured to be placed in one of (i) a switched-on state and (ii) a switched-off state; a first switch control circuit configured to generate control signals to control operation of the solid-state bidirectional switch; a current sensor configured to sense a magnitude of current flowing in an electrical path between the line input terminal and the load output terminal and generate a current sense signal; a voltage sensor configured to sense a magnitude of voltage at a point on the electrical path between the line input terminal and the load output terminal and generate a voltage sense signal; and a processor configured to receive and process the current sense signals and voltage sense signals to determine operational status information of the circuit breaker, to determine a fault event, and to determine power usage information of a load connected to the load output terminal.

In some embodiments, the system further comprises a status display system comprising a display and a master processor. The master processor is configured to communicate with the processor of the circuit breaker to obtain, process, and display the operational status information and power usage information received from the processor of the circuit breaker, and wherein the master processor is configured to transmit the operational status information and power usage information to a remote computing node.

In another embodiment, a circuit breaker comprises: a solid-state switch and an air-gap electromagnetic switch connected in series in an electrical path between a line input terminal and a load output terminal of the circuit breaker; switch control circuitry configured to control operation of the solid-state switch and the air-gap electromagnetic switch; a zero-crossing detection circuit configured to detect zero crossings of an alternating current (AC) power waveform on the electrical path between the line input terminal and the load output terminal of the circuit breaker; and a current sensor configured to sense a current flowing in the electrical path between the line input terminal and the load output terminal, and to detect a fault condition based on the sensed current flow. In response to detecting a fault condition by the current sensor, the switch control circuitry is configured to generate switch control signals to (i) place the solid-state switch into a switched-off state and (ii) place the air-gap electromagnetic switch into a switched-open state after the solid-state switch is placed into the switched-off state. The switch control circuitry utilizes zero-crossing detection signals output from the zero-crossing detection circuit to determine when to place the air-gap electromagnetic switch into the switched-open state.

In some embodiments, the solid-state switch comprises a P-type enhancement metal-oxide-semiconductor field-effect transistor device. In some embodiments, the solid-state switch comprises a N-type enhancement metal-oxide-semiconductor field-effect transistor device.

In some embodiments, the zero-crossing detection circuit is configured to detect zero crossings of an AC supply voltage waveform applied to the line input terminal of the circuit breaker. Further, in some embodiments, the zero-crossing detection circuit is configured to detect an associated direction of polarity transitioning between opposing half cycles of the AC supply voltage waveform, and wherein the switch control circuitry places the air-gap electromagnetic switch into the switched-open state at a time when the polarity transitioning causes a body diode of the solid-state switch to be reversed-biased.

In some embodiments, the zero-crossing detection circuit is configured to detect zero crossings of an AC current waveform. Further, is some embodiments, the zero-crossing detection circuit is configured to detect an associated direction of polarity transitioning between opposing half cycles of the AC current waveform, and wherein the switch control circuitry places the air-gap electromagnetic switch into the switched-open state at a time when the polarity transitioning causes a body diode of the solid-state switch to be reversed-biased.

In some embodiments, the zero-crossing detecting circuit is configured to (i) sample a magnitude and a polarity of a sense voltage across a sense resistor that is serially connected in the electrical path, (ii) detect a zero-crossing event pf the AC current waveform in response to determining that the magnitude of the sense voltage is zero, and (iii) determine a polarity of the AC current waveform based on the polarity of the sense voltage.

In some embodiments, the circuit breaker further comprises an environmental sensor circuit configured to sense an environmental condition and detect whether the sensed environmental condition is hazardous, and wherein in response detecting a hazardous environmental condition, the switch control circuitry is configured to generate switch control signals to (i) place the solid-state switch into a switched-off state and (ii) place the air-gap electromagnetic switch into a switched-open state after the solid-state switch is placed into the switched-off state.

In some embodiments, the environmental sensor circuit comprises one or more of (i) a chemical sensitive detector that is configured to detect a presence of hazardous chemicals, (ii) a gas sensitive detector that is configured to detect a presence of hazardous gases, (iii) a temperature sensor that is configured to detect a temperature, (iv) a piezoelectric detector that is configured to detect vibrations; and (v) a humidity sensor that is configured to detect a damp environment.

In another embodiment, a method comprises: sensing a current flowing in an electrical path between a line input terminal and a load output terminal of a circuit breaker, the circuit breaker comprising a solid-state switch and an air-gap electromagnetic switch connected in series in the electrical path between the line input terminal and the load output terminal of the circuit breaker; and detecting a fault condition based on the sensed current flow. In response to detecting the fault condition, the method further comprises: generating a first switch control signal to place the solid-state switch into a switched-off state; detecting a zero-crossing event of an alternating current (AC) waveform at a point on the electrical path and a polarity of the AC waveform following the zero-crossing event; and generating a second control signal to place the air-gap electromagnetic switch into a switched-open state in response to detecting that the polarity of the AC waveform following the zero-crossing event causes a body diode of the solid-state switch to be reversed-biased.

In some embodiments, the process of detecting the zero-crossing event of the AC waveform and the polarity of the AC waveform following the zero-crossing event comprises: detecting a next zero-crossing event of the AC waveform which occurs at a time following the solid-state switch being placed in a switched-off state; and in response to detecting that a polarity of the AC waveform following the next zero-crossing event causes the body diode of the solid-state switch to be forward-biased, delaying the generating of the second control signal to place the air-gap electromagnetic switch into the switched-open state until after detecting a next subsequent zero-crossing event of the AC waveform in which polarity of the AC waveform following the next subsequent zero-crossing event causes the body diode of the solid-state switch to be reversed-biased.

In some embodiments, the process of detecting the zero-crossing event of the AC waveform comprises detecting zero crossings of an AC supply voltage waveform applied to the line input terminal of the circuit breaker, and in some embodiments, the process of detecting the zero-crossing event of the AC waveform comprises detecting zero crossings of an AC current waveform at a point on the electrical path.

In some embodiments, the process of detecting the zero crossings of the AC current waveform comprises: sampling a magnitude and polarity of a sense voltage across a sense resistor that is serially connected in the electrical path; detecting a zero-crossing event in response to determining that the magnitude of the sense voltage is zero; and determining a polarity of the AC current waveform based on the polarity of the sense voltage.

In some embodiments, the process of detecting the fault condition comprises detecting at least one of a short-circuit fault condition, an over-current fault condition, an arc-fault condition, and a ground-fault condition. In some embodiments, the method further comprises: detecting an environmental condition, and in response to determining that the environmental condition is hazardous, generating a first control signal to place the solid-state switch into a switched-off state and generating a second control signal to place the air-gap electromagnetic switch into a switched-open state after the solid-state switch is placed into the switched-off state, wherein detecting the environmental condition comprises detecting one of (i) a presence a chemical, (ii) a presence of a gas, (iii) a temperature, (iv) a vibration; and (v) humidity.

In another embodiment, a system comprises: a circuit breaker distribution panel comprising a bus bar coupled to a utility power source; and a circuit breaker disposed within the circuit breaker distribution panel. The circuit breaker comprises a line input terminal coupled to the bus bar, and a load output terminal connected to a branch circuit. The circuit breaker further comprises: a solid-state switch and an air-gap electromagnetic switch connected in series in an electrical path between the line input terminal and the load output terminal of the circuit breaker; switch control circuitry configured to control operation of the solid-state switch and the air-gap electromagnetic switch; a zero-crossing detection circuit configured to detect zero crossings of an alternating current (AC) power waveform on the electrical path between the line input terminal and the load output terminal of the circuit breaker; and a current sensor configured to sense a current flowing in the electrical path between the line input terminal and the load output terminal, and detect a fault condition based on the sensed current flow. In response to detecting a fault condition by the current sensor, the switch control circuitry is configured to generate switch control signals to (i) place the solid-state switch into a switched-off state and (ii) place the air-gap electromagnetic switch into a switched-open state after the solid-state switch is placed into the switched-off state. The switch control circuitry utilizes zero-crossing detection signals output from the zero-crossing detection circuit to determine when to place the air-gap electromagnetic switch into the switched-open state.

In another embodiment, a circuit breaker comprises: a solid-state switch and a sense resistor, which are connected in series in an electrical path between a line input terminal and a load output terminal of the circuit breaker; a current detection circuit configured to (i) sample a sense voltage that is generated across the sense resistor in response to load current flowing through the sense resistor, (ii) detect an over-current fault condition based on the sampled sense voltage, and (iii) output a fault detection signal in response to detecting the over-current fault condition; and a switch control circuit configured to control the solid-state switch, wherein the switch control circuit is configured to switch-off the solid-state switch in response to the fault detection signal output from the current detection circuit.

In some embodiments, the sense resistor comprises a power resistor with a resistance value on an order of about one milliohm.

In some embodiments, the current detection circuit comprises: an input stage and an output stage. The input stage comprises a first comparator and a second comparator. The first comparator is configured to (i) compare a first reference voltage to a sense voltage which is generated across the sense resistor during a positive half-cycle of the load current, and (ii) generate first over-current detection signal when the sense voltage generated during the positive half-cycle of the load current exceeds the first reference voltage. The second comparator is configured to (i) compare a second reference voltage to a sense voltage which is generated across the sense resistor during a negative half-cycle of the load current, and (ii) generate a second over-current detection signal when the sense voltage generated during the negative half-cycle of the load current exceeds the second reference voltage. The output stage is configured to generate and output the fault detection signal based on the first and second over-current detection signals output from the first and second comparators.

In some embodiments, the output stage of the current detection circuit comprises a logical NOR gate which is configured to output the fault detection signal as a logic low pulse in response to an output of one of the first and second over-current detection signals from the first and second comparators.

In some embodiments, the sense resistor has a first terminal connected to a line side node of the electrical path, and a second terminal connected to a load side node of the electrical path. The first comparator comprises a non-inverting input connected to the first terminal of the sense resistor, and an inverting input that receives the first reference voltage. The second comparator comprises a non-inverting input connected to the second terminal of the sense resistor, and an inverting input that receives the second reference voltage.

In some embodiments, the current detection circuit comprises a first voltage divider circuit configured to generate the first reference voltage, and a second voltage divider circuit configured to generate the second reference voltage. The first voltage divider circuit is connected between a DC supply voltage rail and the load side node of the electrical path. The second voltage divider circuit is connected between the DC supply voltage rail and the line side of the electrical path.

In some embodiments, the DC supply voltage rail comprises a hot line rail with a DC voltage offset.

In some embodiments, the solid-state switch of the circuit breaker comprises a solid-state bidirectional switch comprising power metal-oxide-semiconductor field-effect transistor devices.

In some embodiments, the circuit breaker further comprises a zero-crossing detection circuit configured to (i) sample a sense voltage that is generated across the sense resistor in response to the load current flowing through the sense resistor, (ii) detect a zero-crossing of the load current based on the sampled sense voltage and (iii) output a zero-crossing detection signal in response to detecting the zero-crossing of the load current. In some embodiments, the zero-crossing detection circuit comprises: a polarity change detection stage configured to detect change a change in polarity between positive and negative half-cycles of the load current; an edge detection stage, coupled to an output of the polarity change detection stage, wherein the edge detection stage is configured to generate a control pulse in response to a detected change in polarity of the load current by the polarity change detection stage; and an output stage configured to output the zero-crossing detection signal based on the control pulse generated by the edge detection stage.

In some embodiments, the sense resistor has a first terminal connected to a line side node of the electrical path, and a second terminal connected to a load side node of the electrical path. The polarity change detection stage comprises a first comparator and a second comparator, wherein the first comparator comprises a non-inverting input connected to the first terminal of the sense resistor, and an inverting input connected to the second terminal of the sense resistor, and wherein the second comparator comprises a non-inverting input connected to the second terminal of the sense resistor, and an inverting input connected to the first terminal of the sense resistor.

In some embodiments, the edge detection stage comprises: a first edge detection circuit configured to generate a first edge detection pulse in response to a transition of a first compare signal output from the first comparator; and a second edge detection circuit configured to generate a second edge detection pulse in response to a transition of a second compare signal output from the second comparator.

In some embodiments, the output stage comprises a logical AND gate that outputs the zero-crossing detection signal based on the first and second edge detection pulses generated by the edge detection stage.

In some embodiments, the circuit breaker further comprises a processor, wherein the processor is configured to process zero-crossing detection signals output from the zero-crossing detection circuit and control one or more operation of the circuit breaker based on the zero-crossing detection signals.

In some embodiments, the processor configures the circuit breaker to operate in one of a direct current (DC) protection mode and an alternating current (AC) protection mode upon power up of the circuit breaker, based on an output of the zero-crossing detection circuit.

In another embodiment, a circuit breaker comprises: a switch and a sense resistor, which are connected in series in an electrical path between a line input terminal and a load output terminal of the circuit breaker; a zero-crossing detection circuit configured to (i) sample a sense voltage that is generated across the sense resistor in response to load current flowing through the sense resistor, (ii) detect a zero-crossing of the load current based on the sampled sense voltage and (iii) output a zero-crossing detection signal in response to detecting the zero-crossing of the load current; and a switch control circuit configured to control operation of the switch based on the output of the zero-crossing detection circuit.

In some embodiments, the zero-crossing detection circuit comprises: a polarity change detection stage configured to detect change a change in polarity between positive and negative half-cycles of the load current; an edge detection stage, coupled to an output of the polarity change detection stage, wherein the edge detection stage is configured to generate a control pulse in response to a detected change in polarity of the load current by the polarity change detection stage; and an output stage configured to output the zero-crossing detection signal based on the control pulse generated by the edge detection stage.

In some embodiments, the sense resistor has a first terminal connected to a line side node of the electrical path, and a second terminal connected to a load side node of the electrical path. The polarity change detection stage comprises a first comparator and a second comparator, wherein the first comparator comprises a non-inverting input connected to the first terminal of the sense resistor, and an inverting input connected to the second terminal of the sense resistor, and wherein the second comparator comprises a non-inverting input connected to the second terminal of the sense resistor, and an inverting input connected to the first terminal of the sense resistor. The edge detection stage comprises (i) a first edge detection circuit configured to generate a first edge detection pulse in response to a transition of a first compare signal output from the first comparator; and (ii) a second edge detection circuit configured to generate a second edge detection pulse in response to a transition of a second compare signal output from the second comparator. The output stage comprises a logical AND gate that outputs the zero-crossing detection signal based on the first and second edge detection pulses generated by the edge detection stage.

In some embodiments, the switch control circuit comprises a processor, wherein the processor is configured to process zero-crossing detection signals output from the zero-crossing detection circuit and control one or more operations of the circuit breaker based on the zero-crossing detection signals. In some embodiments, the processor configures the circuit breaker to operate in one of a DC protection mode and an AC protection mode upon power up of the circuit breaker, based on an output of the zero-crossing detection circuit.

In another embodiment, a circuit breaker comprises: a circuit breaker housing; an air-gap switch disposed within the circuit breaker housing, the air-gap switch comprising a first contact and a second contact disposed in an electrical path between a line input terminal and a load output terminal of the circuit breaker; an actuator mechanism disposed within the circuit breaker housing, wherein the air-gap switch is coupled to the actuator mechanism, and wherein the actuator mechanism is operatively configured to (i) mechanically force the first and second contacts apart to place the air-gap switch into an open state and create an air-gap in the electrical path, and (ii) mechanically force the first and second contacts together to place the air-gap switch into a closed state; and a first visual indicator configured to provide an indication of a state of the air-gap switch, wherein the first visual indicator comprises (i) a first window that is formed as part of the circuit breaker housing, (ii) a first indicator element coupled to the actuator mechanism and (iii) a second indicator element coupled to the actuator mechanism. The actuator mechanism is configured to move the first indicator element into position behind the first window as the actuator mechanism places the air-gap switch into the open state, such that the first indicator element is viewable through the first window to provide an indication of the open state of the air-gap switch. The actuator mechanism is configured to move the second indicator element into position behind the first window as the actuator mechanism places the air-gap switch into the closed state, such that the second indicator element is viewable through the first window to provide an indication of the closed state of the air-gap switch.

In some embodiments, the first indicator element comprises a colored element having a first color, and wherein the second indicator element comprises a colored element having a second color, which is different from the first color.

In some embodiments, the circuit breaker further comprises a second visual indicator configured to provide an indication of an operational state of the circuit breaker, wherein the second visual indicator comprises (i) a second window that is formed as part of the circuit breaker housing, and (ii) at least one light-emitting element disposed within the circuit breaker housing behind the second window. In some embodiments, the at least one light-emitting element comprises a light emitting diode. In some embodiments, the at least one light-emitting element is configured to emit light of a first color which is viewable through the second window to provide an indication of a non-tripped operating state of the circuit breaker. In some embodiments, the at least one light-emitting element is configured to emit light of a second color which is viewable through the second window to provide an indication of a tripped state of the circuit breaker. In some embodiments, the at least one light-emitting element is deactivated and emits no light to provide an indication of an off state of the circuit breaker.

In some embodiments, the circuit breaker further comprises a manual control switch that is mechanically coupled to the actuator mechanism, wherein the manual control switch is configured to toggle between a first position and a second position, wherein toggling the manual control switch into the first position causes the actuator mechanism to place the air-gap switch into the open state.

In some embodiments, the circuit breaker further comprises an electromechanical actuator coupled to the actuator mechanism, wherein actuation of the electromechanical actuator causes the actuator mechanism to place the air-gap switch into the open state and trip the circuit breaker. In some embodiments, the electromechanical actuator comprises a solenoid.

In another embodiment, a circuit breaker comprises: a solid-state switch and an air-gap switch connected in series in an electrical path between a line input terminal and a load output terminal of the circuit breaker, wherein the air-gap switch comprises a first contact and a second contact; an actuator mechanism operatively configured to (i) mechanically force the first and second contacts apart to place the air-gap switch into an open state and create an air-gap in the electrical path, and (ii) mechanically force the first and second contacts together to place the air-gap switch into a closed state; a manual control switch operatively coupled to the actuator mechanism, wherein the manual control switch is configured to toggle between a first position and a second position, wherein toggling the manual control switch into the first position causes the actuator mechanism to place the air-gap switch into the open state; an electromechanical actuator operatively coupled to the actuator mechanism, wherein actuation of the electromechanical actuator causes the actuator mechanism to place the air-gap switch into the open state; control circuitry configured to control operation of the solid-state switch and the electromechanical actuator, wherein the control circuitry is configured to generate (i) a first control signal that is configured to place the solid-state switch into one of a switched-on state and a switched-off state and (ii) a second control signal that is configured to control actuation of the electromechanical actuator; and a sensor switch operatively coupled to the manual control switch and electrically connected to the control circuitry, wherein the sensor switch is configured to (i) detect a toggling of the manual control switch from the second position to the first position which causes the actuator mechanism to place the air-gap switch into the open state and (ii) in response to detecting the toggling of the manual control switch from the second position to the first position, output a third control signal to the control circuitry. In response to the third control signal, the control circuitry is configured to generate the first control signal to place the solid-state switch into the switched-off state before the air-gap switch is placed into the open state to create the air-gap in the electrical path.

In some embodiments, the circuit breaker further comprises a current sensor configured to sense a current flowing in the electrical path between the line input terminal and the load output terminal, and detect a fault condition based on the sensed current flow. In response to detecting a fault condition by the current sensor, the control circuitry is configured to generate the first and second control signals to (i) place the solid-state switch into a switched-off state and (ii) actuate the electromechanical actuator to cause the actuation mechanism to place the air-gap electromagnetic switch into the open sate after the solid-state switch is placed into the switched-off state. In some embodiments, the electromechanical actuator comprises a solenoid.

In some embodiments, the circuit breaker further comprises a first visual indicator configured to provide an indication of the state of the air-gap switch, wherein the first visual indicator comprises (i) a first window that is formed as part of a circuit breaker housing of the circuit breaker, (ii)

a first indicator element coupled to the actuator mechanism and (iii) a second indicator element coupled to the actuator mechanism. The actuator mechanism is configured to move the first indicator element into position behind the first window as the actuator mechanism places the air-gap switch into the open state, such that the first indicator element is viewable through the first window to provide an indication of the open state of the air-gap switch. The actuator mechanism is configured to move the second indicator element into position behind the first window as the actuator mechanism places the air-gap switch into the closed state, such that the second indicator element is viewable through the first window to provide an indication of the closed state of the air-gap switch.

In some embodiments, the first indicator element comprises a colored element having a first color, and wherein the second indicator element comprises a colored element having a second color, which is different from the first color.

In some embodiments, the circuit breaker further comprises a second visual indicator configured to provide an indication of an operational state of the circuit breaker. The second visual indicator comprises (i) a second window that is formed as part of the circuit breaker housing, and (ii) at least one light-emitting element disposed within the circuit breaker housing behind the second window. In some embodiments, the at least one light-emitting element comprises a light emitting diode. In some embodiments, the at least one light-emitting element is configured to: emit light of a first color which is viewable through the second window to provide an indication of a non-tripped operating state of the circuit breaker; emit light of a second color which is viewable through the second window to provide an indication of a tripped state of the circuit breaker; and emit no light to provide an indication of an off state of the circuit breaker.

In another embodiment, a circuit breaker comprises: a circuit breaker housing; an air-gap switch disposed within the circuit breaker housing; and a first visual indicator configured to provide an indication of an open state and a closed state of the air-gap switch, wherein the first visual indicator comprises (i) a first window that is formed as part of the circuit breaker housing, (ii) a first indicator element disposed within the circuit breaker housing, and (iii) a second indicator element disposed within the circuit breaker housing. The first indicator element is configured to move into position behind the first window as the air-gap switch is placed into the open state, such that the first indicator element is viewable through the first window to provide an indication of the open state of the air-gap switch. The second indicator element is configured to move into position behind the first window as the air-gap switch is placed into the closed state, such that the second indicator element is viewable through the first window to provide an indication of the closed state of the air-gap switch.

In some embodiments, the circuit breaker further comprises a second visual indicator configured to provide an indication of an operational state of the circuit breaker, wherein the second visual indicator comprises (i) a second window that is formed as part of the circuit breaker housing, and (ii) at least one light-emitting element disposed within the circuit breaker housing behind the second window. The at least one light-emitting element is configured to emit light of at least one color through the second window to provide an indication of an operational state of the circuit breaker corresponding to the at least one color.

In another embodiment, a circuit breaker device comprises: a line hot terminal, a line neutral terminal, a load hot terminal, and a load neutral terminal; a solid-state switch and an air-gap electromagnetic switch connected in series between the line hot terminal and the load hot terminal; an internal switch and a shunt resistor serially connected between a first node and a second node, wherein the first node comprises a point along an electrical path between the line hot terminal and the load hot terminal, and wherein the second node comprises a point along an electrical path between the line neutral terminal and the load neutral terminal; switch control circuitry that is configured to control operation of (i) the solid-state switch and (ii) the internal switch; and fault detection circuitry that is configured to detect a fault condition and generate a fault detection control signal in response to detection of the fault condition. The switch control circuitry is configured to place the solid-state switch in a switched-off state in response to the fault detection control signal. The switch control circuitry is configured to activate the internal switch in response to the fault detection control signal and thereby generate an internal short-circuit path with the shunt resistor connected between the first and second nodes and cause an internal short-circuit current to flow through the air-gap electromagnetic switch, wherein the internal short-circuit current is sufficient to trip the air-gap electromagnetic switch and thereby create an air-gap in the electrical path between line hot terminal and the load hot terminal.

In some embodiments, the shunt resistor has a resistance value that is configured to limit a magnitude of the internal short-circuit current to a range of about 2× to about 3× a current rating of the air-gap electromagnetic switch.

In some embodiments, the solid-state switch comprises one of a P-type enhancement MOSFET device and a N-type enhancement MOSFET device.

In some embodiments, the fault detection circuitry comprises a current sensor configured to sense a current flowing in the electrical path between the line hot terminal and the load hot terminal, and detect one of an over-current fault condition and a short-circuit load current fault condition based on the sensed current flow.

In some embodiments, the internal switch comprises a solid-state bidirectional switch comprising a first MOSFET device and a second MOSFET device, which are serially connected. In some embodiments, the first and second MOSFET devices have commonly connected gate terminals, wherein the commonly connected gate terminals are coupled to the switch control circuitry, and wherein the switch control circuitry controls activation and deactivation of the internal switch by applying gate control signals to the commonly connected gate terminals.

In some embodiments, the circuit breaker device further comprises a zero-crossing detection circuit configured to detect zero crossings of an alternating current (AC) power waveform on the electrical path between the line hot terminal and the load hot terminal of the circuit breaker device. The switch control circuitry utilizes zero-crossing detection signals output from the zero-crossing detection circuit to control a timing for activating the internal switch in response to the fault detection control signal, so that short-circuit current is generated to trip the air-gap electromagnetic switch subsequent to placing the solid-state switch in the switched-off state in response to the fault detection control signal.

In some embodiments, the zero-crossing detection circuit is configured to detect (i) zero crossings of an AC supply voltage waveform on the electrical path between the line hot terminal and the load hot terminal circuit breaker, and (ii) an associated direction of polarity transitioning of the zero-crossings between opposing half cycles of the AC supply voltage waveform. The switch control circuitry activates the internal switch at a time when the polarity transitioning of detected zero crossing of the AC supply voltage waveform causes a body diode of the solid-state switch to be in a reversed-biased state subsequent to placing the solid-state switch in the switched-off state.

In some embodiments, the zero-crossing detection circuit is configured to detect (i) zero crossings of an AC current waveform on the electrical path between the line hot terminal and the load hot terminal circuit breaker and (ii) an associated direction of polarity transitioning of the zero crossings between opposing half cycles of the AC current waveform. The switch control circuitry activates the internal switch at a time when the polarity transitioning of a detected zero crossing of the AC current waveform causes a body diode of the solid-state switch to be in a reversed-biased state subsequent to placing the solid-state switch in the switched-off state.

In another embodiment, a method comprises: sensing a current flowing in an electrical path between a line hot terminal and a load hot terminal of a circuit breaker device, wherein the circuit breaker device comprises a solid-state switch and an air-gap electromagnetic switch connected in series in the electrical path between the line hot terminal and the load hot terminal of the circuit breaker device; and detecting a fault condition based on the sensed current flow. In response to detecting the fault condition, the method further comprises: applying a first switch control signal to the solid-state switch to place the solid-state switch into a switched-off state; and applying a second switch control signal to an internal switch to activate the internal switch and thereby generate an internal short-circuit path within the circuit breaker device and generate an internal short-circuit current which flows through the air-gap electromagnetic switch. The flow of the internal short-circuit current causes the air-gap electromagnetic switch to trip and thereby create an air-gap in the electrical path between line hot terminal and the load hot terminal of the circuit breaker device.

In some embodiments, the process of applying the second switch control signal to the internal switch comprises applying the second switch control signal to activate the internal switch and generate the internal short-circuit path subsequent to applying the first switch control signal to the solid-state switch to place the solid-state switch into the switched-off state.

In some embodiments, the method further comprises: detecting zero crossings of an AC power waveform on the electrical path between the line hot terminal and the load hot terminal of the circuit breaker device; and utilizing a timing of the detected zero crossings of the AC power waveform to control a timing for applying the second switch control signal to activate the internal switch subsequent to applying the first switch control signal to place the solid-state switch into the switched-off state.

In some embodiments, the process of utilizing the timing of the detected zero crossings of the AC power waveform to control a timing for applying the second switch control signal to activate the internal switch, comprises: detecting a direction of polarity transitioning between opposing half cycles of the AC power waveform at the detected zero crossings of the AC power waveform; and applying the second switch control signal to the internal switch to activate the internal switch at a time when a detected direction of polarity transitioning of the AC power waveform following the detected zero crossing of the AC supply voltage waveform causes a body diode of the solid-state switch to be in a reversed-biased state subsequent to placing the solid-state switch in the switched-off state.

In another embodiment, a system comprises: a circuit breaker distribution panel comprising a line hot bus bar and a line neutral bus bar coupled to a utility power source; and a circuit breaker device disposed within the circuit breaker distribution panel. The circuit breaker device comprises: a line hot terminal coupled to the line hot bus bar, a line neutral terminal coupled to the line neutral bus bar, and a load hot terminal and a load neutral terminal connected to a branch circuit: a solid-state switch and an air-gap electromagnetic switch connected in series between the line hot terminal and the load hot terminal; an internal switch and a shunt resistor serially connected between a first node and a second node, wherein the first node comprises a point along an electrical path between the line hot terminal and the load hot terminal, and wherein the second node comprises a point along an electrical path between the line neutral terminal and the load neutral terminal; switch control circuitry that is configured to control operation of (i) the solid-state switch and (ii) the internal switch; and fault detection circuitry that is configured to detect a fault condition and generate a fault detection control signal in response to detection of the fault condition. The switch control circuitry is configured to place the solid-state switch in a switched-off state in response to the fault detection control signal. The switch control circuitry is configured to activate the internal switch in response to the fault detection control signal and thereby generate an internal short-circuit path with the shunt resistor connected between the first and second nodes and cause an internal short-circuit current to flow through the air-gap electromagnetic switch, wherein the internal short-circuit current is sufficient to trip the air-gap electromagnetic switch and thereby create an air-gap in the electrical path between line hot terminal and the load hot terminal.

Although exemplary embodiments have been described herein with reference to the accompanying figures, it is to be understood that the current disclosure is not limited to those precise embodiments, and that various other changes and modifications may be made therein by one skilled in the art without departing from the scope of the appended claims.

We claim:

1. A circuit breaker device, comprising:
 a line hot terminal, a line neutral terminal, a load hot terminal, and a load neutral terminal;
 a solid-state switch and an air-gap electromagnetic switch connected in series between the line hot terminal and the load hot terminal;
 an internal switch and a shunt resistor serially connected between a first node and a second node, wherein the first node comprises a point along an electrical path between the line hot terminal and the load hot terminal, and wherein the second node comprises a point along an electrical path between the line neutral terminal and the load neutral terminal;
 switch control circuitry that is configured to control operation of (i) the solid-state switch and (ii) the internal switch; and
 fault detection circuitry that is configured to detect a fault condition and generate a fault detection control signal in response to detection of the fault condition;
 wherein the switch control circuitry is configured to place the solid-state switch in a switched-off state in response to the fault detection control signal; and
 wherein the switch control circuitry is configured to activate the internal switch in response to the fault detection control signal and thereby generate an internal short-circuit path with the shunt resistor connected between the first and second nodes and cause an internal short-circuit current to flow through the air-gap electromagnetic switch, wherein the internal short-circuit current is sufficient to trip the air-gap electromagnetic switch and thereby create an air-gap in the electrical path between line hot terminal and the load hot terminal.

2. The circuit breaker device of claim 1, wherein the shunt resistor has a resistance value that is configured to limit a magnitude of the internal short-circuit current to a range of about 2× to about 3× a current rating of the air-gap electromagnetic switch.

3. The circuit breaker device of claim 1, wherein the solid-state switch comprises one of a P-type enhancement metal-oxide-semiconductor field-effect transistor (MOSFET) device and a N-type enhancement MOSFET device.

4. The circuit breaker device of claim 1, wherein the fault detection circuitry comprises a current sensor that is configured to sense a current flowing in the electrical path between the line hot terminal and the load hot terminal, and detect one of an over-current fault condition and a short-circuit load current fault condition based on the sensed current flow.

5. The circuit breaker device of claim 1, wherein the internal switch comprises a solid-state bidirectional switch comprising a first MOSFET device and a second MOSFET device, which are serially connected.

6. The circuit breaker device of claim 5, wherein the first and second MOSFET devices have commonly connected gate terminals, wherein the commonly connected gate terminals are coupled to the switch control circuitry, and wherein the switch control circuitry controls activation and deactivation of the internal switch by applying gate control signals to the commonly connected gate terminals.

7. The circuit breaker device of claim 1, further comprising:
a zero-crossing detection circuit configured to detect zero-crossings of an alternating current (AC) power waveform on the electrical path between the line hot terminal and the load hot terminal of the circuit breaker device;
wherein the switch control circuitry utilizes zero-crossing detection signals output from the zero-crossing detection circuit to control a timing for activating the internal switch in response to the fault detection control signal, so that short-circuit current is generated to trip the air-gap electromagnetic switch subsequent to placing the solid-state switch in the switched-off state in response to the fault detection control signal.

8. The circuit breaker device of claim 7, wherein:
the zero-crossing detection circuit is configured to detect zero-crossings of an AC supply voltage waveform on the electrical path between the line hot terminal and the load hot terminal of the circuit breaker device;
the zero-crossing detection circuit is configured to detect an associated direction of polarity transitioning of the zero-crossings between opposing half cycles of the AC supply voltage waveform; and
the switch control circuitry activates the internal switch at a time when the polarity transitioning of a detected zero-crossing of the AC supply voltage waveform causes a body diode of the solid-state switch to be in a reversed-biased state subsequent to placing the solid-state switch in the switched-off state.

9. The circuit breaker device of claim 7, wherein:
the zero-crossing detection circuit is configured to detect zero-crossings of an AC current waveform on the electrical path between the line hot terminal and the load hot terminal of the circuit breaker device;
the zero-crossing detection circuit is configured to detect an associated direction of polarity transitioning of the detected zero-crossings between opposing half cycles of the AC current waveform; and
the switch control circuitry activates the internal switch at a time when the polarity transitioning of a detected zero-crossing of the AC current waveform causes a body diode of the solid-state switch to be in a reversed-biased state subsequent to placing the solid-state switch in the switched-off state.

10. A method, comprising:
sensing a current flowing in an electrical path between a line hot terminal and a load hot terminal of a circuit breaker device, wherein the circuit breaker device comprises a solid-state switch and an air-gap electromagnetic switch connected in series in the electrical path between the line hot terminal and the load hot terminal of the circuit breaker device;
detecting a fault condition based on the sensed current flow; and
in response to detecting the fault condition;
applying a first switch control signal to the solid-state switch to place the solid-state switch into a switched-off state; and
applying a second switch control signal to an internal switch to activate the internal switch and thereby generate an internal short-circuit path within the circuit breaker device and generate an internal short-circuit current which flows through the air-gap electromagnetic switch;
wherein the flow of the internal short-circuit current causes the air-gap electromagnetic switch to trip and thereby create an air-gap in the electrical path between line hot terminal and the load hot terminal of the circuit breaker device.

11. The method of claim 10, wherein the internal short-circuit path comprises a shunt resistor which has a resistance value that is configured to limit a magnitude of the internal short-circuit current to a range of about 2× to about 3× a current rating of the air-gap electromagnetic switch.

12. The method of claim 11, wherein the internal switch and the shunt resistor are serially connected between a first node and a second node, wherein the first node comprises a point along the electrical path between the line hot terminal and the load hot terminal of the circuit breaker device, and wherein the second node comprises a point along an electrical path between a line neutral terminal and a load neutral terminal of the circuit breaker device.

13. The method of claim 10, wherein applying the second switch control signal to the internal switch comprises applying the second switch control signal to activate the internal switch and generate the internal short-circuit path subsequent to applying the first switch control signal to the solid-state switch to place the solid-state switch into the switched-off state.

14. The method of claim 10, further comprising:
detecting zero-crossings of an alternating current (AC) power waveform on the electrical path between the line hot terminal and the load hot terminal of the circuit breaker device; and
utilizing a timing of the detected zero crossings of the AC power waveform to control a timing for applying the second switch control signal to activate the internal switch subsequent to applying the first switch control signal to place the solid-state switch into the switched-off state.

15. The method of claim 14, wherein utilizing the timing of the detected zero-crossings of the AC power waveform to control a timing for applying the second switch control signal to activate the internal switch, comprises:
detecting a direction of polarity transitioning between opposing half cycles of the AC power waveform at the detected zero crossings of the AC power waveform; and
applying the second switch control signal to the internal switch to activate the internal switch at a time when a detected direction of polarity transitioning of the AC power waveform following the detected zero-crossing of the AC power waveform causes a body diode of the solid-state switch to be in a reversed-biased state subsequent to placing the solid-state switch in the switched-off state.

16. A system, comprising:
a circuit breaker distribution panel comprising a line hot bus bar and a line neutral bus bar coupled to a utility power source;
a circuit breaker device disposed within the circuit breaker distribution panel;
wherein the circuit breaker device comprises:
a line hot terminal coupled to the line hot bus bar, a line neutral terminal coupled to the line neutral bus bar, and a load hot terminal and a load neutral terminal connected to a branch circuit;
a solid-state switch and an air-gap electromagnetic switch connected in series between the line hot terminal and the load hot terminal;
an internal switch and a shunt resistor serially connected between a first node and a second node, wherein the first node comprises a point along an electrical path between the line hot terminal and the load hot terminal, and wherein the second node comprises a point along an electrical path between the line neutral terminal and the load neutral terminal;
switch control circuitry that is configured to control operation of (i) the solid-state switch and (ii) the internal switch; and
fault detection circuitry that is configured to detect a fault condition and generate a fault detection control signal in response to detection of the fault condition;
wherein the switch control circuitry is configured to place the solid-state switch in a switched-off state in response to the fault detection control signal; and
wherein the switch control circuitry is configured to activate the internal switch in response to the fault detection control signal and thereby generate an internal short-circuit path with the shunt resistor connected between the first and second nodes and cause an internal short-circuit current to flow through the air-gap electromagnetic switch, wherein the internal short-circuit current is sufficient to trip the air-gap electromagnetic switch and thereby create an air-gap in the electrical path between line hot terminal and the load hot terminal.

17. The system of claim 16, wherein the shunt resistor of the circuit breaker device has a resistance value that is configured to limit a magnitude of the internal short-circuit current to a range of about 2× to about 3× a current rating of the air-gap electromagnetic switch.

18. The system of claim 16, wherein the circuit breaker device further comprises:
a zero-crossing detection circuit configured to detect zero-crossings of an alternating current (AC) power waveform on the electrical path between the line hot terminal and the load hot terminal of the circuit breaker device;
wherein the switch control circuitry utilizes zero-crossing detection signals output from the zero-crossing detection circuit to control a timing for activating the internal switch in response to the fault detection control signal, so that short-circuit current is generated to trip the air-gap electromagnetic switch subsequent to placing the solid-state switch in the switched-off state in response to the fault detection control signal.

19. The system of claim 18, wherein:
the zero-crossing detection circuit is configured to detect zero-crossings of an AC supply voltage waveform on the electrical path between the line hot terminal and the load hot terminal of the device;
the zero-crossing detection circuit is configured to detect an associated direction of polarity transitioning of the detected zero-crossings between opposing half cycles of the AC supply voltage waveform; and
the switch control circuitry activates the internal switch at a time when the polarity transitioning of a detected zero-crossing of the AC supply voltage waveform causes a body diode of the solid-state switch to be in a reversed-biased state subsequent to placing the solid-state switch in the switched-off state.

20. The system of claim 18, wherein:
the zero-crossing detection circuit is configured to detect zero crossings of an AC current waveform on the electrical path between the line hot terminal and the load hot terminal of the circuit breaker device;
the zero-crossing detection circuit is configured to detect an associated direction of polarity transitioning of the detected zero-crossings between opposing half cycles of the AC current waveform; and
the switch control circuitry activates the internal switch at a time when the polarity transitioning of a detected zero crossing of the AC current waveform causes a body diode of the solid-state switch to be in a reversed-biased state subsequent to placing the solid-state switch in the switched-off state.

* * * * *